(12) United States Patent
Bok et al.

(10) Patent No.: US 12,086,367 B2
(45) Date of Patent: Sep. 10, 2024

(54) DISPLAY PANEL AND DISPLAY DEVICE INCLUDING THE SAME

(71) Applicant: Samsung Display Co., LTD., Yongin-si (KR)

(72) Inventors: Seung Lyong Bok, Hwaseong-si (KR); Ki Seo Kim, Yongin-si (KR); Jae Kyoung Kim, Hwaseong-si (KR); Young Seok Seo, Seoul (KR); Sun Mi Yu, Seoul (KR); Jin Oh Kwag, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/303,770

(22) Filed: Apr. 20, 2023

(65) Prior Publication Data

US 2023/0266850 A1 Aug. 24, 2023

Related U.S. Application Data

(62) Division of application No. 17/682,494, filed on Feb. 28, 2022, now Pat. No. 11,635,861, which is a
(Continued)

(30) Foreign Application Priority Data

| Jun. 13, 2019 | (KR) | .................. | 10-2019-0069831 |
| Jul. 29, 2019 | (KR) | .................. | 10-2019-0092018 |

(51) Int. Cl.
  *G06F 3/044* (2006.01)
  *G06F 3/041* (2006.01)
(Continued)

(52) U.S. Cl.
  CPC .......... *G06F 3/0443* (2019.05); *G06F 3/0414* (2013.01); *G09G 3/3225* (2013.01);
  (Continued)

(58) Field of Classification Search
  CPC ...... G06F 3/0443; G06F 3/0414; G06F 3/044; H01Q 1/38; H01Q 9/0407; G09G 3/3225; H10K 59/131; H10K 59/40
  See application file for complete search history.

(56) References Cited

U.S. PATENT DOCUMENTS

| 7,663,607 B2 | 2/2010 | Hotelling et al. |
| 7,759,863 B2 | 7/2010 | Kim et al. |
| (Continued) | | |

FOREIGN PATENT DOCUMENTS

| CN | 105446526 | 3/2016 |
| CN | 109801949 | 5/2019 |
| (Continued) | | |

*Primary Examiner* — Sardis F Azongha
(74) *Attorney, Agent, or Firm* — KILE PARK REED & HOUTTEMAN PLLC

(57) ABSTRACT

A display device includes a display panel including a display layer having light-emitting elements on the substrate, and a sensor electrode layer on the display layer. The sensor electrode layer includes sensor electrodes in a sensor area, sensor lines electrically connected to the sensor electrodes and a first conductive pattern spaced apart from the sensor lines and sensor electrodes. The sensor lines and the first conductive pattern are in a sensor peripheral area adjacent to the sensor area. The first conductive pattern is an antenna.

20 Claims, 103 Drawing Sheets

Related U.S. Application Data division of application No. 16/884,844, filed on May 27, 2020, now Pat. No. 11,275,473.

(51) Int. Cl.
| | |
|---|---|
| *G09G 3/3225* | (2016.01) |
| *H01Q 1/38* | (2006.01) |
| *H10K 59/131* | (2023.01) |
| *H10K 59/40* | (2023.01) |

(52) U.S. Cl.
CPC ............ *H01Q 1/38* (2013.01); *H10K 59/131* (2023.02); *H10K 59/40* (2023.02); *G06F 2203/04102* (2013.01)

(56) References Cited

U.S. PATENT DOCUMENTS

| | | |
|---|---|---|
| 8,390,582 B2 | 3/2013 | Hotelling et al. |
| 8,718,553 B2 | 5/2014 | Parekh et al. |
| 9,081,453 B2 | 7/2015 | Bulea et al. |
| 9,164,636 B2 | 10/2015 | Kuo et al. |
| 9,430,180 B2 | 8/2016 | Hirakata et al. |
| 9,904,430 B2 | 2/2018 | Shibata et al. |
| 9,927,898 B2 | 3/2018 | Bok et al. |
| 10,185,430 B2 | 1/2019 | Zhu et al. |
| 10,249,603 B2 | 4/2019 | Cho et al. |
| 10,461,123 B2 | 10/2019 | Kim et al. |
| 10,541,281 B2 | 1/2020 | Han et al. |
| 2014/0043261 A1 | 2/2014 | Wang et al. |
| 2015/0037992 A1 | 2/2015 | Perez, Jr. |
| 2017/0023687 A1 | 1/2017 | Sicking et al. |
| 2017/0104855 A1 | 4/2017 | Lee et al. |
| 2017/0237152 A1 | 8/2017 | Lee et al. |
| 2018/0005345 A1 | 1/2018 | Apodaca |
| 2018/0015735 A1 | 1/2018 | Liu et al. |
| 2018/0190723 A1 | 7/2018 | Han et al. |
| 2018/0314369 A1 | 11/2018 | Yashiro et al. |
| 2019/0000464 A1 | 1/2019 | Shelton, IV et al. |
| 2019/0280054 A1 | 9/2019 | Huang et al. |

FOREIGN PATENT DOCUMENTS

| | | |
|---|---|---|
| JP | 2010-220266 | 9/2010 |
| JP | 3171994 | 11/2011 |
| JP | 2017-152904 | 8/2017 |
| JP | 3221633 | 6/2019 |
| JP | 2019-125019 | 7/2019 |
| KR | 10-2006-0085879 | 7/2006 |
| KR | 10-2012-0122159 | 11/2012 |
| KR | 10-2015-0006798 | 1/2015 |
| KR | 10-1704536 | 2/2017 |
| KR | 10-2017-0024672 | 3/2017 |
| KR | 10-2017-0096866 | 8/2017 |
| KR | 10-2017-0119849 | 10/2017 |
| KR | 10-2019-0009637 | 1/2019 |
| KR | 10-2019-0019802 | 2/2019 |
| KR | 10-2019-0069226 | 6/2019 |
| WO | 2016/158085 | 10/2016 |
| WO | 2018/147109 | 8/2018 |

DISPLAY PANEL AND DISPLAY DEVICE INCLUDING THE SAME

CROSS REFERENCE TO RELATED APPLICATION(S)

This is a divisional application of U.S. patent application Ser. No. 17/682,494, filed Feb. 28, 2022, the disclosure of which is incorporated herein by reference in its entirety. U.S. patent application Ser. No. 17/682,494 is a divisional application of U.S. patent application Ser. No. 16/884,844, filed May 27, 2020, now U.S. Pat. No. 11,275,473, issued Mar. 15, 2022, the disclosure of which is incorporated herein by reference in its entirety. U.S. patent application Ser. No. 16/884,844 claims priority to and benefit of Korean Patent Application No. 10-2019-0069831 under 35 U.S.C. § 119, filed on Jun. 13, 2019 and Korean Patent Application No. 10-2019-0092018 under 35 U.S.C. § 119, filed on Jul. 29, 2019 in the Korean Intellectual Property Office, the entire contents of which are incorporated herein by reference.

BACKGROUND

1. Technical Field

The disclosure relates to a display panel and a display device including the same.

2. Description of the Related Art

As the information-oriented society evolves, various demands are ever-increasing for display devices. For example, display devices are being utilized in a variety of electronic devices such as smart phones, digital cameras, laptop computers, navigation devices, and smart televisions.

A display device may include an antenna that may transmit and receive wireless electromagnetic waves for wireless communications. For example, a display device may include an antenna for near field communications such as a radio frequency identification (RFID) tag as well as fourth-generation (4G) mobile communications and fifth-generation (5G) mobile communications such as long-term evolution (LTE). Therefore, there may be a variety of the frequency bands of the wireless electromagnetic waves that may be transmitted and received depending on the communication types, and the shapes or lengths of the antennas may vary depending on the frequency bands of the wireless electromagnetic waves. Therefore, a display device may require different antennas for different frequency bands of wireless electromagnetic waves. For this reason, a display panel including a conductive pattern for implementing an antenna has been recently studied.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments may provide a display panel including a conductive pattern as an antenna.

Embodiments may also provide a display device including a conductive pattern as an antenna.

Additional features of embodiments will be set forth in the description which follows, and in part may be apparent from the description, or may be learned by practice of an embodiment herein.

According to an embodiment, a display device may include a display panel including a display layer including light-emitting elements disposed on a substrate, and a sensor electrode layer disposed on the display layer. The sensor electrode layer may include sensor electrodes disposed in a sensor area, sensor lines electrically connected to the sensor electrodes, and a first conductive pattern spaced apart from the sensor lines and sensor electrodes. The sensor lines and the first conductive pattern may be disposed in a sensor peripheral area adjacent to the sensor area, and the first conductive pattern may be an antenna.

The first conductive pattern and the sensor electrodes may be disposed on a same layer.

A second conductive pattern may be disposed between the first conductive pattern and the display layer.

The first conductive pattern may be disposed in a sensor peripheral area adjacent to a first side of the sensor area, a sensor peripheral area adjacent to a second side of the sensor area, and a sensor peripheral area adjacent to a third side of the sensor area.

Sensor pads may be disposed adjacent to a side of the substrate and electrically connected to the sensor lines; and a conductive pad may be disposed adjacent to the side of the substrate and electrically connected to the first conductive pattern.

The sensor electrode layer may include sensor pads disposed adjacent to a first side of the substrate and electrically connected to the sensor lines, and the first conductive pattern may be disposed adjacent to a second side of the substrate opposite to the first side, a third side of the substrate connecting the first side with the second side of the substrate, and a corner between the second side and the third side of the substrate.

The substrate may include a second bending area extended from a side of the sensor peripheral area, and a second pad area extended from the second bending area, and the first conductive pattern may be disposed in the second pad area.

The display device may include a radio frequency driver electrically connected to the first conductive pattern and processing a radio frequency signal transmitted or received from or to the first conductive pattern.

The radio frequency driver may be disposed in the second pad area.

The substrate may include a first bending area extended from another side of the sensor peripheral area, and a first pad area extended from the first bending area. A display driver may be disposed in the first pad area.

The substrate may include a first bending area extended from the side of the sensor peripheral area, and a first pad area extended from the first bending area. A display driver may be disposed in the first pad area.

A gap may be disposed between the first bending area and the second bending area and between the first pad area and the second pad area.

A battery may be disposed below the display panel, wherein the first conductive pattern may be electrically connected to the battery.

A thickness of the first conductive pattern may be larger than a thickness of each of the sensor electrodes and a thickness of each of the sensor lines.

A thickness of the first conductive pattern may be equal to or greater than about 2,150 µm.

The sensor electrodes may include sensing electrodes electrically connected to one another in a first direction, driving electrodes electrically connected to one another in a second direction, the second direction intersecting the first direction, a first connection unit electrically connected between the driving electrodes adjacent to one another in the second direction and disposed on a layer different from the sensing electrodes and the driving electrodes; and a second connection unit electrically connected between the sensing electrodes adjacent to one another in the first direction and disposed on a same layer as the sensing electrodes and the driving electrodes.

The display device may include a second conductive pattern disposed between the first conductive pattern and the display layer, wherein the first conductive pattern may be disposed on the same layer as the sensing electrodes and the driving electrodes, and the second conductive pattern may be disposed on the same layer as the first connection unit.

The first conductive pattern may be disposed in the sensor peripheral area adjacent to a side of the sensor area, and the sensor electrode layer may include a ground line disposed between the first conductive pattern and the sensor area. According to an embodiment, a display device may include a display panel including a display layer including light-emitting elements disposed on a substrate, and a sensor electrode layer disposed on the display layer. The sensor electrode layer may include sensor electrodes; sensor lines electrically connected to the sensor electrodes; and at least one first conductive pattern spaced apart from the sensor lines and sensor electrodes. The sensor electrodes and the at least one first conductive pattern may be disposed in a sensor area. The sensor lines may be disposed in a sensor peripheral area adjacent to the sensor area, and the at least one first conductive pattern may be an antenna.

The at least one first conductive pattern and the sensor electrodes may be disposed on a same layer.

The at least one first conductive pattern may include a plurality of first conductive patterns which are surrounded by the sensor electrodes, respectively.

The sensor electrodes may include sensing electrodes electrically connected to one another in a first direction; driving electrodes electrically connected to one another in a second direction, the second direction intersecting the first direction, a first connection unit electrically connected between the driving electrodes adjacent to one another in the second direction and disposed on a layer different from the sensing electrodes and the driving electrodes, and a second connection unit electrically connected between the sensing electrodes adjacent to one another in the first direction and disposed on a same layer as the sensing electrodes and the driving electrodes.

The at least one first conductive pattern may include a plurality of first conductive patterns, and each of the plurality of first conductive patterns may be surrounded by one of the sensing electrodes or one of the driving electrodes.

The at least one first conductive pattern may include a plurality of first conductive patterns, the display device may include a third connection unit electrically connected between the first conductive patterns adjacent to each other in a first direction; and a fourth connection unit electrically connected between the first conductive patterns adjacent to each other in a second direction, the second direction intersecting the first direction.

The third connection unit may include a first sub connection unit disposed on a same layer as the sensing electrodes and the driving electrodes, and a second sub connection unit disposed on a same layer as the first connection unit.

The fourth connection unit may be disposed on a same layer as the sensing electrodes and the driving electrodes.

The at least one first conductive pattern may include a plurality of first conductive patterns, and the sensor electrode layer may include a guard pattern disposed between one of the plurality of first conductive patterns and one of the sensing electrodes or one of the driving electrodes.

The at least one first conductive pattern may be surrounded by the guard pattern, and the guard pattern may be surrounded by the sensing electrodes or the driving electrodes.

The guard pattern, the sensing electrodes, and the driving electrodes may be disposed on a same layer.

The guard pattern may include a first sub guard pattern disposed on the same layer as the sensing electrodes and the driving electrodes, and a second sub guard pattern disposed on a same layer as the first connection unit.

The sensor electrodes may include proximity sensing electrodes spaced apart from the driving electrodes and the sensing electrodes and disposed on a same layer as the sensing electrodes and the driving electrodes, a fifth connection unit electrically connected between the proximity sensing electrodes adjacent to each other in the first direction, and a sixth connection unit electrically connected between the proximity sensing electrodes adjacent to each other in the second direction.

Each of the proximity sensing electrodes may be surrounded by one of the sensing electrodes or one of the driving electrodes.

The fifth connection unit may include a first sub connection unit disposed on a same layer as the sensing electrodes and the driving electrodes, and a second sub connection unit disposed on a same layer as the first connection unit.

The sixth connection unit may be disposed on a same layer as the sensing electrodes and the driving electrodes.

The first conductive pattern and the sensor electrodes may not overlap emission areas of the light-emitting elements.

The sensor electrodes may include a transparent conductive material, and the at least one first conductive pattern and the sensor lines may include an opaque conductive material.

The at least one first conductive pattern may overlap the emission areas of the light-emitting elements.

According to an embodiment, a display panel may include a first electrode and a second electrode disposed on a substrate and spaced apart from each other, a first contact electrode electrically connected to the first electrode, a second contact electrode electrically connected to the second electrode, a light-emitting element disposed between the first contact electrode and the second contact electrode, and a first conductive pattern that may not overlap the light-emitting element in a thickness direction of the substrate. The first conductive pattern may be an antenna.

The display panel may include a first insulating layer disposed on a part of the first electrode and the second electrode, a second insulating layer disposed on the light-emitting element, and a third insulating layer disposed on the first contact electrode, wherein the first contact electrode and the second contact electrode may be disposed on the first insulating layer and the second insulating layer, respectively, and the second contact electrode may be disposed on the third insulating layer.

The first conductive pattern and the second contact electrode may be disposed on a same layer.

The first conductive pattern and the first contact electrode may be disposed on a same layer.

The first conductive pattern, the first electrode, and the second electrode may be disposed on a same layer.

The display panel may include a shielding electrode disposed between the first insulating layer and the first contact electrode, wherein the first conductive pattern may be disposed on a same layer as the shielding electrode.

The display panel may include a first insulating layer disposed on a part of the first electrode and the second electrode; a second insulating layer disposed on the light-emitting element; and a third insulating layer disposed on the first contact electrode and the second contact electrode, wherein the first contact electrode and the second contact electrode may be disposed on the first insulating layer and the second insulating layer, respectively.

The first conductive pattern, the first contact electrode, and the second contact electrode may be disposed on a same layer.

The display panel may include an encapsulation layer disposed on the second contact electrode and the third insulating layer, wherein the first conductive pattern may be disposed on the encapsulation layer.

The display panel may include a second conductive pattern disposed between the first conductive pattern and the encapsulation layer, and a fourth insulating layer disposed between the first conductive pattern and the second conductive pattern.

The first conductive pattern may include slits.

According to an embodiment, a display panel may include a pixel unit comprising a plurality of sub-pixels disposed on a substrate, a transmissive portion disposed on a side of the pixel unit, and a first conductive pattern disposed in the transmissive portion. The first conductive pattern may be an antenna.

The display panel may include a second conductive pattern disposed in the transmissive portion, the second conductive pattern may overlap the first conductive pattern in a thickness direction of the substrate, and may receive a ground voltage or supply voltage.

Each of the plurality of sub-pixels may include a thin-film transistor including an active layer disposed on the substrate, a gate electrode disposed on a gate insulating layer disposed on at least a part of the active layer, and a source electrode and a drain electrode disposed on an interlayer dielectric layer disposed on the gate electrode, and a light-emitting element including a first electrode disposed on a planarization layer disposed on the source electrode and the drain electrode, an emissive layer disposed on the first electrode, and a second electrode disposed on the emissive layer.

The first conductive pattern and the first electrode may be disposed on a same layer, and the second conductive pattern and the source electrode and the drain electrode may be disposed on a same layer.

Each of the plurality of sub-pixels may include a first thin-film transistor including a first active layer disposed on the substrate, a first gate electrode disposed on a first gate insulating layer disposed on at least a part of the first active layer, and a first source electrode and a first drain electrode disposed on a first interlayer dielectric layer disposed on the first gate electrode, a second thin-film transistor including a light-blocking layer disposed on the first interlayer dielectric layer, a second active layer disposed on a second interlayer dielectric layer disposed on the light-blocking layer, a second gate electrode disposed on a second gate insulating layer disposed on at least a part of the second active layer, and a second source electrode and a second drain electrode disposed on a third interlayer dielectric layer disposed on the second gate electrode, and a light-emitting element including a first electrode disposed on a planarization layer disposed on the first source electrode, the second source electrode, the first drain electrode and the second drain electrode, an emissive layer disposed on the first electrode; and a second electrode disposed on the emissive layer.

The first conductive pattern and the first electrode may be disposed on a same layer, and the second conductive pattern and the source electrode and the drain electrode may be disposed on a same layer.

The display panel may include a mirror area disposed on another side of the pixel unit; and a mirror pattern disposed in the mirror area.

The mirror pattern and the first conductive pattern may be disposed on a same layer.

According to an embodiment, a display panel may include a substrate including an upper surface and a first side surface extending from the upper surface, a display layer disposed on the substrate and including pixels in a main display area displaying an image, the main display area overlapping the upper surface, a sensor electrode layer disposed on the display layer and including sensor electrodes in a sensor area, the sensor area overlapping the main display area, and a first conductive pattern disposed on the first side surface of the substrate, wherein the first conductive pattern may be an antenna.

The first side surface of the substrate may include a first sub display area and a first non-display area, the sensor area may overlap the first sub display area, a sensor peripheral area may be disposed around the sensor area overlap the first non-display area, and the first conductive pattern may be disposed on the first non-display area.

The first conductive pattern and the sensor electrodes may be disposed on a same layer.

The first side surface of the substrate may include a sensor peripheral area adjacent to the sensor area and include sensor lines electrically connected to the sensor electrodes of the sensor area; and an antenna area where the first conductive pattern may be disposed.

The display panel may include a plurality of through holes penetrating through the first side surface of the substrate, the display layer, and the sensor electrode layer.

The display layer may be disposed on a surface of the first side surface of the substrate, and the display panel may include an antenna module disposed below the first side surface of the substrate and include the first conductive pattern.

The display panel may include a force sensor disposed below the first side surface of the substrate.

The display panel may include a driving electrode and a sensing electrode disposed on a first base layer; and a pressure sensing layer disposed on a second base layer facing the first base layer and overlapping the driving electrode and the sensing electrode.

The pressure sensing layer may include a polymer resin and metal microparticles.

According to an embodiment, a first conductive pattern disposed in a sensor peripheral area of a sensor electrode layer of a display panel in a display device may be utilized as a patch antenna for 5G mobile communications or an antenna for an RFID tag for near field communications. Although the wavelength of the electromagnetic waves transmitted/received to/from the first conductive pattern in 5G mobile communications is short, the electromagnetic waves do not need to pass through metal layers of the display panel. Therefore, the electromagnetic waves may be stably radiated toward the upper side of the display device.

According to an embodiment, by forming or disposing an antenna area in a pad area, the antenna area may be increased compared to an antenna area disposed in a sensor peripheral area. Therefore, the first conductive pattern of the antenna area may be designed more freely.

According to an embodiment, by forming or disposing a second conductive pattern overlapping the first conductive pattern in the thickness direction of the display panel and receiving a ground voltage, it may be possible to prevent implement a patch antenna for 5G mobile communications using the first conductive pattern.

According to an embodiment, by forming or disposing a second conductive pattern overlapping the first conductive pattern in the thickness direction of the display panel and receiving a ground voltage, it may be possible to prevent implement a patch antenna for 5G mobile communications using the first conductive pattern.

According to an embodiment, a first conductive pattern and a second conductive pattern for implementing the antenna may be made of the same or similar material on a same layer as the sensor electrodes of the sensor electrode layer, and thus there is an advantage that no additional process for forming the first conductive pattern and the second conductive pattern in the antenna area may be required.

According to an embodiment, instead of dummy patterns for reducing parasitic capacitance between the second electrode and the sensor electrodes (the driving electrodes and the sensing electrodes) of the emission material layer, the first conductive patterns utilized as the antenna may be formed or disposed. There is an advantage that no additional process for forming the first conductive pattern of the antenna area may be required.

According to an embodiment, a guard pattern may be disposed between the sensor electrode (the driving electrode or the sensing electrode) and the first conductive pattern, so that it may be possible to prevent that the sensor electrode (the driving electrode or the sensing electrode) may be affected by electromagnetic waves from the first conductive pattern.

According to an embodiment, the first conductive pattern formed or disposed in the remaining portion of the wiring area surrounding the through hole penetrating the display panel may be utilized as the antenna.

According to an embodiment, a first conductive pattern and a second conductive pattern for implementing the antenna may be made of the same or similar material on a same layer as the electrodes of the display layer, and thus there is an advantage that no additional process for forming the first conductive pattern and the second conductive pattern in the antenna area may be required.

According to an embodiment, when the display panel may be a transparent display panel including transmissive portions or overlaps with sensor devices disposed on a lower surface of the display panel, the first conductive pattern formed or disposed in the transmissive portions of the display panel may be utilized as an antenna.

According to an embodiment, when the display panel comprises an upper surface and at least one side surface extended from the upper surface, the first conductive pattern formed or disposed in the at least one side surface may be utilized as an antenna.

According to an embodiment, when a sensor area is not disposed in at least one side surface, the antenna area may be increased compared to when the sensor area may be disposed in at least one side surface. Therefore, the first conductive pattern of the antenna area may be designed more freely.

According to an embodiment, in order to increase the design area for the antenna area in at least one side surface, no sensor electrode layer may be disposed but only the antenna layer may be disposed. In such case, a force sensor for sensing a user's touch input or a user's pressure may be disposed in at least one side surface in place of the sensor electrode layer.

Other features and embodiments may be apparent from the following detailed description, the drawings, and the claims.

It is to be understood that both the foregoing description and the following detailed description are not to be construed as limiting of an embodiment as described or claimed herein.

BRIEF DESCRIPTION OF THE DRAWINGS

The accompanying drawings, which are included to provide a further understanding of the disclosure, illustrate embodiments.

DETAILED DESCRIPTION OF THE EMBODIMENTS

Figure 1:
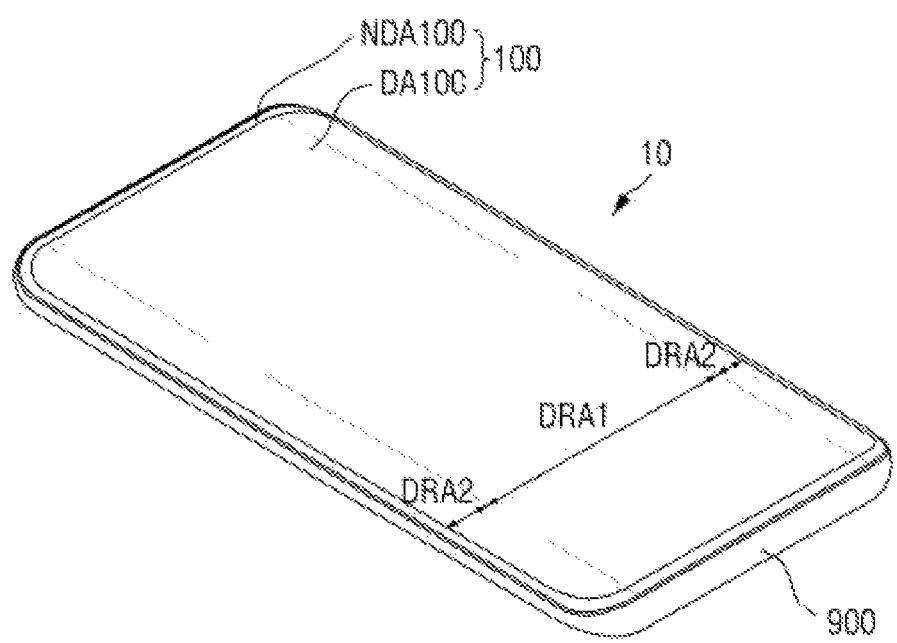
FIG. 1 is a perspective view of a display device according to an embodiment.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure and like reference numerals refer to like elements throughout the specification.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, in the specification, the phrase "in a plan view" means when an object portion is viewed from above, and the phrase "in a schematic cross-sectional view" means when a schematic cross-section taken by vertically cutting an object portion is viewed from the side. Additionally, the terms "overlap" or "overlapped" mean that a first object may be above or below a second object, and vice versa. The terms "face" and "facing" mean that a first object may directly or indirectly oppose a second object. In a case in which a third object intervenes between the first and second object, the first and second objects may be understood as being indirectly opposed to one another, although still facing each other.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
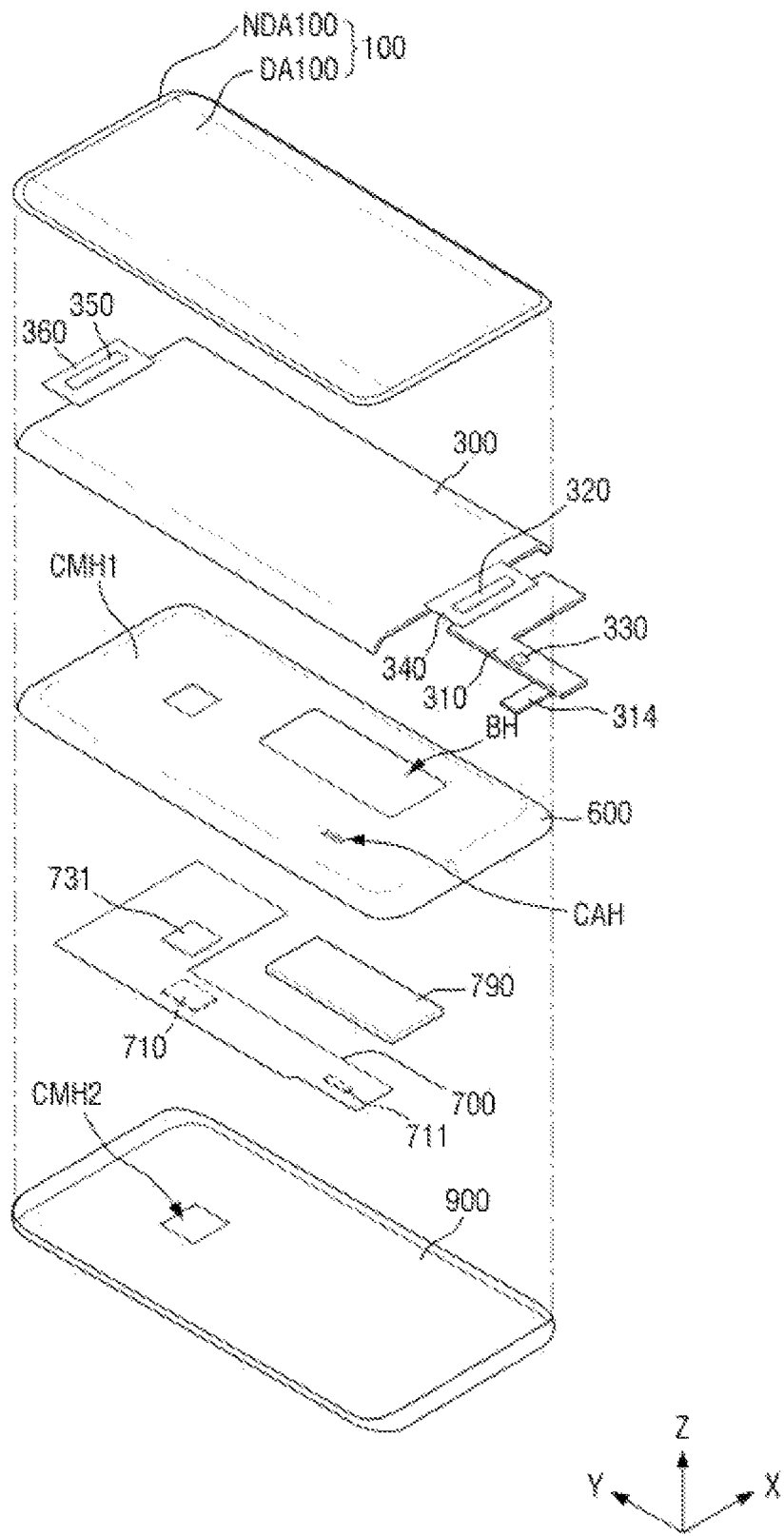
FIG. 2 is an exploded, perspective view of a display device according to an embodiment.

FIG. 1 is a perspective view of a display device according to an embodiment. FIG. 2 is an exploded, perspective view of a display device according to an embodiment.

Referring to FIGS. 1 to 2, a display device 10 according to an embodiment may display moving images or still images. The display device 1 may be used as the display screen of portable electronic devices such as a mobile phone, a smart phone, a tablet PC, a mobile communications terminal, an electronic notebook, an electronic book, a portable multimedia player (PMP), a navigation device and an ultra mobile PC (UMPC), as well as the display screen of various products such as a television, a notebook, a monitor, a billboard and the Internet of Things. The display device 10 according to an embodiment may be applied to wearable devices such as a smart watch, a watch phone, an glasses-type display, and a head-mounted display (HMD) device. The display device 10 according to an embodiment may be used as a center information display (CID) disposed at the instrument cluster and the center fascia or the dashboard of a vehicle, as a room mirror display on the behalf of the side mirrors of a vehicle, as a display placed on the back of each of the front seats that is the entertainment system for passengers at the rear seats of a vehicle.

In the example shown in FIGS. 1 and 2, the display device 10 according to an embodiment is applied to a smart phone for convenience of illustration. The display device 10 according to an embodiment includes a cover window 100, a display panel 300, a display circuit board 310, a display driver 320, a sensor driver 330, a bracket 600, a main circuit board 700, a battery 790 and a bottom cover 900.

As used herein, the term "upper side" refers to the side of the display panel 300 in the z-axis direction where the cover window 100 is disposed, whereas the term "lower side" refers to the opposite side of the display panel 300 in the z-axis direction where the bracket 600 is disposed. As used herein, the terms "left," "right," "upper" and "lower" sides indicate relative positions when the display panel 300 is viewed from the top. For example, the "left side" refers to the opposite direction indicated by the arrow of the x-axis, the "right side" refers to the direction indicated by the arrow of the x-axis, the "upper side" refers to the direction indicated by the arrow of the z-axis, and the "lower side" refers to the opposite direction indicated by the arrow of the z-axis.

The display device 10 may have a substantially rectangular shape when viewed from the top. For example, the display device 10 may have a substantially rectangular shape having shorter sides in a first direction (x-axis direction) and longer sides in a second direction (y-axis direction) when viewed from the top as shown in FIG. 1. Each of the corners where the short side in the first direction (x-axis direction) meets the longer side in the second direction (y-axis direction) may be rounded with a predetermined curvature or may be a right angle. The shape of the display device 10 when viewed from the top is not limited to a substantially rectangular shape, but may be formed in another substantially polygonal shape, substantially circular shape, or substantially elliptical shape.

The display device 10 may include a first area DRA1, and second areas DRA2 extended from the right and left sides of the first area DRA1, respectively. The first area DRA1 may be either flat or curved. The second areas DRA2 may be either flat or curved. When both the first area DRA1 and the second areas DRA2 are formed as curved surfaces, the curvature of the first area DRA1 may be different from the curvature of the second areas DRA2. When the first area DRA1 is formed as a curved surface, it may have a constant curvature or a varying curvature. When the second areas DRA2 are formed as curved surfaces, they may have a constant curvature or a varying curvature. When both the first area DRA1 and the second areas DRA2 are formed as flat surfaces, the angle between the first area DRA1 and the second areas DRA2 may be an obtuse angle.

Although the second areas DRA2 are extended from the left and right sides of the first area DRA1, respectively, in FIG. 1, this is merely illustrative. For example, the second area DRA2 may be extended from only one of the right and left sides of the first area DRA1. Alternatively, the second area DR2 may be extended from at least one of upper and lower sides of the first area DR1, as well as the left and right sides. Alternatively, the second areas DRA2 may be eliminated, and the display device 10 may include only the first area DRA1.

The cover window 100 may be disposed on the display panel 300 to cover or overlap an upper surface of the display panel 300. Thus, the cover window 100 may protect the upper surface of the display panel 300.

The cover window 100 may include a transmissive portion DA100 corresponding to the display panel 300 and a non-transmissive portion NDA100 corresponding to the other area than the display panel 300. The cover window 100 may be disposed in the first region DR1 and the second regions DR2. The transmissive portion DA100 may be disposed in a part of the first region DR1 and a part of each of the second regions DR2. The non-transmissive portion NDA100 may include an opaque material that blocks light. The non-transmissive portion NDA100 may include a pattern that may be perceived by a user when no image is displayed.

The display panel 300 may be disposed under or below the cover window 100. The display panel 300 may be disposed such that it overlaps with the transmissive portion 100DA of the cover window 100. The display panel 300 may be disposed in the first area DR1 and the second areas DR2. A user may see images from the display panel 300 in the first area DR1 as well as the second areas DR2.

The display panel 300 may be a light-emitting display panel including light-emitting elements. For example, the display panel 300 may be an organic light-emitting display panel using organic light-emitting diodes including organic emissive layer, a micro light-emitting diode display panel using micro LEDs, a quantum-dot light-emitting display panel including quantum-dot light-emitting diodes including a quantum-dot emissive layer, or an inorganic light-emitting display panel using inorganic light-emitting elements including an inorganic semiconductor.

The display panel 300 may be a rigid display panel that is rigid and thus is not easily bent, or a flexible display panel that is flexible and thus may be easily bent, folded or rolled. For example, the display panel 300 may be a foldable display panel that may be folded and unfolded, a curved display panel having a curved display surface, a bended display panel having a bent area other than the display surface, a rollable display panel that may be rolled and unrolled, and a stretchable display panel that may be stretched.

The display panel 300 may be a transparent display panel to allow a user to see an object or a background under or below the display panel from above the display panel 300 through it. Alternatively, the display panel 300 may be a reflective display panel that may reflect an object or a background on the upper surface of the display panel 300.

A first flexible film 340 may be attached to one edge of the display panel 300. One side of the first flexible film 340 may be attached to the edge of the display panel 300 using an anisotropic conductive film. The first flexible film 340 may be a flexible film that may be bent.

The display driver 320 may be disposed on the first flexible film 340. The display driver 320 may receive control signals and supply voltages and may generate and output signals and voltages for driving the display panel 300. The display driver 320 may be an integrated circuit (IC).

The display circuit board 310 may be attached to the opposite side of the first flexible film 340. The opposite side of the first flexible film 340 may be attached to the upper surface of the display circuit board 310 using an anisotropic conductive film. The display circuit board 310 may be a flexible printed circuit board (FPCB) that may be bent, a rigid printed circuit board (PCB) that is rigid and not bendable, or a hybrid printed circuit board including a rigid printed circuit board and a flexible printed circuit board.

The sensor driver 330 may be disposed on the display circuit board 310. The sensor driver 330 may be an integrated circuit. The sensor driver 330 may be attached on the display circuit board 310. The sensor driver 330 may be electrically connected to sensor electrodes of a sensor electrode layer of the display panel 300 through the display circuit board 310.

The sensor electrode layer of the display panel 300 may sense a user's touch input using at least one of a variety of touch sensing schemes such as resistive sensing and capacitive sensing. For example, when a user's touch input is sensed by using the sensor electrode layer of the display panel 300 by the capacitive sensing, the sensor driver 330 applies driving signals to the driving electrodes among the sensor electrodes, and senses the voltages charged in the mutual capacitance between the driving electrodes and the sensing electrodes through the sensing electrodes among the sensor electrodes, thereby determining whether there is a user's touch. User's touches may include a physical contact and a near proximity. A user's physical contact refers to that an object such as the user's finger or a pen is brought into contact with the cover window 100 disposed on the sensor electrode layer. A near proximity refers to that an object such as the user's finger or a pen is close to but is spaced apart from the cover window 100, such as hovering over it. The sensor driver 330 may transmit sensor data to the main processor 710 based on the sensed voltages, and the main processor 710 may analyze the sensor data to calculate the coordinates of the position where the touch input is made.

On the display circuit board 310, a power supply for supplying driving voltages for driving the pixels P, the scan driver and the display drive 320 of the display panel 300 may be disposed. Alternatively, the power supply may be integrated with the display drive 320, in which case, the display driver 320 and the power supply may be a single integrated circuit.

The bracket 600 for supporting the display panel 300 may be disposed under or below the display panel 300. The bracket 600 may include plastic, metal, or both plastic and metal. In the bracket 600, a first camera hole CMH1 in which a camera device 731 may be inserted, a battery hole BH in which the battery 790 may be disposed, a cable hole CAH through which a cable 314 connected to the display circuit board 310 may pass, for example.

The main circuit board 700 and the battery 790 may be disposed under or below the bracket 600. The main circuit board 700 may be either a printed circuit board or a flexible printed circuit board.

The main circuit board 700 may include a main processor 710, a camera device 731, and a main connector 711. The maintain processor 710 may be an integrated circuit. The camera device 731 may be disposed on both the upper and lower surfaces of the main circuit board 700, and the main processor 710 and the main connector 711 may be disposed on one of the upper and lower surfaces of the main circuit board 700.

The main processor 710 may control all the functions of the display device 10. For example, the main processor 710 may output digital video data to the display driver 320 through the display circuit board 310 so that the display panel 300 displays images. The main processor 710 may receive detection data from the sensor driver 330. The main processor 710 may determine whether there is a user's touch based on the detection data, and may execute an operation associated with the user's physical contact or near proximity if determined. For example, the main processor 710 may calculate the coordinates of the user's touch by analyzing the detection data, and then may run an application indicated by an icon touched by the user or perform the operation. The main processor 710 may be an application processor, a central processing unit, or a system chip as an integrated circuit.

The camera device 731 processes image frames such as still image and video obtained by the image sensor in the camera mode and outputs them to the main processor 710. The camera device 731 may include at least one of a camera sensor (e.g., CCD, CMOS, within the spirit and the scope of the disclosure), a photo sensor (or an image sensor), and a laser sensor.

The cable 314 passing through the cable hole CAH of the bracket 600 may be connected to the main connector 711, and thus the main circuit board 700 may be electrically connected to the display circuit board 310.

Figure 3:
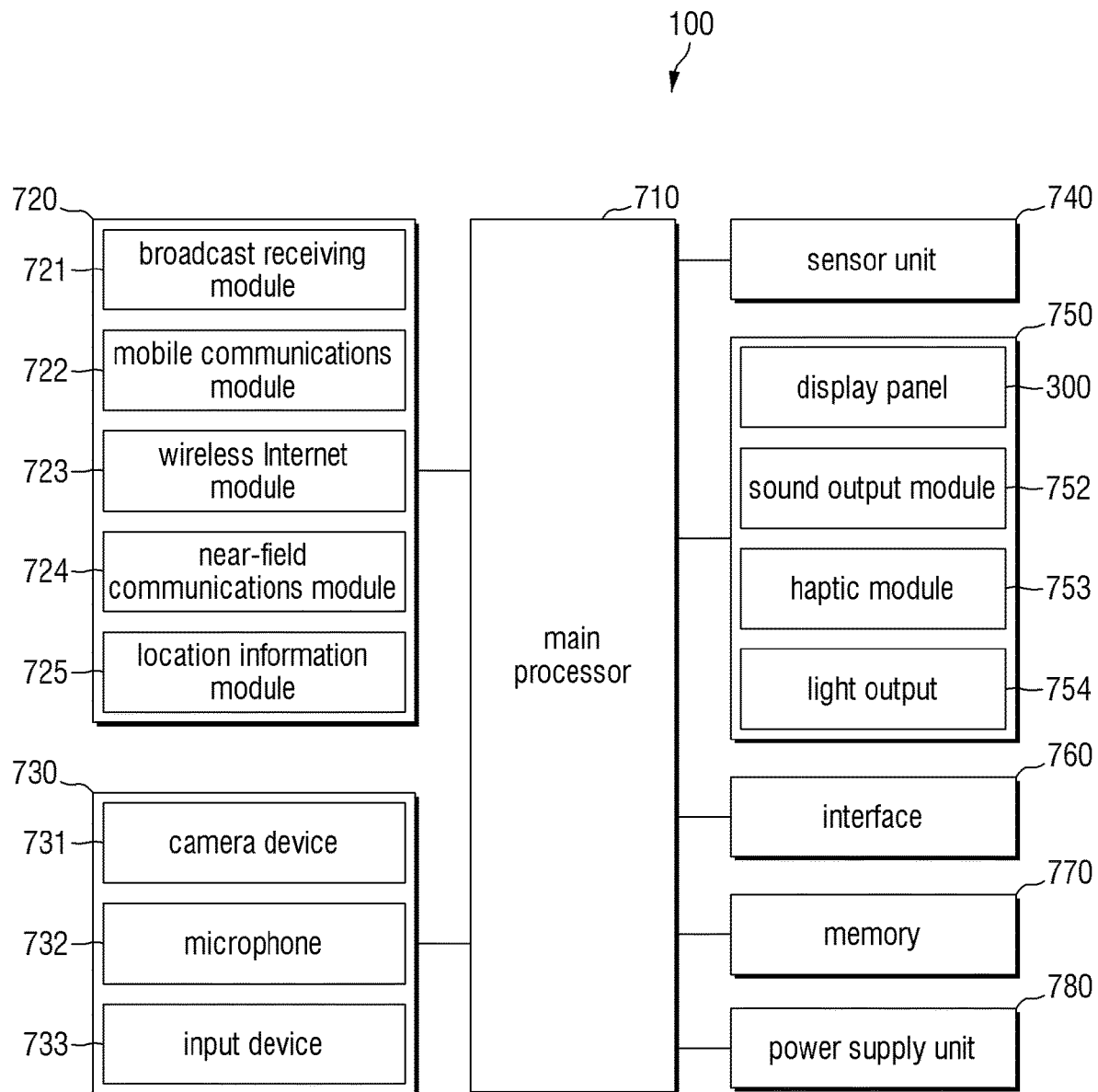
FIG. 3 is a block diagram showing a display device according to an embodiment.

In addition to the main processor 740, the camera device 731 and the main connector 711, the main circuit board 700 may include a wireless communications unit 720, at least one input unit 730, at least one sensor unit 740, at least one output unit 750, at least one interface 760, a memory 770, and a power supply unit 780, shown in FIG. 3.

For example, the wireless communications unit 720 may include at least one of a broadcasting receiving module 721, a mobile communications module 722, a wireless Internet module 723, a near-field communications module 724, and a location information module 725.

The broadcast receiving module 721 receives a broadcast signal and/or broadcast related information from an external broadcast managing server through a broadcast channel. The broadcasting channel may include a satellite channel and a terrestrial channel.

The mobile communications module 722 transmits/receives wireless signals to/from at least one of a base station, an external terminal and a server in a mobile communications network established according to technical standards or communications schemes for mobile communications (e.g., global system for mobile communications (GSM), code division multi access (CDMA), code division multi access 2000 (CDMA2000), enhanced voice-data optimized or enhanced voice-data only (EV-DO), wideband CDMA (WCDMA), high speed downlink packet access (HSDPA), high speed uplink packet access (HSUPA), long term evolution (LTE), long term evolution-advanced (LTE-A), within the spirit and the scope of the disclosure). The wireless signals may include a voice call signal, a video call signal, or a variety of types of data depending on transmission and reception of a text/multimedia message.

The wireless Internet module 723 refers to a module for wireless Internet connection. The wireless Internet module 723 may transmit and receive wireless signals in a communications network according to wireless Internet technologies. Examples of wireless Internet technologies include wireless LAN (WLAN), wireless-fidelity (Wi-Fi), wireless fidelity (Wi-Fi) Direct, digital living network alliance (DLNA), within the spirit and the scope of the disclosure.

The near-field communications module 724 is for near field communications, and may support near field communications by using at least one of: Bluetooth™, radio frequency identification (RFID), infrared data association (IrDA), ultra wideband (UWB), ZigBee, near-field communications (NFC), Wi-Fi, Wi-Fi Direct and wireless universal serial bus (Wireless USB). The near-field communications module 724 may support wireless communications between the display device 10 and a wireless communications system, between the display device 10 and another electronic device, or between the display device 10 and a network where another electronic device (or an external server) is located over wireless area networks. The wireless area network may be a wireless personal area network. Another electronic device may be a wearable device capable of exchanging (or interworking) data with the display device 10.

The location information module 725 is a module for acquiring the location (or current location) of the display device 10. Examples of the location information module 725 include a global positioning system (GPS) module or a wireless fidelity (Wi-Fi) module. For example, the display device 10 utilizing a GPS module may acquire its location 10 by using signals transmitted from GPS satellites. By utilizing a Wi-Fi module, the display device 10 may acquire its location based on the information of wireless access points (APs) that transmit/receive wireless signals to/from the Wi-Fi module. The location information module 725 refers to any module that may be used to acquire the location (or current location) of the display device 10 and is not limited to a module that calculates or acquires the location of the display device 10 by itself.

The input unit 730 may include an image input unit for inputting an image signal, such as a camera device 731, an audio input unit for inputting an audio signal, such as a microphone 732, and an input device 733 for receiving information from a user.

The camera device 731 processes an image frame such as a still image or a moving image obtained by an image sensor in a video call mode or a recording mode. The processed image frames may be displayed on the display panel 300 or stored in the memory 770.

The microphone 732 processes external sound signals into electrical voice data. The processed voice data may be utilized in a variety of ways depending on a function or an application being executed on the display device 10. In the microphone 732, a variety of algorithms for removing different noises generated during a process of receiving an external sound signal may be implemented.

The main processor 710 may control the operation of the display device 10 in response to the information input through the input device 733. The input device 733 may include a mechanical input means or a touch input means such as a button, a dome switch, a jog wheel, a jog switch, for example, positioned on the rear or side surface of the display device 10. The touch input means may be implemented with the sensor electrode layer of the display panel 300.

The sensor unit 740 may include one or more sensors that sense at least one of information in the display device 10, the environment information surrounding the display device 10, and user information, and generate a sensing signal associated with it. The main processor 710 may control driving or operation of the display device 10 or may perform data processing, function, or operation associated with an application installed on the display device 10 based on the sensing signal. The sensor unit 740 may include at least one of: a proximity sensor, an illumination sensor, an acceleration sensor, a magnetic sensor, a gravity sensor (G-sensor), a gyroscope sensor, a motion sensor, a RGB sensor, an infrared sensors (IR sensor), a finger scan sensor, an ultrasonic sensor, an optical sensor, a battery gauge, an environmental sensor (e.g., a barometer, a hygrometer, a thermometer, a radiation sensor, a heat sensor, a gas sensor, for example), and a chemical sensor (e.g., an electronic nose, a healthcare sensor, a biometric sensor, for example)

The proximity sensor may refer to a sensor that may detect the presence of an object approaching a predetermined detection surface or a nearby object by using an electromagnetic force, an infrared ray, for example, without using a mechanical contact. Examples of the proximity sensor include a transmissive photoelectric sensor, a direct reflective photoelectric sensor, a mirror reflective photoelectric sensor, a high-frequency oscillation proximity sensor, a capacitive proximity sensor, a magnetic proximity sensor, an infrared proximity sensor, for example. The proximity sensor may detect not only a proximity touch but also a proximity touch pattern such as a proximity touch distance, a proximity touch direction, a proximity touch speed, a proximity touch time, a proximity touch position, and a proximity touch moving state. The main processor 710 may process data (or information) corresponding to the proximity touch operation and the proximity touch pattern detected by the proximity sensor, and may control the display panel 300 so that it displays visual information corresponding to the processed data. The ultrasonic sensor may recognize location information of an object using ultrasonic waves. The main processor 710 may calculate the location of an object based on information detected from the optical sensor and the ultrasonic sensors. Because the speed of the light is different from the speed of the ultrasonic waves, the position of the object may be calculated using the time taken for the light to reach the optical sensor and the time taken for the ultrasonic wave to reach the ultrasonic sensor.

The output unit 750 is for generating outputs associated with visual, auditory, tactile effects, and the like, may include at least one of the display panel 300, the sound output module 752, the haptic module 753 and the light output 754.

The display panel 300 displays (outputs) information processed by the display device 10. For example, the display panel 300 may display information on an application run on the screen of the display device 10, or user interface (UI) or graphic user interface (GUI) information according to the execution screen information. The display panel 300 may include a display layer for displaying images and a sensor electrode layer for sensing a user's touch input. As a result, the display panel 300 may work as one of the input devices 733 providing an input interface between the display device 10 and the user, and also work as one of the output units 750 for providing an output interface between the display device 10 and the user.

The sound output module 752 may output source data received from the wireless communications unit 720 or stored in the memory 770 in a call signal reception mode, a talking or recording mode, a voice recognition mode, a broadcast reception mode or the like. The sound output unit 752 may also output a sound signal associated with a function performed in the display device 10 (e.g., a call signal reception sound, a message reception sound, for example.) The sound output unit 752 may include a receiver and a speaker. At least one of the receiver and the speaker may be a sound generator that is attached under or below the display panel 300 and vibrates the display panel 300 to output sound. The second generator may be a piezoelectric element or a piezoelectric actuator that contracts or expands depending on a voltage applied thereto, or may be an exciter that generates a magnetic force using a voice coil to vibrate the display panel 300.

The haptic module 753 may generate a variety of tactile effects sensed by a user. The haptic module 753 may provide a user with vibration as the tactile effect. The intensity and pattern of the vibration generated by the haptic module 753 may be controlled by user selection or setting of the main processor 710. For example, the haptic module 753 may output different vibrations by synthesizing them or sequentially. In addition to the vibration, the haptic module 753 may generate various types of tactile effects, such as stimulus effects by a pin arrangement vertically moving on a skin, a spraying or suction force through a spraying or suction hole, a graze on a skin, contact of an electrode, and an electrostatic force, or effects of cold or hot feeling reproduced by using a device capable of absorbing or generating heat. The haptic module 753 may not only transmit a tactile effect through direct contact, but also may allow a user to feel the tactile effect through a muscle sense such as a finger or an arm.

The light output unit 754 outputs a signal for notifying occurrence of an event by using light of a light source. Examples of the events occurring in the display device 10 may include message reception, call signal reception, missed call, alarm, schedule notification, email reception, information reception through an application, within the spirit and the scope of the disclosure. The signal output from the light output unit 754 is produced as the display device 10 emits light of a single color or multiple colors through the front or the rear surface. The signal output may be terminated once the display device 10 detects that the user has checked the event.

The interface 760 serves as a path to various types of external devices connected to the display device 10. The interface 150 may include at least one of a wired/wireless headset port, an external charger port, a wired/wireless data port, a memory card port, a port for electrically connecting to a device including an identity module, an audio input/output (I/O) port, a video I/O port and an earphone port. When an external device is connected to the interface 760 of the display device 10, appropriate control associated with the connected external device may be carried out.

The memory 770 stores data supporting various functions of the display device 10. The memory 770 may store application programs that are run on the display device 10, and data items and instructions for operating the display device 10. At least some of the application programs may be downloaded from an external server via wireless communications. The memory 770 may store an application program for operating the main processor 710, and may temporally store input/output data, e.g., a phone book, a message, a still image, a moving picture, for example. therein. The memory 770 may store haptic data for vibration in different patterns provided to the haptic module 753 and acoustic data regarding various sounds provided to the sound output unit 752. The memory 770 may include at least one of a flash memory type storage medium, a hard disk type storage medium, a solid state disk (SSD) type storage medium, a silicon disk drive (SDD) type storage medium, a multimedia card micro type storage medium, a card type memory (for example, an SD or XD memory), a random access memory (RAM), a static random access memory (SRMA), a read-only memory (ROM), an electrically erasable programmable read-only memory (EEPROM), a programmable read-only memory (PROM), a magnetic memory, a magnetic disk, and an optical disk.

The power supply unit 780 may receive a power from an external power source and an internal power source to supply the power to each of elements included in the display device 10 under the control of the main processor 710. The power supply unit 780 may include the battery 790. The power supply unit 780 includes a connection port. The connection port may be an example of the interface 760 to which the external charger for supplying power for charging the battery is electrically connected. Alternatively, the power supply unit 780 may charge the battery 790 in a wireless manner without using the connection port. The battery 790 may receive power from an external wireless power transmitter using at least one of inductive coupling based on the magnetic induction phenomenon or magnetic resonance coupling based on the electromagnetic resonance phenomenon. The battery 790 may be disposed so that it does not overlap the main circuit board 700 in the third direction (z-axis direction). The battery 790 may overlap with the battery hole BH of the bracket 600.

The bottom cover 900 may be disposed under or below the main circuit board 700 and the battery 790. The bottom cover 900 may be fastened and fixed to the bracket 600. The bottom cover 900 may form the exterior of the lower surface of the display device 10. The bottom cover 900 may include plastic, metal or plastic and metal.

A second camera hole CMH2 may be formed or disposed in the bottom cover 900 via which the lower surface of the camera device 731 is exposed. The positions of the camera device 731 and the first and second camera holes CMH1 and CMH2 in line with the camera device 731 are not limited to those of an embodiment shown in FIGS. 1 and 2.

Figure 4:
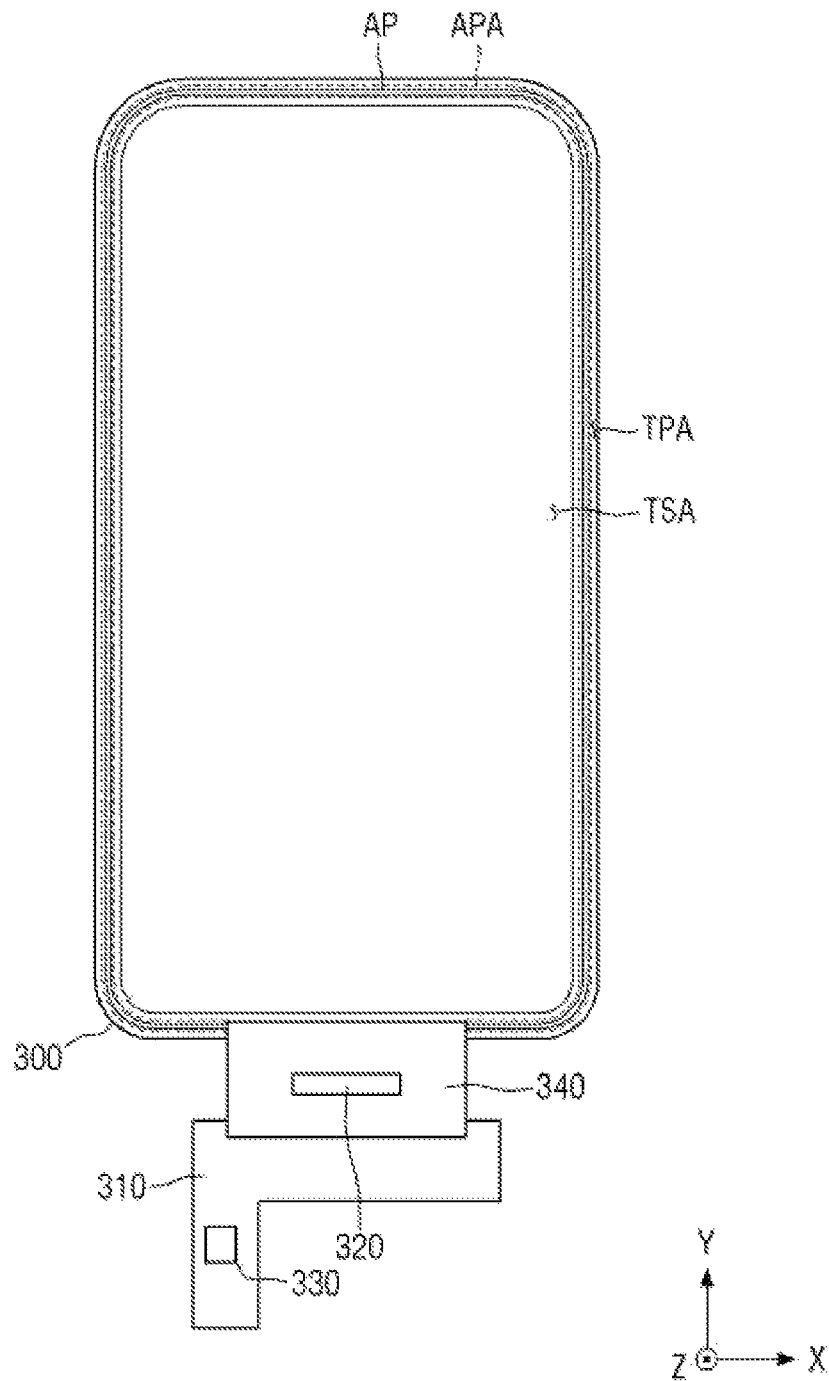
FIG. 4 is a plan view showing a display panel according to an embodiment.
Figure 5:
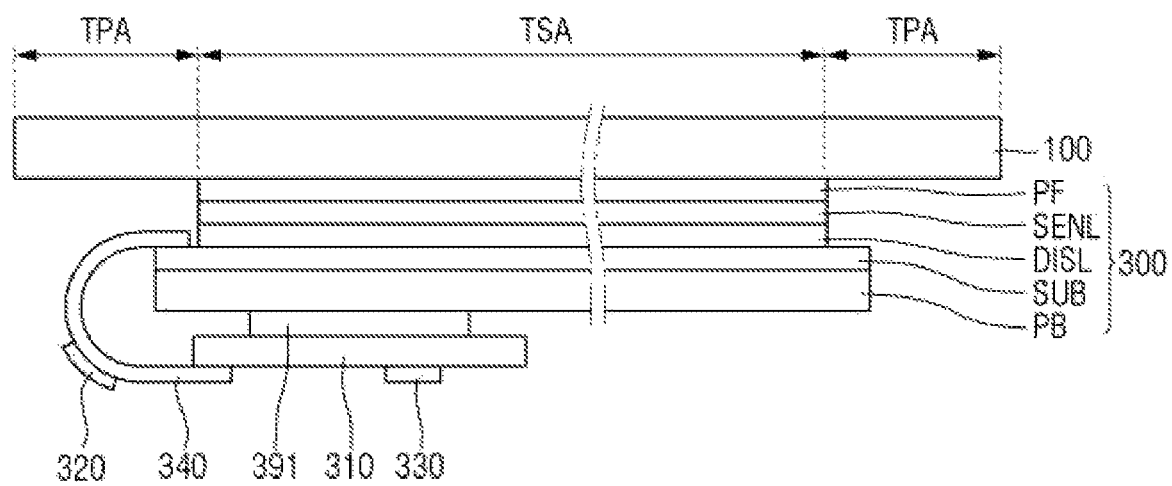
FIG. 5 is a side view showing an example of the display panel of FIG. 4.

FIG. 4 is a plan view showing a display panel according to an embodiment. FIG. 5 is a side view showing an example of the display panel of FIG. 4. In the plan view of FIG. 4, the first flexible film 340 of the display panel 300 is not bent but is unfolded.

Referring to FIGS. 4 and 5, the display panel 300 may include a substrate SUB, a display layer DISL, a sensor electrode layer SENL, a polarizing film PF, and a panel bottom cover PB.

The substrate SUB may be made of an insulating material such as glass, quartz and a polymer resin. The substrate SUB may be a rigid substrate or a flexible substrate that may be bent, folded, and/or rolled, within the spirit and the scope of the disclosure.

The display layer DISL may be disposed on the substrate SUB. The display layer DISL may include pixels and display images. The display layer DISL may include a thin-film transistor layer on which thin-film transistors may be formed or disposed, an emission material layer on which light-emitting elements emitting light may be formed or disposed, and an encapsulation layer for encapsulating the emission material layer.

The display layer DISL may be divided into a display area DA and a non-display area NDA. In the display area DA, pixels are disposed to display images. In the non-display area NDA, no image is displayed. The non-display area NDA may surround the display area DA. The non-display area NDA may be defined as the area from the outer side of the display area DA to the edge of the display panel 300. In addition to the pixels, scan lines, data lines, power lines, for example electrically connected to the pixels may be disposed in the display area DA. In the non-display area NDA, the scan driver for applying scan signals to scan lines, fan-out lines electrically connecting the data lines with the display driver 320, for example may be disposed.

The sensor electrode layer SENL may be disposed on the display layer DISL. The sensor electrode layer SENL may include sensor electrodes and may sense whether there is a user's touch. The sensor electrode layer SENL may include a first layer in which connection units electrically connecting between the driving electrodes among the sensor electrodes may be formed or disposed, and a second layer in which the sensor electrodes may be formed or disposed.

The sensor electrode layer SENL may include a sensor area TSA and a sensor peripheral area TPA. In the sensor area TSA, sensor electrodes may be disposed to sense a user's touch input. In the sensor peripheral area TPA, no sensor electrodes are disposed. The sensor peripheral area TPA may surround the sensor area TSA. The sensor peripheral area TPA may be defined as the area from the outer side of the sensor area TSA to the edge of the display panel 300. The sensor electrodes, the connection units, and conductive patterns may be disposed in the sensor area TSA. Sensor lines electrically connected to the sensor electrodes may be disposed in the sensor peripheral area TPA.

The sensor area TSA of the sensor electrode layer SENL may overlap the display area DA of the display layer DISL. Most of the sensor peripheral area TPA of the sensor electrode layer SENL may overlap the non-display area NDA of the display layer DISL.

The polarizing film PF may be disposed on the sensor electrode layer SENL. The polarizing film may include a linear polarizer and a retardation film such as a λ/4 (quarter-wave) plate. The phase retardation film may be disposed on the sensor electrode layer SENL, and the linear polarizer may be disposed on the phase retardation film.

The cover window 100 may be disposed on the polarizing film PF. The cover window 100 may be attached onto the polarizing film PF by a transparent adhesive member such as an optically clear adhesive (OCA) film.

The panel bottom cover PB may be disposed under or below the display panel 300. The panel bottom cover PB may be attached to the lower surface of the display panel 300 by an adhesive member. The adhesive member may be a pressure-sensitive adhesive (PSA). The panel bottom cover PB may include at least one of: a light-absorbing member for absorbing light incident from outside, a buffer member for absorbing external impact, and a heat dissipating member for efficiently discharging heat from the display panel 300.

The light-absorbing member may be disposed under or below the display panel 300. The light-absorbing member blocks the transmission of light to prevent the elements disposed thereunder from being seen from above the display panel 300, such as the display circuit board 310. The light-absorbing member may include a light-absorbing material such as a black pigment and a black dye.

The buffer member may be disposed under or below the light-absorbing member. The buffer member absorbs an external impact to prevent the display panel 300 from being damaged. The buffer member may be made up of a single layer or multiple layers. For example, the buffer member may be formed of a polymer resin such as polyurethane, polycarbonate, polypropylene and polyethylene, or may be formed of a material having elasticity such as a rubber and a sponge obtained by foaming a urethane-based material or an acrylic-based material.

The heat dissipating member may be disposed under or below the buffer member. The heat-dissipating member may include a first heat dissipation layer including graphite or carbon nanotubes, and a second heat dissipation layer formed of a thin metal film such as copper, nickel, ferrite and silver, which may block electromagnetic waves and have high thermal conductivity.

The first flexible film 340 may be disposed in a non-display area NDA at one edge of the display panel 300. For example, the first flexible film 340 may be disposed in the non-display area NDA at the lower edge of the display panel 300. The first flexible film 340 may be bent so that it is disposed under or below the display panel 300, and the display circuit board 310 may be disposed on the lower surface of the panel bottom cover PB. The display circuit board 310 may be attached to and fixed to the lower surface of the panel bottom cover PB via a first adhesive member 391. The first adhesive member 391 may be a pressure-sensitive adhesive.

An antenna area APA may include a first conductive pattern utilized as an antenna. The first conductive pattern of the antenna area APA may be utilized as a patch antenna for 5G mobile communications, or may be utilized as an antenna for an RFID tag for near field communications. When the first conductive pattern of the antenna area APA is utilized as a patch antenna for 5G mobile communications, it may be formed as a quadrangle patch when viewed from the top. When the first conductive pattern of the antenna area APA is utilized as an antenna for an RFID tag for near field communications, it may be formed in a substantially loop shape or a substantially coil shape.

The antenna area APA may be disposed in the sensor peripheral area on at least three outer sides of the sensor area TSA. The antenna area APA may be disposed such that it surrounds at least three sides of the sensor area TSA. For example, the antenna area APA may be disposed such that it surrounds the upper side, the left side and the right side of the sensor area TSA. Alternatively, the antenna area APA may be disposed in the sensor peripheral area on the four outer sides of the sensor area TSA For example, the antenna area APA may be disposed such that it may surround at least four sides of the sensor area TSA.

The first conductive pattern of the antenna area APA may be electrically connected to the first flexible film 340 at one edge of the display panel 300. The first conductive pattern of the antenna area APA may be electrically connected to sensor pads disposed at one edge of the display panel 300. The sensor pads may be connected to the first flexible film 340 via an anisotropic conductive film. A radio frequency driver 350 may be disposed on the first flexible film 340. The radio frequency driver 350 may be an integrated circuit. The radio frequency driver 350 may be electrically connected to the first conductive pattern of the antenna area APA.

The radio frequency driver 350 may process a radio frequency (RF) signal transmitted or received to the first conductive pattern of the antenna area APA. For example, the radio frequency driver 350 may change the phase and amplify the amplitude of the radio frequency signal received to the first conductive pattern of the antenna area APA. The radio frequency driver 350 may transmit the radio frequency signal that has the changed phase and the amplified amplitude to the mobile communications module 722 or the near-field communications module 725 of the main circuit board 700. Alternatively, the radio frequency driver 350 may change the phase and amplify the amplitude of the radio frequency signal transmitted from the mobile communications module 722 or the near-field communications module 725 of the main circuit board 700. The radio frequency driver 350 may transmit the radio frequency signal having the changed phase and the amplified amplitude to the first conductive pattern of the antenna area APA.

As shown in FIGS. 4 and 5, the first conductive pattern AP of the antenna area APA disposed in the sensor peripheral area TPA of the sensor electrode layer SENL may be utilized as a patch antenna for 5G mobile communications or an antenna for an RFID tag for near field communications. Although the wavelength of the electromagnetic waves transmitted/received to/from the first conductive pattern in 5G mobile communications is short, the electromagnetic waves do not need to pass through metal layers of the display panel 300. Therefore, the electromagnetic waves may be stably radiated toward the upper side of the display device 10.

Figure 6:
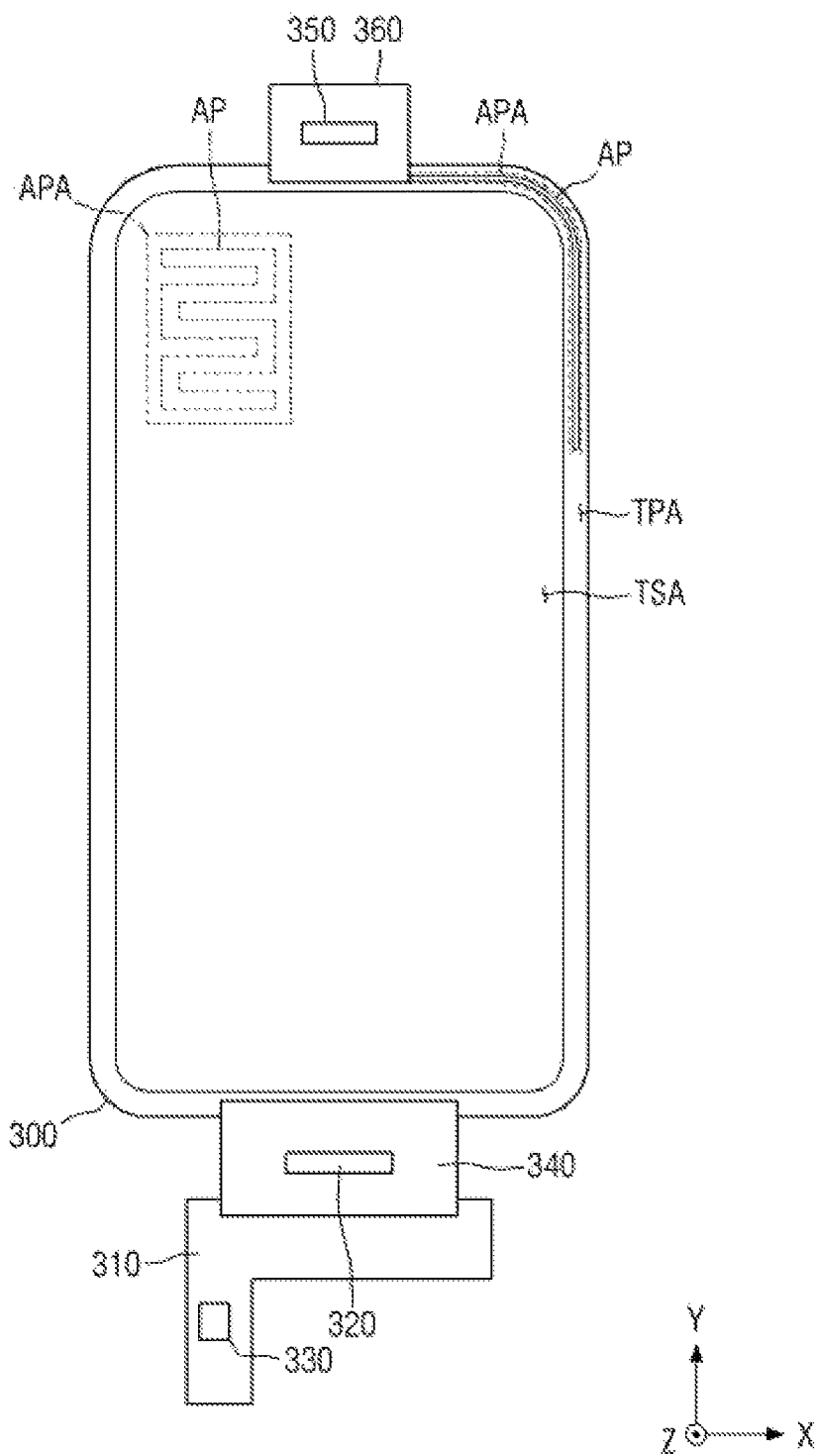
FIG. 6 is a plan view showing a display panel according to an embodiment.
Figure 7:
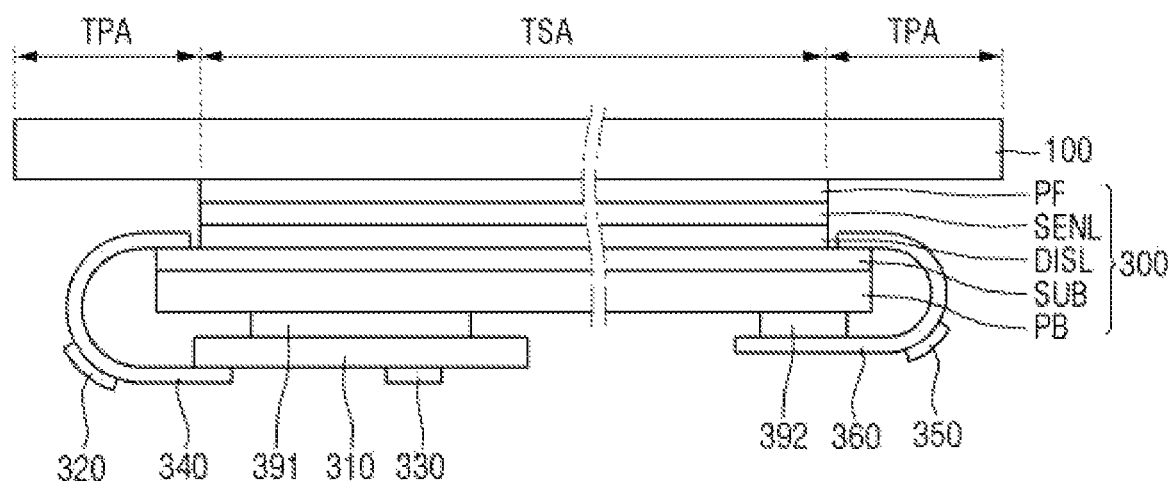
FIG. 7 is a side view showing an example of the display panel of FIG. 6.

FIG. 6 is a plan view showing a display panel according to an embodiment. FIG. 7 is a side view showing an example of the display panel of FIG. 6. In the plan view of FIG. 6, flexible films 340 and 360 of the display panel 300 are not bent but are unfolded.

An embodiment shown in FIGS. 6 and 7 may be different from an embodiment of FIGS. 4 and 5 in that the second flexible film 360 may be disposed on another side of the display panel 300.

Referring to FIGS. 6 and 7, when the first flexible film 340 is disposed on a first side of the display panel 300, the antenna area APA may be disposed on a second side opposite to the first side of the display panel, on a third side connecting the first side with the second side, and at a corner between the second side and the third side. For example, the antenna area APA may be disposed in the sensor periphery area TPA on the upper outer side of the sensor area TSA and in the sensor periphery area TPA on the right outer side of the sensor area TSA. The antenna area APA may be disposed at the corner between the upper side and the right side of the display panel 300.

Alternatively, the antenna area APA may be disposed in the sensor area TSA. The first conductive pattern AP of the antenna area APA disposed in the sensor area TSA may be formed in a substantially serpentine shape including bending portions when viewed from the top, but the disclosure is not limited thereto. The first conductive pattern of the antenna area APA disposed in the sensor area TSA may be formed in a quadrangular patch, a substantially loop shape, or a substantially coil shape when viewed from the top.

The first conductive pattern of the antenna area APA may be electrically connected to the second flexible film 360 at the opposite edge of the display panel 300. The first conductive pattern of the antenna area APA may be electrically connected to sensor pads disposed at one edge of the display panel 300. The sensor pads may be connected to the second flexible film 360 via an anisotropic conductive film. The radio frequency driver 350 may be disposed on the second flexible film 360. The radio frequency driver 350 may be an integrated circuit. The radio frequency driver 350 may be electrically connected to the first conductive pattern AP of the antenna area APA.

As shown in FIGS. 6 and 7, the first conductive pattern AP of the antenna area APA disposed in the sensor peripheral area TPA of the sensor electrode layer SENL may be utilized as a patch antenna for 5G mobile communications or an antenna for an RFID tag for short range communications. Although the wavelength of the electromagnetic waves transmitted/received to/from the first conductive pattern in 5G mobile communications is short, the electromagnetic waves do not need to pass through metal layers of the display panel 300. Therefore, the electromagnetic waves may be stably radiated toward the upper side of the display device 10.

Figure 8:
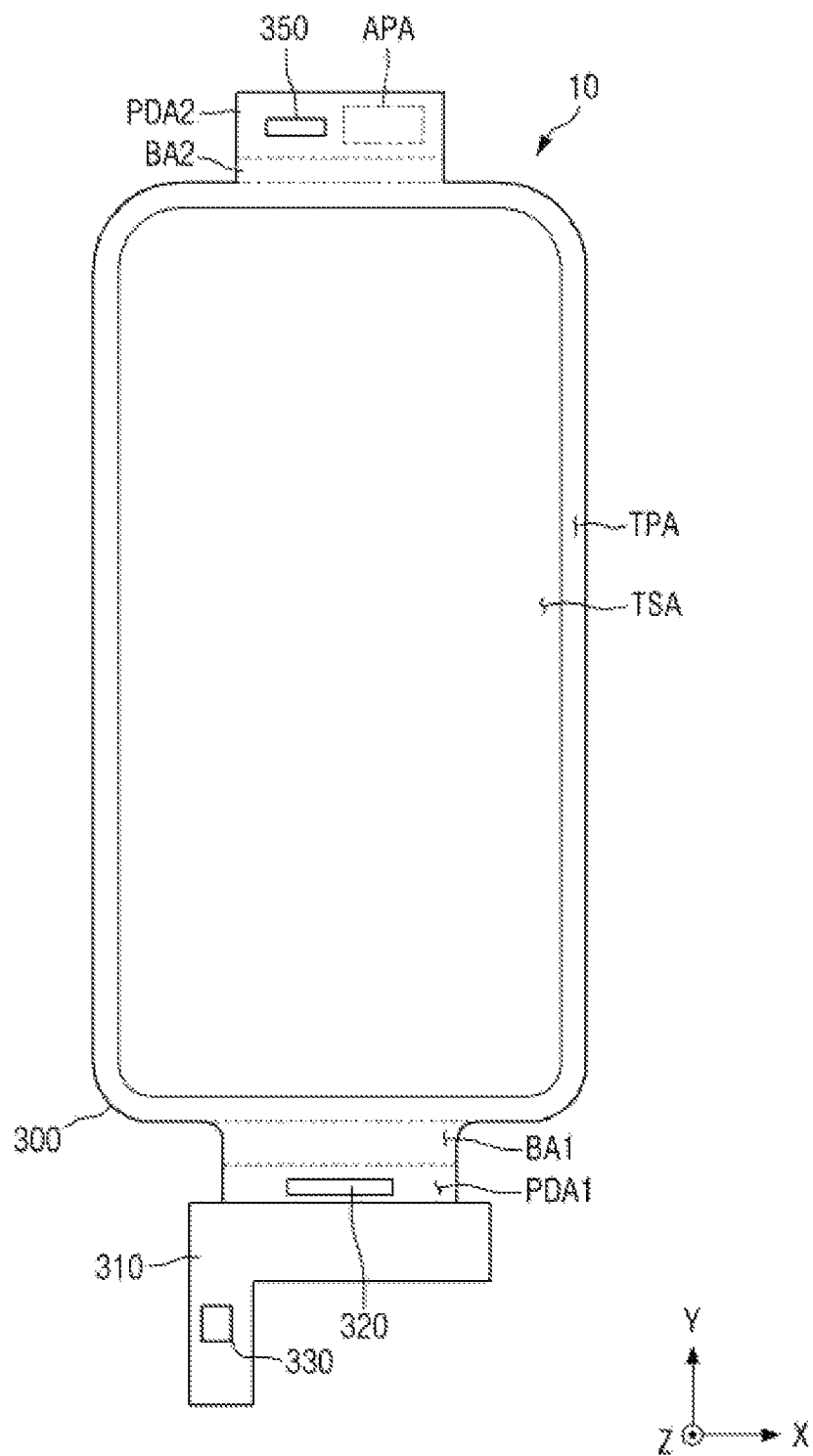
FIG. 8 is a plan view showing a display panel according to an embodiment.
Figure 9:
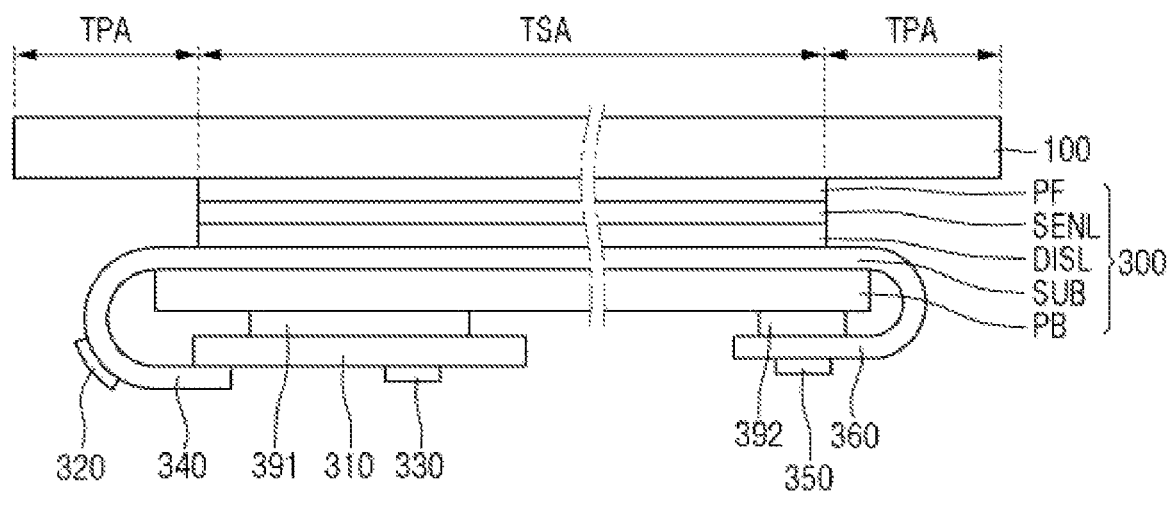
FIG. 9 is a side view showing an example of the display panel of FIG. 8.

FIG. 8 is a plan view showing a display panel according to an embodiment. FIG. 9 is a side view showing an example of the display panel of FIG. 8. FIG. 8 is a plan view of the display panel 300 with a first bending area BA1 and a second bending area BA2 unfolded.

An embodiment of FIGS. 8 and 9 may be different from an embodiment of FIGS. 4 and 5 in that a first bending area BA1 on a side of the display panel 300 may be bent so that a first pad area PDA1 may be disposed on a lower surface of the panel bottom cover PB, and a second bending area BA2 on another side of the display panel 300 may be bent so that a second pad area PDA2 may be disposed on a lower surface of the panel bottom cover PB. For example, the display panel 300 may be a bended display panel with one side and the other side bent.

Referring to FIGS. 8 and 9, the first bending area BA1 and the first pad area PDA1 may protrude from the sensor peripheral area TPA on one side of the display panel 300 in the second direction (y-axis direction). In FIGS. 8 and 9, the length of the first bending area BA1 and the first pad area PDA1 in the first direction (x-axis direction) is smaller than the length of the sensor area TSA in the first direction (x-axis direction). It is, however, to be understood that the disclosure is not limited thereto.

The display panel 300 may be bent at the first bending area BA1, and the first pad area PDA1 may be disposed on the lower surface of the panel cover member 400. The first pad area PDA1 may overlap the sensor area TSA in the thickness direction (z-axis direction) of the display panel 300. The display driver 320 and the display circuit board 310 may be disposed in the first pad area PDA1.

The second bending area BA2 and the second pad area PDA2 may protrude from the sensor peripheral area TPA on the other side of the display panel 300 in the second direction (y-axis direction). In FIGS. 8 and 9, the length of the second bending area BA2 and the second pad area PDA2 in the first direction (x-axis direction) is smaller than the length of the sensor area TSA in the first direction (x-axis direction). It is, however, to be understood that the disclosure is not limited thereto.

Figure 10:
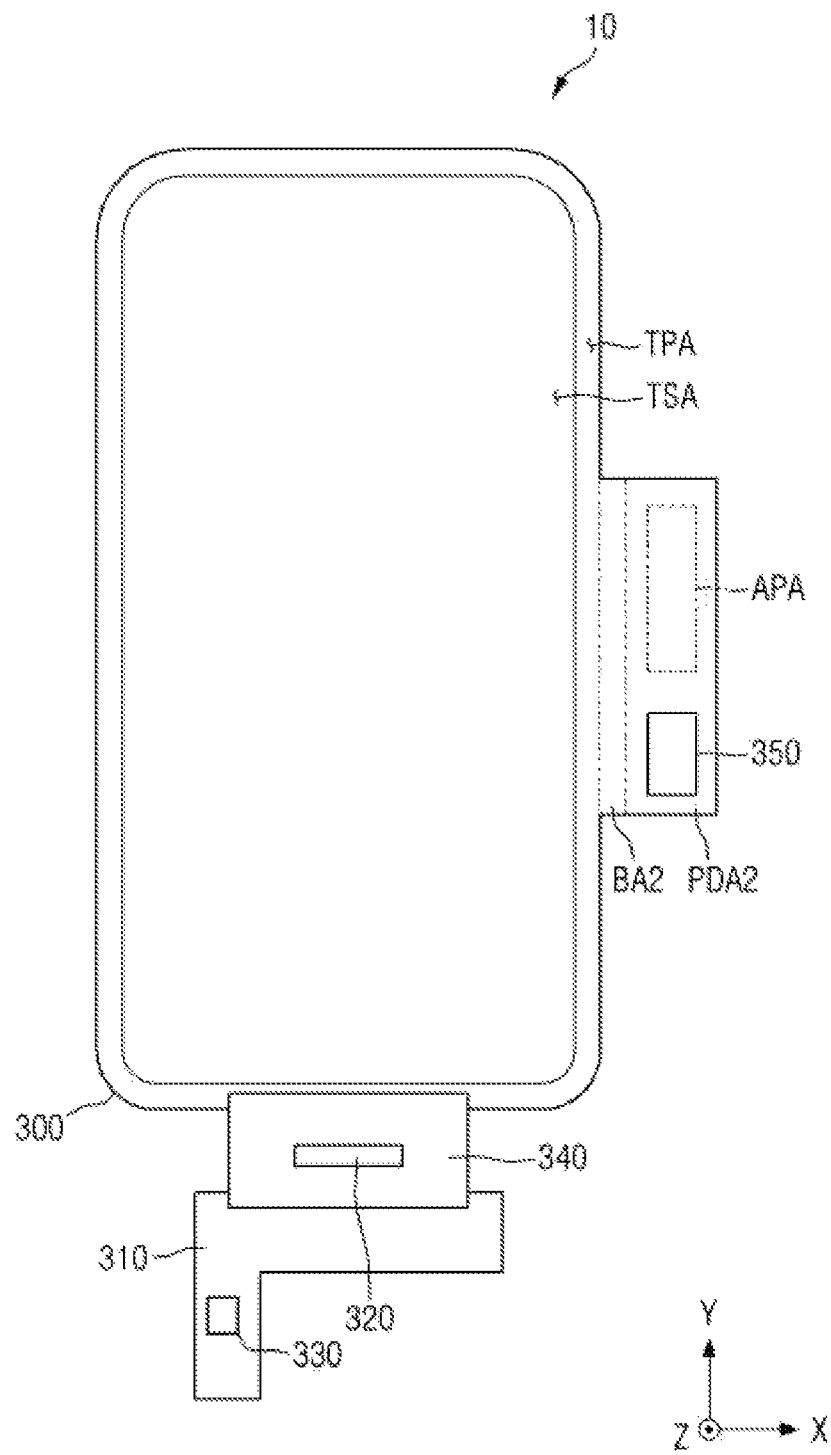
FIG. 10 is a plan view showing a display panel according to an embodiment.
Figure 11:
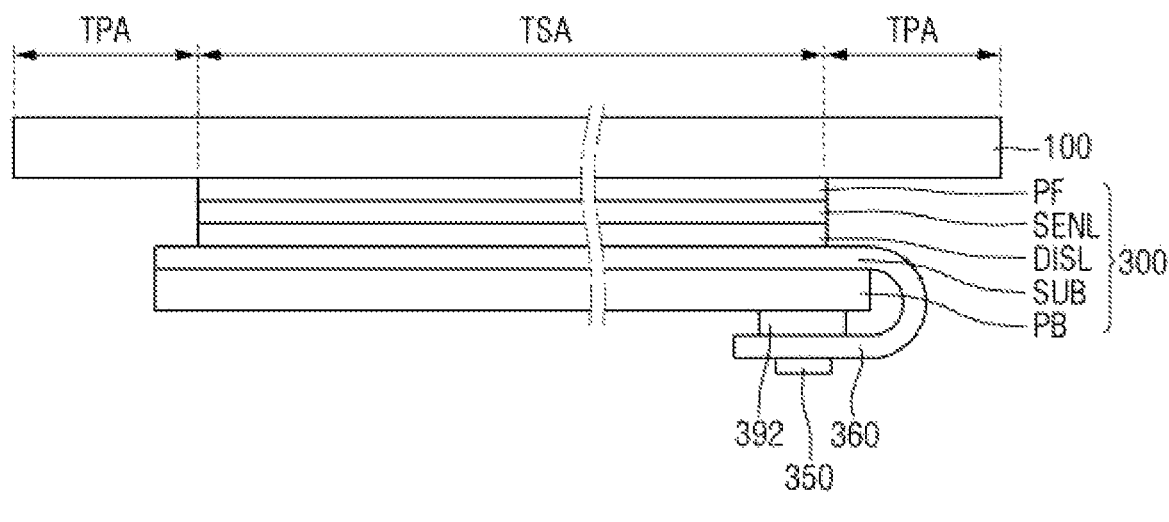
FIG. 11 is a side view showing an example of the display panel of FIG. 10.

Although the other side of the display panel 300 is the opposite side to the side of the display panel 300 in FIGS. 8 and 9, the disclosure is not limited thereto. For example, as shown in FIGS. 10 and 11, one side of the display panel 300 may be one of the upper side and the lower side of the display panel 300, while the other side of the display panel 300 may be one of the left side and right side of the display panel 300.

The display panel 300 may be bent at the second bending area BA2, and the second pad area PDA2 may be disposed on the lower surface of the panel cover member 400. The second pad area PDA2 may overlap the sensor area TSA in the thickness direction (z-axis direction) of the display panel 300.

The antenna area APA and the radio frequency driver 350 may be disposed in the second pad area PDA2. The antenna area APA may include the first conductive pattern formed in a substantially loop shape, a substantially coil shape, or a quadrangular patch. Since the second pad area PDA2 is disposed on the lower surface of the panel cover member 400, the first conductive pattern may be disposed on the lower surface of the panel cover member 400.

As shown in FIGS. 8 and 9, when the antenna area APA is disposed in the second pad area PDA2, the design area for the first conductive pattern in the antenna area APA may be increased compared to when it is disposed in the sensor peripheral area TPA. Therefore, the first conductive pattern AP of the antenna area APA may be designed more freely.

Figure 12:
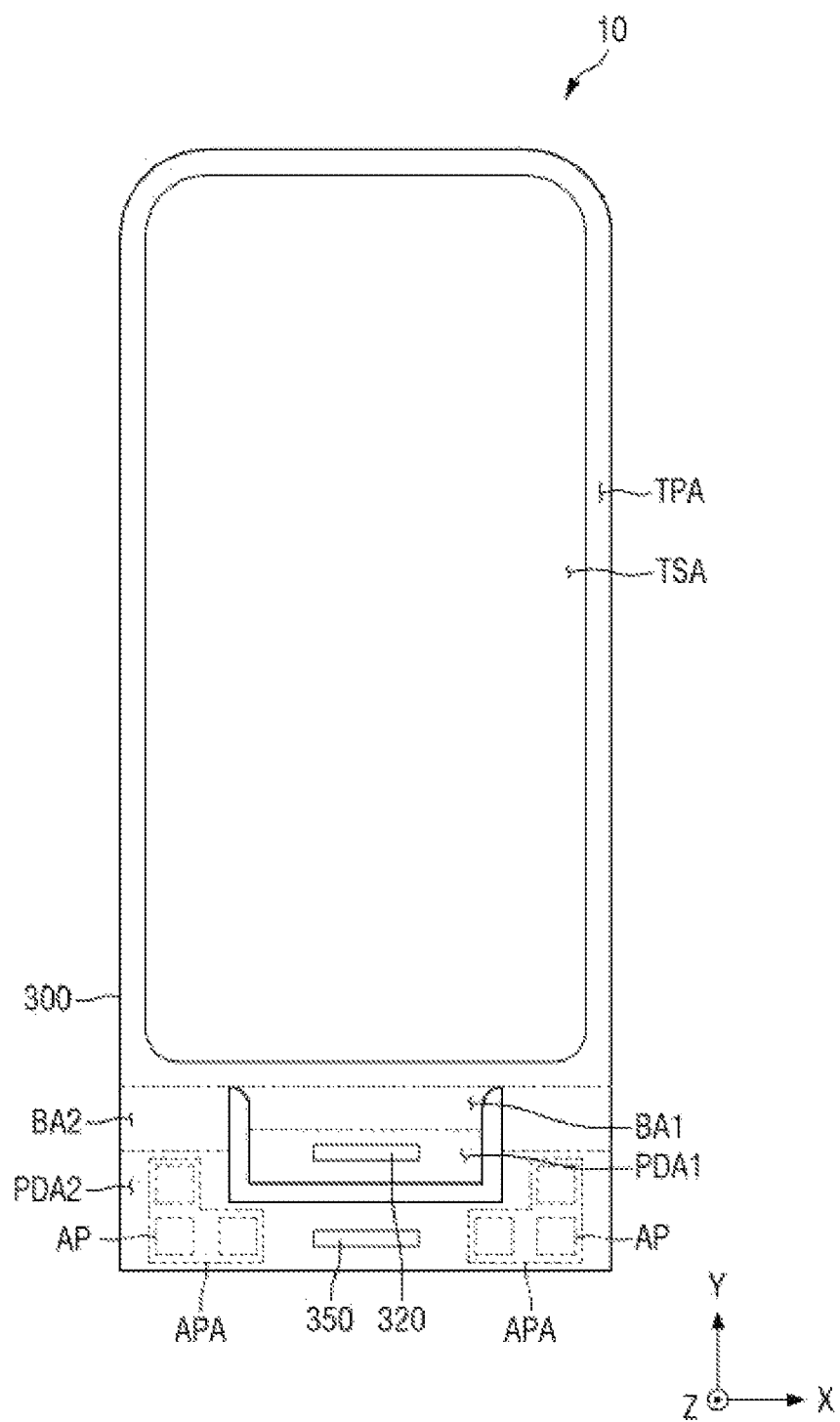
FIG. 12 is a plan view showing a display panel according to an embodiment.
Figure 13:
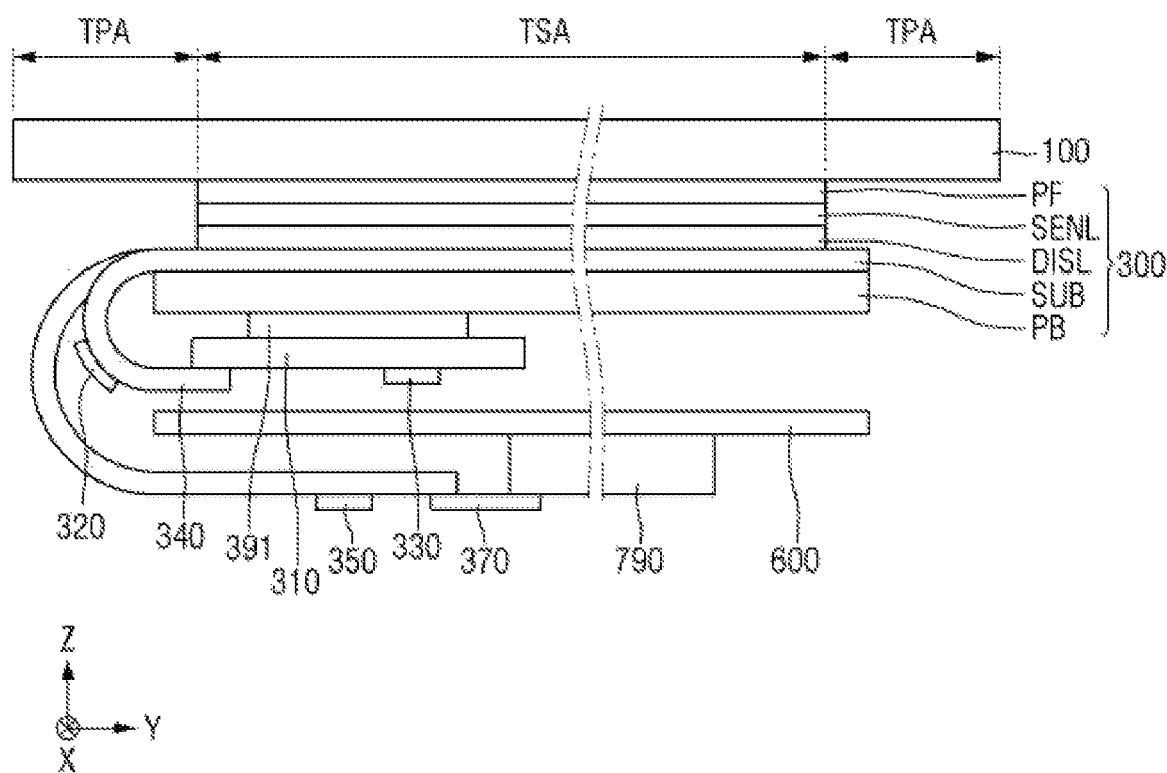
FIG. 13 is a side view showing an example of the display panel of FIG. 12.

FIG. 12 is a plan view showing a display panel according to an embodiment. FIG. 13 is a side view showing an example of the display panel of FIG. 12. FIG. 12 is a plan view of the display panel 300 with a first bending area BA1 and second bending areas BA2 unfolded.

An embodiment of FIGS. 12 and 13 may be different from an embodiment of FIGS. 4 and 5 in that a first bending area BA1 at the center of a side of the display panel 300 may be bent so that a first pad area PDA1 may be disposed on the lower surface of the panel bottom cover PB, and second bending areas BA2 at edges of another side of the display panel 300 may be bent so that a second pad area PDA2 may be disposed on a lower surface of the panel bottom cover PB.

Referring to FIGS. 12 and 13, the first bending area BA1 and the first pad area PDA1 may protrude from the sensor peripheral area TPA at the center of one side of the display panel 300 in the second direction (y-axis direction). The length of the first bending area BA1 and the first pad area PDA1 in the first direction (x-axis direction) is smaller than the length of the sensor area TSA in the first direction (x-axis direction).

The second bending areas BA2 may protrude from the sensor peripheral area TPA at the first edge and the second edge of one side of the display panel 300 in the second direction (y-axis direction). The first edge of the side of the display panel 300 may be disposed on the left side of the center of the side of the display panel 300, and the second edge of the side of the display panel 300 may be disposed on the right side of the center of the side of the display panel 300. Although the second bending areas BA2 protrude from the sensor peripheral area TPA at the first edge and the second edge of the side of the display panel 300 in FIG. 12, the disclosure is not limited thereto. For example, the second bending areas BA2 and the second pad area PDA2 may protrude from the sensor peripheral area TPA at one of the first edge and second edge of the side of the display panel 300.

There may be a gap between the first bending area BA1 and the second bending area BA2. Since the length of the part of the display panel 300 that is bent at the second bending area BA2 is larger than the length of the part of the display panel 300 that is bent at the first bending area BA1, the length of the second bending area BA2 in the second direction (y-axis direction) may be larger than the length of the first bending area BA1 in the second direction (y-axis direction), as shown in FIG. 12.

The second pad area PDA2 may be extended from the second bending areas BA2. There may be a gap between the first pad area PDA1 and the second pad area PDA2. The second pad area PDA2 may surround the left side, the right side and the lower side of the first pad area PDA1. The maximum length of the second pad area PDA2 in the first direction (x-axis direction) may be larger than the maximum length of the first pad area PDA1 in the first direction (x-axis direction). The maximum length of the second pad area PDA2 in the second direction (y-axis direction) may be larger than the maximum length of the first pad area PDA1 in the second direction (y-axis direction).

The display panel 300 may be bent at the first bending area BA1 and the second bending area BA2, and the first pad area PDA1 and the second pad area PDA2 may be disposed on the lower surface of the panel cover member 400. The first pad area PDA1 and the second pad area PDA2 may overlap the sensor area TSA in the thickness direction (z-axis direction) of the display panel 300. The display driver 320 and the display circuit board 310 may be disposed in the first pad area PDA1. The antenna area APA and the radio frequency driver 350 may be disposed in the second pad area PDA2.

As shown in FIGS. 12 and 13, when the first conductive pattern of the antenna area APA is disposed in the second pad area PDA2, the design area for the first conductive pattern may be increased compared to when it is disposed in the sensor peripheral area TPA.

The first conductive pattern AP and the radio frequency driver 350 connected to the first conductive pattern AP may be electrically connected to the mobile communications module 722 or the near-field communications module 725 for wireless communications or may be electrically connected to the battery 790 for wireless charging. When the radio frequency driver 350 is electrically connected to the battery 790, a circuit board electrically connecting the battery 790 with the second pad area PDA2 may be disposed the edge of the second pad area PDA2 as shown in FIG. 12. The circuit board 370 may be a flexible printed circuit board (FPC).

Figure 14:
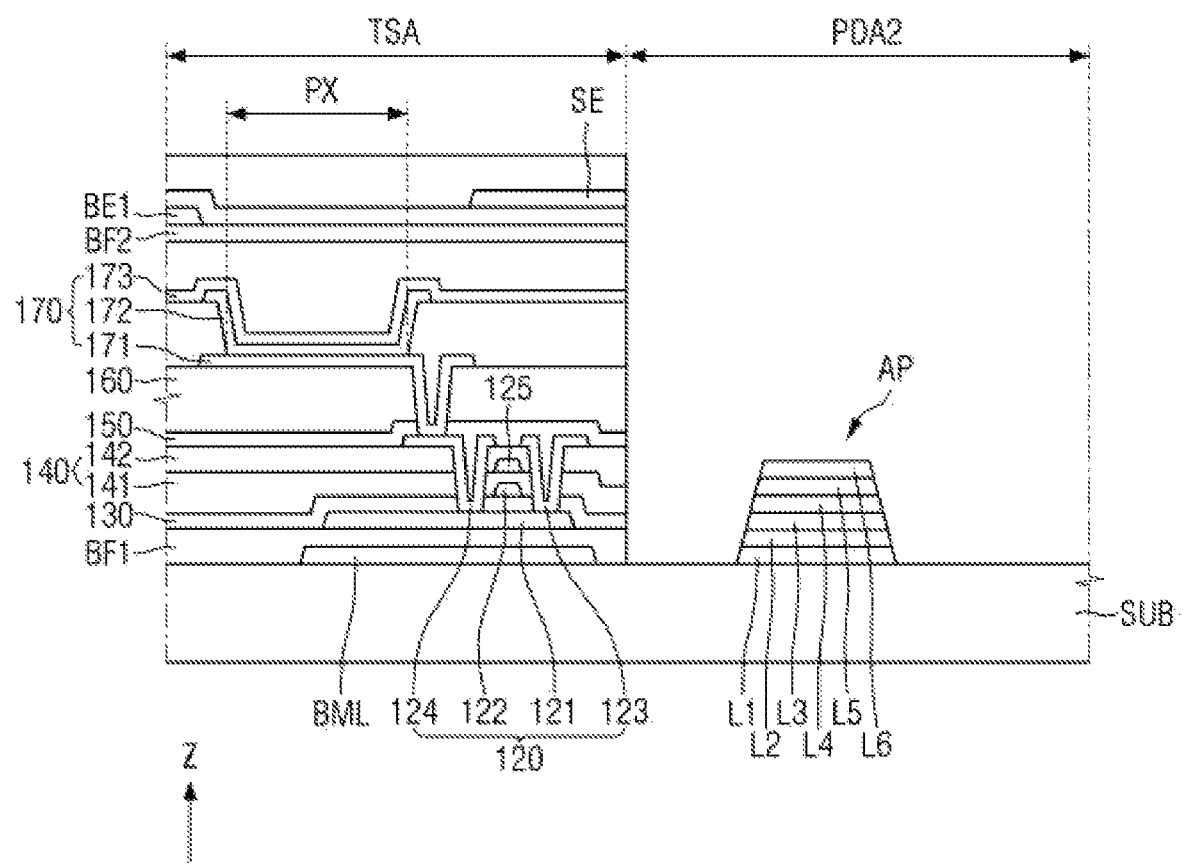
FIG. 14 is a schematic cross-sectional view showing the display area of the display panel and the first area of the second pad area of FIG. 12.

When the first conductive pattern AP is used for wireless charging, it may include six layers L1 to L6 as shown in FIG. 14 for sufficient thickness. For example, the first layer L1 may be made of the same or similar material as a light-blocking layer BML disposed under or below an active layer 121 of the display layer DISL, and may have a thickness of approximately or about 250 μm. The second layer L2 may be made of the same or similar material as a gate electrode 122 of the display layer DISL and may have a thickness of approximately or about 250 μm. The third layer L3 may be made of the same or similar material as a capacitor electrode 125 of the display layer DISL and may have a thickness of approximately or about 250 µm. The fourth layer L4 may be made of the same or similar material as a source electrode 123 and a drain electrode 124 of the display layer DISL and may have a thickness of approximately or about 700 µm. The fifth layer L5 may be made of the same or similar material as a first connection unit BE1 of the sensor electrode SENL and may have a thickness of approximately or about 250 µm. The sixth layer L6 may be made of the same or similar material as the sensor electrode SE of the sensor electrode SENL and may have a thickness of approximately or about 700 µm. In this instance, since the light-blocking layer BML and the first layer L1 may be eliminated, the first conductive pattern AP may have a thickness of at least approximately or about 2,150 µm.

Figure 15:
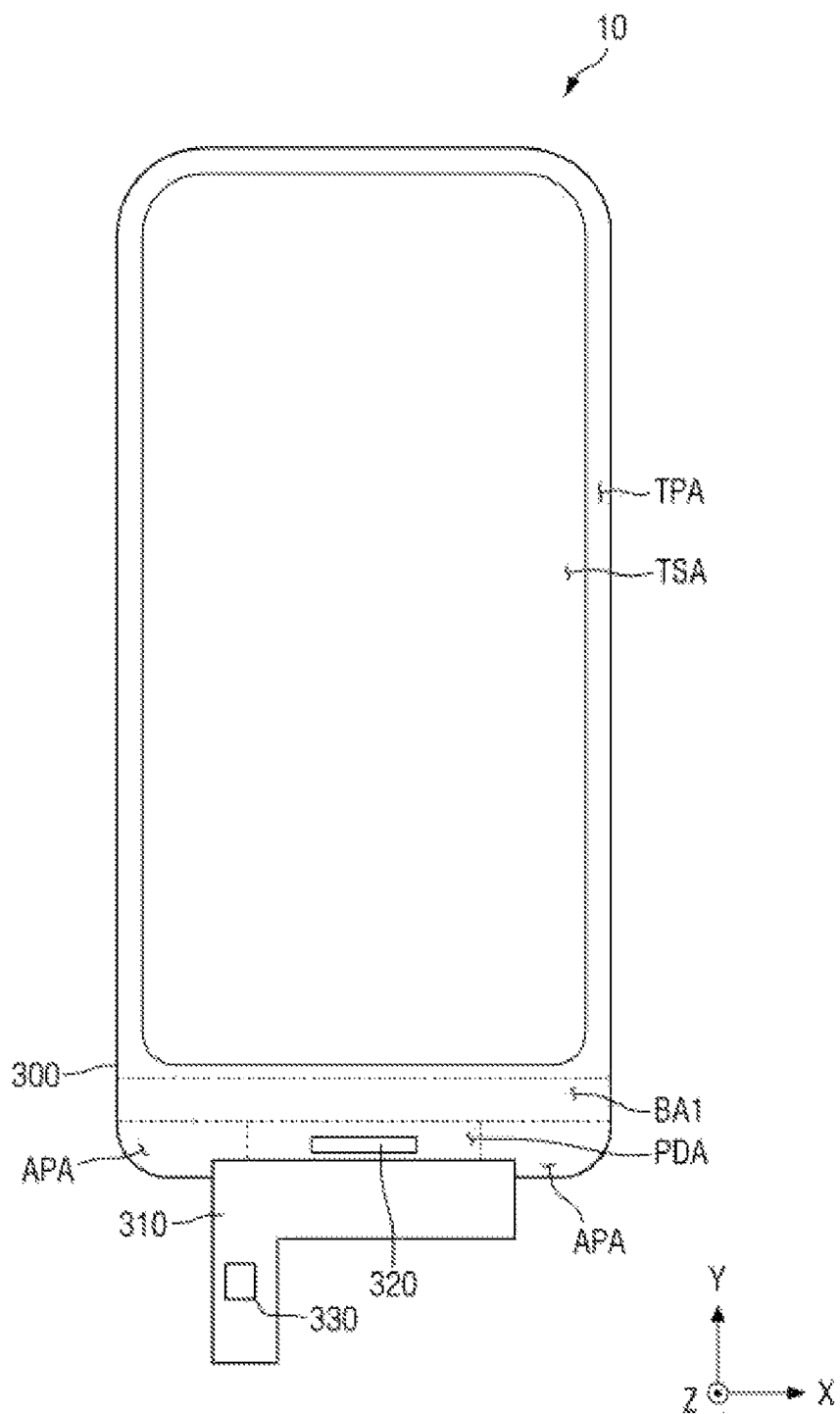
FIG. 15 is a plan view showing a display panel according to an embodiment.
Figure 16:
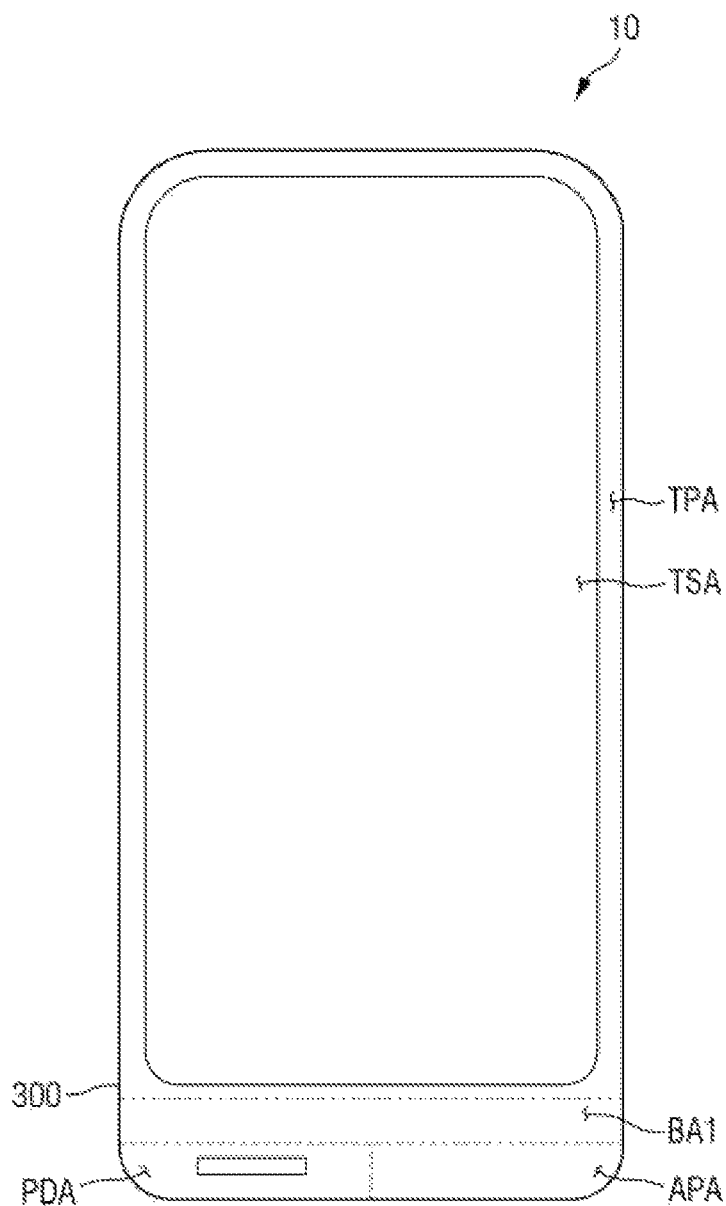
FIG. 16 is a plan view showing a display panel according to an embodiment.

FIG. 15 is a plan view showing a display panel according to an embodiment. FIG. 16 is a plan view showing a display panel according to an embodiment. In the plan views of FIGS. 15 and 16, a bending area BA1 of the display panel 300 is not bent but is unfolded.

An embodiment 15 and 16 may be different from an embodiment of FIG. 4 in that a first bending area BA1 on a side of the display panel 300 may be bent so that a first pad area PDA1 may be disposed on a lower surface of the panel bottom cover PB.

Referring to FIGS. 15 and 16, the first bending area BA1 and the first pad area PDA1 may protrude from the sensor peripheral area TPA on one side of the display panel 300 in the second direction (y-axis direction). In FIGS. 15 and 16, the length of the first bending area BA1 and the first pad area PDA1 in the first direction (x-axis direction) is substantially equal to the length of the sensor peripheral area TPA in the first direction (x-axis direction). It is, however, to be understood that the disclosure is not limited thereto.

The display panel 300 may be bent at the first bending area BA1, and the first pad area PDA1 may be disposed on the lower surface of the panel cover member 400. The first pad area PDA1 may overlap the sensor area TSA in the thickness direction (z-axis direction) of the display panel 300. The display driver 320, the display circuit board 310 and the antenna area APA may be disposed in the first pad area PDA1.

As shown in FIG. 15, the display driver 320 may be disposed on one side of the first pad area PDA1, and the antenna area APA may be disposed on both sides of the display driver 320. Alternatively, as shown in FIG. 16, the display driver 320 may be disposed at the center of the first pad area PDA1, the antenna area APA may be disposed one side of the display driver 320, and the antenna area APA may be disposed on the other side of the display driver 320.

As shown in FIGS. 15 and 16, when the first conductive pattern of the antenna area APA is disposed in the first pad area PDA1, the design area for the first conductive pattern may be increased compared to when it is disposed in the sensor peripheral area TPA.

Figure 17:
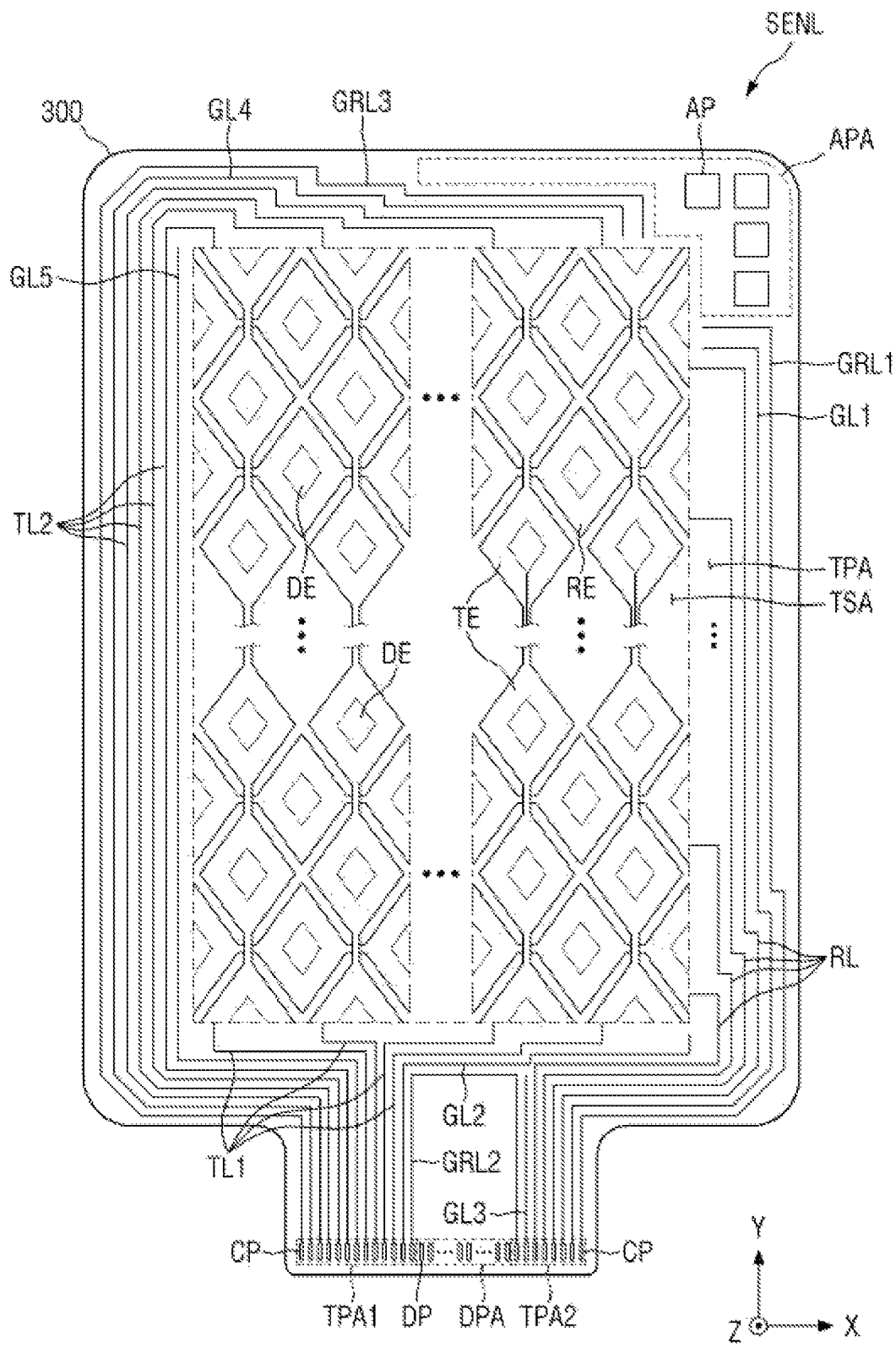
FIG. 17 is a plan view showing a sensor electrode layer of a display panel according to an embodiment.

FIG. 17 is a plan view illustrating a sensor electrode layer of a display panel according to an embodiment.

In the example shown in FIG. 17, the sensor electrodes TE and RE of the sensor electrode layer SENL include two kinds of electrodes, e.g., the driving electrodes TE and the sensing electrodes RE, and the mutual capacitive sensing is carried out by using two layer, i.e., driving signals are applied to the driving electrodes TE and then the voltages charged at the mutual capacitances may be sensed through the sensing electrodes RE.

In FIG. 17, the antenna area APA including the first conductive pattern AP is disposed in the sensor peripheral area TPA on the upper outer side of the sensor area TSA, in the sensor peripheral area TPA on the right outer side of the sensor area TSA, and at the corner between the upper side and the right side of the display panel 300, as in FIG. 6. In FIG. 17, the second flexible film 360 where the radio frequency driver 350 electrically connected to the first conductive pattern AP of the antenna area APA is disposed may be disposed on the upper side of the display panel 300, as in FIG. 6.

For convenience of illustration, FIG. 17 shows only sensor electrodes TE and RE, dummy patterns DE, sensor lines TL and RL, sensor pads TP1 and TP2, guard lines GL1 to GL5, and ground lines GRL1 to GRL3. However, the disclosure is not limited thereto.

Referring to FIG. 17, the sensor electrode layer SENL includes the sensor area TSA for sensing a user's touch, and the sensor peripheral area TPA disposed around the sensor area TSA. The sensor area TSA may overlap the display area DA of the display layer DISL, and the sensor peripheral area TPA may overlap the non-display area NDA of the display layer DISL.

The sensor electrodes TE and RE may include first sensor electrodes TE and second sensor electrodes RE. In an embodiment shown in FIG. 17, the first sensor electrode may be the driving electrode TE, and the second sensor electrode may be the sensing electrode RE. In FIG. 17, the driving electrodes TE, the sensing electrodes RE and the dummy patterns DE each may have a substantially diamond shape when viewed from the top, but the disclosure is not limited thereto.

The sensing electrodes RE may be arranged or disposed in the first direction (x-axis direction) and electrically connected to one another. The driving electrodes TE may be arranged or disposed in the second direction (y-axis direction) crossing the first direction (x-axis direction) and may be electrically connected to one another. The driving electrodes TE may be electrically separated from the sensing electrodes RE. The driving electrodes TE may be spaced apart from the sensing electrodes RE. The driving electrodes TE may be arranged or disposed in parallel in the second direction (y-axis direction). In order to electrically separate the sensing electrodes RE from the driving electrodes TE at their intersections, the driving electrodes TE adjacent to each other in the second direction (y-axis direction) may be electrically connected through the first connection unit BE1, and the sensing electrodes RE adjacent to each other in the first direction (x-axis direction) may be electrically connected through second connection unit BE2.

The dummy patterns DE may be electrically separated from the driving electrodes TE and the sensing electrodes RE. The driving electrodes TE, the sensing electrodes RE and the dummy patterns DE may be disposed apart from each other. The dummy patterns DE may be surrounded by the driving electrodes TE and the sensing electrodes RE, respectively. Each of the dummy patterns DE may be electrically floating.

The parasitic capacitance between the second electrode of the emission material layer EML and the driving electrode TE or the sensing electrode RE may be reduced due to the dummy patterns DE. When the parasitic capacitance is reduced, there is an advantage in that the mutual capacitance between the driving electrode TE and the sensing electrode RE may be charged more quickly. However, as the area of the driving electrode TE and the sensing electrode RE is reduced due to the dummy patterns DE, the mutual capacitance between the driving electrode TE and the sensing electrode RE may be reduced. As a result, the voltage charged in the mutual capacitance may be easily affected by noise. Therefore, it is desired to determine the area of the dummy patterns DE by the trade-off between the parasitic capacitance and the mutual capacitance.

The sensor lines TL and RL may be disposed in the sensor peripheral area TPA. The sensor lines TL and RL may include sensing lines RL electrically connected to the sensing electrodes RE, and first driving lines TL1 and second driving lines TL2 electrically connected to the driving electrodes TE.

The sensing electrodes RE disposed on one side of the sensor area TSA may be electrically connected to the sensing lines RL. For example, some of the sensing electrodes RE electrically connected in the first direction (x-axis direction) that are disposed at the right end may be electrically connected to the sensing lines RL as shown in FIG. 17. The sensing lines RL may be electrically connected to second sensor pads TP2. Therefore, the sensor driver 330 may be electrically connected to the sensing electrodes RE.

The driving electrodes TE disposed on one side of the sensor area TSA may be electrically connected to the first driving lines TL1, while the driving electrodes TE disposed on the other side of the sensor area TSA may be electrically connected to the second driving lines TL2. For example, some of the driving electrodes TE electrically connected to one another in the second direction (y-axis direction) on the lowermost side may be electrically connected to the first driving line TL1, while some of the driving electrodes TE disposed on the uppermost side may be electrically connected to the second driving line TL2, as shown in FIG. 17. The second driving lines TL2 may be electrically connected to the driving electrodes TE on the upper side of the sensor area TSA via the left outer side of the sensor area TSA. The first driving lines TL1 and the second driving lines TL2 may be electrically connected to the first sensor pads TP1. Therefore, the sensor driver 330 may be electrically connected to the driving electrodes TE.

The first guard line GL1 may be disposed on the outer side of the outermost one of the sensing lines RL. The first ground line GRL1 may be disposed on the outer side of the first guard line GL1. As shown in FIG. 17, the first guard line GL1 may be disposed on the right side of the rightmost one of the sensing lines RL, and the first ground line GRL1 may be disposed on the right side of the first guard line GL1.

A second guard line GL2 may be disposed between the innermost one of the sensing lines RL and the rightmost one of the first driving lines TL1. As shown in FIG. 17, the innermost one of the sensing lines RL may be the leftmost one of the sensing lines RL. The second guard line GL2 may be disposed between the rightmost one of the first driving lines TL1 and the second ground line GRL2.

A third guard line GL3 may be disposed between the innermost one of the sensing lines RL and the second ground line GRL2. The second ground line GRL2 may be connected to the rightmost one of the first sensor pads TP1 and the leftmost one of the second sensor pads TP2.

A fourth guard line GL4 may be disposed on the outer side of the outermost one of the second driving lines TL2. As shown in FIG. 17, the fourth guard line GL4 may be disposed on the left side of the leftmost one of the second driving lines TL2.

The third ground line GRL3 may be disposed on the outer side of the fourth guard line GL4. As shown in FIG. 17, the fourth guard line GL4 may be disposed on the left side and upper side of the leftmost and uppermost one of the second driving lines TL2, and the third ground line GRL3 may be disposed on the left side and upper side of the fourth guard line GL4.

The fifth guard line GL5 may be disposed on the inner side of the innermost one of the second driving lines TL2. As shown in FIG. 17, the fifth guard line GL5 may be disposed between the rightmost one of the second driving lines TL2 and the sensing electrodes RE.

A ground voltage may be applied to the first ground line GRL1, the second ground line GRL2 and the third ground line GRL3. A ground voltage may be applied to the first guard line GL1, the second guard line GL2, the third guard line GL3, the fourth guard line GL4 and the fifth guard line GL5.

As shown in FIG. 17, the driving electrodes TE adjacent to each other in the second direction (y-axis direction) are electrically connected to each other, while the driving electrodes TE adjacent to each other the first direction (x-axis direction) are electrically insulated from each other. The sensing electrodes RE adjacent to each other in the first direction (x-axis direction) are electrically connected to each other, while the sensing electrodes RE adjacent to each other in the second direction (y-axis direction) are electrically insulated from each other. Therefore, mutual capacitances may be formed at intersections of the driving electrodes TE and the sensing electrodes RE.

As shown in FIG. 17, the first guard line GL1 is disposed between the outermost one of the sensing lines RL and the first ground line GRL1, so that it may reduce the influence by a change in the voltage of the first ground line GRL1 on the outermost one of the sensing lines RL. The second guard line GL2 is disposed between the innermost one of the sensing lines RL and the outermost one of the first driving line TL1. Therefore, the second guard line GL2 may reduce the influence by a change in the voltage on the innermost one of the sensing lines RL and on the outermost one of the first driving lines TL1. The third guard line GL3 is disposed between the innermost one of the sensing lines RL and the second ground line GRL2, so that it may reduce the influence by a change in the voltage of the second ground line GRL2 on the innermost one of the sensing lines RL. The fourth guard line GL4 is disposed between the outermost one of the second sensing lines TL2 and the third ground line GRL3, so that it may reduce the influence by a change in the voltage of the third ground line GRL3 on the second driving line TL2. The fifth guard line GL5 is disposed between the innermost one of the second driving lines TL2 and the touch electrodes TE and RE, so that it may suppress the innermost one of the second driving lines TL2 and the touch electrodes TE and RE from influencing mutually.

The antenna area APA may be disposed in the sensor periphery area TPA on the right outer side of the sensor area TSA and in the sensor periphery area TPA on the upper outer side of the sensor area TSA. In the sensor peripheral area TPA on the right outer side of the sensor area TSA, the number of sensing lines RL is reduced from the lower side to the upper side. Therefore, there may be an empty area where the sensing lines RL are not disposed in the sensor peripheral area TPA on the right outer side of the sensor area TSA. In the sensor peripheral area TPA on the upper outer side of the sensor area TSA, the number of the second driving lines TL2 is reduced from the left side to the right side. Therefore, there may be an empty area where the second driving lines TL2 are not disposed in the sensor peripheral area TPA on the upper outer side of the sensor area TSA. The antenna area APA may be disposed in an empty area where the sensing lines RL are not disposed in the sensor periphery area TPA on the right outer side of the sensor area TSA, and an empty area where the second driving lines TL2 are not disposed in the sensor periphery area TPA on the upper outer side of the sensor area TSA. Accordingly, the first conductive pattern AP of the antenna area APA may be formed or disposed on a same layer as the sensing lines RL and the second driving lines TL2 of the sensor peripheral area TPA.

For example, as shown in FIG. 17, the first conductive pattern AP of the antenna area APA may be disposed in the area of the sensor peripheral area TPA where the sensor lines may not be disposed, so that the first conductive pattern AP of the antenna area APA may be formed or disposed on a same layer as the sensor lines of the sensor peripheral area TPA. Therefore, the first conductive pattern AP of the antenna region APA may be formed without any separate process. The antenna area APA may overlap a first ground line GRL1 and a third ground line GRL3.

A first guard line GL1 may be disposed between the antenna area APA and the rightmost one of the sensing lines RL. By virtue of the first guard line GL1, it is possible to reduce or prevent the sensing lines RL from being affected by the electromagnetic waves radiated from the antenna area APA. A fourth guard line GL4 may be disposed between the antenna area APA and the second driving line TL2 disposed at the upper end. By virtue of the fourth guard line GL4, it is possible to reduce or prevent the second driving lines TL2 from being affected by the electromagnetic waves radiated from the antenna area APA.

Although the first conductive pattern AP of the antenna area APA is formed as a rectangular patch in FIG. 17, the disclosure is not limited thereto. The first conductive pattern AP may be formed in a substantially loop shape or a substantially coil shape.

Figure 18:
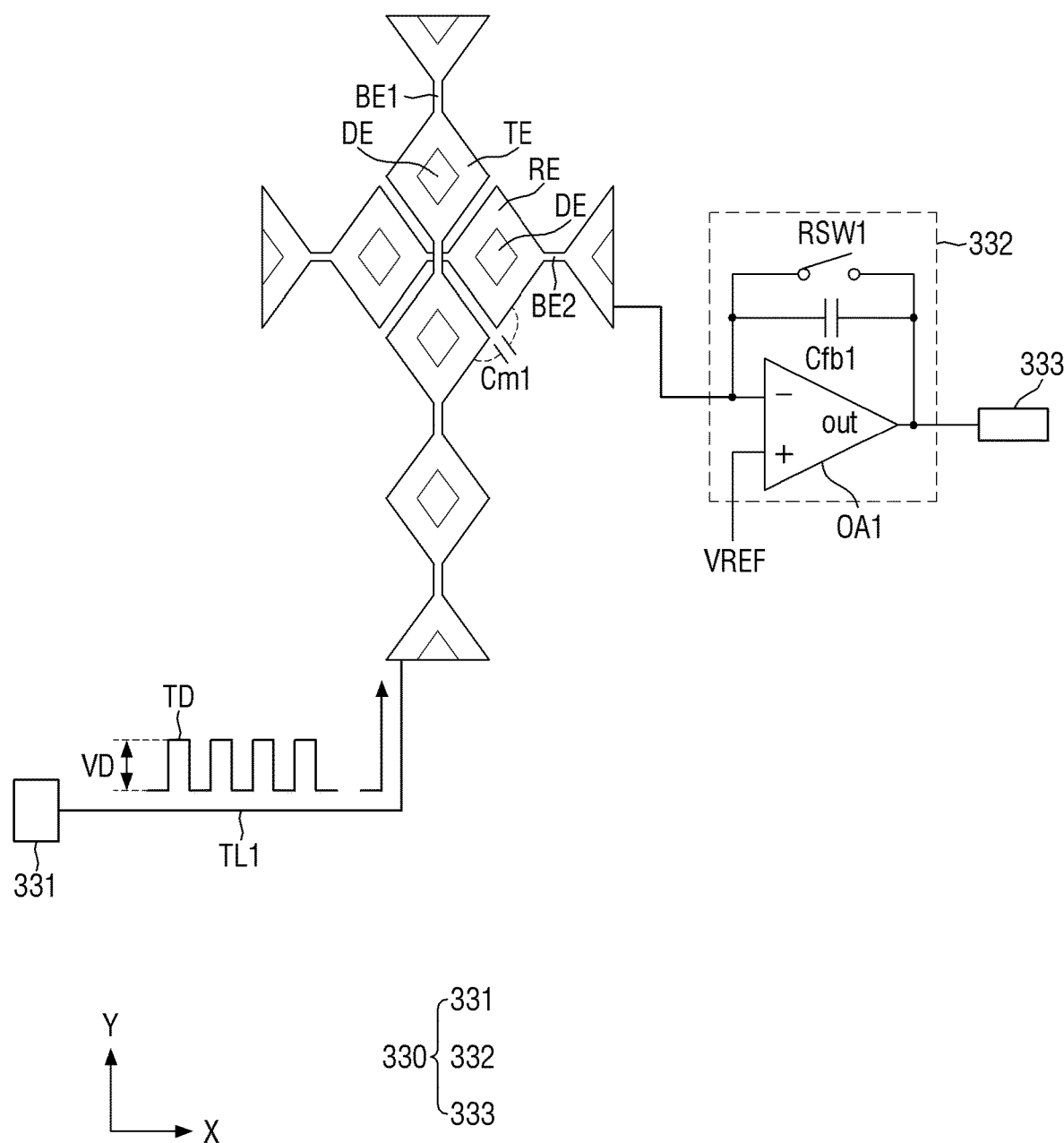
FIG. 18 is a view showing an example of the sensor driver connected to the sensor electrodes.

FIG. 18 is a view showing an example of the sensor driver connected to the sensor electrodes.

For convenience of illustration, FIG. 18 shows only driving electrodes TE arranged or disposed in a row and electrically connected to each other in the second direction (y-axis direction), and sensing electrodes RE arranged or disposed in a row and electrically connected to each other in the first direction (x-axis direction). However, the disclosure is not limited thereto.

Referring to FIG. 18, the sensor driver 330 may include a driving signal output 331, a first sensor detector 332, and a first analog-to-digital digital converter 333.

The driving signal output 331 may output a touch driving signal TD to the driving electrodes TE through a first driving line TL1, and the touch driving signal TD to the driving electrodes TE through a second driving line TL2. The touch driving signal TD may include pulses.

The driving signal output 331 may output the touch driving signal TD to the driving lines TL1 and TL2 in a predetermined order. For example, the driving signal output 331 may output the touch driving signal TD sequentially from the driving electrodes TE disposed on the left side of the touch sensing area TSA of FIG. 17 to the driving electrodes TE disposed on the right side of the touch sensing area TSA.

The first sensor detector 332 detects a voltage charged in a first mutual capacitance Cm1 through the sensing line RL electrically connected to the sensing electrodes RE. As shown in FIG. 18, the first mutual capacitance Cm1 may be formed between the driving electrode TE and the sensing electrode RE.

The first sensor detector 332 may include a first operational amplifier OA1, a first feedback capacitor Cfb1, and a first reset switch RSW1. The first operational amplifier OA1 may include a first input terminal (−), a second input terminal (+), and an output terminal (out). The first input terminal (−) of the first operational amplifier OA1 may be connected to the sensing line RL, the initialization voltage VREF may be supplied to the second input terminal (+), and the output terminal (out) of the first operational amplifier OA1 may be electrically connected to a first storage capacitor Cs1. The first storage capacitor Cs1 may be electrically connected between the output terminal (out) of the first operational amplifier OA1 and the ground to store the output voltage Vout1 of the first operational amplifier OA1. The first feedback capacitor Cfb1 and the first reset switch RSW1 may be electrically connected in parallel between the first input terminal (−) and the output terminal (out) of the first operational amplifier OA1. The first reset switch RSW1 controls the connection of both ends of the first feedback capacitor Cfb1. When the first reset switch RSW1 is turned on such that both ends of the first feedback capacitor Cfb1 may be electrically connected, the first feedback capacitor Cfb1 may be reset.

The output voltage Vout1 of the first operational amplifier OA1 may be defined as in Equation 1 below:

$$Vout1 = \frac{Cm1 \times Vt1}{Cfb1} \qquad \text{[Equation 1]}$$

where Vout1 denotes the output voltage of the first operational amplifier OA1, Cm1 denotes the first mutual capacitance, Cfb1 denotes the capacitance of the first feedback capacitor, and Vt1 denotes the voltage charged in the first mutual capacitance Cm1.

The first analog-to-digital converter 333 may convert the output voltage Vout1 stored in the first storage capacitor Cs1 into first digital data and output the first digital data.

As shown in FIG. 18, the sensor electrode layer SENL may determine whether there is a user's touch by sensing voltages charged in the first mutual capacitances Cm1.

Figure 19:
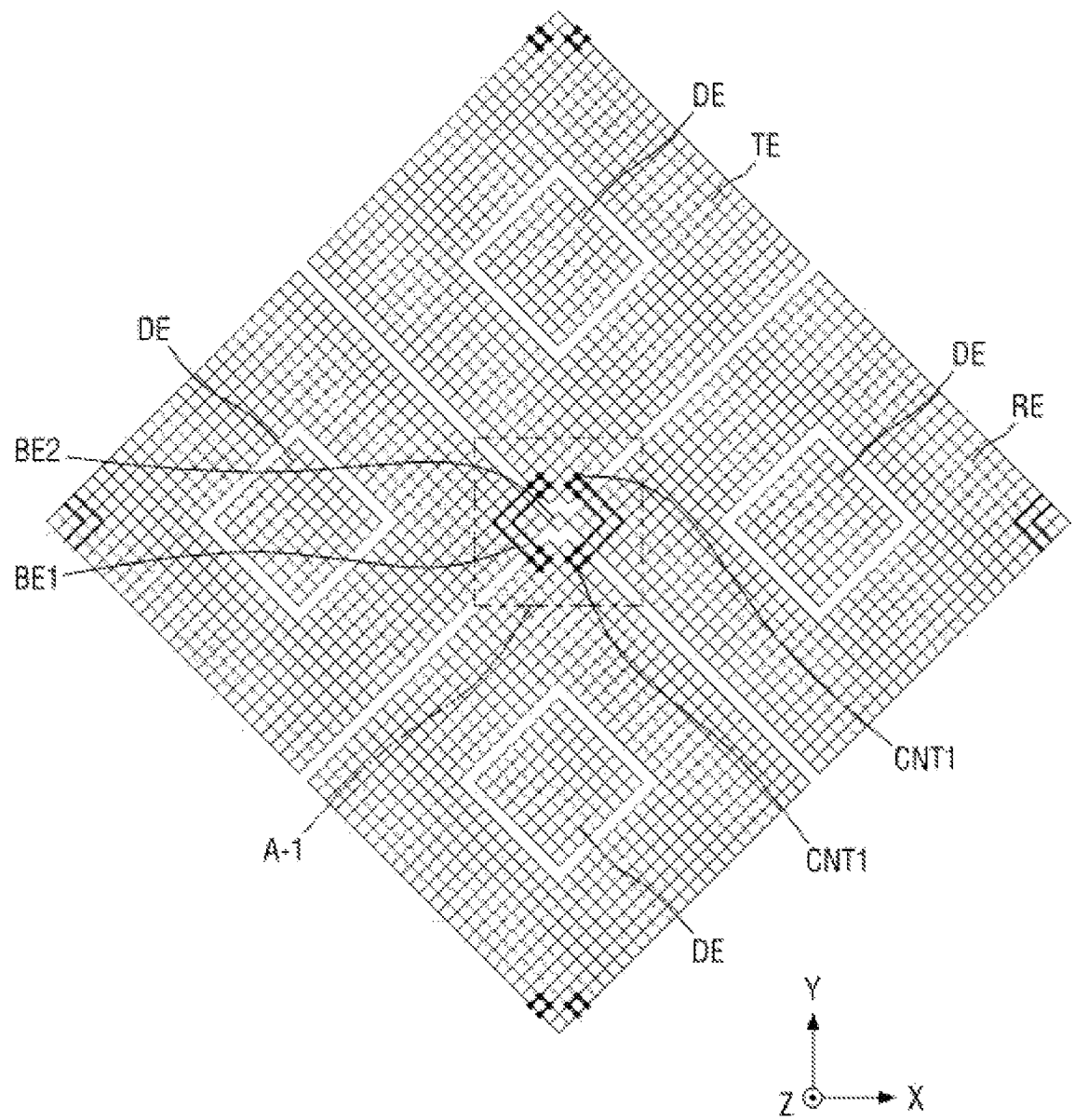
FIG. 19 is an enlarged plan view showing the sensor area of FIG. 18 in detail.

FIG. 19 is an enlarged plan view showing the sensor area of FIG. 17 in detail.

For convenience of illustration, FIG. 19 shows only two sensing electrodes RE adjacent to each other in the first direction (x-axis direction) and two driving electrodes TE adjacent to each other in the second direction (y-axis direction). However, the disclosure is not limited thereto.

Referring to FIG. 19, each of the driving electrodes TE, the sensing electrodes RE and the dummy patterns DE may have, but is not limited to, a substantially quadrangular shape. The driving electrodes TE, the sensing electrodes RE, the dummy patterns DE, the first connection units BE1 and the second connection units BE2 may be formed in a substantially mesh topology when viewed from the top.

The sensing electrodes RE may be arranged or disposed in the first direction (x-axis direction) and electrically connected to one another. The driving electrodes TE may be arranged or disposed in the second direction (y-axis direction) and may be electrically connected to one another. The dummy patterns DE may be surrounded by the driving electrodes TE and the sensing electrodes RE, respectively. The driving electrodes TE, the sensing electrodes RE and the dummy patterns DE may be electrically separated from each other. The driving electrodes TE, the sensing electrodes RE and the dummy patterns DE may be disposed apart from each other.

In order to electrically separate the sensing electrodes RE from the driving electrodes TE at their intersections, the driving electrodes TE adjacent to each other in the second direction (y-axis direction) may be connected through the first connection units BE1, and the sensing electrodes RE adjacent to each other in the first direction (x-axis direction) may be connected through second connection units BE2. The first connection unit BE1 may be formed or disposed on a different layer from the driving electrodes TE and may be connected to the driving electrodes TE through the first contact holes CNT1. For example, the first connection unit BE1 may be disposed on a second buffer layer BF2 shown in FIG. 21, and the driving electrodes TE may be disposed on a first sensor insulating layer TINS1 shown in FIG. 21.

Each of the first connection units BE1 may be bent at least once. In FIG. 19, the first connection units BE1 may be bent in the shape of angle brackets, for example "<" or ">", but the shape of the first connection units BE1 is not limited thereto. Since the driving electrodes TE adjacent to each other in the second direction (y-axis direction) may be connected by the first connection units BE1, even if any of the first connection units BE1 is disconnected, the driving electrodes TE may still be stably connected with each other. Although two adjacent ones of the driving electrodes TE are connected by two first connection units BE1 in the example shown in FIG. 19, but the number of first connection units BE1 is not limited thereto.

The second connection unit BE2 is formed or disposed on a same layer as the sensing electrodes RE and may have a shape extended from the sensing electrodes RE. The sensing electrodes RE and the second connection unit BE2 may be formed of the same or similar material. For example, the sensing electrodes RE and the second connection unit BE2 may be formed or disposed on the first sensor insulating layer TINS1 shown in FIG. 19.

As shown in FIG. 19, the first connection units BE1 electrically connecting the driving electrodes TE adjacent to each other in the second direction (y-axis direction) may be disposed on the second buffer layer BF2, while the driving electrodes TE, the sensing electrodes RE, the dummy patterns DE and the second connection units BE2 may be disposed on the first sensor insulating layer TISL1. Therefore, the driving electrodes TE and the sensing electrodes RE may be electrically separated from each other at their intersections, while the sensing electrodes RE may be electrically connected with one another in the first direction (x-axis direction), and the driving electrodes TE may be electrically connected with each other in the second direction (y-axis direction).

Figure 20:
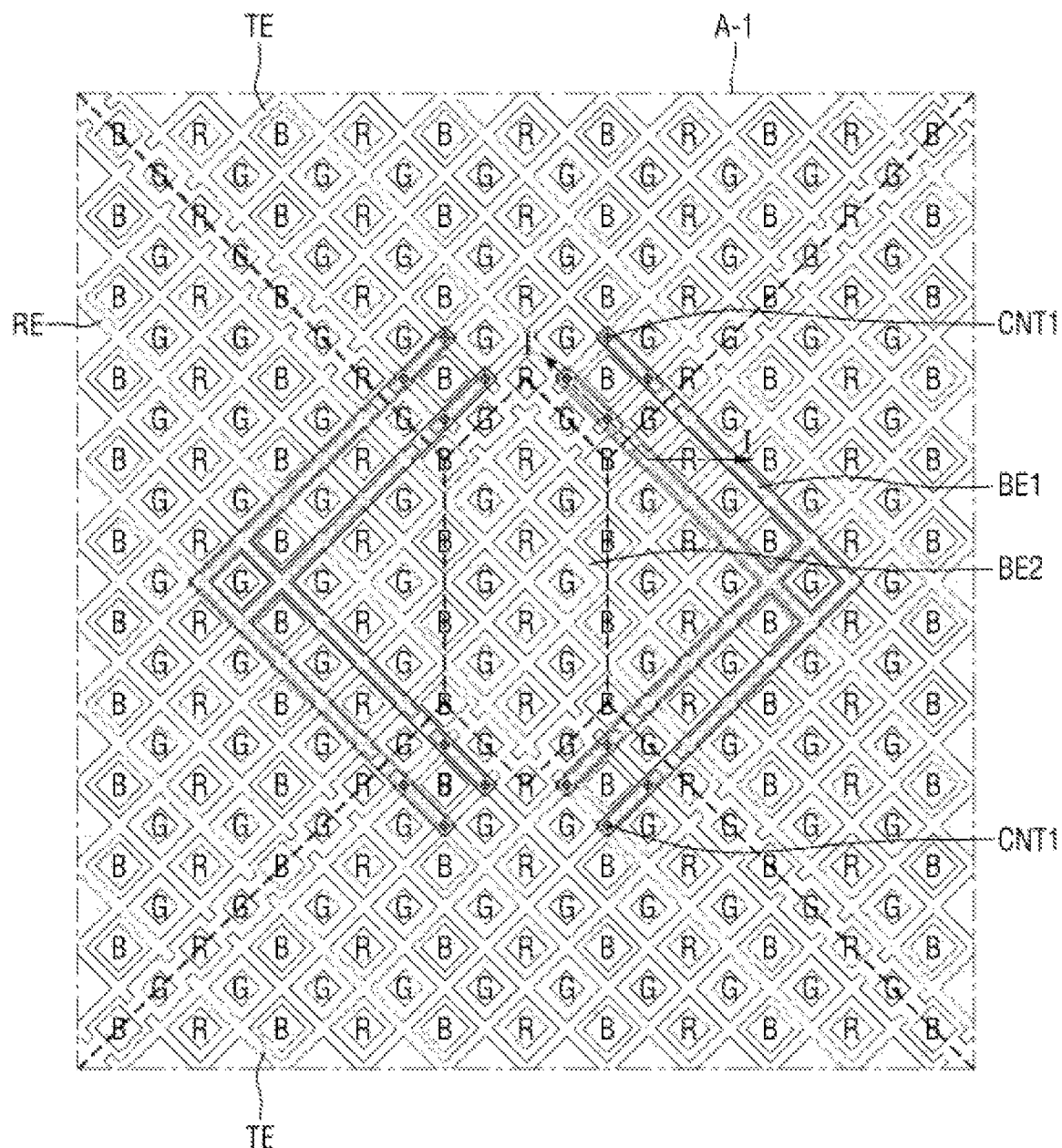
FIG. 20 is an enlarged plan view showing the sensor electrodes and the connection units of FIG. 19.

FIG. 20 is an enlarged plan view showing the sensor electrodes and the connection units of FIG. 19. FIG. 20 is an enlarged plan view of area A-1 of FIG. 19.

Figure 21:
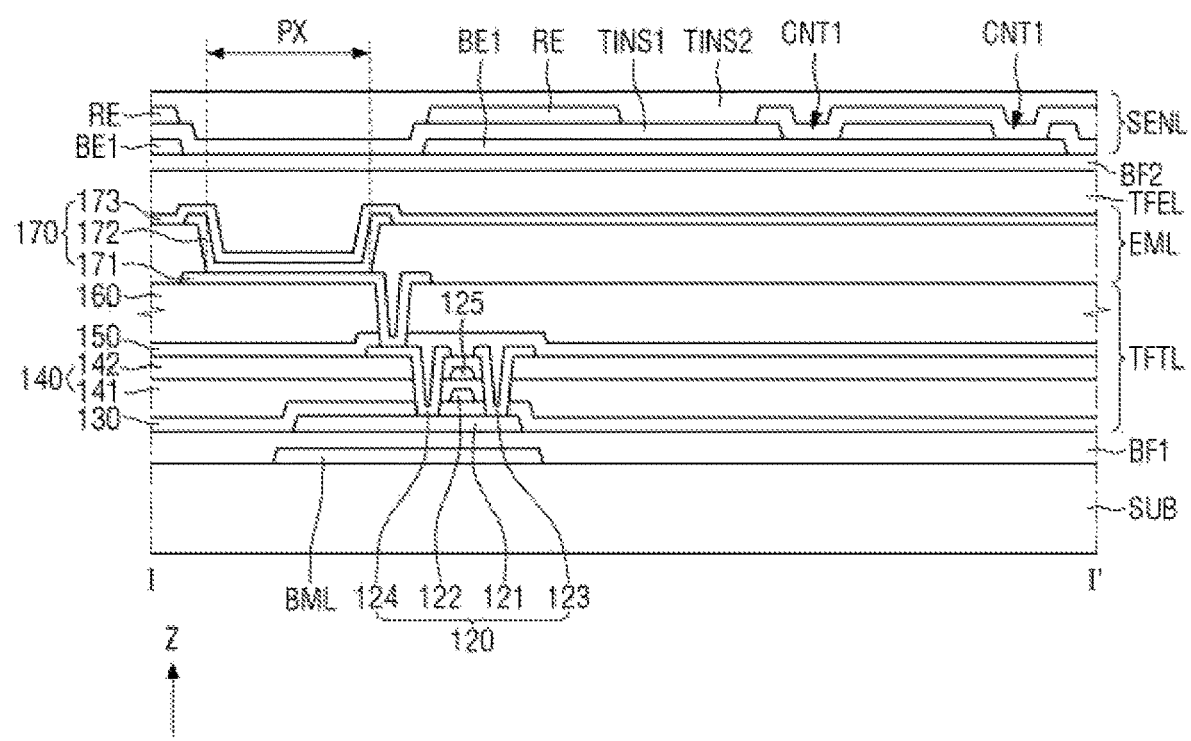
FIG. 21 is a schematic cross-sectional view taken along line I-I' of FIG. 20.

Referring to FIG. 20, the driving electrodes TE, the sensing electrodes RE, the first connection units BE1 and the second connection units BE2 may be formed in a substantially mesh topology when viewed from the top. The dummy patterns DE may be formed or disposed in a substantially mesh topology when viewed from the top. If the sensor electrode layer SENL including the driving electrodes TE and the sensing electrodes RE is formed or disposed directly on an encapsulation layer TFEL as shown in FIG. 21, the distance between the second electrode of the emission material layer EML and the driving electrode TE or the sensing electrode RE of the sensor electrode layer SENL is close. As a result, a large parasitic capacitance may be formed between the second electrode of the emission material layer EML and the driving electrode TE or the sensing electrode RE of the sensor electrode layer SENL. Since the parasitic capacitance is proportional to the area where the second electrode of the emission material layer EML overlaps with the driving electrode TE or the sensing electrode RE of the sensor electrode layer SENL. For this reason, in order to reduce the parasitic capacitance, it is desired that the driving electrodes TE and the sensing electrodes RE are formed in a substantially mesh topology when viewed from the top.

The driving electrodes TE, the sensing electrodes RE, the dummy patterns DE and the second connection units BE2 may be formed or disposed in a same layer, and thus they may be spaced apart from each other. There may be a gap between the driving electrode TE and the sensing electrode RE, between the driving electrode TE and the second connection unit BE2, between the driving electrode TE and the dummy pattern DE, and between the sensing electrode RE and the dummy pattern DE. For convenience of illustration, the boundary between the driving electrode TE and the sensing electrode RE, the boundary between the driving electrode TE and the second connection unit BE2, and the boundary between the sensing electrode RE and the second connection unit BE2 are indicated by dashed lines in FIG. 20.

The first connection units BE1 may be connected to the driving electrodes TE through the first contact holes CNT1, respectively. One end of each of the first connection units BE1 may be connected to one of the driving electrodes TE adjacent to each other in the second direction (y-axis direction) through a first contact hole CNT1. The other end of each of the first connection units BE1 may be connected to another one of the driving electrodes TE adjacent to each other in the second direction (y-axis direction) through a first contact hole CNT1. The first connection units BE1 may overlap the driving electrodes TE and the sensing electrode RE. Alternatively, the first connection unit BE1 may overlap the second connection unit BE2 instead of the sensing electrode RE. Alternatively, the first connection unit BE1 may overlap the sensing electrode RE as well as the second connection unit BE2. Since the first connection unit BE1 may be formed or disposed on a different layer from the driving electrodes TE, the sensing electrodes RE and the second connection unit BE2, it is possible to prevent a short-circuit from being created in the sensing electrode RE and/or the second connection unit BE2 even though they overlap the sensing electrode RE and/or the second connection unit BE2.

The second connection unit BE2 may be disposed between the sensing electrodes RE. The second connection unit BE2 is formed or disposed on a same layer as the sensing electrodes RE and may be extended from each of the sensing electrodes RE. Therefore, the second connection unit BE2 may be connected to the sensing electrodes RE without any additional contact hole.

Sub-pixels R, G and B may include a first sub-pixel R emitting a first color, a second sub-pixel G emitting a second color, and a third sub-pixel B emitting a third color. Although the first sub-pixel R is a red sub-pixel, the second sub-pixel G is a green sub-pixel and the third sub-pixel B is a blue sub-pixel in the example shown in FIG. 20, the disclosure is not limited thereto. Although the first sub-pixel R, the second sub-pixel G and the third sub-pixel B have a substantially quadrangular shape when viewed from the top in the example shown in FIG. 20, the disclosure is not limited thereto. For example, the first sub-pixel R, the second sub-pixel G and the third sub-pixel B may have a substantially polygonal shape other than a substantially quadrangular, or a substantially circular or substantially elliptical shape when viewed from the top. Although FIG. 20 illustrates that the third sub-pixel B has the largest size while the second sub-pixel G has the smallest size, the disclosure is not limited thereto.

A pixel P refers to a group of sub-pixels capable of representing grayscales. In the example shown in FIG. 20, a pixel P may include a first sub-pixel R, two second sub-pixels G and a third sub-pixel B. It is, however, to be understood that the disclosure is not limited thereto. For example, a pixel P may include a first sub-pixel PX1, a second sub-pixel PX2 and a third sub-pixel PX3.

Since the driving electrodes TE, the sensing electrodes RE, the dummy patterns DE, the first connection units BE1 and the second connection units BE2 are formed in a substantially mesh topology, the sub-pixels R, G and B may not overlap the driving electrodes TE, the sensing electrodes RE, the dummy patterns DE, the first connection units BE1 and the second connection units BE2. Accordingly, it may be possible to prevent that the light output from the sub-pixels R, G and B is covered by the driving electrodes TE, the sensing electrodes RE, the dummy patterns DE, the first connection units BE1 and the second connection units BE2 and thus the luminance of light may be reduced.

FIG. 21 is a schematic cross-sectional view taken along line I-I' of FIG. 20.

Referring to FIG. 21, the display layer DISL including the first buffer layer BF1, the thin-film transistor layer TFTL, the emission material layer EML and the encapsulation layer TFEL may be disposed on the substrate SUB.

The first buffer layer BF1 may be formed or disposed on one surface of the substrate SUB. The first buffer layer BF1 may be formed or disposed on one surface of the substrate SUB in order to protect the thin-film transistors 120 and organic emitting layer 172 of the light-emitting element layer EML from moisture that is likely to permeate through the substrate SUB. The first buffer layer BF1 may be made up of multiple inorganic layers sequentially stacked on one another. For example, the first buffer layer BF1 may be made up of multiple layers in which one or more inorganic layers of a silicon nitride layer, a silicon oxynitride layer, a silicon oxide layer, a titanium oxide layer and an aluminum oxide layer are alternately stacked on one another. The first buffer layer BF1 may be eliminated.

The thin-film transistor layer TFTL includes thin-film transistors 120, a gate insulating layer 130, an interlayer dielectric layer 140, a protective layer 150, and a planarization layer 160.

The thin-film transistors 120 may be formed or disposed on the first buffer layer BF1. Each of the thin-film transistor 120 includes an activate layer 121, a gate electrode 122, a source electrode 123, and a drain electrode 124. In FIG. 21, the thin-film transistors 120 may be top-gate transistors in which the gate electrode 122 may be located or disposed above the active layer 121. It is, however, to be understood that the disclosure is not limited thereto. For example, the thin-film transistors 120 may be bottom-gate transistors in which the gate electrode 122 may be located or disposed below the active layer 121, or as double-gate transistors in which the gate electrodes 122 may be disposed above and below the active layer 121.

The active layer 121 may be formed or disposed on the first buffer layer BF1. The active layer 121 may include polycrystalline silicon, single crystal silicon, low-temperature polycrystalline silicon, amorphous silicon, or an oxide semiconductor. The oxide semiconductor may include, for example, a binary compound (ABx), a ternary compound (ABxCy) and a quaternary compound (ABxCyDz) containing indium, zinc, gallium, tin, titanium, aluminum, hafnium (Hf), zirconium (Zr), magnesium (Mg), or other materials within the spirit and the scope of the disclosure. For example, the active layer 121 may include an oxide including indium, tin, and titanium (ITZO) or an oxide including indium, gallium and tin (IGZO). A light-blocking layer for blocking external light incident on the active layer 121 may be formed or disposed between the buffer layer and the active layer 121.

The gate insulating layer 130 may be formed or disposed on the active layer 121. The gate insulating layer 130 may be formed of an inorganic layer, for example, a silicon nitride layer, a silicon oxynitride layer, a silicon oxide layer, a titanium oxide layer, or an aluminum oxide layer.

The gate electrodes 122 and gate lines may be formed or disposed on the gate insulating layer 130. The gate electrode 122 may overlap the active layer 121. The gate electrodes 122 and the gate lines may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A first interlayer dielectric layer 141 may be formed or disposed over the gate electrode 122 and the gate line. The first interlayer dielectric layer 141 may be formed of an inorganic layer, for example, a silicon nitride layer, a silicon oxynitride layer, a silicon oxide layer, a titanium oxide layer, or an aluminum oxide layer.

A capacitor electrode 125 may be formed or disposed on the first interlayer dielectric layer 141. The capacitor electrode 125 may overlap the gate electrode 122. The capacitor electrode 125 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A second interlayer dielectric layer 142 may be formed or disposed over the capacitor electrode 125. The second interlayer dielectric layer 142 may be formed of an inorganic layer, for example, a silicon nitride layer, a silicon oxynitride layer, a silicon oxide layer, a titanium oxide layer, or an aluminum oxide layer.

The source electrode 123 and the drain electrode 124 may be formed or disposed on the second interlayer dielectric layer 142. Each of the source electrode 123 and the drain electrode 124 may be connected to the active layer 121 through a contact hole penetrating through the interlayer dielectric layer 140. The source electrode 123 and the drain electrode may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The protective layer 150 may be formed or disposed on the source electrode 213 and the drain electrode 124 in order to insulate the thin-film transistors 120. The protective layer 150 may be formed of an inorganic layer, for example, a silicon nitride layer, a silicon oxynitride layer, a silicon oxide layer, a titanium oxide layer, or an aluminum oxide layer.

The planarization layer 160 may be formed or disposed on the protective layer 150 to provide a flat surface over the step differences of the thin-film transistors 120. The planarization layer 160 may be formed of an organic layer such as an acryl resin, an epoxy resin, a phenolic resin, a polyamide resin and a polyimide resin.

The emission material layer EML is formed or disposed on the thin-film transistor layer TFTL. The emission material layer EML includes light-emitting elements 170 and a bank 180.

The light-emitting elements 170 and the bank 180 are formed or disposed on the planarization layer 160. Each of the light-emitting elements 170 may include a first electrode 171, an organic emitting layer 172, and a second electrode 173. In FIG. 21, the light-emitting elements 170 are organic light-emitting diodes including the organic emitting layer 172.

The first electrode 171 may be formed or disposed on the planarization layer 160. Although the first electrode 171 is connected to the drain electrode 124 of the thin-film transistor 120 through the contact hole penetrating through the protective layer 150 and the planarization layer 160 in the example shown in FIG. 21, the disclosure is not limited thereto. The first electrode 171 may be connected to the source electrode 123 of the thin-film transistor 120 through the contact hole penetrating through the protective layer 150 and the planarization layer 160.

In the top-emission organic light-emitting diode that light exits from the organic emitting layer 172 toward the second electrode 173, the first electrode 171 may be made of a metal material having a high reflectivity such as a stack structure of aluminum and titanium (Ti/Al/Ti), a stack structure of aluminum and ITO (ITO/Al/ITO), an APC alloy and a stack structure of APC alloy and ITO (ITO/APC/ITO). The APC alloy is an alloy of silver (Ag), palladium (Pd) and copper (Cu).

In the bottom-emission organic light-emitting diode that light exits from the organic emitting layer 172 toward the first electrode 173, the first electrode 171 may be formed of a transparent conductive material (TCP) such as ITO and IZO that may transmit light, or a semi-transmissive conductive material such as magnesium (Mg), silver (Ag) and an alloy of magnesium (Mg) and silver (Ag). In such case, when the first electrode 171 is made of a semi-transmissive metal material, the light extraction efficiency may be increased by using microcavities.

The bank 180 may partition the first electrode 171 on the planarization layer 250 in order to define each of the sub-pixels PX. The bank layer 180 may be formed or disposed to cover or overlap an edge of the first electrode 171. The bank 180 may be formed of an organic layer such as an acryl resin, an epoxy resin, a phenolic resin, a polyamide resin and a polyimide resin.

In each of the sub-pixels PX, the first electrode 171, the organic emitting layer 172 and the second electrode 173 so that holes from the first electrode 171 and electrons from the second electrode 173 are combined with each other in the organic emitting layer 172 to emit light.

The organic emitting layer 172 is formed or disposed on the first electrode 171 and the bank 180. The organic emitting layer 172 may include an organic material and emit light of a certain color. For example, the organic emitting layer 172 may include a hole transporting layer, an organic material layer, and an electron transporting layer. In the example shown in FIG. 20, the organic emitting layer 172 of the first sub-pixel R may emit red light, the organic emitting layer 172 of the second sub-pixel G may emit green light, and the organic emitting layer 172 of the third sub-pixel B may emit blue light.

Alternatively, the organic emitting layers 172 of the sub-pixels PX may be formed as a single layer to emit white light, ultraviolet light, or blue light. In the example shown in FIG. 20, the first sub-pixel R may overlap a first color filter transmitting red light, the second sub-pixel G may overlap a second color filter transmitting green light, and the third sub-pixel B may overlap a third color filter transmitting blue light. The first color filter, the second color filter and the third color filter may be disposed on the encapsulation layer TFEL. In FIG. 20, the first sub-pixel R may overlap a first wavelength converting layer that converts blue light into red light, the second sub-pixel G may overlap a second wavelength converting layer that converts blue light into green light, and the third sub-pixel B may overlap a transmissive layer that outputs blue light without converting it. The first wavelength converting layer, the second wavelength converting layer and the third wavelength converting layer may be disposed on the encapsulation layer TFEL. For example, the first wavelength converting layer may be disposed between the encapsulation layer TFEL and the first color filter, the second wavelength converting layer may be disposed between the encapsulation layer TFEL and the second color filter, and the third wavelength converting layer may be disposed between the encapsulation layer TFEL and the third color filter.

The second electrode 173 is formed or disposed on the organic emitting layer 172. The second electrode 173 may be formed or disposed to cover or overlap the organic emitting layer 172. The second electrode 173 may be a common layer formed or disposed across the sub-pixels PX. A capping layer may be formed or disposed on the second electrode 173.

In the top-emission organic light-emitting diode, the second electrode 173 may be formed of a transparent conductive material (TCP) such as ITO and IZO that may transmit light, or a semi-transmissive conductive material such as magnesium (Mg), silver (Ag) and an alloy of magnesium (Mg) and silver (Ag). When the second electrode 173 is formed of a semi-transmissive conductive material, the light extraction efficiency may be increased by using microcavities.

In the bottom-emission organic light-emitting diode, the second electrode 173 may be made of a metal material having a high reflectivity such as a stack structure of aluminum and titanium (Ti/Al/Ti), a stack structure of aluminum and ITO (ITO/Al/ITO), an APC alloy and a stack structure of APC alloy and ITO (ITO/APC/ITO). The APC alloy is an alloy of silver (Ag), palladium (Pd) and copper (Cu).

The encapsulation layer TFFL may be formed or disposed on the emission material layer EML. The encapsulation layer TFEL may be disposed on the second electrode 173. The encapsulation layer TFEL may include at least one inorganic layer to prevent oxygen or moisture from permeating into the organic emitting layer 172 and the second electrode 173. The encapsulation layer TFEL may include at least one organic layer to protect the light-emitting element layer EML from foreign substances such as dust. For example, the encapsulation layer TFEL may include a first inorganic layer disposed on the second electrode 173, an organic layer disposed on the first inorganic layer, and a second inorganic layer disposed on the organic layer. The first inorganic layer and the second inorganic layer may be formed of, but is not limited to, a silicon nitride layer, a silicon oxynitride layer, a silicon oxide layer, a titanium oxide layer, or an aluminum oxide layer. The organic layer may be formed of, but is not limited to, an acryl resin, an epoxy resin, a phenolic resin, a polyamide resin and a polyimide resin.

The sensor electrode layer SEL may be formed or disposed on the encapsulation layer TFEL. The sensor electrode layer SENL may include the second buffer layer BF2, the driving electrodes TE, the sensing electrodes RE, the dummy patterns DE, the second connection units BE2, the first driving lines TL1, the second driving lines TL2, the sensing lines RL, the guard lines GL1, GL2, GL3, GL4 and GL5, the ground lines GRL1, GRL2, GRL3 and GRL4, the first sensor insulating layer TINS1, and the second sensor insulating layer TINS2. FIG. 21 shows only the driving electrode TE, the sensing electrode RE and the first connection unit BE1 of the sensor electrode layer SENL. However, the disclosure is not limited thereto.

The second buffer layer BF2 may be formed of an inorganic layer, for example, a silicon nitride layer, a silicon oxynitride layer, a silicon oxide layer, a titanium oxide layer, or an aluminum oxide layer.

The first connection units BE1 may be formed or disposed on the second buffer layer BF2. The first connection units BE1 may be disposed to overlap the bank 180 in the third direction (z-axis direction). The first connection units BE1 may be made up of, but is not limited to, a stack structure of aluminum and titanium (Ti/Al/Ti), a stack structure of aluminum and ITO (ITO/Al/ITO), an APC alloy and a stack structure of APC alloy and ITO (ITO/APC/ITO).

The first sensor insulating layer TINS1 may be formed or disposed on the first connection units BE1. The first sensor insulating layer TINS1 may be formed of an inorganic layer, for example, a silicon nitride layer, a silicon oxynitride layer, a silicon oxide layer, a titanium oxide layer, or an aluminum oxide layer. Alternatively, the first sensor insulating layer TINS1 may be formed of an organic layer such as an acryl resin, an epoxy resin, a phenolic resin, a polyamide resin and a polyimide resin.

The driving electrodes TE, the sensing electrodes RE, the dummy patterns DE, the second connection units BE2, the first driving lines TL1, the second driving lines TL2, the sense lines RL, the guard lines GL1, GL2, GL3, GL4 and GL5, and the ground lines GRL1, GRL2, GRL3 and GRL4 may be formed or disposed on the first sensor insulating layer TINS1. The driving electrodes TE, the sensing electrodes RE, the dummy patterns DE, and the second connection units BE2 may be disposed to overlap the bank 180 in the third direction (z-axis direction). The driving electrodes TE, the sensing electrodes RE, the dummy patterns DE, the second connection units BE2, the first driving lines TL1, the second driving lines TL2, the sensing lines RL, the guard lines GL1, GL2, GL3, GL4 and GL5 and the ground lines GRL1, GRL2, GRL3 and GRL4 may be formed as, but is not limited to, a stack structure of aluminum and titanium (Ti/Al/Ti), a stack structure of aluminum and ITO (ITO/Al/ITO), an APC alloy, and a stack structure of APC alloy and ITO (ITO/APC/ITO).

First contact holes CNT1 may be formed or disposed through the first touch second layer TINS1, via which the first connection units BE1 are exposed. The driving electrodes TE may be connected to the first connection units BE1 through the first contact holes CNT1.

The second sensor insulating layer TINS2 may be formed on the driving electrodes TE. The second sensor insulating layer TINS2 may provide a flat surface over the level difference of the sensor electrode layer SENL. The second sensor insulating layer TINS2 may be formed of an inorganic layer, for example, a silicon nitride layer, a silicon oxynitride layer, a silicon oxide layer, a titanium oxide layer, or an aluminum oxide layer. Alternatively, the second sensor insulating layer TINS2 may be formed of an organic layer such as an acryl resin, an epoxy resin, a phenolic resin, a polyamide resin and a polyimide resin.

As shown in FIG. 21, the first connection units BE1 electrically connecting the driving electrodes TE adjacent to each other in the second direction (y-axis direction) may be formed or disposed on the second buffer layer BF2, while the driving electrodes TE, the sensing electrodes RE and the second connection units BE2 may be formed or disposed on the first sensor insulating layer TISL1. Therefore, the driving electrodes TE and the sensing electrodes RE may be electrically separated from each other at their intersections, while the sensing electrodes RE may be electrically connected with one another in the first direction (x-axis direction), and the driving electrodes TE may be electrically connected with each other in the second direction (y-axis direction).

Figure 22:
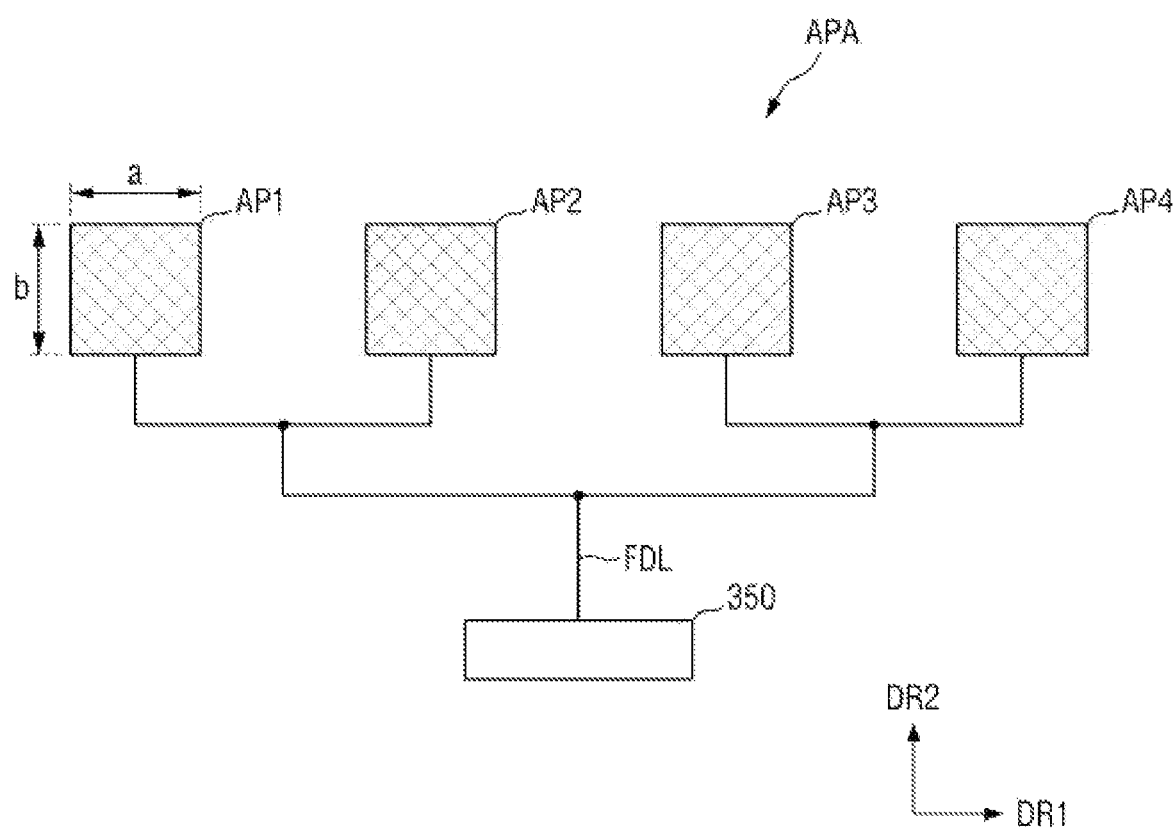
FIG. 22 is an enlarged plan view showing an example of the antenna area of FIG. 18.

FIG. 22 is an enlarged plan view showing an example of the antenna area of FIG. 17. In FIG. 22, the first conductive pattern AP of the antenna area APA may be formed as a patch antenna for mobile communications.

Referring to FIG. 22, the antenna area APA may include first conductive patterns AP1 to AP4. Although the antenna area APA includes four first conductive patterns AP1 to AP4 in the example shown in FIG. 20, the disclosure is not limited thereto. For example, the antenna area APA may include four to sixteen first conductive patterns.

Each of the first conductive patterns AP1 to AP4 may be formed in a substantially mesh topology when viewed from the top. In 5G mobile communications recently available, the frequency of approximately or about 28 GHz or about 39 GHz may be used. Therefore, for 5G mobile communications, the length a of each of the first conductive patterns AP1 to AP4 in one direction DR1 may be approximately or about 2.17 mm, while the length b of the other direction DR2 may be approximately or about 2.06 mm. The area of each of the first conductive patterns AP1 to AP4 may be approximately or in a range of about 4 to about 5 mm$^2$ when viewed from the top. The distance C between the centers of adjacent ones of the first conductive patterns in the direction DR1 may be approximately or about 6 mm.

Each of the first conductive patterns AP1 to AP4 may be connected to the radio frequency driver 350 through a feeding line FDL. The first conductive patterns AP1 to AP4 may be commonly connected to one feeding line FDL. A feeding line FDL connected to one of the first conductive patterns AP1 to AP4 and a feeding line FDL connected to another one of the first conductive patterns AP1 to AP4 may be merged into one line between the two first conductive patterns.

The radio frequency driver 350 may change the phase and amplify the amplitude of the radio frequency signal received from the first conductive patterns AP1 to AP4 through the feeding line FDL. The radio frequency driver 350 may transfer the radio frequency signal to the first conductive patterns AP1 to AP4 through the feeding line FDL.

Figure 23:
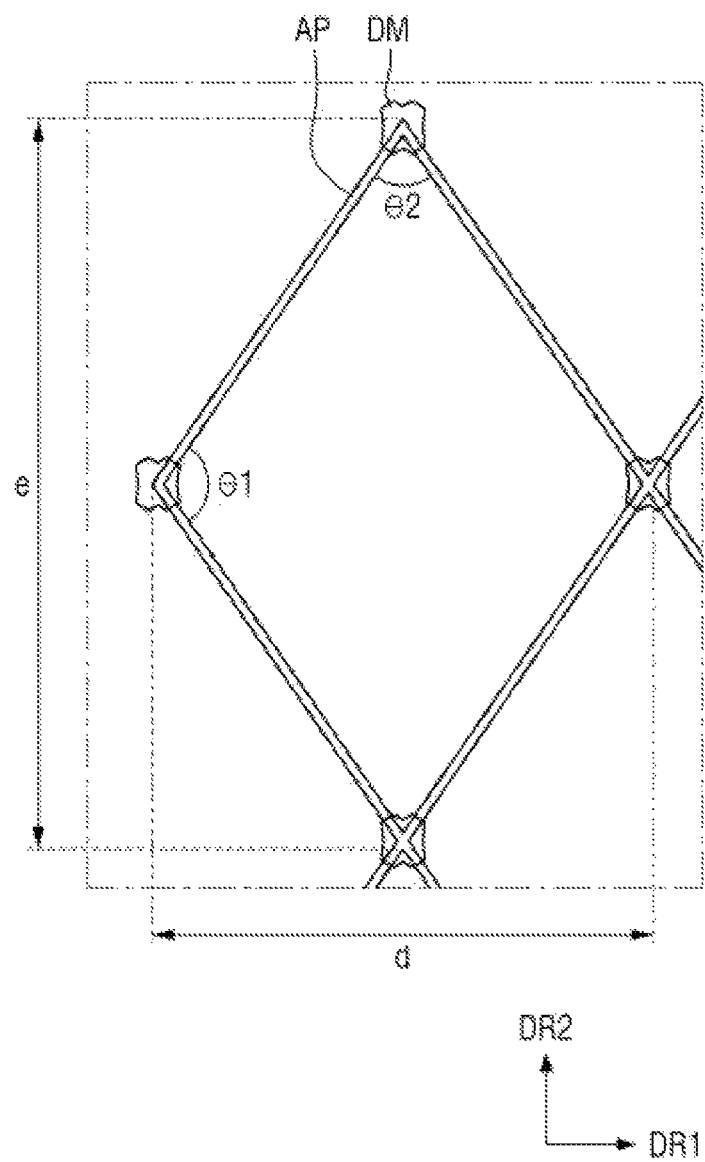
FIG. 23 is an enlarged plan view showing the first conductive pattern in the antenna area of FIG. 22 in detail.
Figure 24:
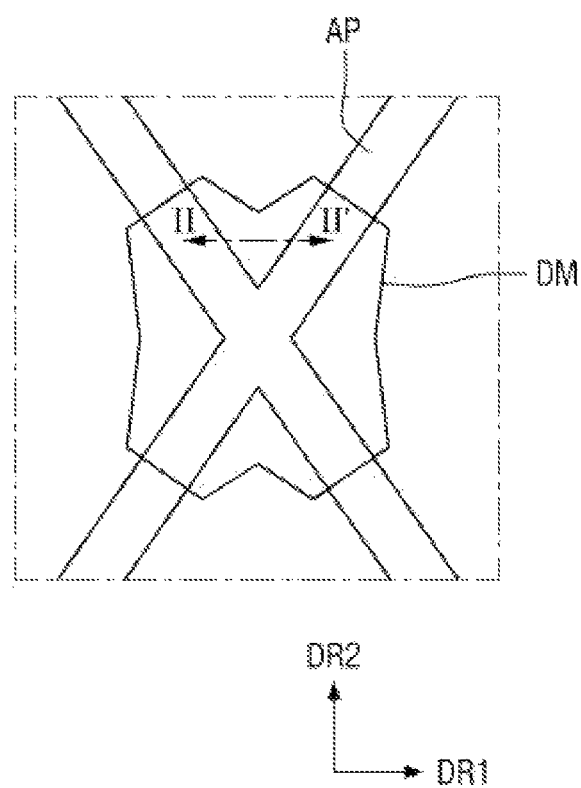
FIG. 24 is an enlarged plan view showing an intersection between the first conductive patterns of FIG. 22 in detail.

FIG. 23 is an enlarged plan view showing the first conductive patterns of FIG. 22 in detail. FIG. 24 is an enlarged plan view showing an intersection between the first conductive patterns of FIG. 22 in detail. FIG. 23 shows the first conductive pattern AP that may be formed in a substantially mesh topology and may have a substantially diamond shape when viewed from the top.

Referring to FIGS. 23 and 24, the first conductive pattern AP may be formed in a substantially mesh topology when viewed from the top. The first conductive pattern AP may have the width of approximately or about 2.5 μm and a thickness of approximately or about 2,400 Å m or less.

The first conductive pattern AP may have a shape in which a substantially quadrangular pattern such as a diamond may be repeated when viewed from the top. The length d of the diamond in the direction DR1 may be smaller than the length e in the other direction DR2. The length d of the diamond in the direction DR1 may be half the length e in the other direction DR2. For example, the length d of the first conductive pattern AP defined as a diamond in the direction DR1 may be approximately or about 260 µm, and the length e in the other direction DR2 may be approximately or about 130 µm. The angle θ1 formed by two vertices facing each other in the direction DR2 may be larger than the angle θ2 formed by two vertices facing each other in the direction DR1.

Each vertex of the diamond may be the intersection where at least two sides intersect. In order to prevent the first conductive pattern AP from being formed or disposed in an inverted taper shape at the intersection due to overetching, a dummy pattern DM may be formed or disposed at the intersection. The minimum distance and the maximum distance of the dummy pattern DM in the direction DR1 may be smaller than the minimum distance and the maximum distance of the dummy pattern DM in the other direction DR2. For example, the minimum distance of the dummy pattern DM in the direction DR1 may be approximately or about 9.25 µm, and the maximum distance may be approximately or about 11 µm. The minimum distance of the dummy pattern DM may be approximately or about 13.5 µm, and the maximum distance may be approximately or about 15.5 µm in the direction DR2.

Figure 25:
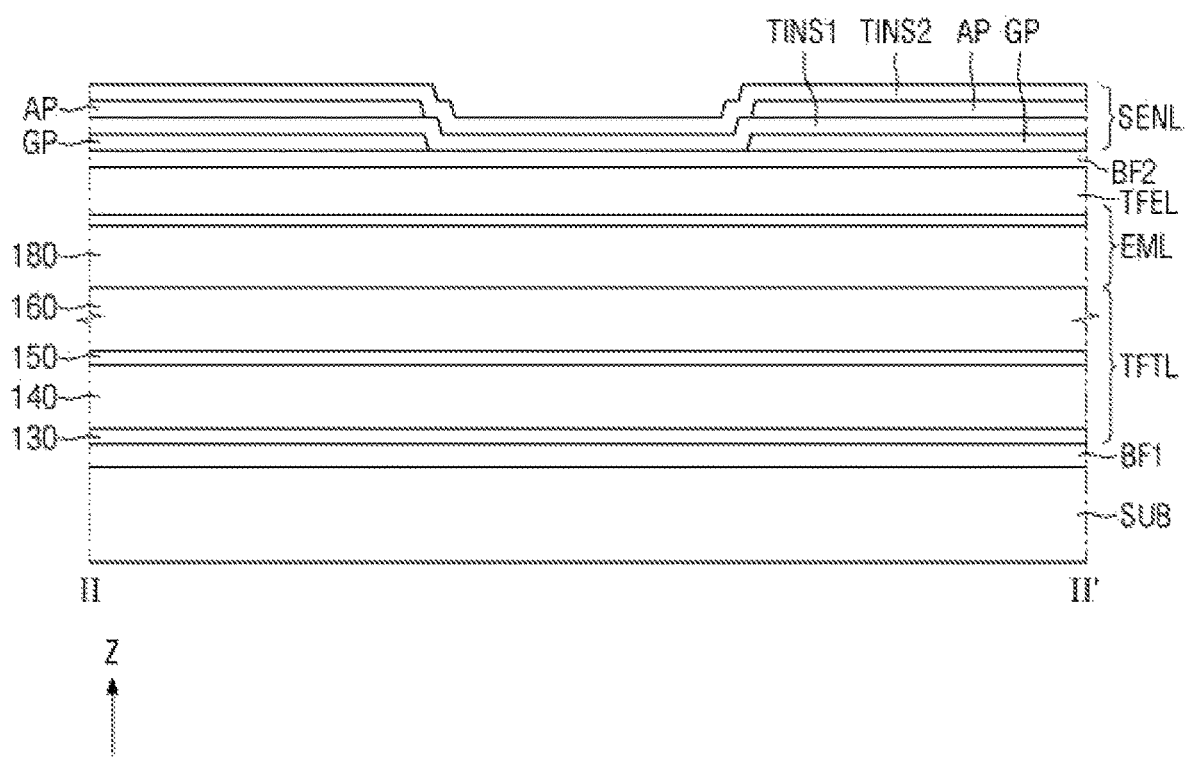
FIG. 25 is a schematic cross-sectional view taken along line II-II' of FIG. 24.

FIG. 25 is a schematic cross-sectional view taken along line II-II' of FIG. 24.

Referring to FIG. 25, the first conductive pattern AP may be disposed on the first sensor insulating layer TINS1. The first conductive pattern AP may be made of the same or similar material on a same layer as the driving electrodes TE, the sensing electrodes RE and the dummy patterns DE. The first conductive pattern AP may be made of the same or similar material on the same or similar material as the first driving lines TL1, the second driving lines TL2, the sensing lines RL, the guard lines GL1, GL2, GL3, GL4 and GL5, and the ground lines GRL1, GRL2, GRL3 and GRL4.

In order for the patch antenna to emit electromagnetic waves, a second conductive pattern GP overlapping the first conductive pattern AP in the third direction (z-axis direction) is required. It is, however, to be noted that when the first sensor insulating layer TINS1 between the first conductive pattern AP and the second conductive pattern GP is made of a material having a low dielectric constant, the second conductive pattern GP may be eliminated. The second conductive pattern GP may be disposed on the second buffer layer BF2. The second conductive pattern GP may be made of the same or similar material on a same layer as the first connection units BE1.

When the first conductive pattern AP is formed in a substantially loop shape or a substantially coil shape to be utilized as an antenna for an RFID tag for near field communications, by forming or disposing the second conductive pattern GP overlapping the first conductive pattern AP, it is possible to reduce or prevent the first electrode 171 and the second electrode 173 of the display layer DISL from being affected by electromagnetic waves emitted from the first conductive pattern AP.

As shown in FIG. 25, when the first conductive pattern AP is disposed on the first sensor insulating layer TINS1 and the second conductive pattern GP is disposed on the second buffer layer BF2, the first conductive pattern of the antenna area APA may be formed without any additional process.

When the first conductive pattern AP overlaps the first ground line GRL1 and the third ground line GRL3 in the antenna area APA, the first ground line GRL1 and the third ground line GRL3 disposed in the antenna area APA may be disposed on the second buffer layer BF2, and the first ground line GRL1 and the third ground line GRL3 disposed in the area other than the antenna area APA may be disposed on the first sensor insulating layer TINS1. The second conductive pattern GP may be connected to at least one of the first ground line GRL1 and the third ground line GRL3.

Figure 26:
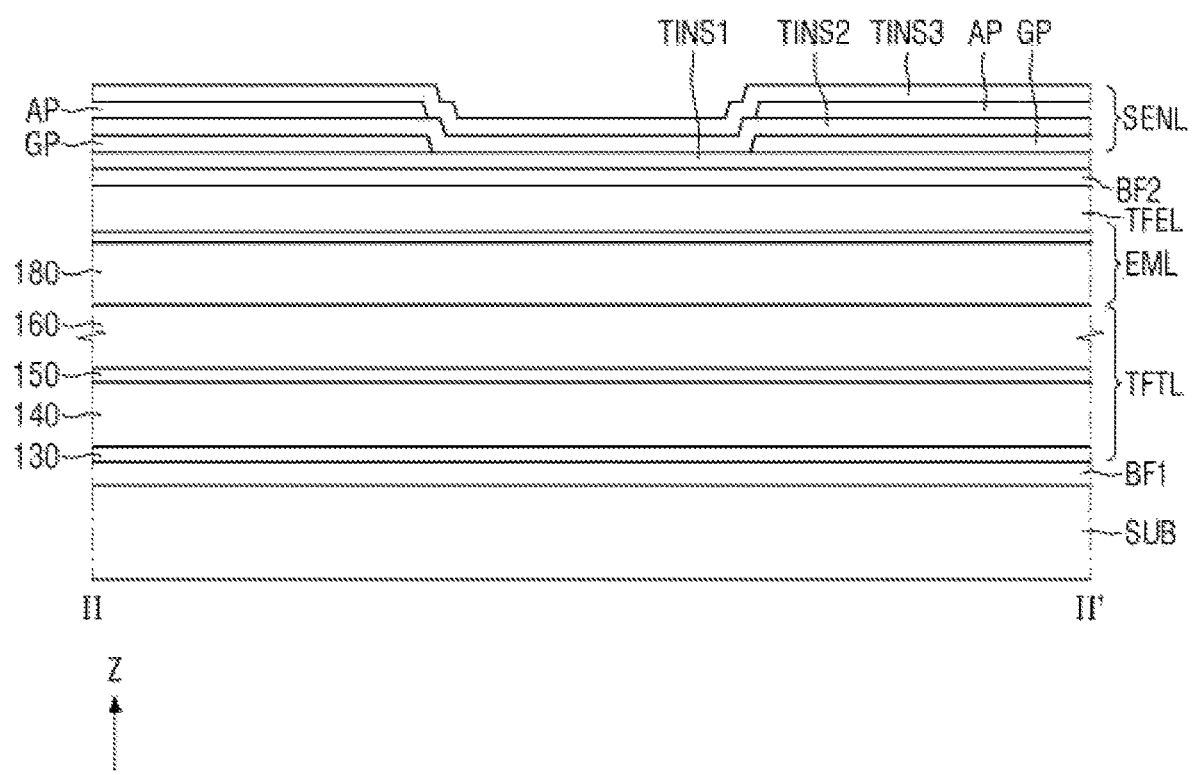
FIG. 26 is a schematic cross-sectional view taken along line II-II' of FIG. 24.

FIG. 26 is a schematic cross-sectional view taken along line II-II' of FIG. 24.

Referring to FIG. 26, the first conductive pattern AP may be disposed on the second sensor insulating layer TINS2.

The second conductive pattern GP overlapping the first conductive pattern AP in the third direction (z-axis direction) may be disposed on the first sensor insulating layer TINS1. The second conductive pattern GP may be made of the same or similar material on a same layer as the driving electrodes TE, the sensing electrodes RE and the dummy patterns DE. The second conductive pattern GP may be made of the same or similar material on a same or similar material as the first driving lines TL1, the second driving lines TL2, the sensing lines RL, the guard lines GL1, GL2, GL3, GL4 and GL5, and the ground lines GRL1, GRL2, GRL3 and GRL4.

It is to be noted that the second conductive pattern GP may be eliminated when the first conductive pattern AP overlaps the first ground line GRL1 and the third ground line GRL3 in the antenna area APA.

Figure 27:
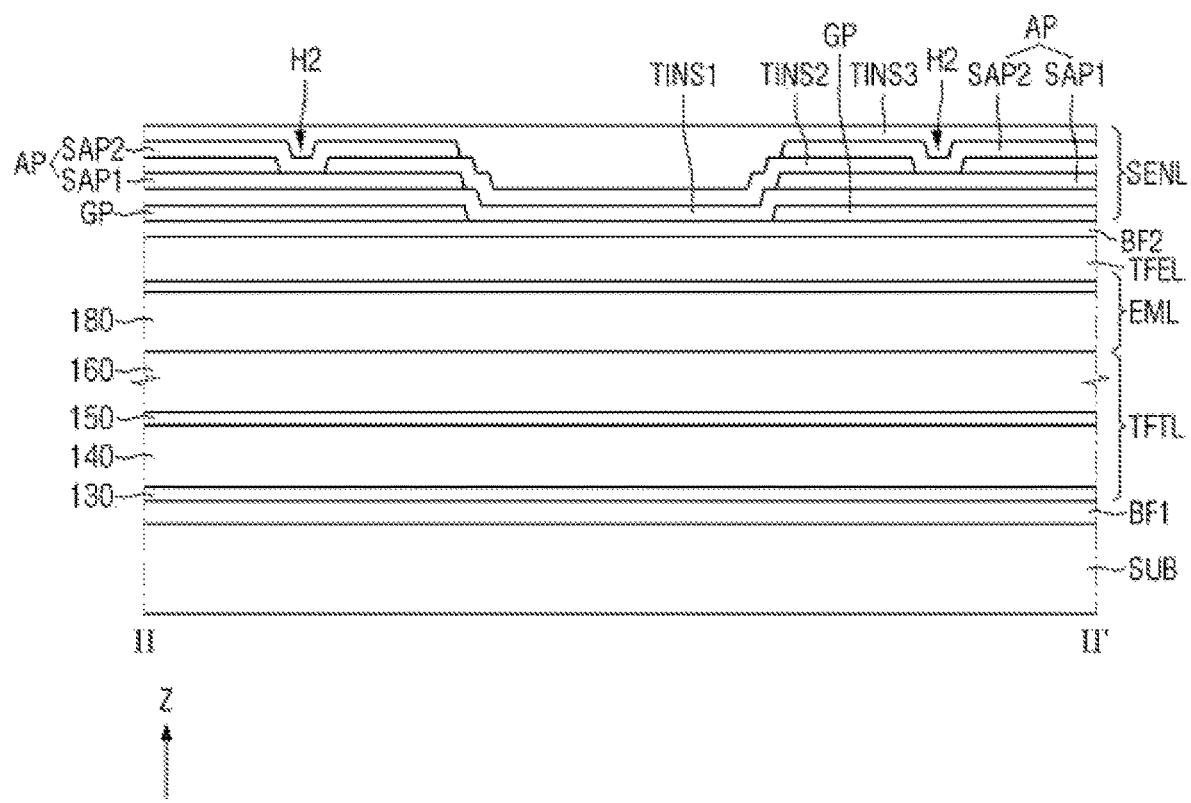
FIG. 27 is a schematic cross-sectional view taken along line II-II' of FIG. 24.

FIG. 27 is a schematic cross-sectional view taken along line II-II' of FIG. 24.

Referring to FIG. 27, the first conductive pattern AP may include a first sub conductive pattern SAP1 and a second sub conductive pattern SAP2.

The first sub conductive pattern SAP1 may be disposed on the first sensor insulating layer TINS1. The first sub conductive pattern SAP1 may be made of the same or similar material on a same layer as the driving electrodes TE, the sensing electrodes RE and the dummy patterns DE. The first conductive pattern SGAP1 may be made of the same or similar material on the same or similar material as the first driving lines TL1, the second driving lines TL2, the sensing lines RL, the guard lines GL1, GL2, GL3, GL4 and GL5, and the ground lines GRL1, GRL2, GRL3 and GRL4.

The second sub conductive pattern SAP2 may be disposed on the second sensor insulating layer TINS2. The second sub conductive pattern SAP2 may be connected to the first sub conductive pattern SAP1 through a second contact hole H2 penetrating through the second sensor insulating layer TINS2 to expose the first sub conductive pattern SAP1.

The second conductive pattern GP overlapping the first conductive pattern AP in the third direction (z-axis direction) may be disposed on the second buffer layer BF2. The second conductive pattern GP may be made of the same or similar material on a same layer as the first connection units BE1.

When the first conductive pattern AP overlaps the first ground line GRL1 and the third ground line GRL3 in the antenna area APA, the first ground line GRL1 and the third ground line GRL3 disposed in the antenna area APA may be disposed on the second buffer layer BF2, and the first ground line GRL1 and the third ground line GRL3 disposed in the area other than the antenna area APA may be disposed on the first sensor insulating layer TINS1. The second conductive pattern GP may be connected to at least one of the first ground line GRL1 and the third ground line GRL3.

Figure 28:
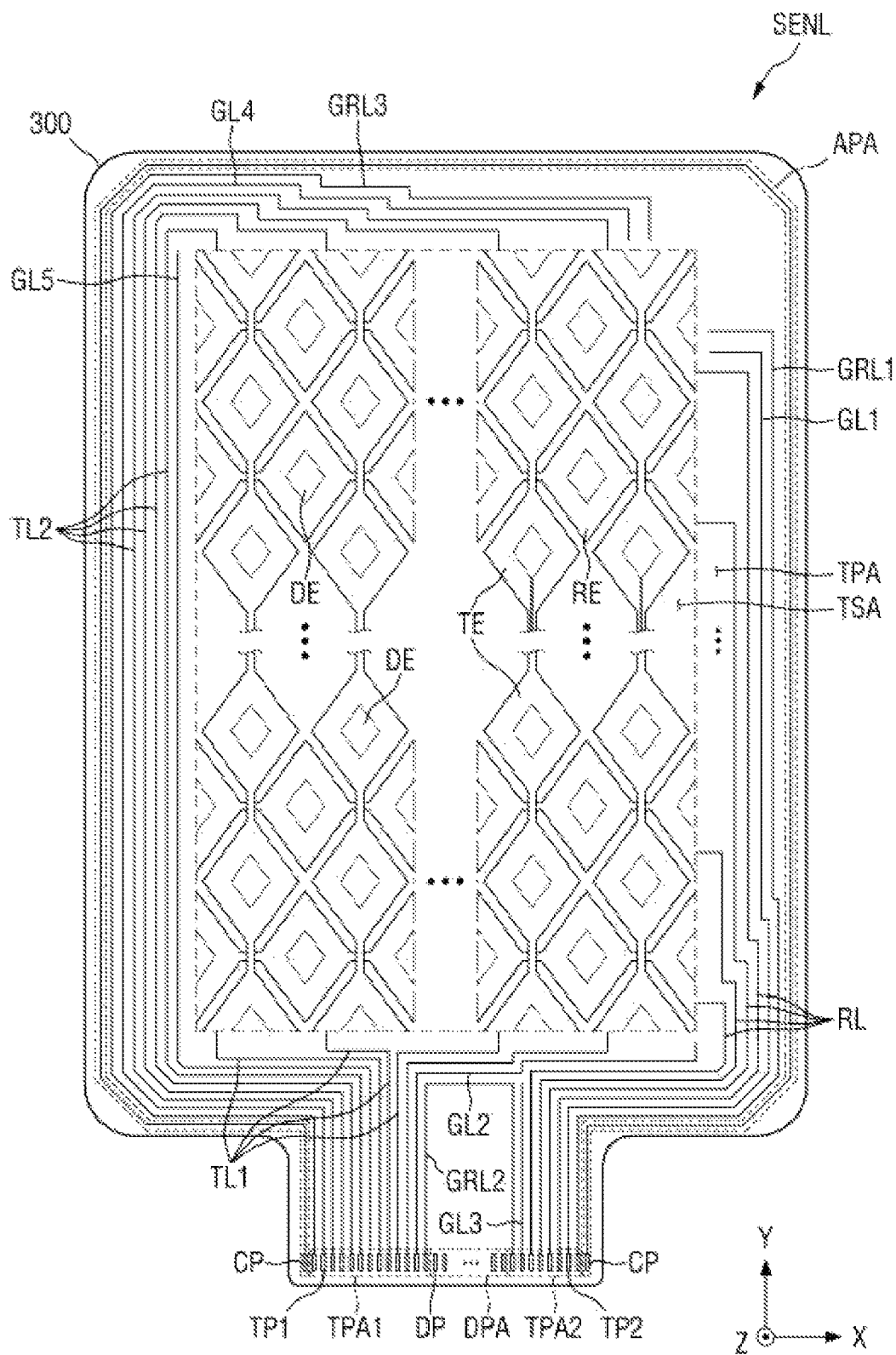
FIG. 28 is a plan view showing a sensor electrode layer of a display panel according to an embodiment.

FIG. 28 is a plan view showing a sensor electrode layer of a display panel according to an embodiment.

An embodiment of FIG. 28 may be different from an embodiment of FIG. 17 in that an antenna area APA may be disposed in a sensor peripheral area TPA on outer sides of the four sides of a sensor area TSA. In FIG. 28, the antenna area APA including the first conductive pattern AP may be disposed in the sensor peripheral area TPA on the upper outer side of the sensor area TSA, in the sensor peripheral area TPA on the right outer side of the sensor area TSA, and at a corner between the upper side and the right side of the display panel 300, as in FIG. 4. In FIG. 28, the first conductive pattern AP of the antenna area APA may be electrically connected to the display circuit board 310 where the radio frequency driver 350 may be disposed, as in FIG. 8.

Referring to FIG. 28, a first conductive pattern AP of the antenna area APA may be disposed in the sensor peripheral area TPA on the upper outer side, the left outer side, the right outer side and the lower outer side of the sensor area TSA. The first conductive pattern AP of the antenna area APA may be disposed to surround the upper side, the left side and the right side of the sensor area TSA except for the lower side.

Alternatively, the first conductive pattern AP of the antenna area APA may be disposed to surround the four sides of the sensor area TSA. When the first conductive pattern AP of the antenna area APA is disposed to surround the four sides of the sensor area TSA, it may overlap the first driving lines TL1, the second driving lines TL2 and the sensing lines RL on the lower side of the sensor area TSA. In such case, in order to reduce the influence on the first driving lines TL1, the second driving lines TL2 and the sensing lines RL by electromagnetic waves from the first conductive pattern of the antenna area APA, additional guard lines may be disposed between the first conductive pattern and the first driving line TL1, between the first conductive pattern and the second driving line TL2, and between the first conductive pattern and the sensing line RL in the third direction (z-axis direction).

Alternatively, the first conductive pattern AP of the antenna area APA may overlap the first ground line GRL1, the third ground line GRL3, the first guard line GL1 and the fourth guard line GL4 in the third direction (z-axis direction). Alternatively, the first conductive pattern AP of the antenna area APA may be disposed to overlap the first ground line GRL1 and the third ground line GRL3 in the third direction (z-axis direction).

The first conductive pattern AP of the antenna area APA may include conductive pads CP disposed adjacent to the sensor pads TP1 and TP2 on one side of the display panel 300 in order to be electrically connected to the display circuit board 310 on which the radio frequency driver 350 is disposed. One of the conductive pads CP may be disposed on the left outer side of the first sensor pad area TPA1 in which the first sensor pads TP1 are disposed, and another one may be disposed on the right outer side of the second sensor pad area TPA2 in which the second sensor pads TP2 are disposed. The conductive pads CP may be electrically connected to the display circuit board 310 by an anisotropic conductive film.

The first conductive pattern AP of the antenna area APA may be formed in a substantially loop shape or a substantially coil shape, in which case the first antenna of the antenna area APA may be an antenna for an RFID tag, so that it may be utilized as an antenna for near field communications. Alternatively, the first conductive pattern AP of the antenna area APA may be a quadrangular patch, in which case the first antenna of the antenna area APA may be a patch antenna, so that it may be utilized as an antenna for mobile communications.

The schematic cross-sectional structure of the antenna area APA shown in FIG. 28 may be substantially identical to that shown in FIGS. 25 to 27.

Figure 29:
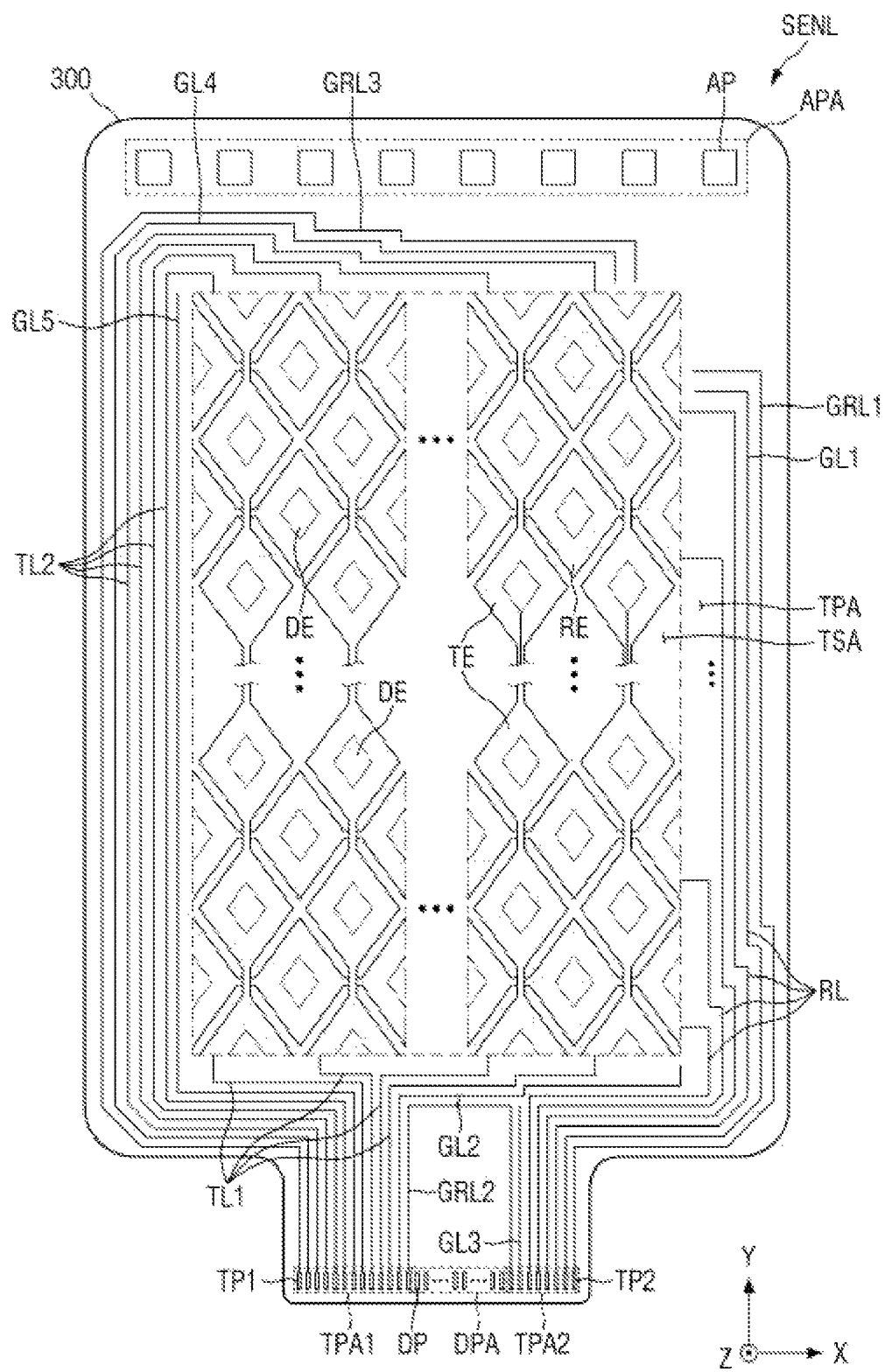
FIG. 29 is a plan view showing a sensor electrode layer of a display panel according to an embodiment.

FIG. 29 is a plan view showing a sensor electrode layer of a display panel according to an embodiment.

An embodiment of FIG. 29 may be different from an embodiment of FIG. 17 in that an antenna area APA may be disposed on an outer side of the ground lines on a side of the display panel 300.

Referring to FIG. 29, the antenna area APA of the display panel 300 may be disposed on the upper side of the display panel 300 on the outer side of the third ground line GRL3, which is the outermost one of the ground lines. In this instance, the antenna area APA may be completely separated spatially so that the antenna area APA does not overlap with the sensor area TSA and the sensor peripheral area TPA in the third direction (z-axis direction). The third ground line GRL3 may be disposed between the antenna area APA and the sensor area TSA. Therefore, it is possible to reduce or prevent the sensor electrodes TE and RE of the sensor region TSA from being affected the electromagnetic waves from the first conductive pattern AP of the antenna region APA.

Although the antenna area APA is disposed on the upper side end of the display panel in the example shown in FIG. 29, the disclosure is not limited thereto. For example, the antenna area APA may be disposed on the right side of the display panel 300 on the outer side of the first ground line GRL1, which is the rightmost one of the ground lines. Alternatively, the antenna area APA may be disposed on the left side of the display panel 300 on the outer side of the third ground line GRL3, which is the leftmost one of the ground lines.

Although FIG. 29 shows first conductive patterns AP formed as eight square patches, the number of the first conductive patterns AP is not limited eight. In FIG. 29, the second flexible film 360 where the radio frequency driver 350 electrically connected to the first conductive pattern AP of the antenna area APA is disposed may be disposed on the upper side of the display panel 300, as in FIG. 6.

The first conductive pattern AP of the antenna area APA may be a quadrangular patch, in which case the first antenna of the antenna area APA may be a patch antenna, so that it may be utilized as an antenna for mobile communications. Alternatively, the first conductive pattern of the antenna area APA may be formed in a substantially loop shape or a substantially coil shape, in which case the first antenna of the antenna area APA may be an antenna for an RFID tag, so that it may be utilized as an antenna for near field communications.

The schematic cross-sectional structure of the antenna area APA shown in FIG. 29 may be substantially identical to that shown in FIGS. 25 to 27.

Figure 30:
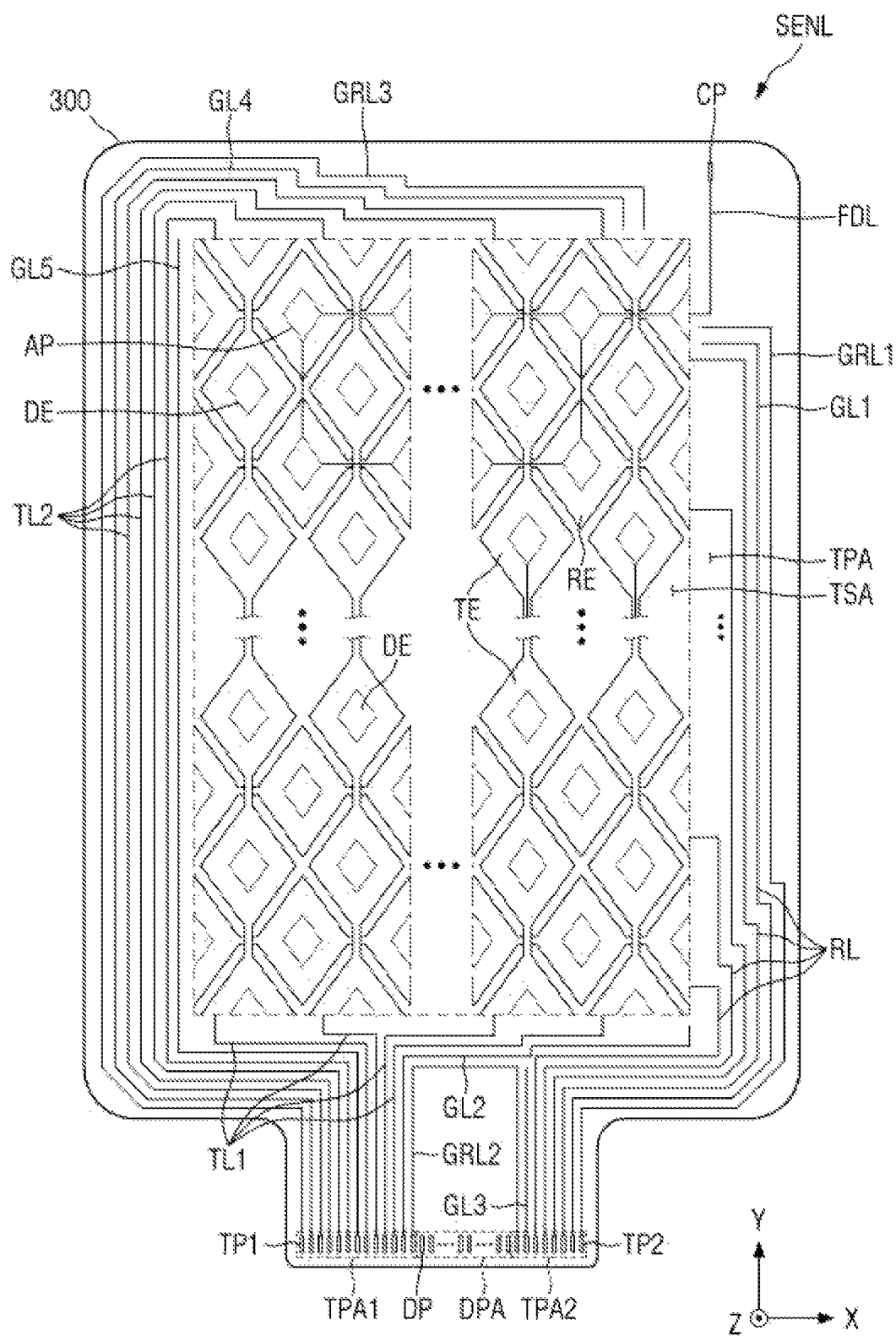
FIG. 30 is a plan view showing a sensor electrode layer of a display panel according to an embodiment.

FIG. 30 is a plan view showing a sensor electrode layer of a display panel according to an embodiment.

An embodiment of FIG. 30 may be different from an embodiment of FIG. 17 in that first conductive patterns AP of an antenna area APA may be disposed in a sensor area TSA.

Referring to FIG. 30, the first conductive patterns AP may be electrically separated from driving electrodes TE, sensing electrodes RE and dummy patterns DE. The driving electrodes TE, the sensing electrodes RE, the dummy patterns DE and the first conductive patterns AP may be spaced apart from one another.

Some of the sensing electrodes RE may be disposed closer to the first conductive pattern AP than the dummy pattern DE, and the others of the sensing electrodes RE may be disposed closer to the dummy pattern DE than the first conductive pattern AP. Each of the first conductive patterns AP and the dummy patterns DE may be disposed to be surrounded by the sensing electrode RE.

Although each of the first conductive patterns AP is surrounded by the sensing electrode RE in the example shown in FIG. 30, the disclosure is not limited thereto. Each of the first conductive patterns AP may be surrounded by the driving electrode TE instead of the sensing electrode RE.

The first conductive patterns AP adjacent to one another in the first direction (x-axis direction) may be connected to one another through third connection units BE3. The first conductive patterns AP adjacent to one another in the second direction (y-axis direction) may be connected to one another through fourth connection units BE4.

Figure 31:
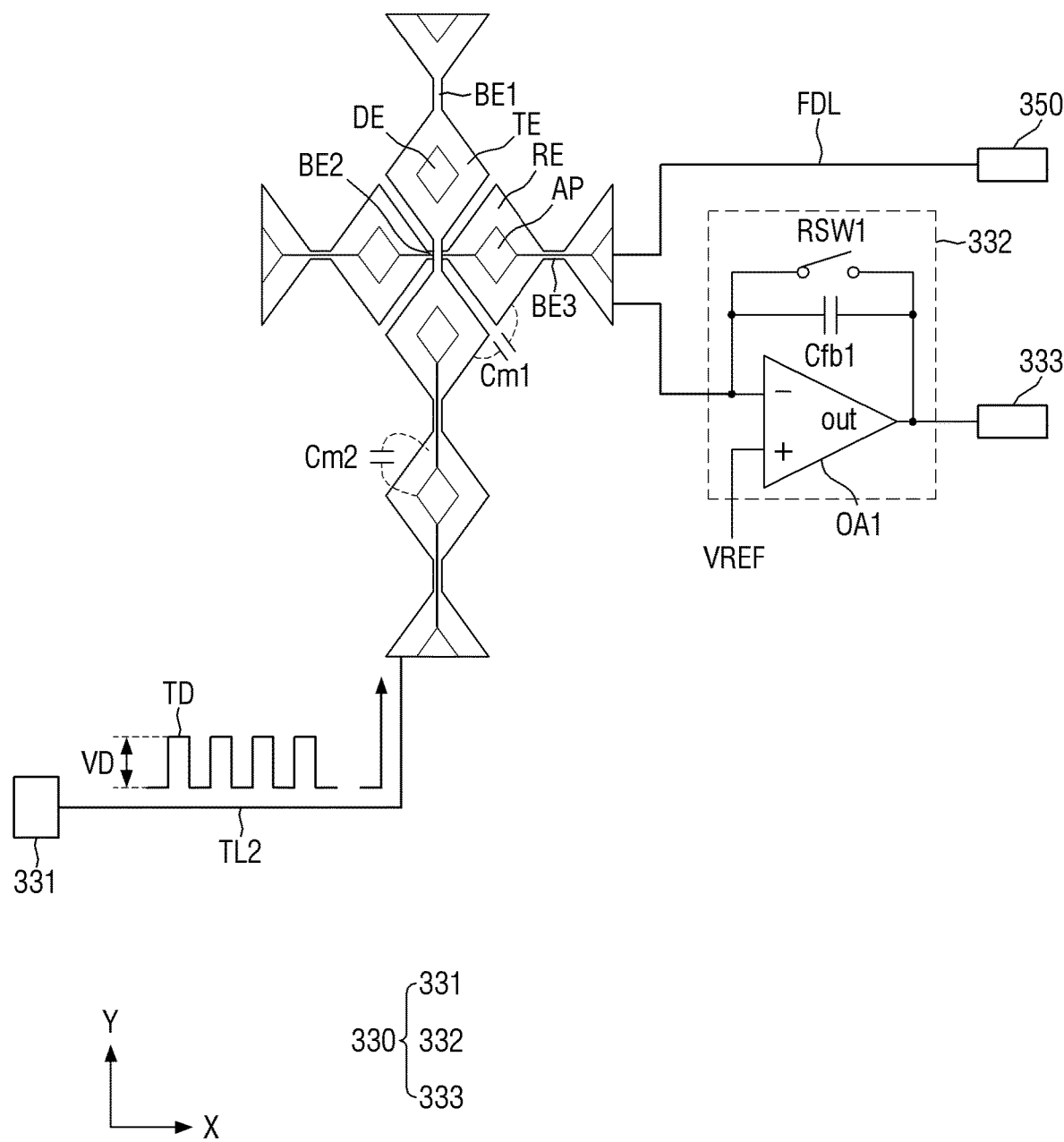
FIG. 31 is a view showing an example of a sensor driver connected to sensor electrodes and a radio frequency driver connected to a first conductive pattern.

In FIG. 30, the second flexible film 360 where the radio frequency driver 350 electrically connected to the first conductive pattern AP of the antenna area APA is disposed may be disposed on the upper side of the display panel 300, as in FIG. 6. The first conductive patterns AP may be connected to the conductive pads CP via the feeding line FDL of the sensor peripheral area TPA, and the second flexible film 360 may be electrically connected to the conductive pads CP via the anisotropic conductive film. Therefore, the first conductive patterns AP may be electrically connected to the radio frequency driver 350 as shown in FIG. 31.

As shown in FIG. 30, the first conductive patterns AP may be formed instead of the dummy patterns DE for reducing parasitic capacitance between the second electrode of the emission material layer EML and the driving electrode TE or the sensing electrode RE. Therefore, the first conductive patterns AP may be formed or disposed in the sensor area TSA without any additional process.

Figure 32:
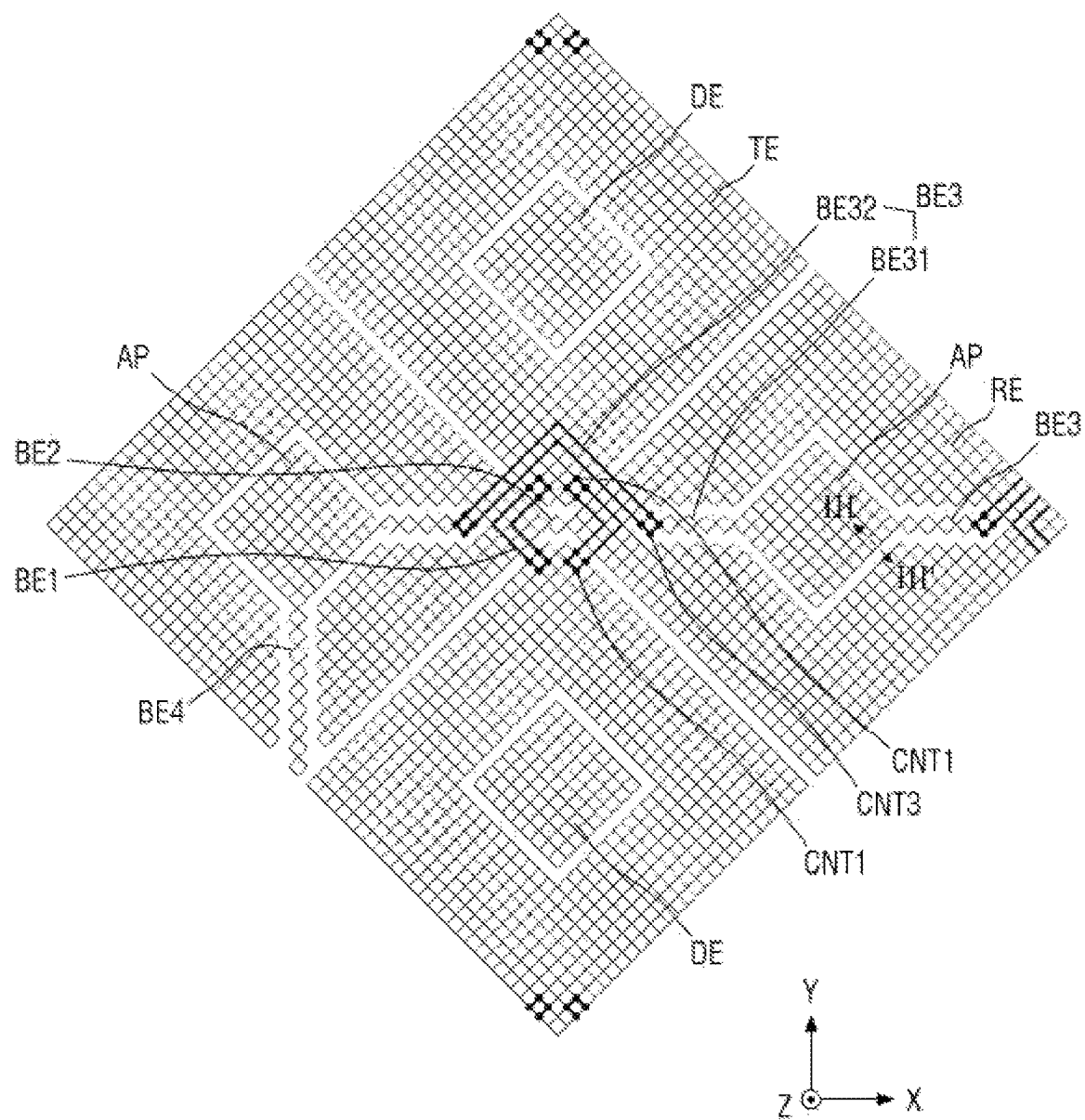
FIG. 32 is an enlarged plan view showing sensor electrodes and a first conductive pattern of FIG. 30.

FIG. 32 is an enlarged plan view showing sensor electrodes and a first conductive pattern of FIG. 30. For convenience of illustration, FIG. 32 shows only two sensing electrodes RE adjacent to each other in the first direction (x-axis direction) and two driving electrodes TE adjacent to each other in the second direction (y-axis direction). However, the disclosure is not limited thereto.

An embodiment of FIG. 32 may be different from an embodiment of FIG. 19 in that a first conductive pattern AP may be surrounded by the sensing electrode RE, and that a third connection unit BE3 for electrically connecting between first conductive patterns AP adjacent to one another in the first direction (x-axis direction) and a fourth connection unit BE4 for electrically connecting between first conductive patterns AP adjacent to one another in the second direction (y-axis direction) may be formed, instead of the dummy pattern DE.

Referring to FIG. 32, each of the first conductive patterns AP may have, but is not limited to, a substantially rectangular shape when viewed from the top. The first conductive patterns AP, the third connection units BE3 and the fourth connection units BE4 may be formed in a substantially mesh topology when viewed from the top.

The first conductive patterns AP may be surrounded by the sensing electrodes RE, respectively. The driving electrodes TE, the sensing electrodes RE, the dummy patterns DE and the first conductive patterns AP may be electrically spaced apart from one another. The driving electrodes TE, the sensing electrodes RE, the dummy patterns DE and the first conductive patterns AP may be spaced apart from one another.

The first conductive patterns AP adjacent to one another in the first direction (x-axis direction) may be connected to one another through third connection units BE3. The third connection unit BE3 may include a first sub connection unit BE31 and a second sub connection unit BE32 in order to be electrically separated from the sensing electrodes RE and the driving electrodes TE.

The first sub connection unit BE31 may be disposed on a same layer as the driving electrodes TE, the sensing electrodes RE, and the dummy patterns DE. The first sub connection unit BE31 may be electrically separated from the driving electrodes TE, the sensing electrodes RE, and the dummy patterns DE. The first sub connection unit BE31 may be spaced apart from the driving electrodes TE, the sensing electrodes RE, and the dummy patterns DE.

The second sub connection unit BE32 may be formed or disposed on a different layer from the driving electrodes TE and the sensing electrodes RE, and may be connected to the first sub connection unit BE31 through a third contact holes CNT3. For example, the first sub connection unit BE31 may be disposed on the first sensor insulating layer TINS1 shown in FIG. 21, and the second sub connection unit BE32 may be disposed on the second buffer layer BF2 shown in FIG. 21. The second sub connection unit BE32 may overlap the driving electrode TE and the sensing electrode RE in the third direction (z-axis direction).

The second sub connection unit BE32 may be bent at least once. In FIG. 30, the second sub connection unit BE32 is bent in the shape of angle brackets, for example, "<" or ">", but the shape of the second connection unit BE32 is not limited thereto.

The first conductive patterns AP adjacent to one another in the second direction (y-axis direction) may be connected to one another through the fourth connection units BE4. The fourth connection unit BE4 may be disposed on a same layer as the driving electrodes TE, the sensing electrodes RE, and the dummy patterns DE. The fourth connection unit BE4 may be electrically separated from the driving electrodes TE, the sensing electrodes RE, and the dummy patterns DE. The fourth connection unit BE4 may be spaced apart from the driving electrodes TE, the sensing electrodes RE, and the dummy patterns DE.

As shown in FIG. 32, the first conductive patterns AP adjacent to one another in the first direction (x-axis direction) may be electrically connected through the third connection units BE3 and the first conductive patterns AP adjacent to one another in the second direction (y-axis direction) may be electrically connected through the fourth connection units BE3, so that the first conductive patterns AP may be electrically separated from the driving electrodes TE and the sensing electrodes RE.

Figure 33:
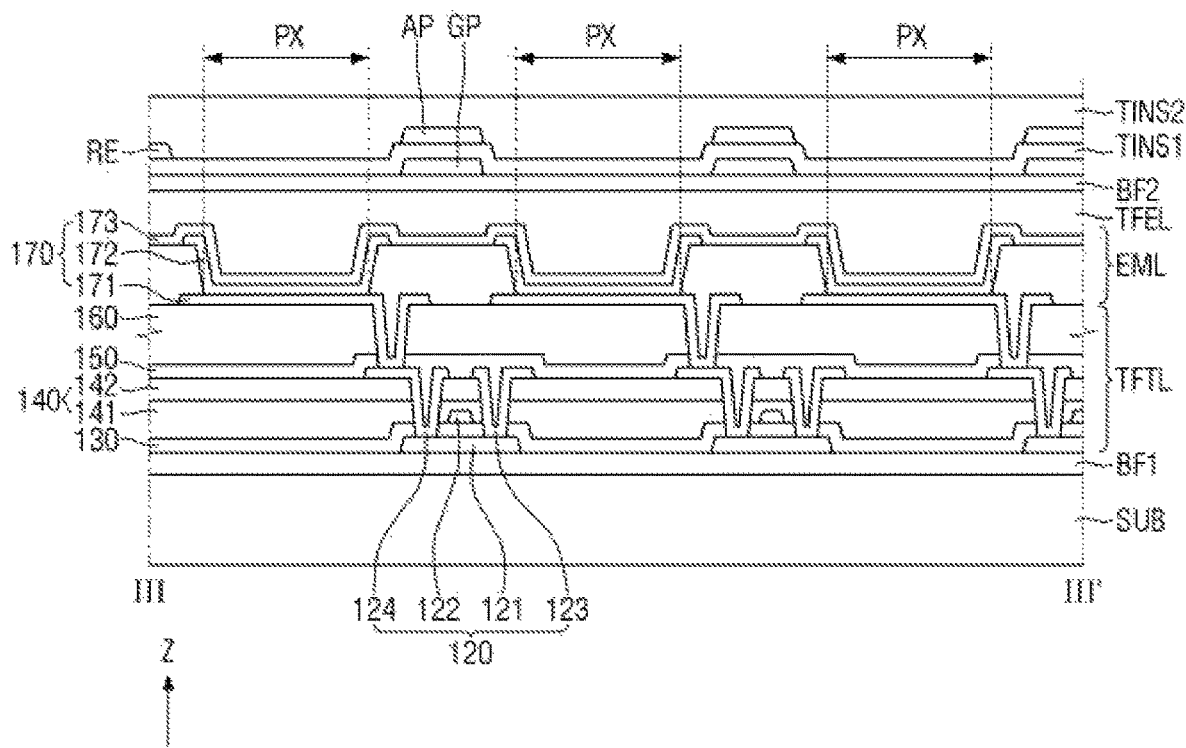
FIG. 33 is a schematic cross-sectional view taken along line III-III' of FIG. 32.

FIG. 33 is a schematic cross-sectional view taken along line III-III' of FIG. 32.

Referring to FIG. 33, the first conductive pattern AP may be disposed on the first sensor insulating layer TINS1. The first conductive pattern AP may be made of the same or similar material on a same layer as the driving electrodes TE, the sensing electrodes RE and the dummy patterns DE. The first conductive pattern AP may be made of the same or similar material on the same or similar material as the first driving lines TL1, the second driving lines TL2, the sensing lines RL, the guard lines GL1, GL2, GL3, GL4 and GL5, and the ground lines GRL1, GRL2, GRL3 and GRL4.

The second conductive pattern GP may be disposed on the second buffer layer BF2. The second conductive pattern GP may be made of the same or similar material on a same layer as the first connection units BE1. The second conductive pattern GP may be disposed to overlap the first conductive pattern AP in the third direction (z-axis direction).

Each of the first conductive patterns AP may be formed in a substantially loop shape, a substantially coil shape, or as a rectangular patch. When each of the first conductive patterns AP is formed in a substantially loop shape or a substantially coil shape, it may be utilized as an antenna for an RFID tag for near field communications. Alternatively, when each of the first conductive patterns AP may be a quadrangular patch, it may be utilized as a patch antenna for mobile communications.

Figure 34:
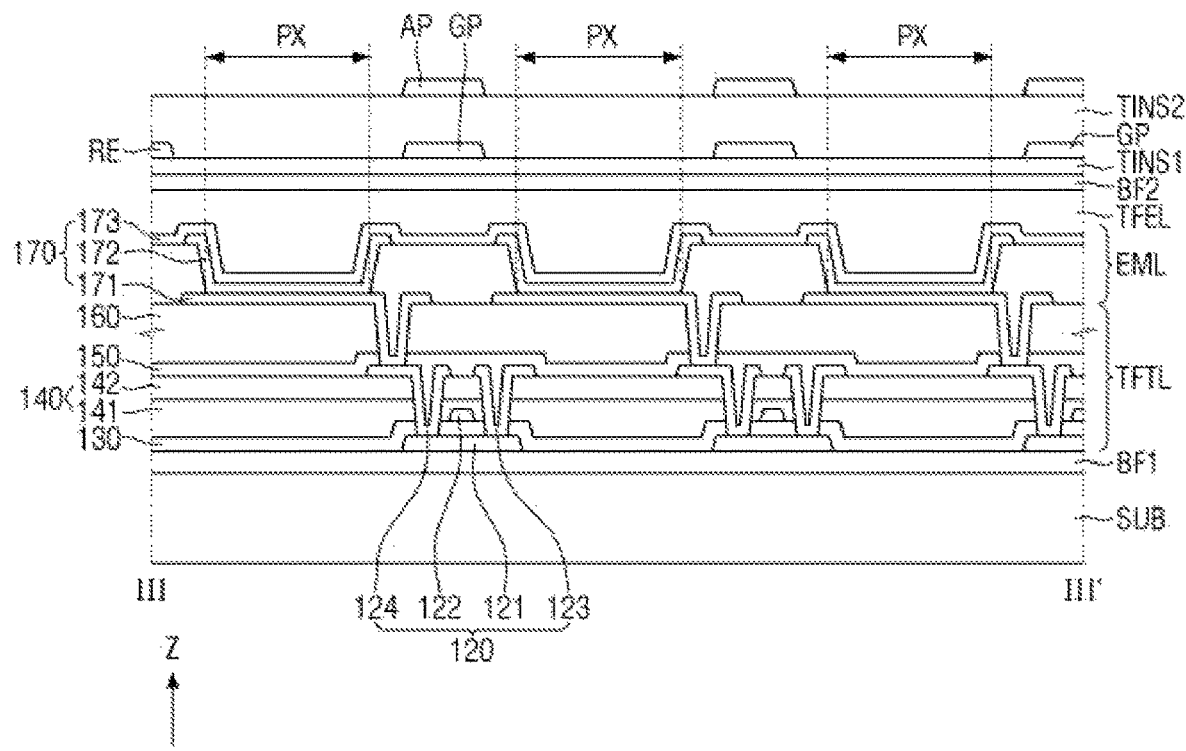
FIG. 34 is a schematic cross-sectional view taken along line III-III' of FIG. 32.

FIG. 34 is a schematic cross-sectional view taken along line III-III' of FIG. 32;

Referring to FIG. 34, the first conductive pattern AP may be disposed on the second sensor insulating layer TINS2. In order to reduce the influence on the driving electrodes TE and the sensing electrodes RE by electromagnetic waves from the first conductive pattern AP, the minimum distance between the first conductive pattern AP and the sensing electrode RE and the minimum distance between the first conductive pattern AP and the driving electrode TE may be 200 μm or more. To this end, the thickness of the second sensor insulating layer TINS2 may be 200 μm or more.

The second conductive pattern GP may be disposed on the first sensor insulating layer TNIS1. The second conductive pattern GP may be made of the same or similar material on a same layer as the driving electrodes TE, the sensing electrodes RE and the dummy patterns DE. The second conductive pattern GP may be made of the same or similar material on the same or similar material as the first driving lines TL1, the second driving lines TL2, the sensing lines RL, the guard lines GL1, GL2, GL3, GL4 and GL5, and the ground lines GRL1, GRL2, GRL3 and GRL4. The second conductive pattern GP may be disposed to overlap the first conductive pattern AP in the third direction (z-axis direction).

Each of the first conductive patterns AP may be formed in a substantially loop shape, a substantially coil shape, or as a rectangular patch. When each of the first conductive patterns AP is formed in a substantially loop shape or a substantially coil shape, it may be used as an antenna for an RFID tag for near field communications. Alternatively, when each of the first conductive patterns AP may be a quadrangular patch, it may be utilized as a patch antenna for mobile communications.

Figure 35:
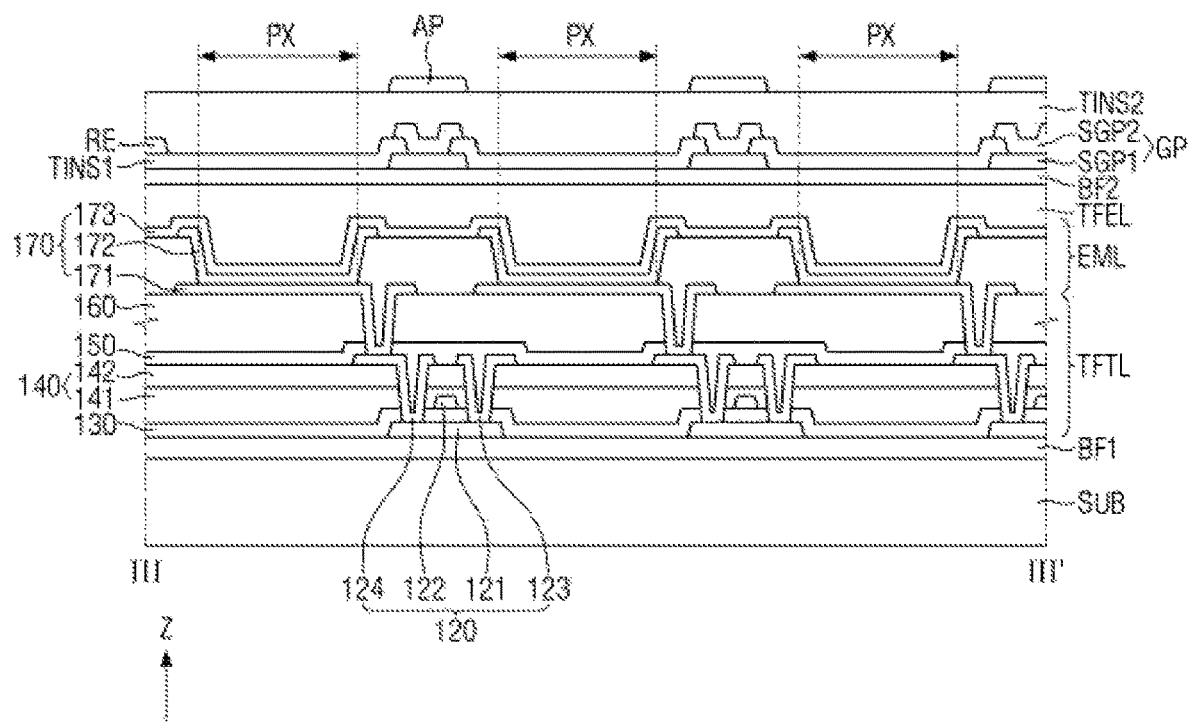
FIG. 35 is a schematic cross-sectional view taken along line III-III' of FIG. 32.

FIG. 35 is a schematic cross-sectional view taken along line III-III' of FIG. 32.

An embodiment of FIG. 35 may be different from an embodiment of FIG. 34 in that a second conductive pattern GP may be made up of two layers.

The second conductive pattern GP may include a first sub conductive pattern SGP1 and a second sub conductive pattern SGP2. The first sub conductive pattern SGP1 may be disposed on a second buffer layer BF2. The first sub conductive pattern SGP1 may be made of the same or similar material on a same layer as the first connection units BEL The second sub conductive pattern SGP2 may be disposed on the first sensor insulating layer TINS1. The second sub conductive pattern SGP2 may be made of the same or similar material on a same layer as the driving electrodes TE, the sensing electrodes RE and the dummy patterns DE. The second sub conductive pattern SGP2 may be made of the same or similar material on a same material as the first driving lines TL1, the second driving lines TL2, the sensing lines RL, the guard lines GL1, GL2, GL3, GL4 and GL5, and the ground lines GRL1, GRL2, GRL3 and GRL4. The second sub conductive pattern SGP2 may be connected to the first sub conductive pattern SGP1 through a contact hole penetrating the first sensor insulating layer TINS1.

Figure 36:
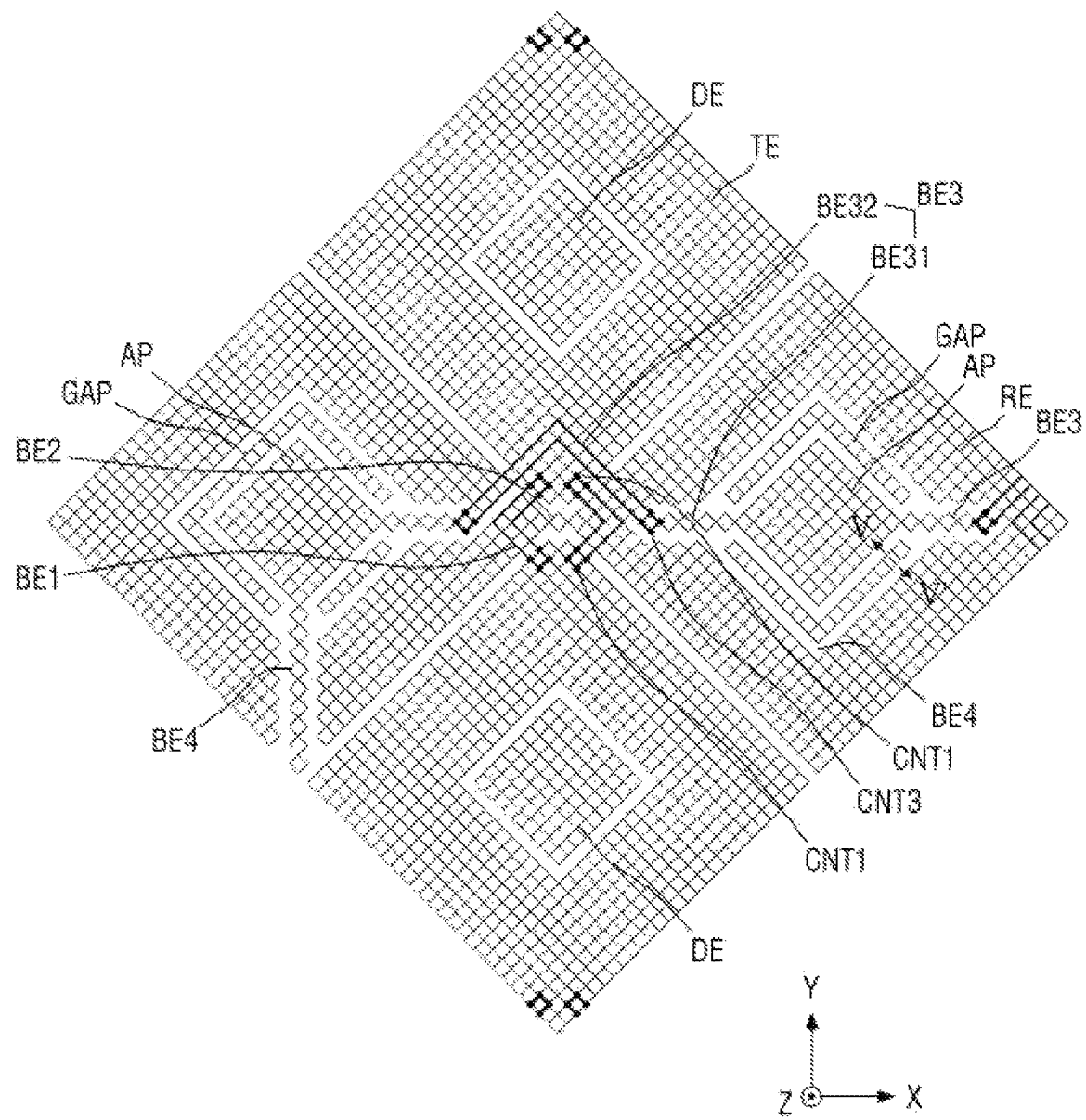
FIG. 36 is an enlarged plan view showing first conductive patterns and sensor electrodes of FIG. 30.

FIG. 36 is an enlarged plan view showing first conductive patterns and sensor electrodes of FIG. 30.

An embodiment of FIG. 36 may be different from an embodiment of FIG. 32 in that a guard pattern GAP may be disposed between a sensing electrode RE and a first conductive pattern AP.

Referring to FIG. 36, the guard pattern GAP may be disposed to surround the first conductive pattern AP. The guard pattern GAP may be spaced apart from a first sub connection unit BE31 of a third connection unit BE3. The guard pattern GAP may be electrically floated or may be connected to at least one of the ground lines GRL1 to GRL3 in the sensor peripheral area TPA to receive a ground voltage.

As the guard pattern GAP is disposed between the sensing electrode RE and the first conductive pattern AP as shown in FIG. 36, it is possible to block the influence on the driving electrodes TE and the sensing electrodes RE by electromagnetic waves from the first conductive pattern AP.

Figure 37:
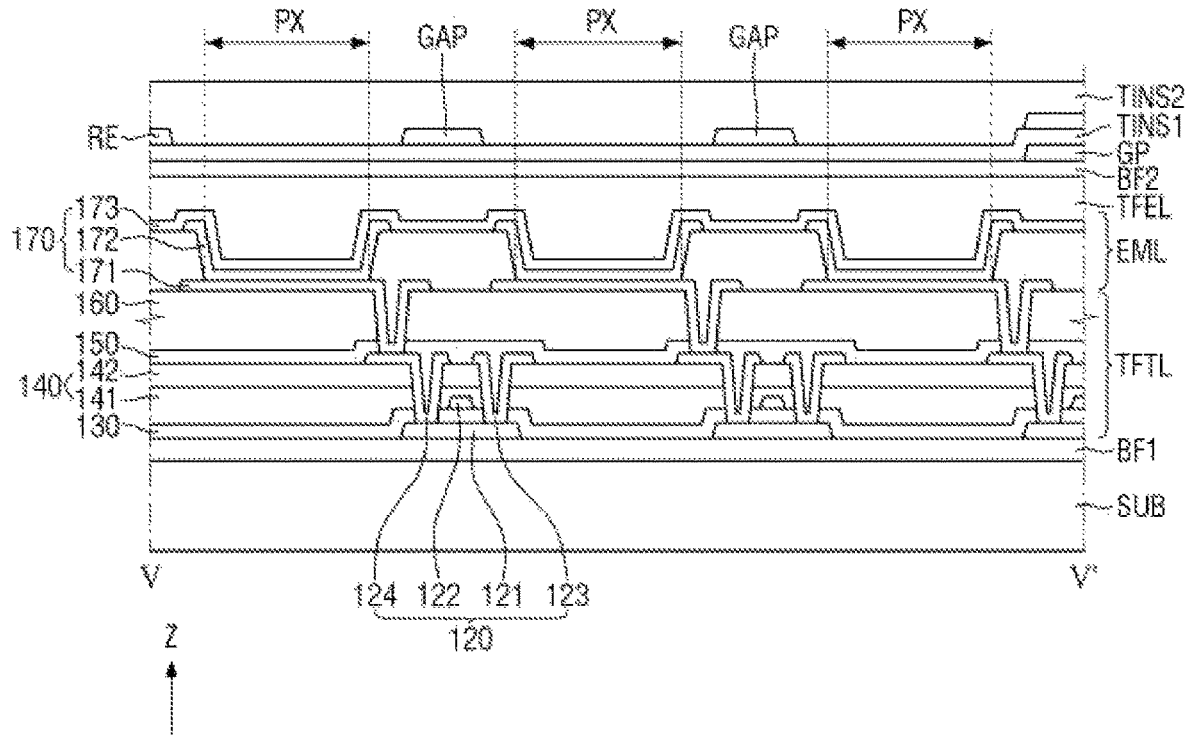
FIG. 37 is a schematic cross-sectional view taken along line V-V' of FIG. 36.

FIG. 37 is a schematic cross-sectional view taken along line V-V' of FIG. 36.

Referring to FIG. 37, the first conductive pattern AP and the guard pattern GAP may be disposed on the first sensor insulating layer TINS1. The first conductive pattern AP and the guard pattern GAP may be made of the same or similar material on a same layer as the driving electrodes TE, the sensing electrodes RE and the dummy patterns DE. The first conductive pattern AP may be made of the same or similar material on a same or similar material as the first driving lines TL1, the second driving lines TL2, the sensing lines RL, the guard lines GL1, GL2, GL3, GL4 and GL5, and the ground lines GRL1, GRL2, GRL3 and GRL4.

The second conductive pattern GP may be disposed on the second buffer layer BF2. The second conductive pattern GP may be made of the same or similar material on a same layer as the first connection units BE1. The second conductive pattern GP may be disposed to overlap the first conductive pattern AP in the third direction (z-axis direction).

Each of the first conductive patterns AP may be formed in a substantially loop shape, a substantially coil shape, or as a rectangular patch. When each of the first conductive patterns AP is formed in a substantially loop shape or a substantially coil shape, it may be used as an antenna for an RFID tag for near field communications. Alternatively, when each of the first conductive patterns AP may be a quadrangular patch, it may be utilized as a patch antenna for mobile communications.

Figure 38:
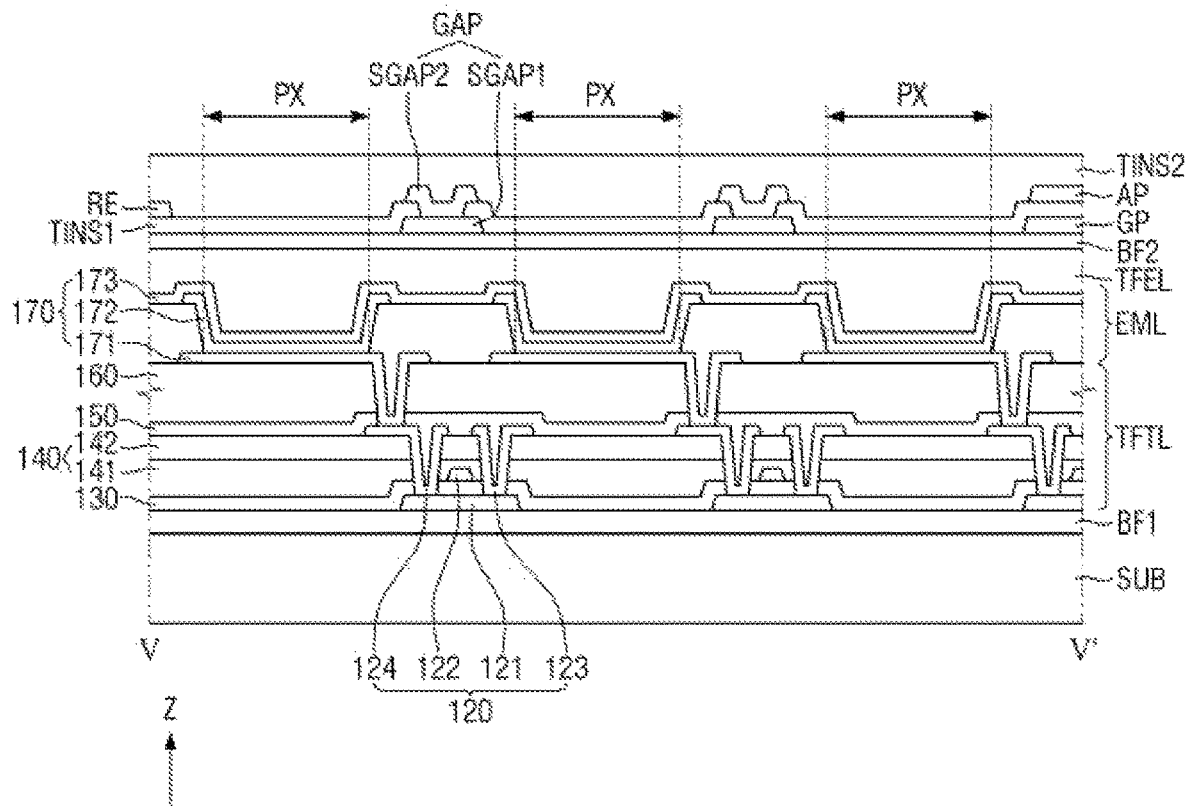
FIG. 38 is a schematic cross-sectional view taken along line V-V' of FIG. 34.

FIG. 38 is a schematic cross-sectional view taken along line V-V' of FIG. 36.

An embodiment of FIG. 38 may be different from an embodiment of FIG. 37 in that each of guard patterns GAP may include a first sub guard pattern SGAP1 and a second sub guard pattern SGAP2.

Referring to FIG. 38, the first sub guard pattern SGAP1 may be disposed on a second buffer layer BF2. The first sub guard pattern SGAP1 may be made of the same or similar material on a same layer as the first connection units BE1.

The second sub guard pattern SGAP2 may be disposed on the first sensor insulating layer TINS1. The second sub guard pattern SGAP2 may be made of the same or similar material on a same layer as the driving electrodes TE, the sensing electrodes RE and the dummy patterns DE. The second sub guard pattern SGAP2 may be made of the same or similar material on the same or similar material as the first driving lines TL1, the second driving lines TL2, the sensing lines RL, the guard lines GL1, GL2, GL3, GL4 and GL5, and the ground lines GRL1, GRL2, GRL3 and GRL4. The second sub guard pattern SGAP2 may be connected to the first sub guard pattern SGAP1 through a contact hole penetrating the first sensor insulating layer TINS1.

As shown in FIG. 38, when the guard pattern GAP is made up of the two layers of the first sub guard pattern SGAP1 and the second sub guard pattern SGAP2, it is possible to more effectively block the influence on driving electrodes TE and the sensing electrodes RE by electromagnetic waves from the first conductive pattern AP.

Figure 39:
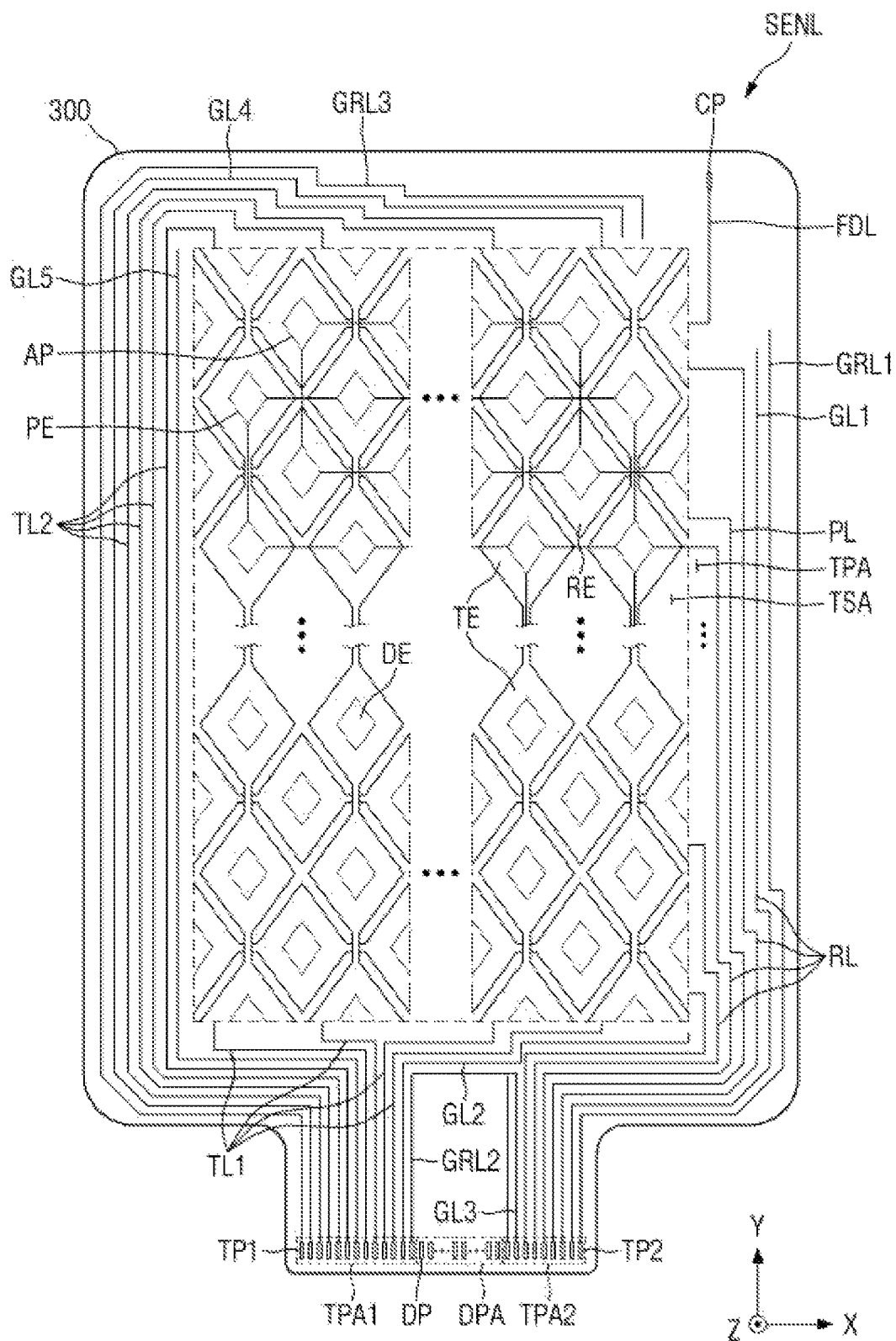
FIG. 39 is a plan view showing a sensor electrode layer of a display panel according to an embodiment.

FIG. 39 is a plan view showing a sensor electrode layer of a display panel according to an embodiment.

An embodiment of FIG. 39 may be different from an embodiment of FIG. 30 in that proximity sensor electrodes PE may be disposed in a sensor area TSA.

Referring to FIG. 39, the proximity sensor electrodes PE may be electrically separated from the driving electrodes TE, the sensing electrodes RE, the dummy patterns DE and the first conductive patterns AP. The driving electrodes TE, the sensing electrodes RE, the dummy patterns DE, the first conductive patterns AP and the proximity sensor electrodes PE may be spaced apart from one another.

Some of the driving electrodes TE may be disposed closer to the proximity sensor electrode PE than the dummy pattern DE, and the others of the driving electrodes TE may be disposed closer to the dummy pattern DE than the proximity sensor electrode PE. Each of the proximity sensor electrodes PE and the dummy patterns DE may be surrounded by the driving electrode TE.

Although each of the first conductive patterns AP is surrounded by the sensing electrode RE and each of the proximity sensor electrodes PE is surrounded by the driving electrode TE in the example shown in FIG. 39, the disclosure is not limited thereto. Each of the first conductive patterns AP may be surrounded by the driving electrode TE, and each of the proximity sensor electrodes PE may be surrounded by the sensing electrode RE.

The proximity sensor electrodes PE adjacent to one another in the first direction (x-axis direction) may be connected through the fifth connection units BE5. The proximity sensor electrodes PE adjacent to one another in the second direction (y-axis direction) may be connected through the sixth connection units BE6. The proximity sensor electrodes PE may be connected to a proximity sensor line PL in the sensor peripheral area TPA as shown in FIG. 39, and thus may be electrically connected to the second sensor detector 332 as shown in FIG. 40.

As shown in FIG. 39, the proximity sensor electrodes PE are formed instead of the dummy patterns DE for reducing parasitic capacitance between the second electrode of the emission material layer EML and the driving electrode TE or the sensing electrode RE. In this manner, the proximity sensor electrodes PE may be formed or disposed in the sensor area TSA without any additional process.

Figure 40:
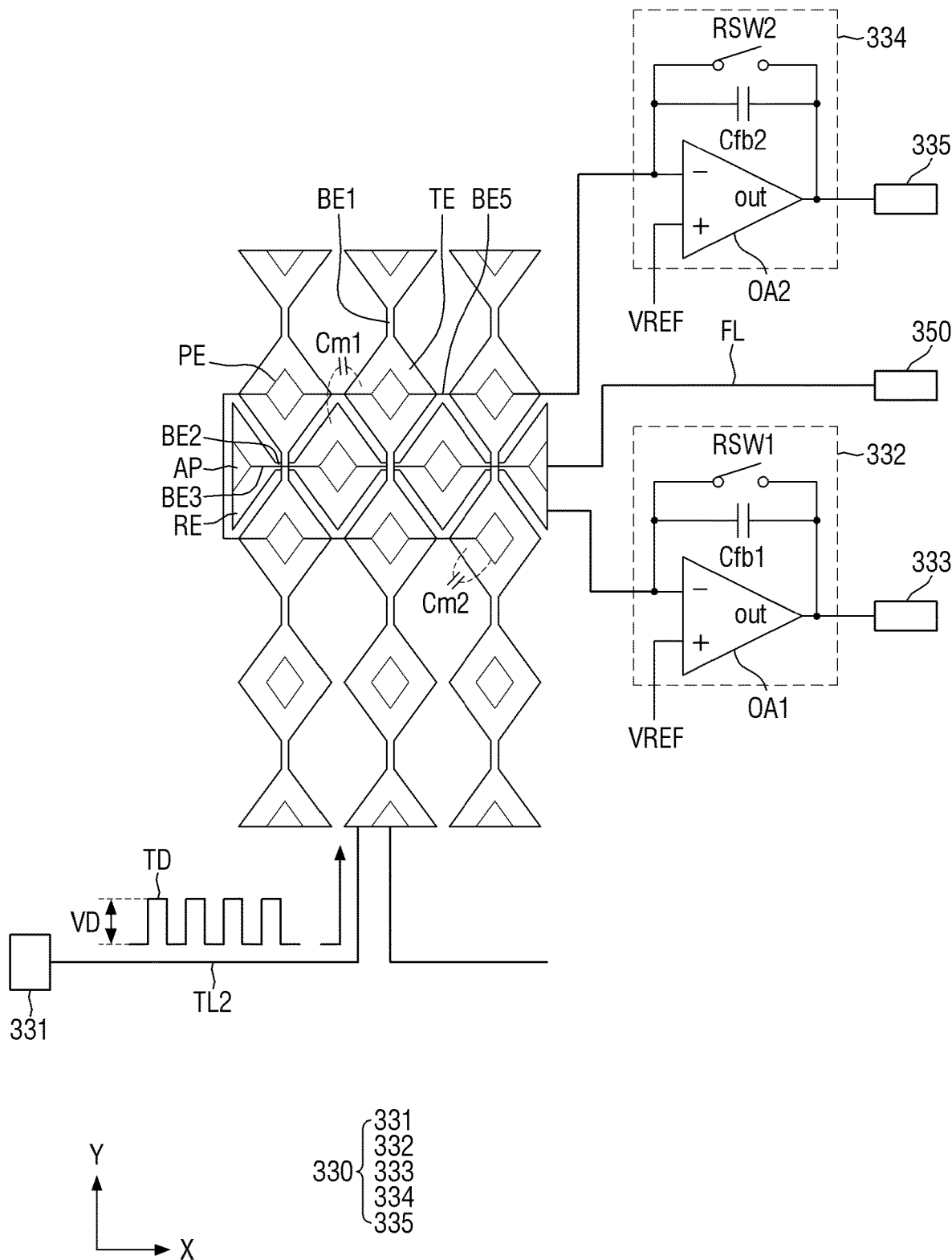
FIG. 40 is a view showing an example of a sensor driver connected to sensor electrodes and a radio frequency driver connected to a first conductive pattern.

FIG. 40 is a view showing an example of a sensor driver connected to sensor electrodes and a radio frequency driver connected to a first conductive pattern.

An embodiment of FIG. 40 may be different from an embodiment of FIG. 18 in that a sensor driver 330 may include a second sensor detector 334 and a second analog-to-digital converter 335.

Referring to FIG. 40, the second sensor detector 334 detects a voltage charged in a second mutual capacitance Cm2 through the proximity sensing line PL connected to the proximity sensing electrodes PE. As shown in FIG. 40, the second mutual capacitance Cm2 may be formed or disposed between the driving electrode TE and the sensing electrode RE.

The second sensor detector 334 may include a second operational amplifier OA2, a second feedback capacitor Cfb2, and a second reset switch RSW2. The second operational amplifier OA2 the second feedback capacitor Cfb2 and the second reset switch RSW2 of the second sensor detector 334 may be substantially identical to the first operational amplifier OA1, the first feedback capacitor Cfb1 and the first reset switch RSW1 of the first sensor detector 332, respectively. The second storage capacitor Cs2 is connected between the output terminal (out) of the second operational amplifier OA2 and the ground to store the output voltage Vout2 of the second operational amplifier OA2.

The second analog-to-digital converter 335 may convert the output voltage stored in the second storage capacitor Cs2 into second digital data and output the second digital data.

As shown in FIG. 40, the sensor electrode layer SENL may determine whether there is an object approaching the sensor electrode layer SENL by sensing the voltages charged in the second mutual capacitances Cm2.

Figure 41:
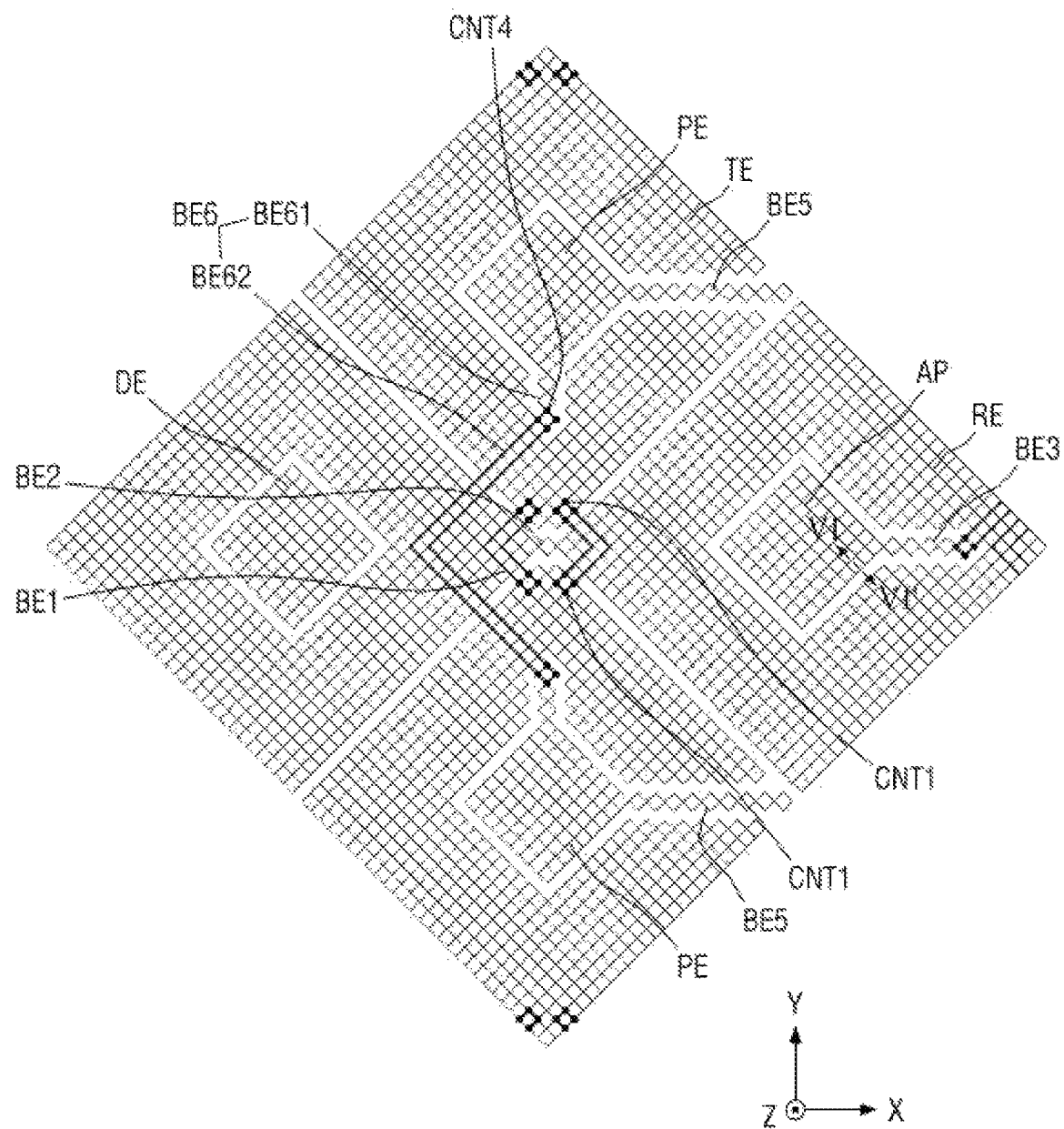
FIG. 41 is an enlarged plan view showing first conductive patterns and sensor electrodes of FIG. 39.

FIG. 41 is an enlarged plan view showing first conductive patterns and sensor electrodes of FIG. 39. For convenience of illustration, FIG. 41 shows only two sensing electrodes RE adjacent to each other in the first direction (x-axis direction) and two driving electrodes TE adjacent to each other in the second direction (y-axis direction). However, the disclosure is not limited thereto.

An embodiment of FIG. 41 may be different from an embodiment of FIG. 30 in that a proximity sensor electrode PE may be surrounded by a sensing electrode RE, and that a fifth connection unit BE5 for electrically connecting between proximity sensor electrodes PE adjacent to one another in the first direction (x-axis direction) and a sixth connection unit BE6 for electrically connecting between the proximity sensor electrodes PE in the second direction (y-axis direction) may be formed or disposed.

Although each of the proximity sensor electrodes PE in FIG. 41 has a substantially square shape when viewed from the top, the disclosure is not limited thereto. The proximity sensor electrodes PE, the fifth connection unit BE5 and the sixth connection unit BE6 may be formed or disposed in a substantially mesh topology when viewed from the top.

The proximity sensor electrodes PE may be surrounded by the driving electrodes TE, respectively. The driving electrodes TE, the sensing electrodes RE, the first conductive patterns AP and the proximity sensing electrodes PE may be electrically separated from each other. The driving electrodes TE, the sensing electrodes RE, the dummy patterns DE, the first conductive patterns AP and the proximity sensor electrodes PE may be spaced apart from one another.

Figure 42:
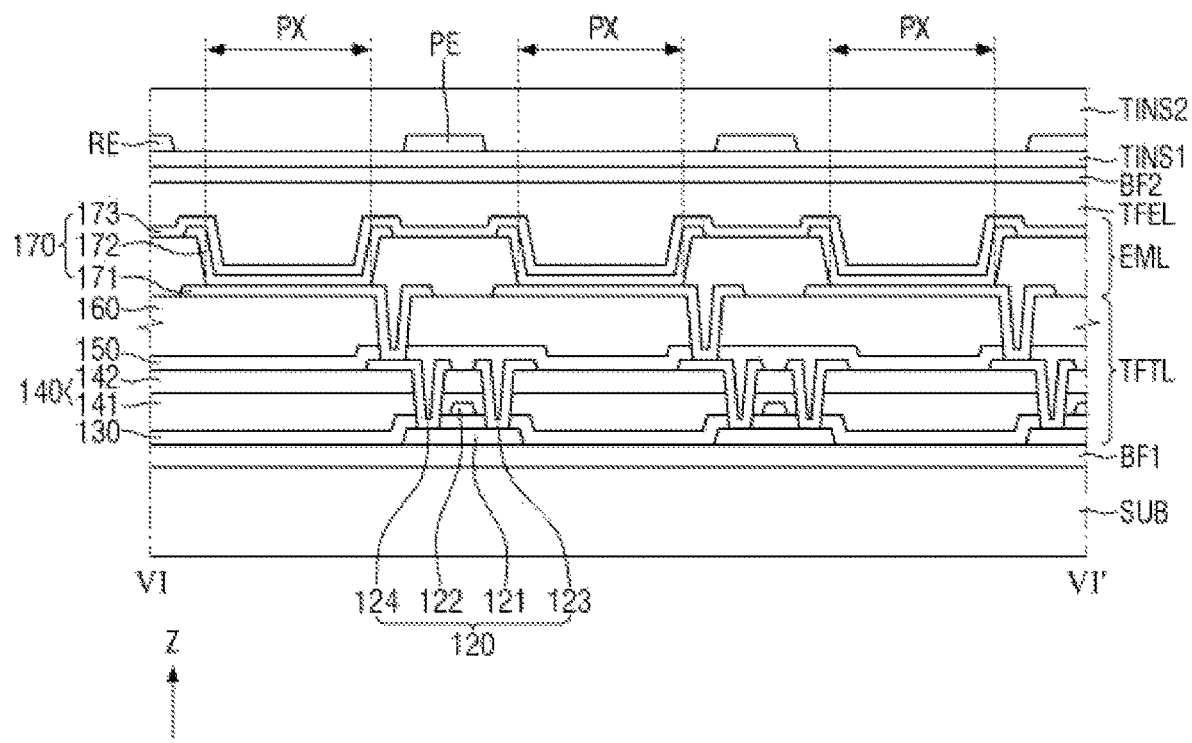
FIG. 42 is a schematic cross-sectional view taken along line VI-VI' of FIG. 41.

The proximity sensor electrodes PE adjacent to one another in the first direction (x-axis direction) may be electrically connected through the fifth connection unit BE5. The proximity sensor electrodes PE and the fifth connection unit BE5 may be disposed on the first sensor insulating layer TINS1 as shown in FIG. 42. The proximity sensor electrodes PE and the fifth connection unit BE5 may be disposed on a same layer as the driving electrodes TE, the sensing electrodes RE and the first conductive patterns AP. The fifth connection unit BE5 may be electrically separated from the driving electrodes TE, the sensing electrodes RE, and the first conductive patterns AP. The fifth connection unit BE5 may be spaced apart from the driving electrodes TE, the sensing electrodes RE, and the first conductive patterns AP.

The proximity sensor electrodes PE adjacent to one another in the second direction (y-axis direction) may be electrically connected through the sixth connection units BE6. The sixth connection unit BE6 may include a first sub connection unit BE61 and a second sub connection unit BE62 in order to be electrically separated from the sensing electrodes RE, the driving electrodes TE and the first conductive patterns AP.

The first sub connection unit BE31 may be disposed on a same layer as the driving electrodes TE, the sensing electrodes RE, and the first conductive patterns AP. The first sub connection unit BE61 may be electrically separated from the driving electrodes TE, the sensing electrodes RE, and the first conductive patterns AP. The first sub connection unit BE31 may be spaced apart from the driving electrodes TE, the sensing electrodes RE, and the first conductive patterns AP.

The second sub connection unit BE32 may be formed or disposed on a different layer from the driving electrodes TE, the sensing electrodes RE and the first conductive patterns AP, and may be electrically connected to the first sub connection unit BE61 through a fourth contact holes CNT4. For example, the first sub connection unit BE61 may be disposed on the first sensor insulating layer TINS1 shown in FIG. 42, and the second sub connection unit BE62 may be disposed on the second buffer layer BF2 shown in FIG. 42. The second sub connection unit BE62 may overlap the driving electrode TE, the sensing electrode RE, and the first sub connection unit BE31 of the third connection unit BE3 in the third direction (z-axis direction).

The second sub connection unit BE62 may be bent at least once. In FIG. 41, the second sub connection unit BE62 is bent in the shape of angle brackets, for example, "<" or ">", but the shape of the second connection unit BE62 is not limited thereto.

As shown in FIG. 41, the proximity sensor electrodes PE adjacent to one another in the first direction (x-axis direction) may be electrically connected through the fifth connection units BE5, and the proximity sensor electrodes PE adjacent to one another in the second direction (y-axis direction) may be electrically connected through the sixth connection units BE6, so that the proximity sensor electrodes PE may be electrically separated from the driving electrodes TE and the sensing electrodes RE.

Figure 43:
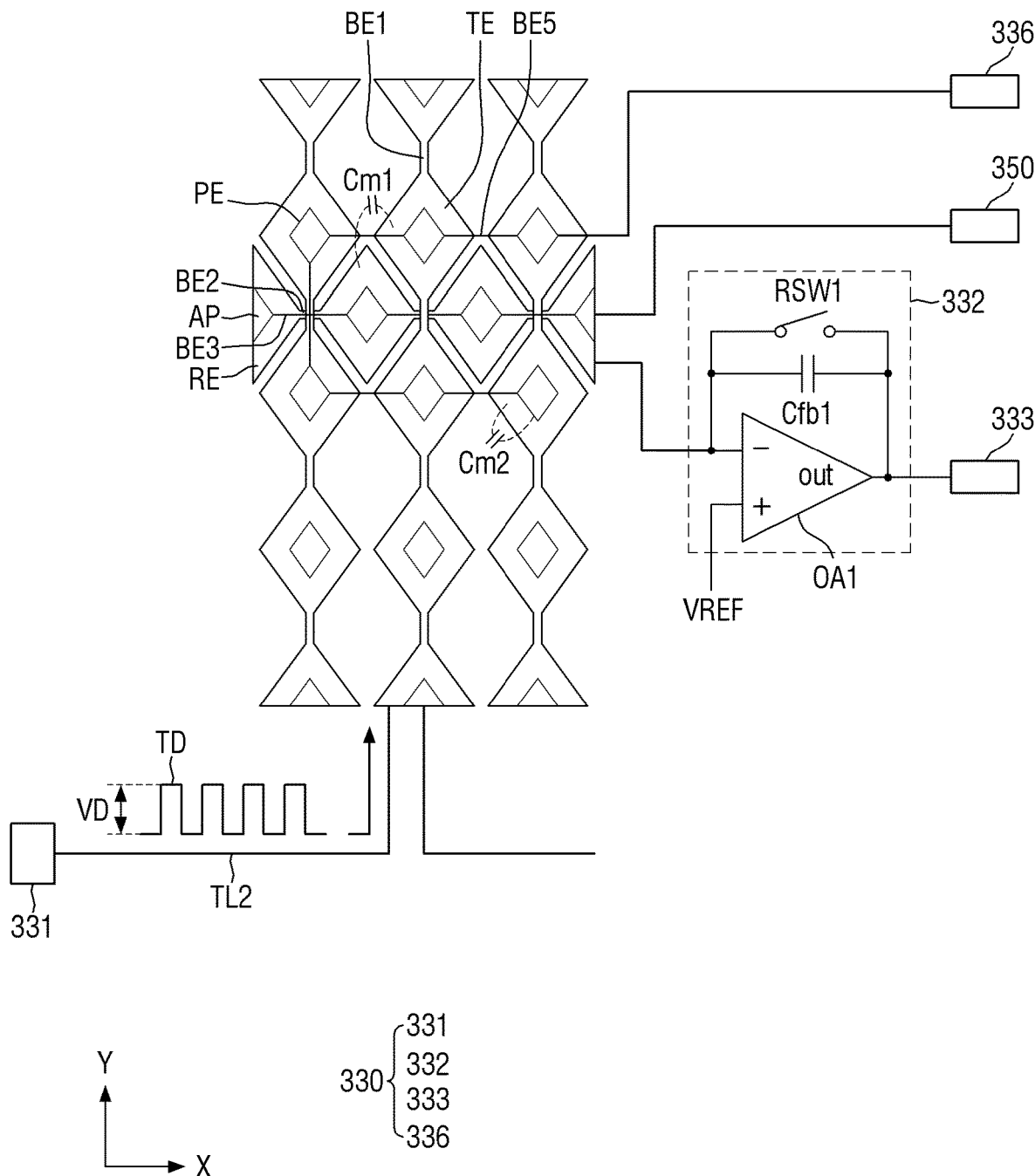
FIG. 43 is a view showing an example of a sensor driver and sensor detectors connected to sensor electrodes and an audio frequency driver electrically connected to the first conductive pattern.
Figure 44:
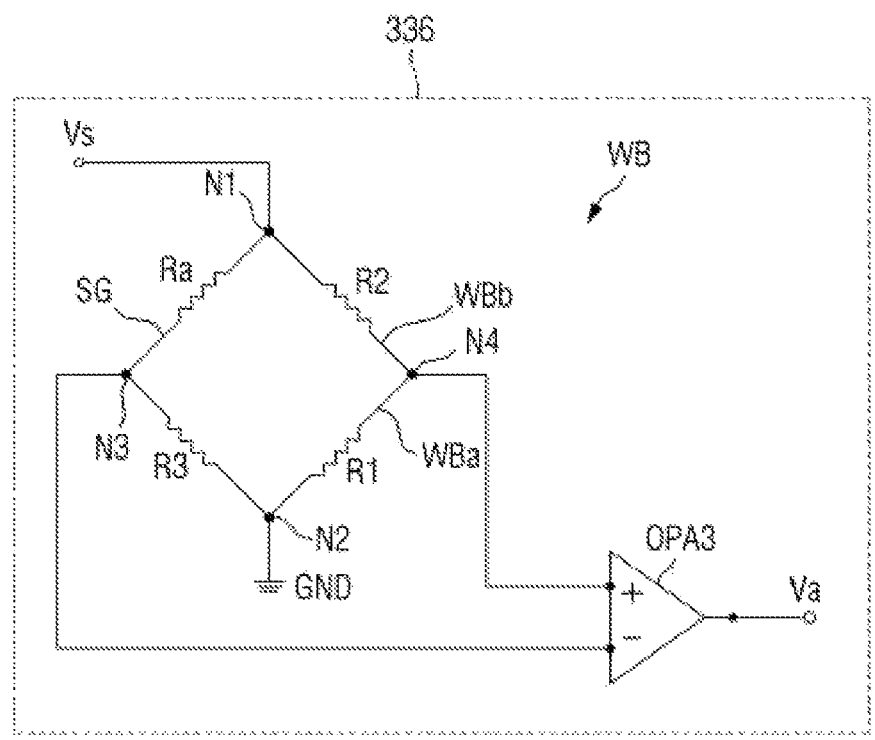
FIG. 44 is a circuit diagram showing the pressure sensing unit of FIG. 41 in detail.

FIG. 43 is an enlarged plan view showing the sensor electrodes, a strain gauge, and a first conductive pattern of FIG. 37 in detail. FIG. 44 is a circuit diagram showing a third sensor detector of FIG. 43 in detail.

An embodiment shown in FIGS. 43 and 44 may be different from an embodiment of FIG. 40 in that proximity sensor electrodes PE may be force sensor electrodes PRE for pressure sensing instead of proximity sensing, and that the force sensor electrodes PRE may be electrically connected to the third sensor detector 336 including a Wheatstone bridge circuit WB.

Referring to FIGS. 43 and 44, the force sensor electrodes PRE may be electrically connected together and may serve as a strain gauge. The third sensor detector 336 may include a Wheatstone bridge circuit WB. The third sensor detector 336 may include an analog-to-digital converter and a processor for detecting a first voltage Va output from the Wheatstone bridge circuit WB.

The Wheatstone bridge circuit WB includes a first node N1, a second node N2, a first output node N3, and a second output node N4. The driving voltage Vs may be applied to the first node N1, and the second node N2 may be connected to the ground GND.

The Wheatstone bridge circuit WB may include a first resistor WBa connected to the second node N2 and the second output node N4, a second resistor WBb connected to the first node N1 and the second output node N4, and a third resistor WBc connected to the second node N2 and first output node N3.

The resistance R1 of the first resistor WBa, the resistance R2 of the second resistor WBb, and the resistance R3 of the third resistor WBc may each have a predetermined value. In other words, the first resistor WBa to the third resistor WBc may be fixed resistors.

The Wheatstone bridge circuit WB may include an amplifier circuit OPA3, such as an operational amplifier. The amplifier circuit OPA3 may include an inverting input terminal, a non-inverting input terminal, and an output terminal. An electrical flow between the first output node N3 and the second output node N4 may be detected through the amplifier circuit OPA3. In other words, the amplifier circuit OPA3 may operate as a current or voltage measuring element.

One of the first output node N3 and the second output node N4 may be electrically connected to one of the input terminals of the amplifier circuit OPA3, and the other one of the first output node N3 and the second output node N4 may be electrically connected to the other input terminal of the amplifier circuit OPA3. For example, the first output node N3 may be connected to the inverting input terminal of the amplifier circuit OPA3, and the second output node N4 may be connected to the non-inverting input terminal of the amplifier circuit OPA3.

The output terminal of the amplifier circuit OPA3 may output a first voltage Va proportional to the difference between the voltages input to the two input terminals.

One end of the strain gauge SG formed by the force sensor electrodes PRE may be electrically connected to the first node N1, and the other end of the strain gauge SG formed by the force sensor electrodes PRE may be connected to the first node N3.

According to an embodiment, the strain gauge SG, the first resistor WBa, the second resistor WBb and the third resistor WBc may be electrically connected with each other to implement the Wheatstone bridge circuit WB.

When no pressure is applied, the product of the resistance Ra of the strain gauge SG and the resistance R1 of the first resistance WBa may be substantially equal to the product of the resistance R2 of the second resistance WBb and the third resistance R3 of the third resistor WBc. When the product of the resistance Ra of the first force sensor electrode PE1 and the resistance R1 of the first resistor WBa is equal to the product of the resistance R2 of the second resistance WBb and the third resistance R3 of the third resistor WBc, the voltage of the first output node N3 may be equal to the voltage of the second output node N4. When the voltage of the first output node N3 is equal to the voltage of the second output node N4, the voltage difference between the first output node N3 and the second output node N4 may be 0V, and the first voltage Va output by the amplifier circuit OPA3 may be 0V.

When a pressure of is applied to the sensor area PSA by a user, the force sensor electrode PRE may be deformed depending on the strength of the pressure, and the resistance Ra of the strain gauge SG may be changed by the deformation. Therefore, a voltage difference is made between the first output node N3 and the second output node N4. When a voltage difference is made between the first output node N3 and the second output node N4, the amplifier circuit OPA outputs a value other than 0V as the first voltage Va. Therefore, it is possible to detect the pressure of the user's touch based on the first voltage Va output from the amplifier circuit OPA.

Figure 45:
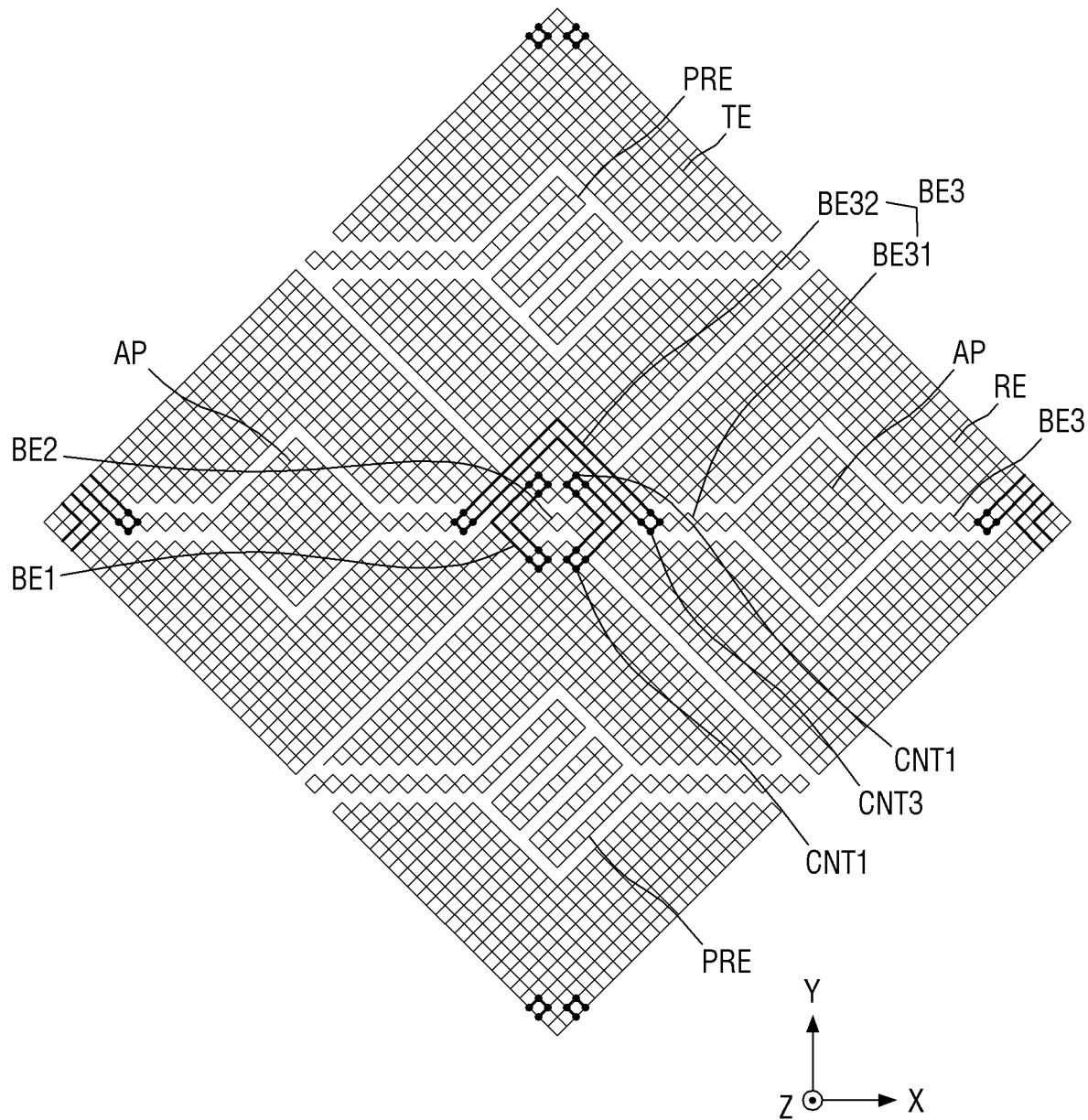
FIG. 45 is an enlarged plan view showing the sensor electrodes, force sensor electrodes and the first conductive pattern of FIG. 39 in detail.

FIG. 45 is an enlarged plan view showing the sensor electrodes, force sensor electrodes and the first conductive pattern of FIG. 39 in detail. For convenience of illustration, FIG. 45 shows only two sensing electrodes RE adjacent to each other in the first direction (x-axis direction) and two driving electrodes TE adjacent to each other in the second direction (y-axis direction). However, the disclosure is not limited thereto.

An embodiment of FIG. 45 may be different from an embodiment of FIG. 41 in that force sensor electrodes PRE may be formed or disposed instead of proximity sensor electrodes PE.

Referring to FIG. 45, for the force sensor electrodes PRE to work as the strain gauge SG, each of the force sensor electrodes PRE may have a substantially serpentine shape including bending portions. For example, in FIG. 45, each of the force sensor electrodes PRE is extended in a first direction and then is bent in the direction perpendicular to the first direction, and is extended in the direction opposite to the first direction and then is bent in the direction perpendicular to the first direction. It is, however, to be understood that the disclosure is not limited thereto.

As shown in FIG. 45, each of the force sensor electrodes PRE has the substantially serpentine shape including bent portions, and thus the shape of the force sensor electrodes PRE may be changed according to the user's touch pressure. As a result, the resistance of the force sensor electrodes PRE changes, so that it is possible to determine whether there is a user's touch pressure.

Figure 46:
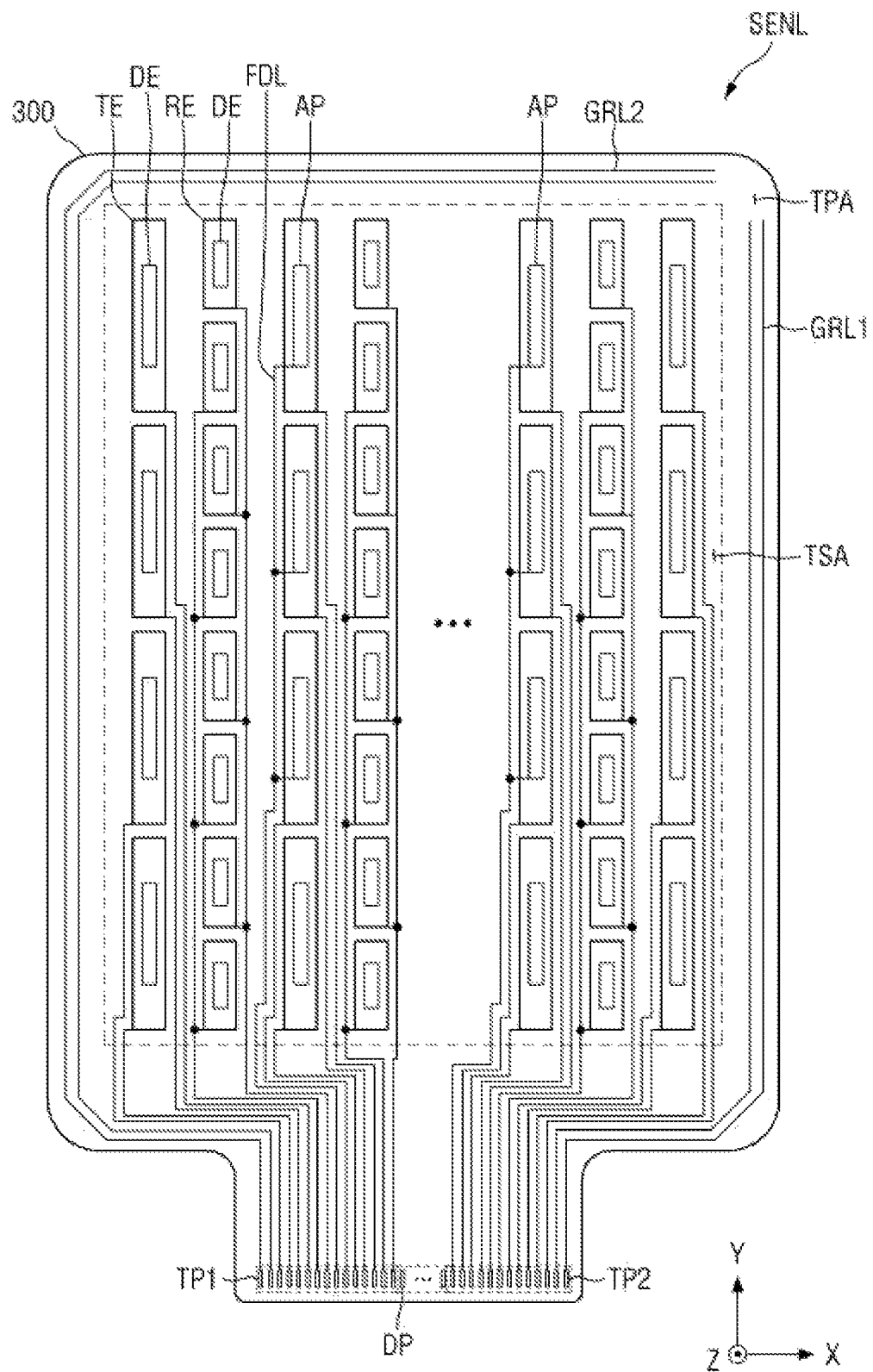
FIG. 46 is a plan view showing a sensor electrode layer of a display panel according to an embodiment.

FIG. 46 is a plan view showing a sensor electrode layer of a display panel according to an embodiment.

In the example shown in FIG. 46, the sensor electrodes TE and RE of the sensor electrode layer SENL include two kinds of electrodes, e.g., the driving electrodes TE and the sensing electrodes RE, and the mutual capacitive sensing is carried out by using one layer, i.e., driving signals are applied to the driving electrodes TE and then the voltages charged at the mutual capacitances may be sensed through the sensing electrodes RE.

For convenience of illustration, FIG. 46 shows only the sensor electrodes TE and RE, the dummy patterns DE, the first conductive patterns AP, the sensor lines TL and RL, the feeding lines FDL, the sensor pads TP1 and TP2, and the ground lines GRL1 and GRL2. However, the disclosure is not limited thereto.

Referring to FIG. 46, the driving electrodes TE may be arranged or disposed in the odd columns in the second direction (y-axis direction), and the sensing electrodes RE may be disposed in the even columns in the second direction (y-axis direction). The driving electrodes TE may be electrically separated from the sensing electrodes RE. The driving electrodes TE may be spaced apart from the sensing electrodes RE.

At least one sensing electrode RE may be disposed between a driving electrode TE disposed in an odd column and a driving electrode TE disposed in another odd column. At least one driving electrode TE may be disposed between a sensing electrode RE disposed in an even column and a sensing electrode RE disposed in another even column.

Each of the sensing electrodes RE may be connected to at least one sensing line RL. The sensing electrodes RE arranged or disposed in the odd rows may be commonly connected to the sensing line RL disposed on one side thereof, while the sensing electrodes RE arranged or disposed in the even rows may be commonly connected to the sensing line RL disposed on the other side thereof.

Each of the driving electrodes TE may be connected to at least one driving line TL. Each of the driving electrodes TE arranged or disposed in the odd rows may be connected to the driving line TL disposed on one side thereof, while each of the driving electrodes TE arranged or disposed in the even rows may be connected to the driving line TL disposed on the other side thereof.

The length of the driving electrodes TE may be larger than that of the sensing electrodes RE in the second direction (y-axis direction). For example, as shown in FIG. 46, the length of the driving electrodes TE may be approximately or about twice the length of the sensing electrodes RE in the second direction (y-axis direction).

One driving electrode TE may overlap the sensing electrodes RE adjacent to the driving electrode TE in the first direction (x-axis direction). For example, as shown in FIG. 46, a driving electrode TE may overlap two sensing electrodes RE adjacent to the driving electrode TE in the first direction (x-axis direction). The mutual capacitance may be formed or disposed between the driving electrode TE and each of the sensing electrodes RE adjacent to the driving electrode TE in the first direction (x-axis direction). The dummy patterns DE may be electrically separated from the driving electrodes TE and the sensing electrodes RE. The driving electrodes TE, the sensing electrodes RE and the dummy patterns DE may be disposed apart from each other. Each of the dummy patterns DE may be electrically floated. The dummy patterns DE may be surrounded by the driving electrodes TE and the sensing electrodes RE, respectively.

The first conductive patterns AP may be electrically separated from the driving electrodes TE and the sensing electrodes RE. The driving electrodes TE, the sensing electrodes RE and the first conductive patterns AP may be spaced apart from each other. The first conductive patterns AP may be surrounded by the driving electrodes TE, respectively. Alternatively, the first conductive patterns AP may be surrounded by the sensing electrodes RE, respectively. The first conductive patterns AP adjacent to each other in the second direction (y-axis direction) may be connected to a single feeding line FDL.

The sensor lines TL and RL may be disposed in the sensor area TSA and in the sensor peripheral area TPA. The sensor lines TL and RL may be disposed in the sensor peripheral area TPA on one outer side of the sensor area TSA. The sensor lines TL and RL may include sensing lines RL connected to the sensing electrodes RE and driving lines TL connected to the driving electrodes TE.

The feeding line FDL may be connected to the first conductive patterns AP. The feeding line FDL may be disposed on one side of the driving electrodes TE arranged or disposed in a column. Each of the feeding lines FDL may be connected to one of the first sensor pads TP1 and the second sensor pads TP2. Since the first sensor pads TP1 and the second sensor pads TP2 are connected to the display circuit board 310 through an anisotropic conductive film, the first conductive patterns AP may be electrically connected to the radio frequency driver 350 disposed on the display circuit board 310. The first conductive pattern AP may be utilized as an antenna for near field communications such as an antenna for an RFID tag, or may be utilized as a patch antenna for mobile communications.

Ground voltage may be applied to the first ground line GRL1 and the second ground line GRL2. The first ground line GRL1 may be disposed in the sensor peripheral area TPA on the left outer side of the sensor area TSA. The second ground line GRL2 may be disposed in the sensor peripheral area TPA on the right outer side and in the sensor peripheral area TPA on the upper outer side of the sensor area TSA.

Figure 47:
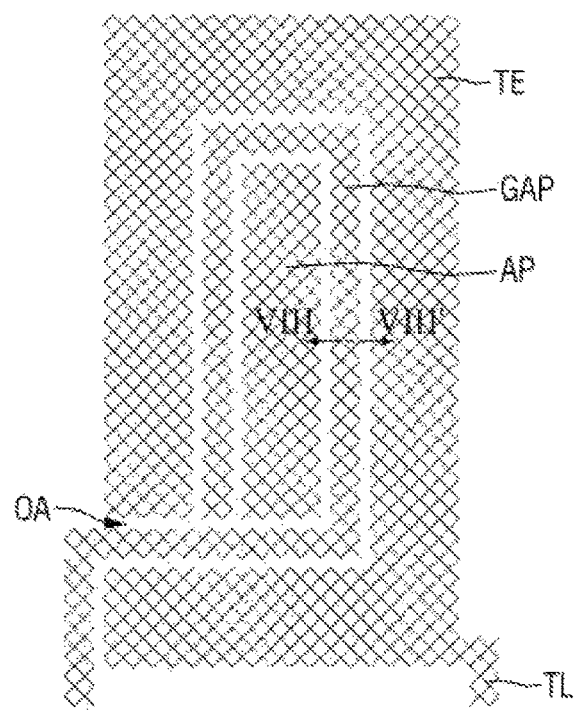
FIG. 47 is an enlarged plan view showing the sensor electrode and the first conductive pattern of FIG. 46.

FIG. 47 is an enlarged plan view showing the sensor electrode and the first conductive pattern of FIG. 46. FIG. 47 shows only the driving electrode TE surrounding the first conductive pattern AP for convenience of illustration. However, the disclosure is not limited thereto.

Referring to FIG. 47, the driving electrode TE, the first conductive pattern AP, a guard pattern GAP, the feeding line FDL, and the driving line TL may be formed in a mesh when viewed from the top.

The driving electrode TE may be formed in the shape of a substantially rectangular window frame with an empty center. The driving electrode TE may include an empty space at its center. The first conductive pattern AP may be disposed in the empty space of the driving electrode TE. The first conductive pattern AP may surround the driving electrode TE. Although the first conductive pattern AP may have a substantially rectangular shape when viewed from the top in FIG. 47, the shape of the first conductive pattern AP is not limited thereto. The driving electrode TE may include an open area OA connecting the empty space with the outside on one side of the driving electrode TE. Therefore, the feeding line FDL may be connected to the first conductive pattern AP through the open area OA of the driving electrode TE. Therefore, the driving electrode TE may be spaced apart from and electrically insulated from the first conductive pattern AP.

The guard pattern GAP may be formed or disposed between the first conductive pattern AP and the driving electrode TE. The guard pattern GAP may be electrically floated or may be connected to at least one of the ground lines GRL1 to GRL3 in the sensor peripheral area TPA to receive a ground voltage. As the guard pattern GAP is disposed between the driving electrode TE and the first conductive pattern AP, it is possible to block the driving electrode TE from being affected by electromagnetic waves from the first conductive pattern AP.

Although the feeding line FDL is disposed on one side of the driving electrode TE and the driving line TL is disposed on the other side of the driving electrode TE in the example shown in FIG. 47, the disclosure is not limited thereto. Both the feeding line FDL and the driving line TL may be disposed on one side of the drive electrode TE.

Figure 48:
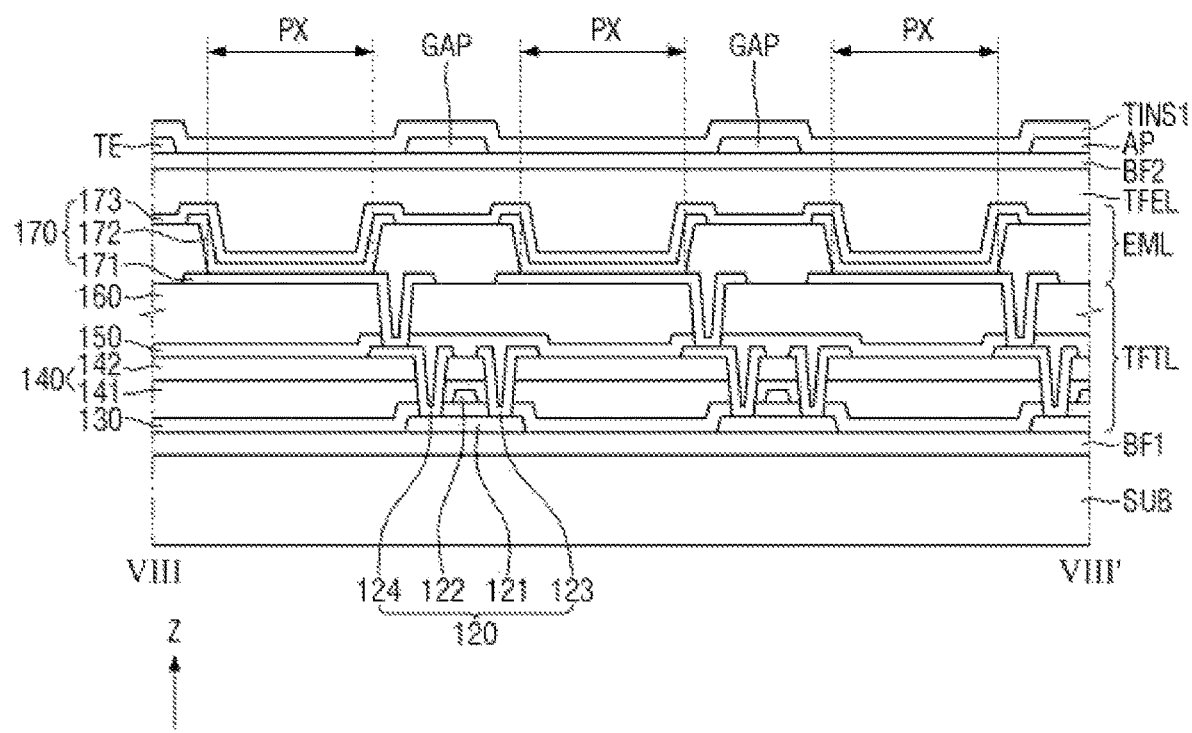
FIG. 48 is a schematic cross-sectional view taken along line VIII-VIII' of FIG. 47.

FIG. 48 is a schematic cross-sectional view taken along line VIII-VIII' of FIG. 47.

Referring to FIG. 48, the driving electrode TE, the guard pattern GAP and the first conductive pattern AP may be disposed on the second buffer layer BF2. For example, the first conductive pattern AP may be made of the same or similar material on a same layer as the driving electrode TE and the guard pattern GAP. The first conductive pattern AP may be made of the same or similar material on a same layer as the sensing electrode RE, the dummy pattern DE, the driving line TL, the sensing line RL, and the feeding line FDL. Therefore, the first conductive pattern AP and the guard pattern GAP may be formed without any additional process.

The driving electrode TE, the sensing electrode RE, the dummy pattern DE, the driving line TL, the sensing line RL, the feeding line FDL, the guard pattern GAP and first conductive pattern AP may be disposed to overlap the bank 180 in the third direction (z-axis direction). Therefore, it is possible to avoid that the luminance of the light output from the sub-pixels PX is reduced as the light is hidden by the driving electrode TE, the sensing electrode RE, the dummy pattern DE, the driving line TL, the sensing line RL, the feeding line FDL, the guard pattern GAP and the first conductive pattern AP.

As shown in FIG. 48, the first conductive pattern AP and the guard pattern GAP are disposed on the first sensor insulating layer TINS1 and the second conductive pattern GP is disposed on the second buffer layer BF2, and thus the first conductive pattern may be formed without any additional process.

Figure 49:
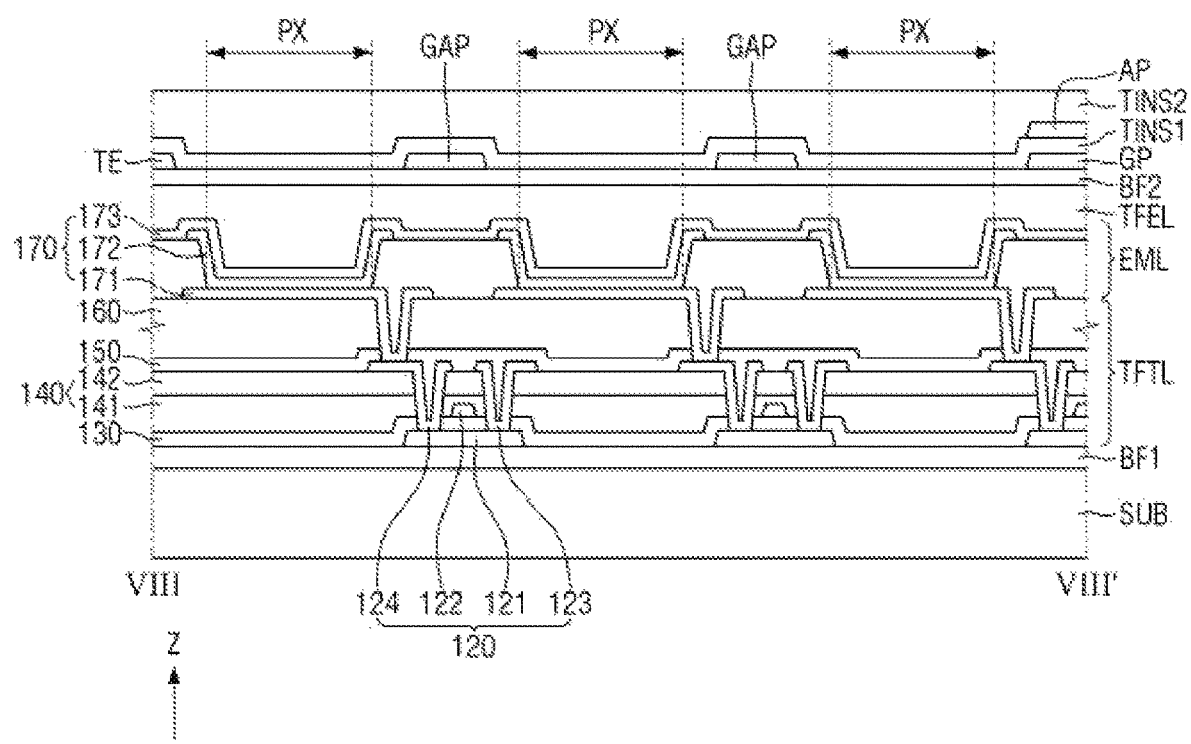
FIG. 49 is a schematic cross-sectional view taken along line VIII-VIII' of FIG. 47.

FIG. 49 is a schematic cross-sectional view taken along line VIII-VIII' of FIG. 47.

An embodiment of FIG. 49 may be different from an embodiment of FIG. 48 in that a second conductive pattern GP overlapping a first conductive pattern AP may be disposed on a second buffer layer BF2 in the third direction (z-axis direction), and that a first conductive pattern AP may be disposed on a first sensor insulating layer TINS1.

Referring to FIG. 49, the driving electrode TE, the guard pattern GAP and the second conductive pattern GP may be disposed on the second buffer layer BF2. For example, the second conductive pattern GP may be made of the same or similar material on a same layer as the driving electrode TE and the guard pattern GAP. The second conductive pattern GP may be made of the same or similar material on a same layer as the sensing electrode RE, the dummy pattern DE, the driving line TL, the sensing line RL, and the feeding line FDL.

Figure 50:
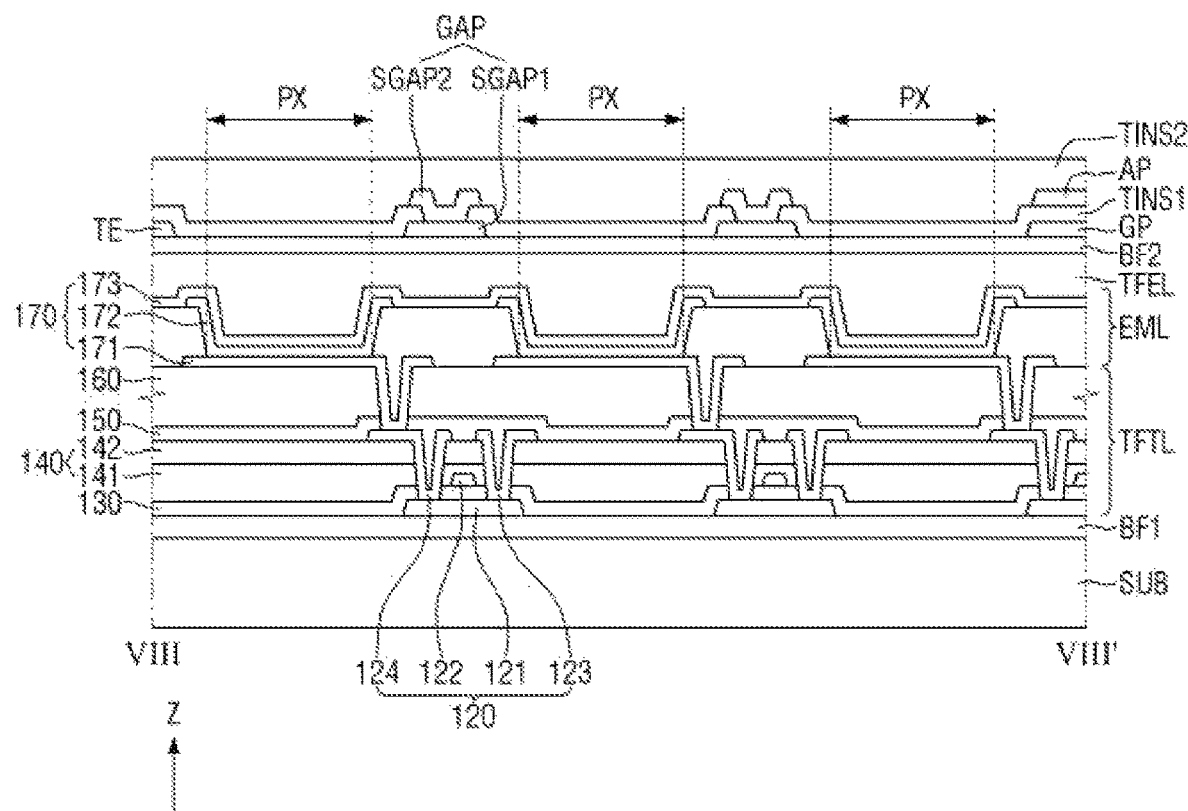
FIG. 50 is a schematic cross-sectional view taken along line VIII-VIII' of FIG. 47.

FIG. 50 is a schematic cross-sectional view taken along line VIII-VIII' of FIG. 47.

An embodiment of FIG. 50 may be different from an embodiment of FIG. 49 in that each of guard patterns GAP may include a first sub guard pattern SGAP1 and a second sub guard pattern SGAP2.

Referring to FIG. 50, the first sub guard pattern SGAP1 may be disposed on a second buffer layer BF2. The first sub guard pattern SGAP1 may be made of the same or similar material on a same layer as the driving electrode TE. The first sub guard pattern SGAP1 may be made of the same or similar material on a same layer as the driving electrode RE, the dummy pattern DE, the driving line TL, the sensing line RL, the feeding line FDL and the second conductive pattern GP.

The second sub guard pattern SGAP2 may be disposed on the first sensor insulating layer TINS1. The second sub guard pattern SGAP2 may be made of the same or similar material on a same layer as the first conductive pattern AP.

As shown in FIG. 50, when the guard pattern GAP is made up of the two layers of the first sub guard pattern SGAP1 and the second sub guard pattern SGAP2, it may be possible to more effectively block the influence on the driving electrode TE by electromagnetic waves from the first conductive pattern AP.

Figure 51:
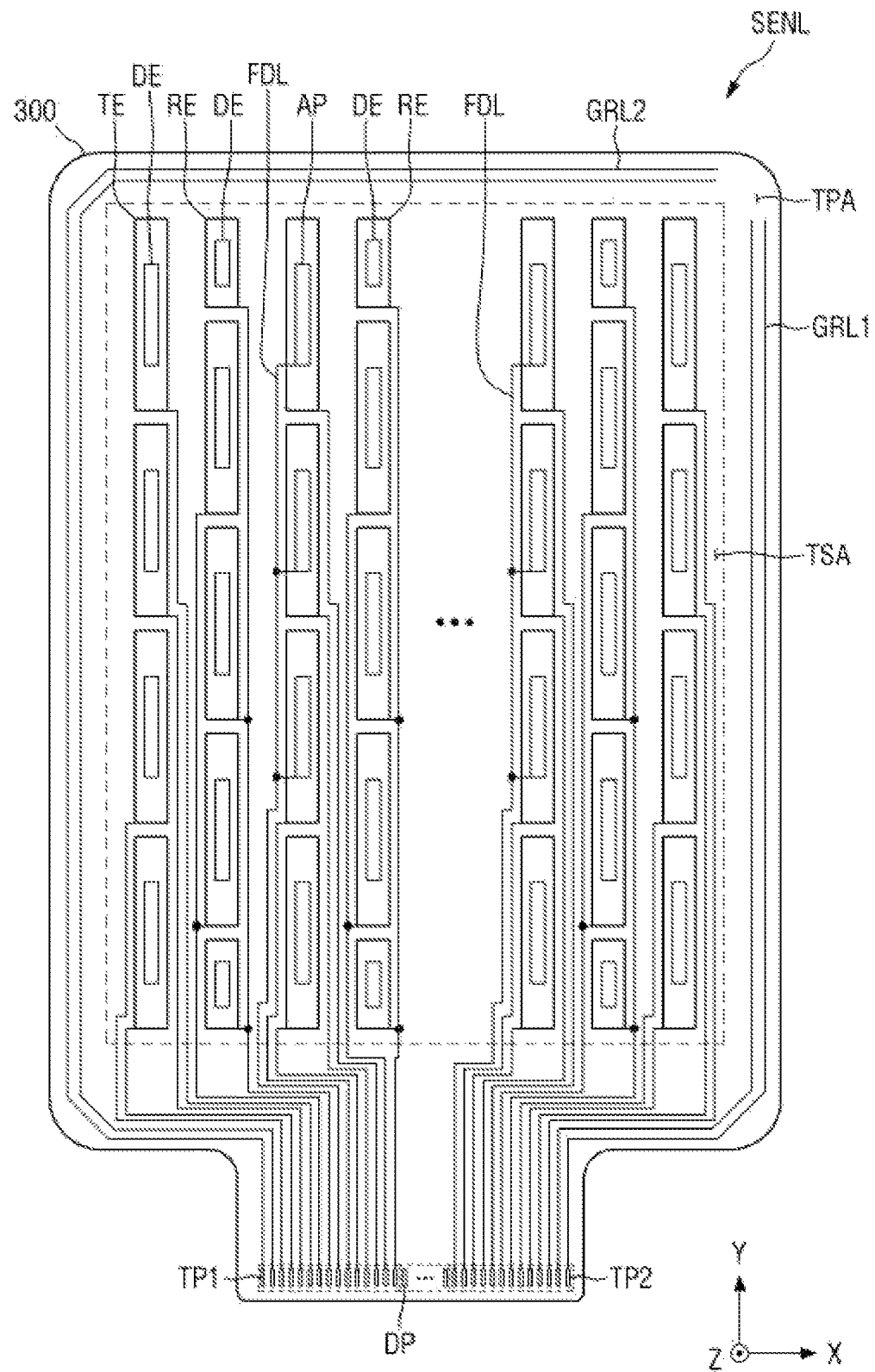
FIG. 51 is a plan view showing a sensor electrode layer of a display panel according to an embodiment.

FIG. 51 is a plan view showing a sensor electrode layer of a display panel according to an embodiment.

In the example shown in FIG. 51, the sensor electrodes TE and RE of the sensor electrode layer SENL include two kinds of electrodes, e.g., the driving electrodes TE and the sensing electrodes RE, and the mutual capacitive sensing is carried out by using one layer, i.e., driving signals are applied to the driving electrodes TE and then changes in the mutual capacitances may be sensed through the sensing electrodes RE.

An embodiment of FIG. 51 may be different from an embodiment of FIG. 46 in that the length of the driving electrode TE may be substantially equal to the length of the sensing electrode RE in the second direction (y-axis direction).

Referring to FIG. 51, one driving electrode TE may overlap sensing electrodes RE adjacent to the driving electrode TE in the first direction (x-axis direction). Because the length of the driving electrode TE is substantially equal to the length of the sensing electrode RE in the second direction (y-axis direction), one driving electrode TE may overlap the half of one sensing electrode RE. The mutual capacitance may be formed or disposed between the driving electrode TE and each of the sensing electrodes RE adjacent to the driving electrode TE in the first direction (x-axis direction).

Figure 52:
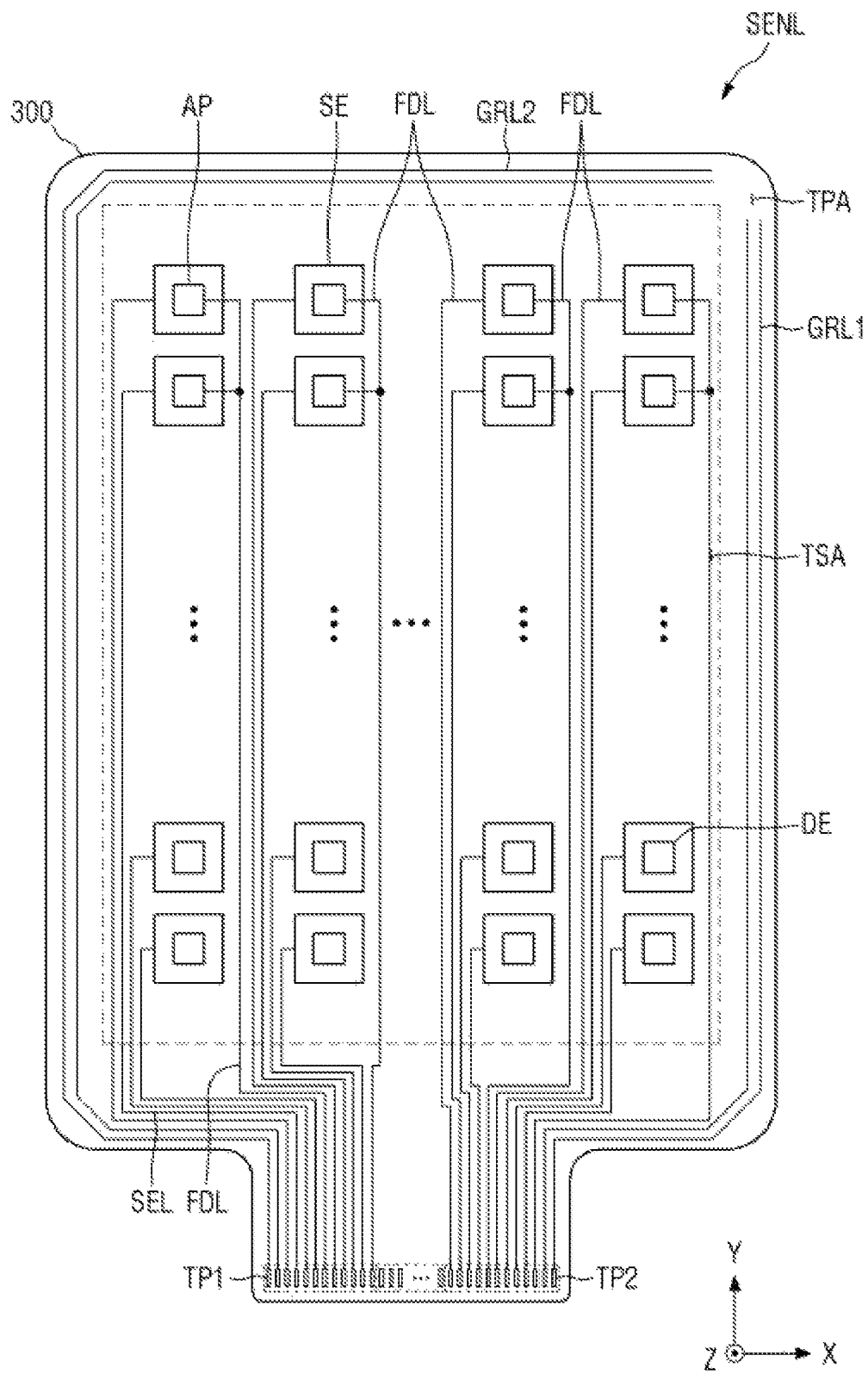
FIG. 52 is a plan view showing a sensor electrode layer of a display panel according to an embodiment.

FIG. 52 is a plan view showing a sensor electrode layer of a display panel according to an embodiment.

In the example shown in FIG. 52, the sensor electrodes SE of the sensor electrode layer SENL include one kind of electrodes, and the self capacitive sensing is carried out by using one layer, i.e., driving signals are applied to the sensor electrode SE and then the voltage charged in the self-capacitance of the sensor electrode SE is sensed For convenience of illustration, FIG. 52 shows only the sensor electrodes SE, the dummy patterns DE, the first conductive patterns AP, the dummy patterns DE, the sensor lines SEL, and the feeding lines FDL, the sensor pads TP1 and TP2, and the ground lines GRL1 to GRL2. However, the disclosure is not limited thereto.

Referring to FIG. 52, the sensor electrodes SE may be electrically separated from one another. The sensor electrodes SE may be spaced apart from one another. Each of the sensor electrodes SE may be connected to the sensor line SEL. Although each of the sensor electrodes SE may be formed in a substantially square shape when viewed from the top in FIG. 52, the disclosure is not limited thereto. Each of the sensor electrodes SE may surround one of the dummy pattern DE and the first conductive pattern AP.

The dummy patterns DE may be surrounded by the sensor electrodes SE, respectively. The sensor electrodes SE may be electrically separated from the dummy patterns DE. The sensor electrodes SE may be spaced apart from the dummy patterns DE. Each of the dummy patterns DE may be electrically floated.

The first conductive patterns AP may be electrically separated from the sensor electrodes SE. The sensor electrodes SE may be spaced apart from the first conductive patterns AP. The first conductive patterns AP may be surrounded by the sensor electrodes SE, respectively. The first conductive patterns AP adjacent to each other in the second direction (y-axis direction) may be connected to a single feeding line FDL.

The sensor lines SEL and the feeding lines FDL may be disposed in the sensor area TSA and in the sensor peripheral area TPA. The sensor lines SEL and the feeding lines FDL may be disposed in the sensor peripheral area TPA on one outer side of the sensor area TSA. Each of the sensor lines SEL may be connected to the sensor electrode SE, and each of the feeding lines FDL may be connected to the first conductive patterns AP. Each of the sensor lines SEL may be disposed on one side of the sensor electrode SE. Each of the feeding lines FDL may be disposed on the other side of the sensor electrode SE.

The sensor electrodes SE, the dummy patterns DE, the first conductive patterns AP, the sensor lines SL, and the feeding lines FDL may be formed in a mesh when viewed from the top.

Ground voltage may be applied to the first ground line GRL1 and the second ground line GRL2. The first ground line GRL1 may be disposed in the sensor peripheral area TPA on the left outer side of the sensor area TSA. The second ground line GRL2 may be disposed in the sensor peripheral area TPA on the right outer side and in the sensor peripheral area TPA on the upper outer side of the sensor area TSA.

The connection between the sensor electrodes SE and the sensor lines SEL and the connection between the first conductive patterns AP and the feeding lines FDL may be substantially identical to the connection between the driving electrodes TE and the driving lines TL and the connection between the first conductive pattern AP and the feeding line FDL shown in FIG. 47. The schematic cross-sectional structures of the sensor electrodes SE and the first conductive patterns AP may be substantially identical to the schematic cross-sectional structures of the driving electrodes TE and the first conductive patterns AP shown in FIGS. 48 to 50. A guard pattern GAP may be disposed between the sensor electrode SE and the first conductive pattern AP as shown in FIGS. 48 to 50.

Figure 53:
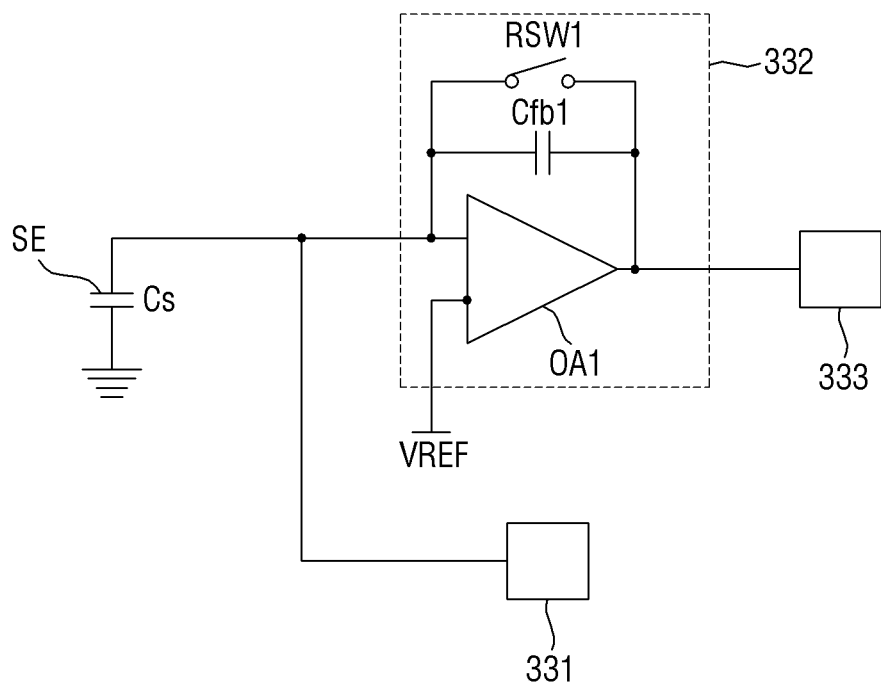
FIG. 53 is a view showing an example of the sensor driver electrically connected to the sensor electrodes and the radio frequency driver electrically connected to the first conductive pattern of FIG. 52.

FIG. 53 is a view showing an example of the sensor driver connected to the sensor electrodes of FIG. 52. In FIG. 53, the sensor driver 330 is connected to one sensor electrode SE for convenience of illustration.

Referring to FIG. 53, the sensor driver 330 may include a driving signal output 331, a first sensor detector 332, and a first analog-to-digital converter 333.

The driving signal output 331 may output a touch driving signal TD to the sensor electrodes SE through the sensor line SEL. The touch driving signal TD may include pulses. The driving signal output 331 may output the touch driving signal TD to the sensor lines SEL in a predetermined order.

The first sensor detector 332 detects a voltage charged in a self-capacitance Cs through the sensor line SEL electrically connected to the sensing electrodes RE. As shown in FIG. 53, the self-capacitance Cs may be formed or disposed between the sensor electrode SE and another electrode overlapping the sensor electrode SE.

The first sensor detector 332 may include a first operational amplifier OA1, a first feedback capacitor Cfb1, and a first reset switch RSW1. The first operational amplifier OA1, the first feedback capacitor Cfb1 and the first reset switch RSW1 of the first sensor detector 332 may be substantially identical to those described above with reference to FIG. 16. The first storage capacitor Cs1 is connected between the output terminal (out) of the first operational amplifier OA1 and the ground to store the output voltage Vout1 of the first operational amplifier OA1.

The first analog-to-digital converter 333 may convert the output voltage Vout1 stored in the first storage capacitor Cs1 into first digital data and output the first digital data.

According to an embodiment shown in FIG. 53, for the self-capacitance sensing, the self-capacitance Cs of the sensor electrode SE may be charged with the touch driving signal TD, and then the voltage charged in the self-capacitance Cs may be sensed, so that it may be possible to determine whether a user's touch has been applied.

Figure 54:
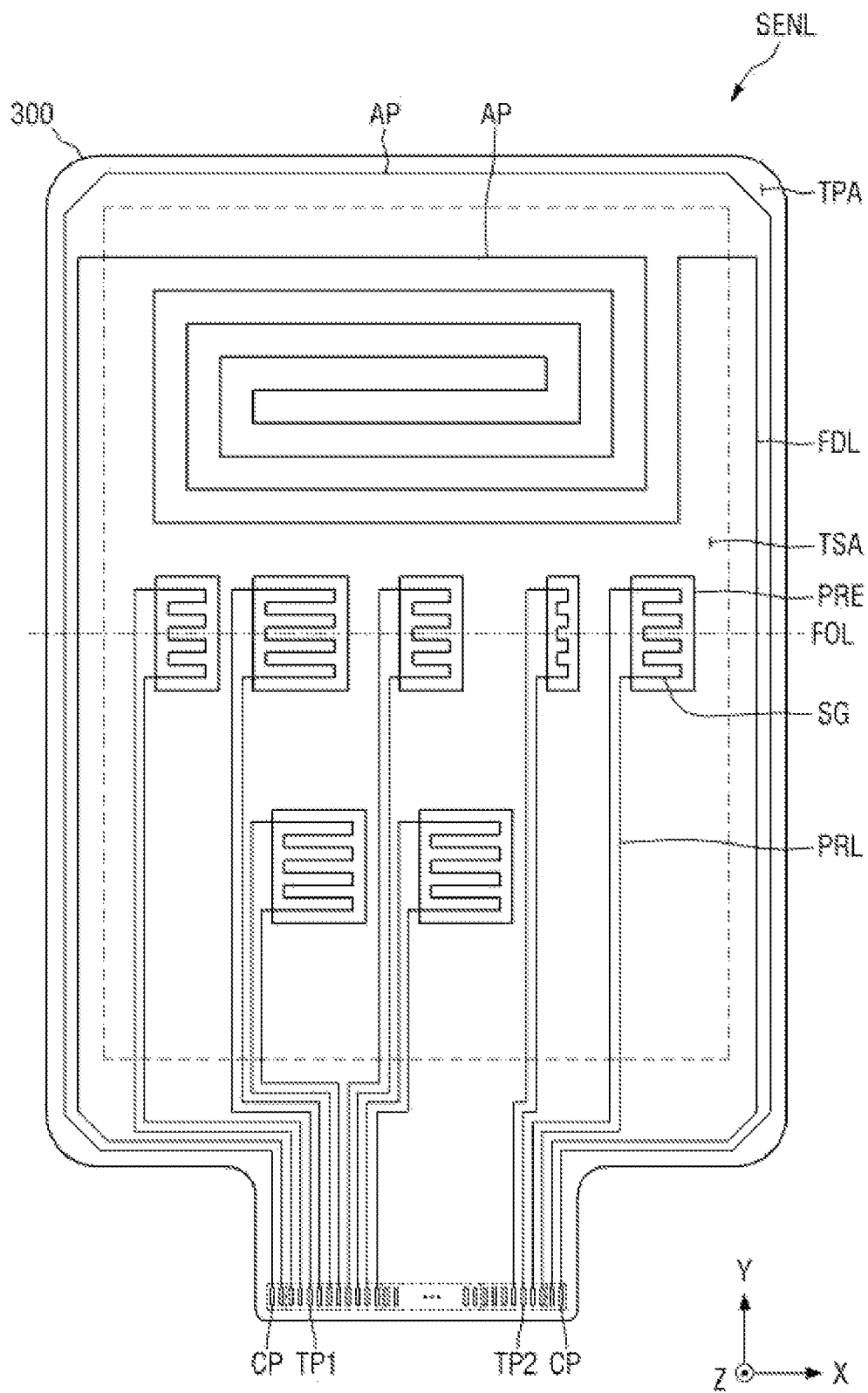
FIG. 54 is a plan view showing a sensor electrode layer of a display panel according to an embodiment.

FIG. 54 is a plan view showing a sensor electrode layer of a display panel according to an embodiment.

In FIG. 54, the sensor electrode of the sensor electrode layer SENL may be a force sensor electrode PRE working as a strain gauge SG.

For convenience of illustration, FIG. 54 shows only force sensor electrodes PRE, pressure sensing lines PRL, first conductive patterns AP, first feeding lines FDL1, second pad lines FL2 and sensor pads TP1 and TP2. However, the disclosure is not limited thereto.

Referring to FIG. 54, a display panel 300 may be a foldable display panel that may be folded over a folding line FOL. Although FIG. 54 shows only one folding line FOL, the disclosure is not limited thereto. For example, the display panel 300 may be folded over several folding lines FOLs.

The force sensor electrodes PRE may include the strain gauge SG. The strain gauge SG may have a substantially serpentine shape including bending portions. For example, in FIG. 54, each of the force sensor electrodes PRE is extended in the first direction (x-axis direction) to then be bent in the second direction (y-axis direction), and is extended in the opposite direction of the first direction (x-axis direction) to then be bent in the second direction (y-axis direction). It is, however, to be understood that the disclosure is not limited thereto.

The force sensor electrodes PRE may be disposed in the sensor area TSA. Some of the force sensor electrodes PRE may be arranged or disposed along the folding line FOL. When the display panel 300 is folded along the folding line FOL, the shape of the strain gauge SG of each of some of the force sensor electrodes PRE may be deformed. Therefore, it is possible to determine whether the display panel 300 is folded or not based on a change in the resistance of the strain gauge SG of each of some force sensor electrodes PRE.

The other force sensor electrodes PRE may not overlap the folding line FOL. According to the pressure of the user's touch, the shape of the strain gauge SG of each of the other force sensor electrodes PRE may be changed. Therefore, it is possible to determine whether there is a user's touch pressure based on a change in the resistance of the strain gauge SG of each of the other force sensor electrodes PRE.

The strain gauge SG of each of the force sensor electrodes PRE may be connected to the pressure sensing lines PRL. One side of the strain gauge SG of each of the force sensor electrodes PRE may be connected to one pressure sensing line PRL, and the other side thereof may be connected to another pressure sensing line PRL. The pressure sensing lines PRL may be connected to the sensor pads TP1 and TP2, and thus may be electrically connected to the sensor driver 330. The sensor driver 330 may include a third sensor detector 336 as shown in FIG. 44, and the third sensor detector 336 may be substantially identical to that of FIG. 44.

When the first conductive pattern AP is disposed in the sensor peripheral area TPA, it may be disposed in the sensor peripheral area on at least three outer sides of the sensor area TSA. The first conductive pattern AP may be disposed to surround at least three sides of the sensor area TSA. For example, the first conductive pattern AP may be disposed to surround the upper side, the left side, and the right side of the sensor area TSA. The first conductive pattern AP may be connected to the conductive pads CP on the lower side of the sensor area TSA.

When the first conductive pattern AP is disposed in the sensor area TSA, it may be disposed so as not to overlap the force sensor electrodes PRE. The first conductive pattern AP may be connected to the feeding lines FL disposed in the sensor peripheral area TPA, and the feeding lines FL may be connected to the conductive pads CP. One end of the first conductive pattern AP may be connected to a feeding line FL disposed on the left outer side of the sensor area TSA, while the other end of the first conductive pattern AP may be connected to a feel line FL disposed on the right outer side of the sensor area TSA.

The conductive pads CP may be electrically connected to the display circuit board 310 via an anisotropic conductive film. Therefore, the conductive patterns AP may be electrically connected to the radio frequency driver 350 disposed on the display circuit board 310.

Although the first conductive pattern AP is formed in a substantially loop or a substantially coil shape in FIG. 54, the disclosure is not limited thereto. The first conductive pattern AP may be formed as a rectangular patch.

The first conductive patterns AP and the feeding lines FDL may be disposed on a same layer as the force sensor electrodes PRE and the pressure sensing lines PRL. Therefore, the first conductive patterns AP and the feeding lines FDL may be formed or disposed without any additional process.

Figure 55:
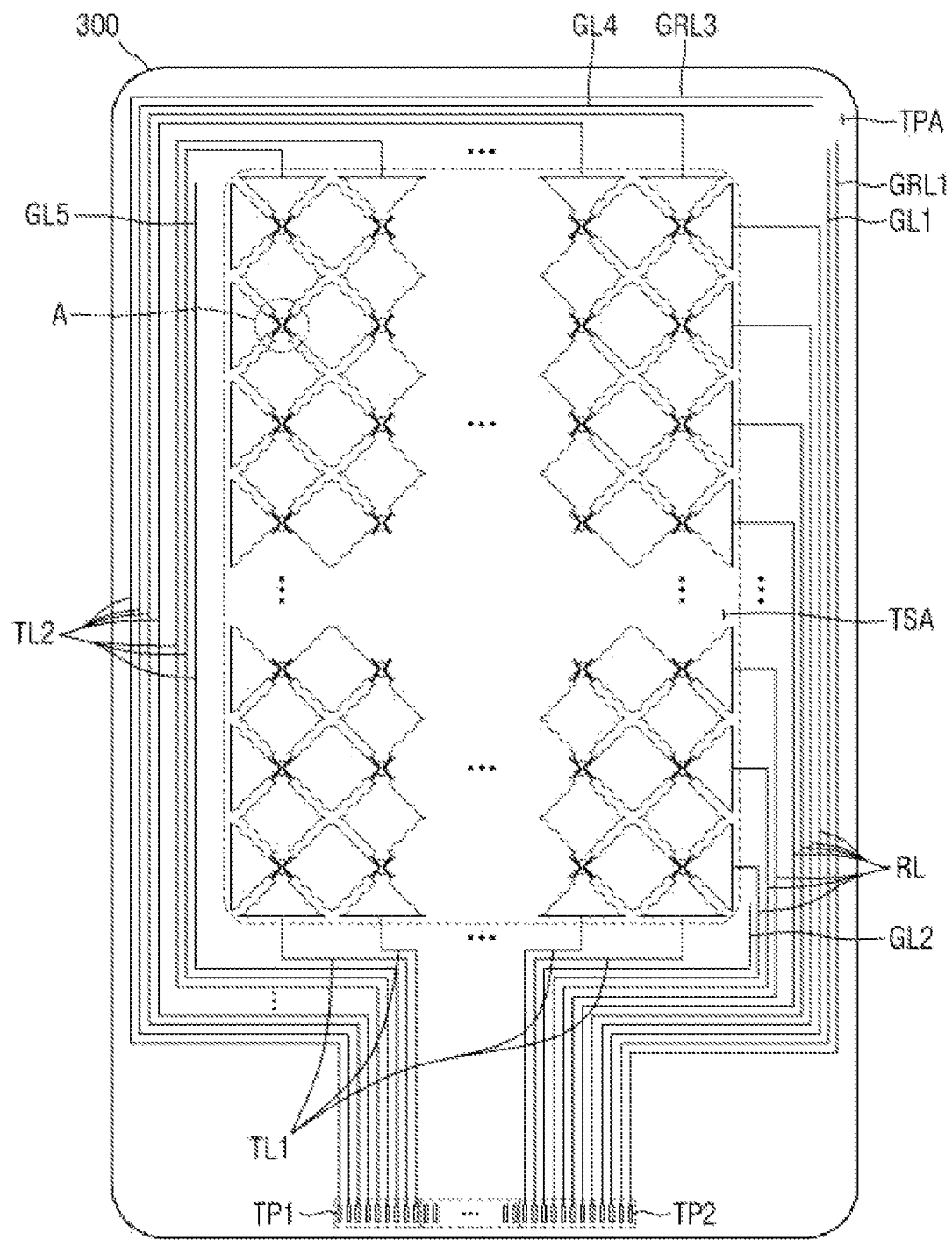
FIG. 55 is a plan view showing a sensor electrode layer of a display panel according to an embodiment.
Figure 55:
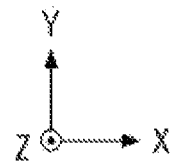
Figure 56:
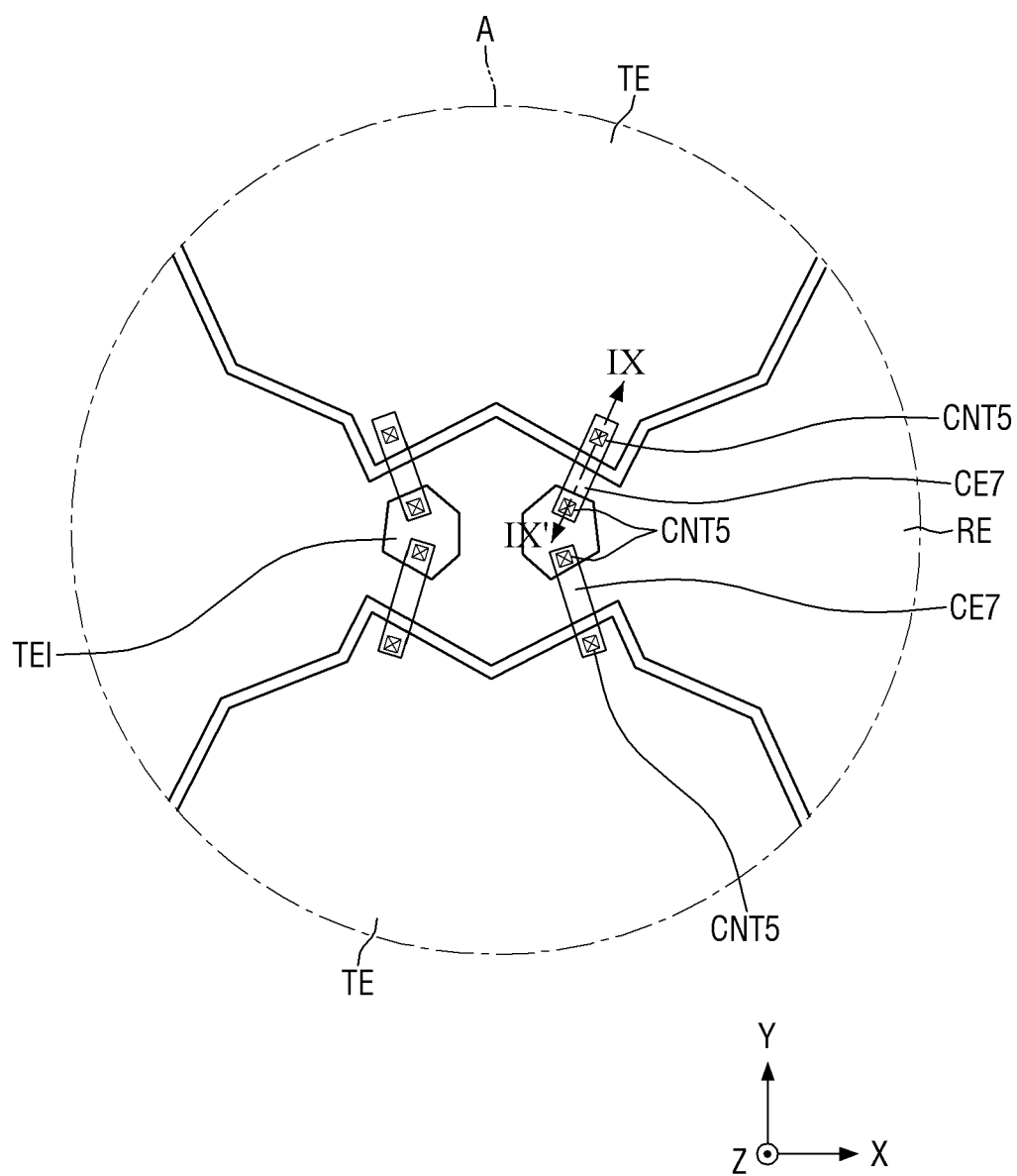
FIG. 56 is a side view showing an example of the display panel of FIG. 55.
Figure 57:
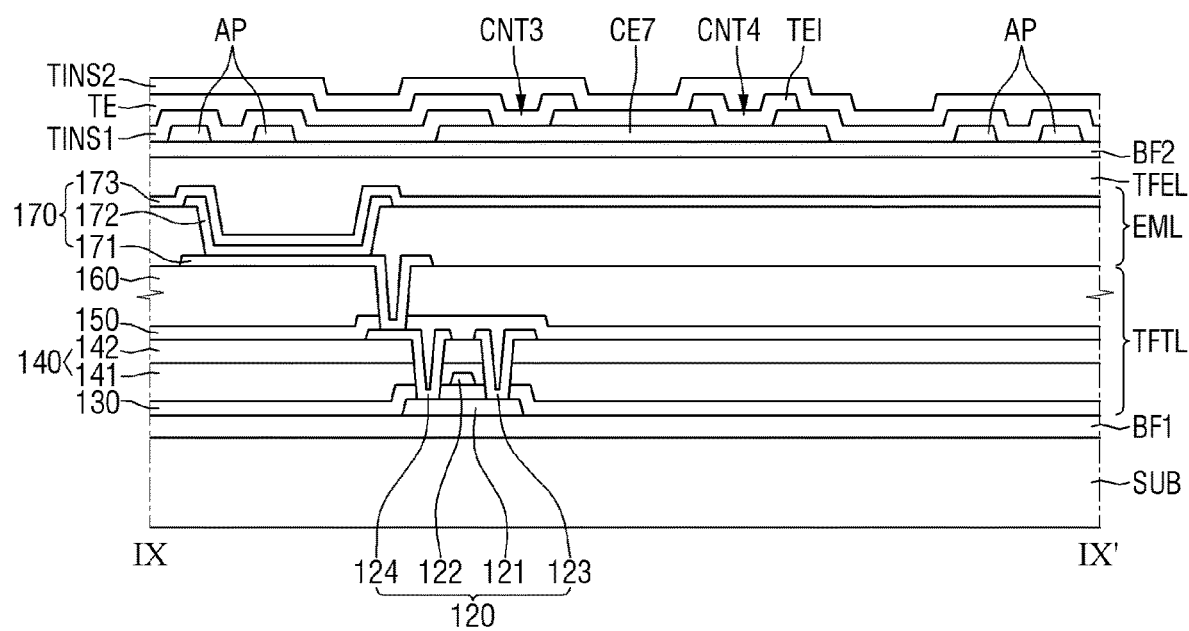
FIG. 57 is an enlarged plan view showing the sensor electrodes and the connection units of FIG. 55.

FIG. 55 is a plan view showing a sensor electrode layer of a display panel according to an embodiment. FIG. 56 is an enlarged plan view showing the sensor electrodes and the connection units of FIG. 55. FIG. 57 is a schematic cross-sectional view taken along line IX-IX' of FIG. 56.

An embodiment of FIGS. 55 to 57 may be different from an embodiment of FIG. 17 in that sensor electrodes TE and RE of a sensor electrode layer SENL may be transparent electrodes.

Referring to FIGS. 55 to 57, driving electrodes TE, sensing electrodes RE and island electrodes TEI may be made of a transparent metal oxide TCO, such as ITO and IZO, which may transmit light. Accordingly, even though the driving electrodes TE, the sensing electrodes RE and the island electrodes TEI overlap sub-pixels, the aperture ratio of the sub-pixel does not decrease.

In order to prevent the moiré phenomenon possibly caused by the driving electrodes TE and the sensing electrodes RE when a user watches images on the display panel 300, the driving electrodes TE and the sensing electrodes may have zigzag sides when viewed from the top as shown in FIG. 55. The zigzag pattern of a side of the driving electrode TE may conform to the zigzag pattern of a side of the sensing electrode RE adjacent to the side of the driving electrode TE.

Each of the connection units CE7 may electrically connect the driving electrode TE with the island electrode TEL One end of each of the connection units CE7 may be electrically connected to the driving electrode TE, and the other end thereof may be electrically connected to the island electrode TEL The island electrode TEI may be surrounded by the sensing electrode RE.

Figure 58:
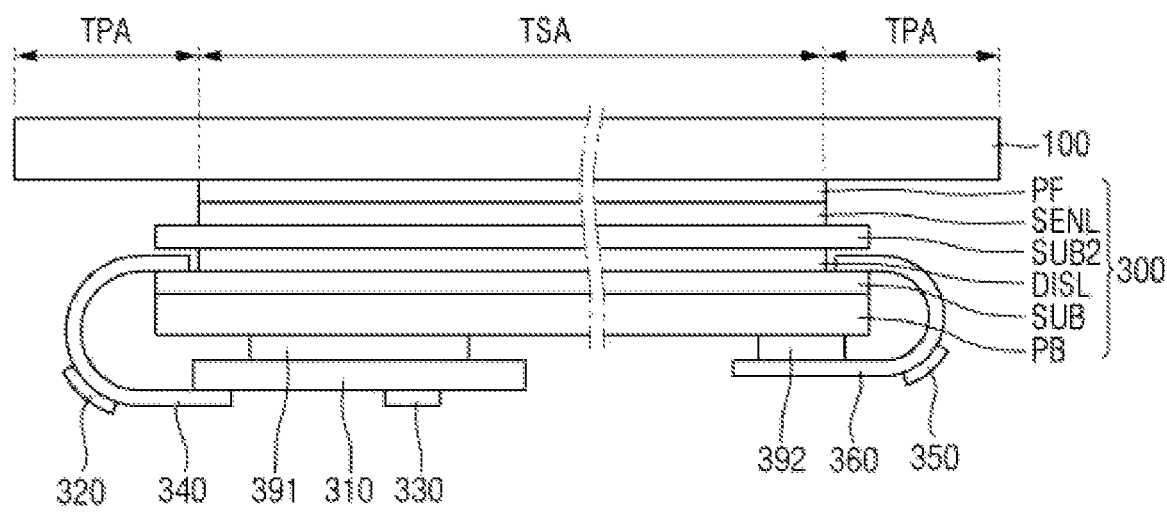
FIG. 58 is a schematic cross-sectional view taken along line IX-IX' of FIG. 57.

As shown in FIG. 58, a second substrate SUB2 may be added between the display layer DISL and the sensor electrode layer SENL of the display panel 300. For example, the sensor electrode layer SENL may be disposed on the second substrate SUB2. In this instance, the connection units CE7 may be disposed on the second substrate SUB2 as shown in FIG. 57. The connection units CE7 may be made up of, but not limited to, a stack structure of aluminum and titanium (Ti/Al/Ti), a stack structure of aluminum and ITO (ITO/Al/ITO), an APC alloy and a stack structure of APC alloy and ITO (ITO/APC/ITO). The second substrate SUB2 may be made of an insulating material such as glass, quartz and a polymer resin. The second substrate SUB2 may be a rigid substrate or a flexible substrate that may be bent, folded, or rolled, within the spirit and the scope of the disclosure.

The first sensor insulating layer TINS1 may be formed or disposed on the connection units CE7. The first sensor insulating layer TINS1 may be formed of an inorganic layer, for example, a silicon nitride layer, a silicon oxynitride layer, a silicon oxide layer, a titanium oxide layer, or an aluminum oxide layer.

The driving electrodes TE, the sensing electrodes RE and the island electrodes TEI may be formed or disposed on the first sensor insulating layer TINS1. Each of the driving electrodes TE may be electrically connected to the connection unit CE7 through a fifth contact hole CNT5 that penetrates the first sensor insulating layer TINS1 and exposes the connection unit CE7. Each of the island electrodes TEI may be electrically connected to the connection unit CE7 through a fifth contact hole CNT5 that penetrates through the first sensor insulating layer TINS1 and exposes the connection unit CE7. Accordingly, the driving electrode TE may be electrically connected to the island electrode TEI via the seventh connection unit CE7. Accordingly, the driving electrodes TE arranged or disposed in the second direction (y-axis direction) may be electrically connected to one another.

The first conductive patterns AP may be made of the same or similar material on a same layer as the driving electrodes TE, the sensing electrodes RE and the island electrodes TEL Each of the first conductive patterns AP may be made of a transparent metal oxide (TCO) such as ITO and IZO, which may transmit light. Therefore, each of the first conductive patterns AP may overlap the sub-pixel PX or the bank 180 in the third direction (z-axis direction). The width of each of the first conductive patterns AP may be 2 µm or less in order to prevent the first conductive patterns AP from being recognized by the user.

As shown in FIGS. 55 to 57, like the driving electrodes TE, the sensing electrodes RE and the island electrodes TEI, the first conductive patterns AP may be made of a transparent metal oxide TCI such as ITO and IZO, which may transmit light. Therefore, the first conductive patterns AP may be formed without any additional process.

Figure 59:
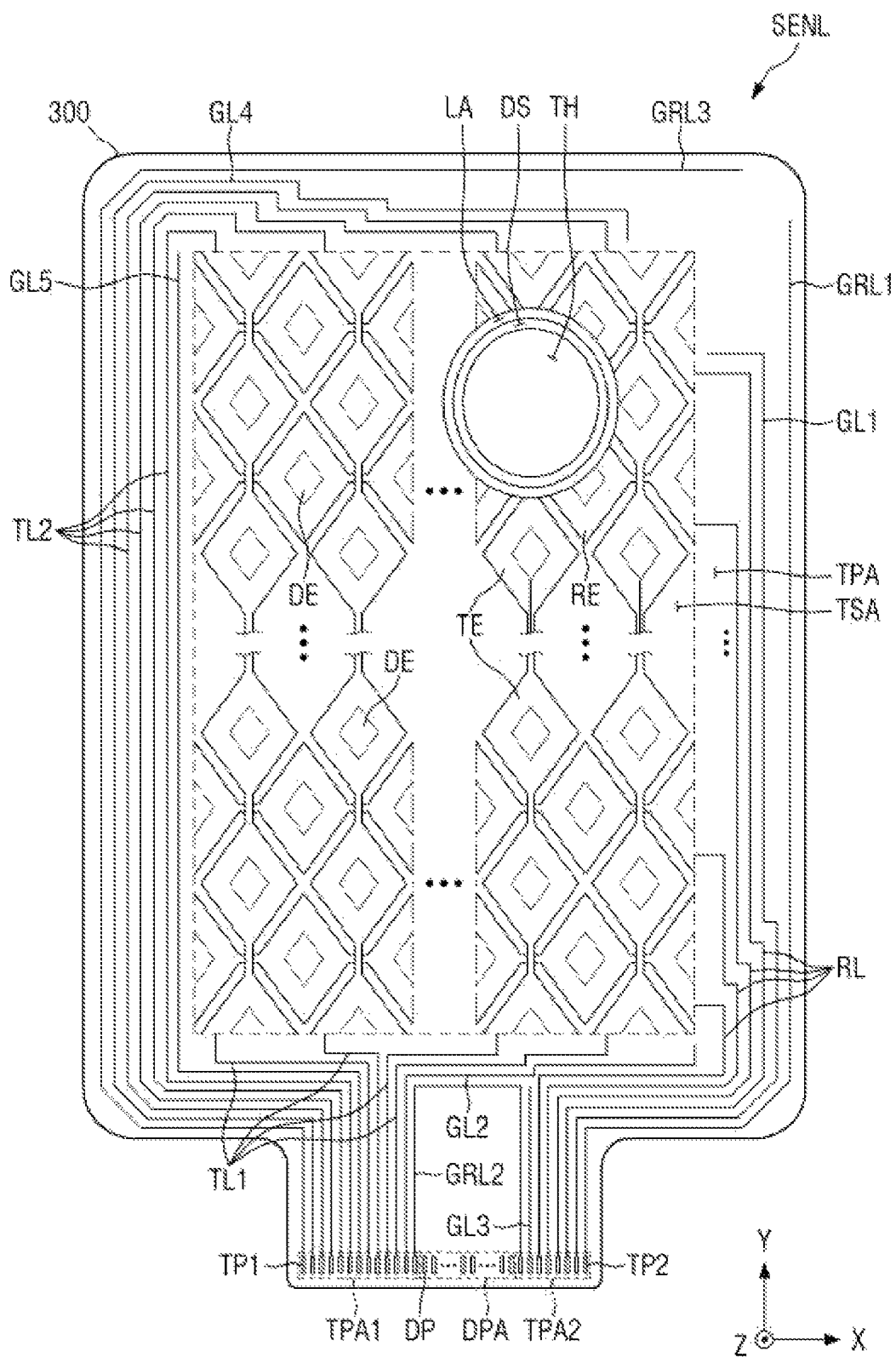
FIG. 59 is a plan view showing a sensor electrode layer of a display panel according to an embodiment.

FIG. 59 is a plan view showing a sensor electrode layer of a display panel according to an embodiment.

An embodiment of FIG. 59 may be different from an embodiment of FIG. 15 in that a through hole TH may be formed or disposed in the sensor area TSA, and that first conductive patterns AP may be formed or disposed in a wiring area LA around the through hole TH.

Referring to FIG. 59, a through hole TH penetrating through the display panel 300 may be formed or disposed in the sensor area TSA. The driving electrode TE and the sensing electrode RE may not be formed in the through hole TH. The through hole TH is shown as a circle when viewed from the top, the disclosure is not limited thereto. The through hole TH may have a substantially oval or a substantially polygonal shape when viewed from the top.

A dead space DS may surround the through hole TH. The driving electrodes TE and the sensing electrodes RE may not be formed or disposed in the dead space DS. The dead space DS may be formed in order to prevent the through hole TH from being formed so large by a processing error that it may be formed or disposed beyond the wiring area LA and the sensor area TSA during the process of forming the through hole TH. The dead space DS may be formed in, but is not limited to, a substantially ring or annular shape when viewed from the top. For example, since the dead space DS may surround the through hole TH, the shape of the dead space DS may substantially conform to the shape of the through hole TH when viewed from the top.

The wiring area LA may surround the dead space DS. The wiring area LA may be formed or disposed in, but is not limited to, a substantially ring or annular shape when viewed from the top. For example, since the wiring area LA may surround the dead space DS, the shape of the wiring area LA may substantially conform to the shape of the through hole TH and the dead space DS when viewed from the top.

The driving electrode TE and the sensing electrode RE may not be formed or disposed in the wiring area LA. In the wiring area LA, a driving connection unit electrically connecting between the driving electrodes TE disconnected by the through hole TH, and a sensing connection unit electrically connecting between sensing connection lines for electrically connecting between the sensing electrodes RE disconnected by the through hole TH. The wiring area LA may overlap a light-blocking layer of a cover window 100 in the third direction (z-axis direction). Therefore, the wiring area LA may be covered or overlapped by the light-blocking layer of the cover window 100.

Figure 60:
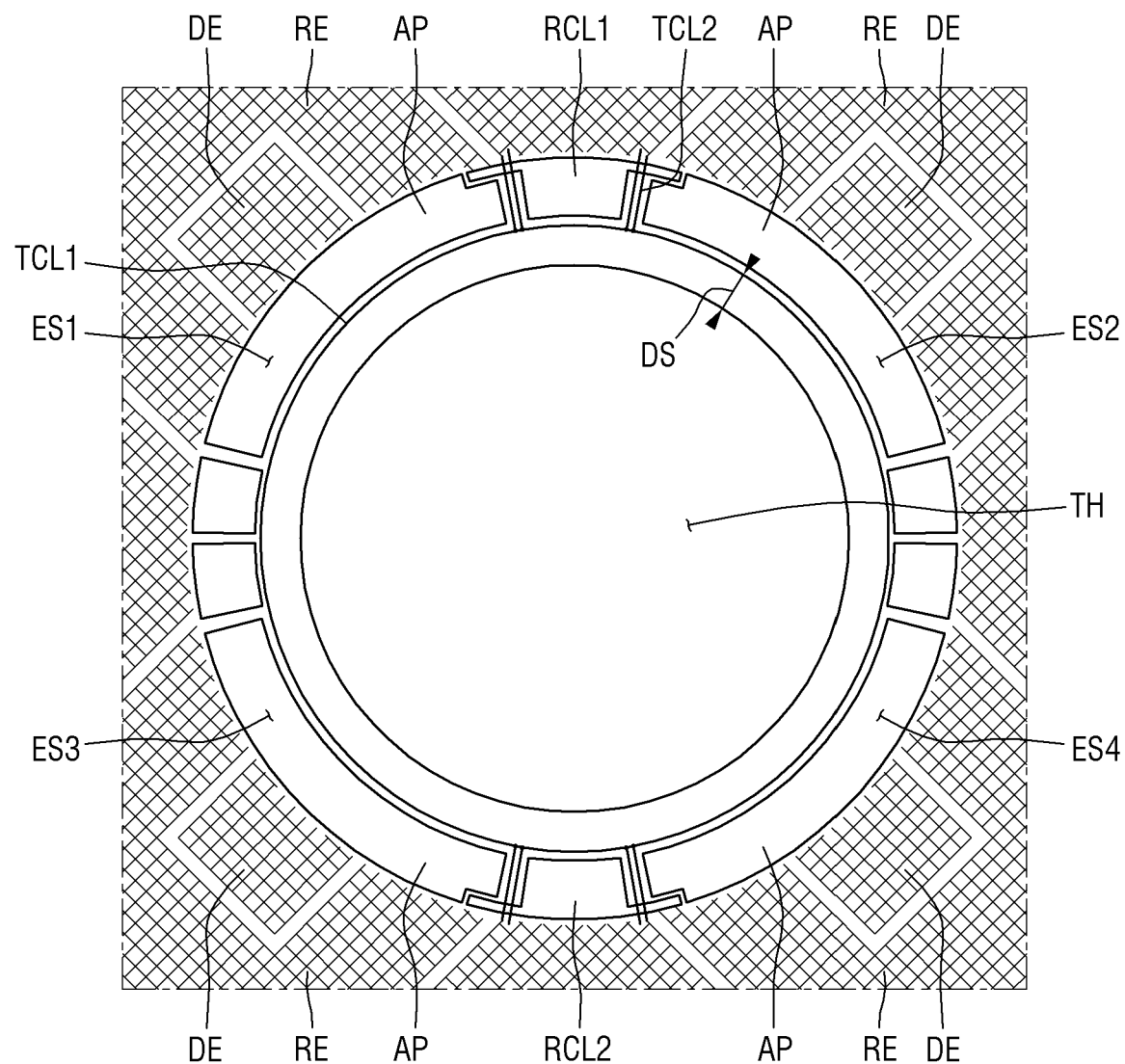
FIG. 60 is an enlarged plan view showing the through hole, the dead space and the wiring area of FIG. 59.
Figure 61:
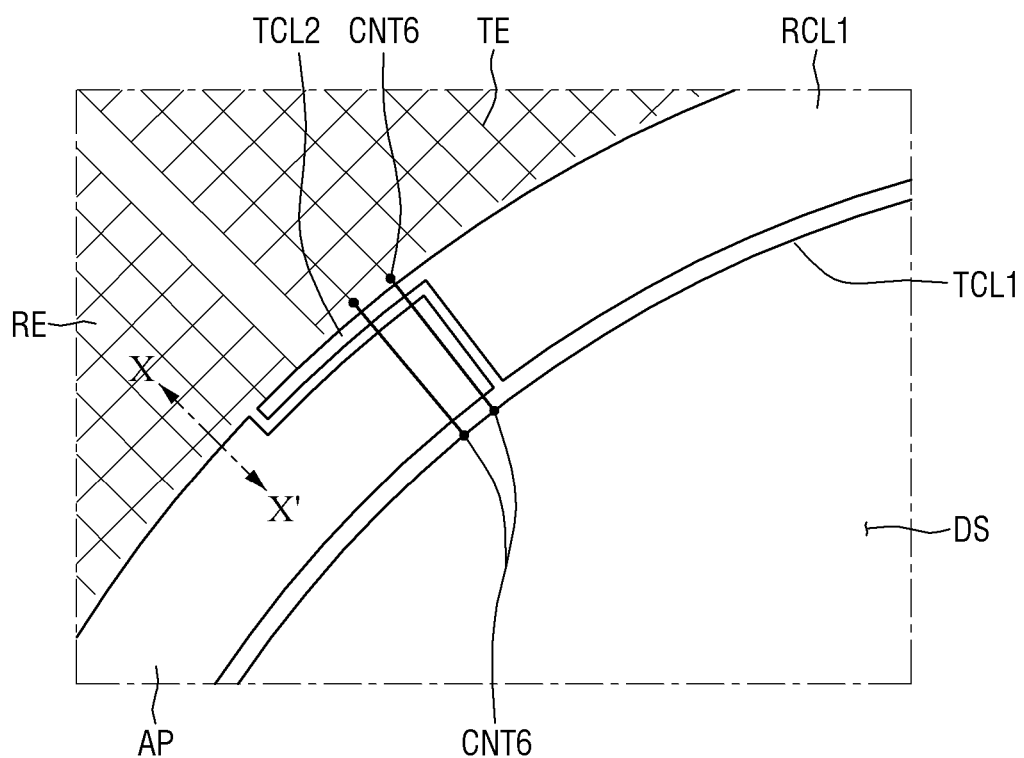
FIG. 61 is an enlarged plan view showing a connection unit between a driving electrode and a driving connection line and a connection unit between a sensing electrode and a sensing connection line of FIG. 60.
Figure 62:
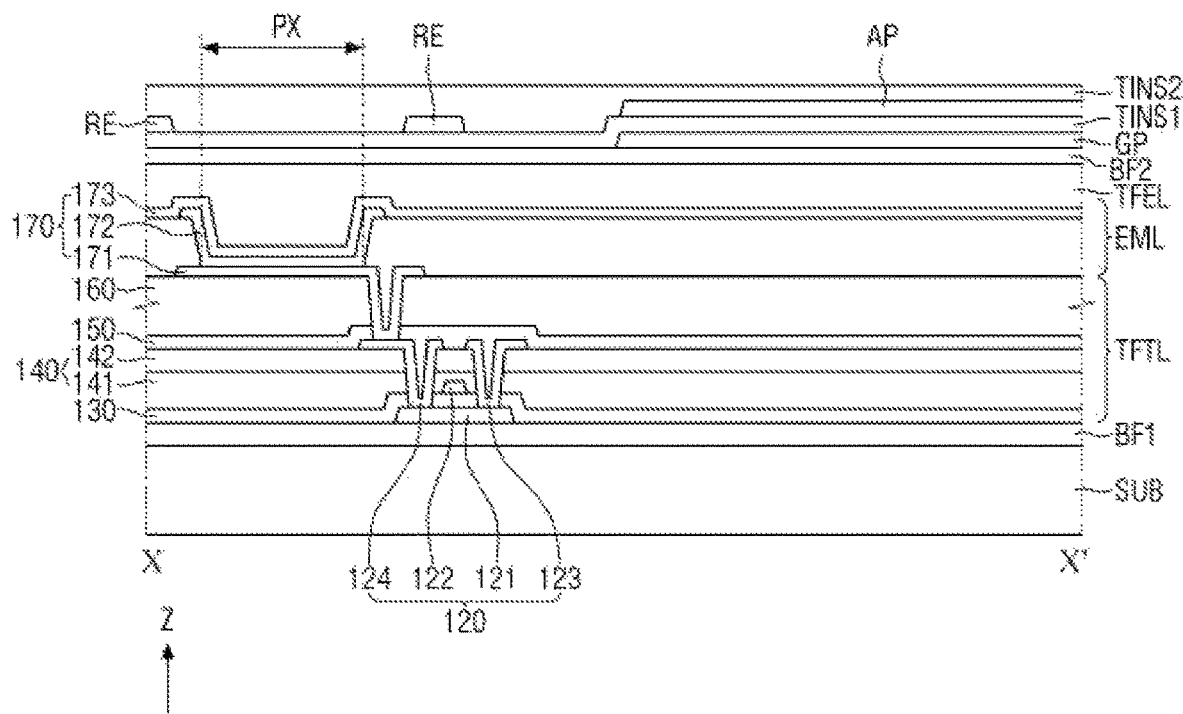
FIG. 62 is a schematic cross-sectional view taken along line X-X' of FIG. 61.

FIG. 60 is an enlarged plan view showing the through hole, the dead space and the wiring area of FIG. 59. FIG. 61 is an enlarged plan view showing a connection unit between a driving electrode and a driving connection line and a connection unit between a sensing electrode and a sensing connection line of FIG. 60. FIG. 62 is a schematic cross-sectional view taken along line X-X' of FIG. 61.

Referring to FIGS. 60 to 62, the wiring area LA may include a driving connection unit TCL, a first sensing connection unit RCL1, a second sensing connection unit RCL2, a first area compensating portion ES1, and a second area compensating portion ES2.

The driving connection unit TCL may electrically connect between the driving electrodes TE disconnected by the through hole TH. The driving connection unit TCL may include a first driving connection unit TCL1 and a second driving connection unit TCL2.

The first driving connection unit TCL1 may be formed or disposed along the edge of the wiring area LA adjacent to the dead space DS. For example, as the wiring area LA is formed in a substantially ring or annular shape when viewed from the top, the first driving connection unit TCL1 may be formed in a substantially circular shape when viewed from the top.

The second driving connection unit TCL2 may electrically connect the first driving connection unit TCL1 with the driving electrode TE. One side of the second driving connection unit TCL2 may be electrically connected to the first driving connection unit TCL1 through a sixth contact hole CNT6 exposing the first driving connection unit TCL1, and the other side of the second driving connection unit TCL2 may be electrically connected to the driving electrode TE through the sixth contact hole CNT6 exposing the driving electrode TE.

The first driving connection unit TCL1 may be made of the same or similar material on a same layer as the driving electrode TE. The second driving connection unit TCL2 may be made of the same or similar material on a same layer as the first connection unit BE1. The first driving connection unit TCL1 and the second driving connection unit TCL2 may be disposed on different layers. For example, the first driving connection unit TCL1 may be disposed on the first sensor insulating layer TINS1, and the second driving connection unit TCL2 may be disposed on the second buffer layer BF2.

The first sensing connection unit RCL1 may electrically connect the sensing electrodes TE disconnected by the through hole TH. The first sensing connection unit RCL1 may be electrically separated from the driving electrode TE, the first driving connection unit TCL1 and the second driving connection unit TCL2. The first sensing connection unit RCL1 may intersect the second driving connection unit TCL2. The first sensing connection unit RCL1 may be made of the same or similar material on a same layer as the sensing electrode RE.

The second sensing connection unit RCL2 may electrically connect other sensing electrodes TE disconnected by the through hole TH. The second sensing connection unit RCL2 may be electrically separated from the driving electrode TE, the first driving connection unit TCL1 and the second driving connection unit TCL2. The second sensing connection unit RCL2 may intersect the second driving connection unit TCL2. The second sensing connection unit RCL2 may be made of the same or similar material on a same layer as the sensing electrode RE.

Incidentally, because the area of the sensing electrode RE removed by the through hole TH is greater than the area of the driving electrode TE removed by the through hole TH, it is necessary to compensate for the area of the sensing electrode RE removed by the through hole TH. Therefore, the width of the first sensing connection unit RCL1 and the width of the second sensing connection unit RCL2 may be larger than the width of the first driving connection unit TCL1 and the width of the second driving connection unit TCL2, respectively. For example, the first sensing connection unit RCL1 may be formed or disposed between the driving electrode TE and the first driving connection unit TCL1.

The first area compensating portion ES1 may compensate for the area of a sensing electrode RE removed by the through hole TH. The first area compensating portion ES1 may be electrically separated from the driving electrode TE, the first driving connection unit TCL1 and the second driving connection unit TCL2. The first area compensating portion ES1 may intersect the second driving connection unit TCL2. The first area compensating portion ES1 may be made of the same or similar material on a same layer as the sensing electrode RE.

The second area compensating portion ES2 may compensate for the area of another sensing electrode RE removed by the through hole TH. The first area compensating portion ES1 may be adjacent to the second area compensating portion ES2. The second area compensating portion ES2 may be electrically separated from the driving electrode TE, the first driving connection unit TCL1 and the second driving connection unit TCL2. The second area compensating portion ES2 may intersect the second driving connection unit TCL2. The second area compensating portion ES2 may be made of the same or similar material on a same layer as the sensing electrode RE.

The third area compensating portion ES3 may compensate for the area of still another sensing electrode RE removed by the through hole TH. The third area compensating portion ES3 may be electrically separated from the driving electrode TE, the first driving connection unit TCL1 and the second driving connection unit TCL2. The third area compensating portion ES3 may intersect the second driving connection unit TCL2. The third area compensating portion ES3 may be made of the same or similar material on a same layer as the sensing electrode RE.

The fourth area compensating portion ES4 may compensate for the area of another sensing electrode RE removed by the through hole TH. The third area compensating portion ES3 may be adjacent to the fourth area compensating portion ES4. The fourth area compensating portion ES4 may be electrically separated from the driving electrode TE, the first driving connection unit TCL1 and the second driving connection unit TCL2. The fourth area compensating portion ES4 may intersect the second driving connection unit TCL2. The fourth area compensating portion ES4 may be made of the same or similar material on a same layer as the sensing electrode RE.

In the wiring area LA, the first conductive patterns AP may be disposed between the first sensing connection unit RCL1 and the first area compensating portion ES1, between the first sensing connection unit RCL1 and the third area compensating portion ES3, between the second sensing connection unit RCL2 and the second area compensating portion ES2, and between the second sensing connection unit RCL2 and the fourth area compensating portion ES4. The first conductive patterns AP may be electrically connected by a single feeding line. Alternatively, the first conductive patterns AP may be electrically connected to different feeding lines.

Each of the first conductive patterns AP may be formed in a substantially loop shape, a substantially coil shape, or as a rectangular patch. When each of the first conductive patterns AP is formed in a substantially loop shape or a substantially coil shape, it may be used as an antenna for an RFID tag for near field communications. When each of the first conductive patterns AP may be the quadrangular patch as shown in FIG. 21, it may be utilized as a patch antenna for mobile communications.

As shown in FIG. 62, the first conductive pattern AP may be made of the same or similar material on a same layer as the sensing electrode RE. The first conductive pattern AP may be disposed on the first sensor insulating layer TINS1.

The second conductive pattern GP overlapping the first conductive pattern AP may be made of the same or similar material on a same layer as the first connection unit CE1 and the second driving connection unit TCL2 as shown in FIG. 62. The second conductive pattern GP may be disposed on the second buffer layer BF2.

The first conductive pattern AP may be made of the same or similar material on a same layer as the sensing electrode RE, and the second conductive pattern GP is made of the same or similar material on a same layer as the first connection unit CE1 and the second driving connection unit TCL2, and thus the first conductive pattern AP and the second conductive pattern GP may be formed without any additional process.

As shown in FIGS. 60 to 62, the first conductive pattern AP formed or disposed in the remaining portion of the wiring area LA surrounding the through hole TH may be utilized as the antenna.

Figure 63:
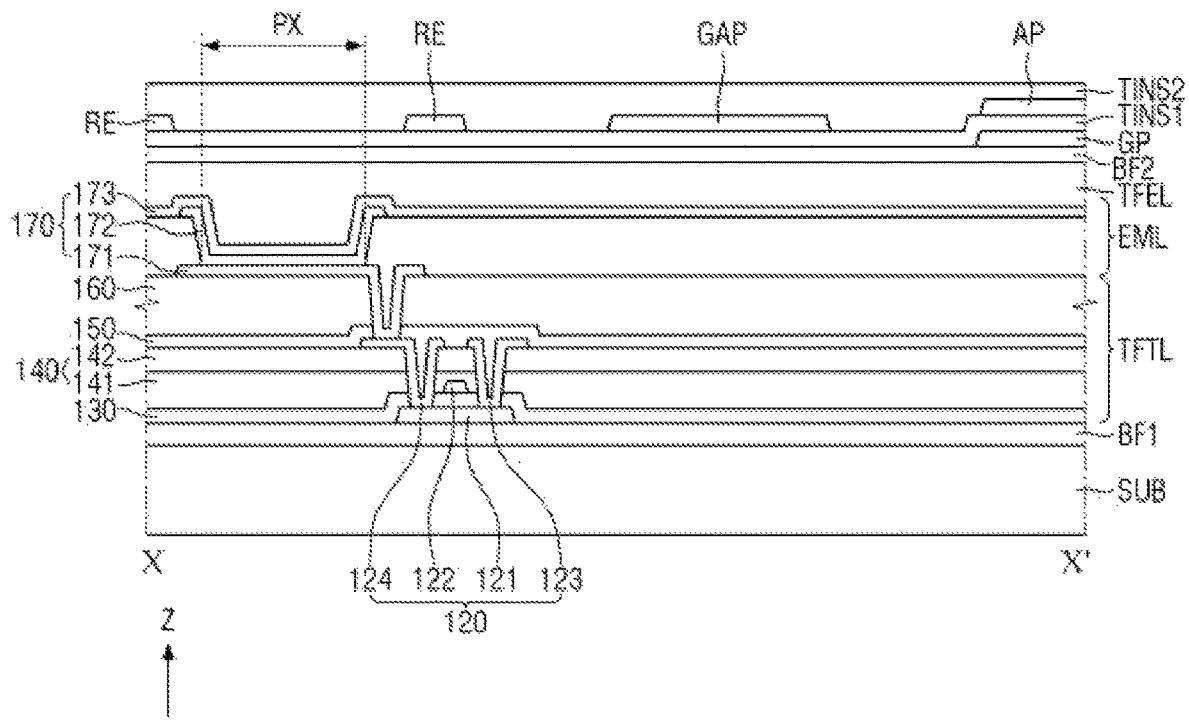
FIG. 63 is a schematic cross-sectional view taken along line X-X' of FIG. 61.

FIG. 63 is a schematic cross-sectional view taken along line X-X' of FIG. 61.

An embodiment of FIG. 63 may be different from an embodiment of FIG. 62 in that a guard pattern GAP may be formed or disposed between a sensing electrode RE and a first conductive pattern AP.

Referring to FIG. 63, the guard pattern GAP may be spaced apart from the sensing electrode RE and the first conductive pattern AP. The guard pattern GAP may be electrically floating or may receive a ground voltage.

As the guard pattern GAP is disposed between the sensing electrode RE and the first conductive pattern AP as shown in FIG. 63, it is possible to block the influence on the sensing electrode RE by electromagnetic waves from the first conductive pattern AP.

Figure 64:
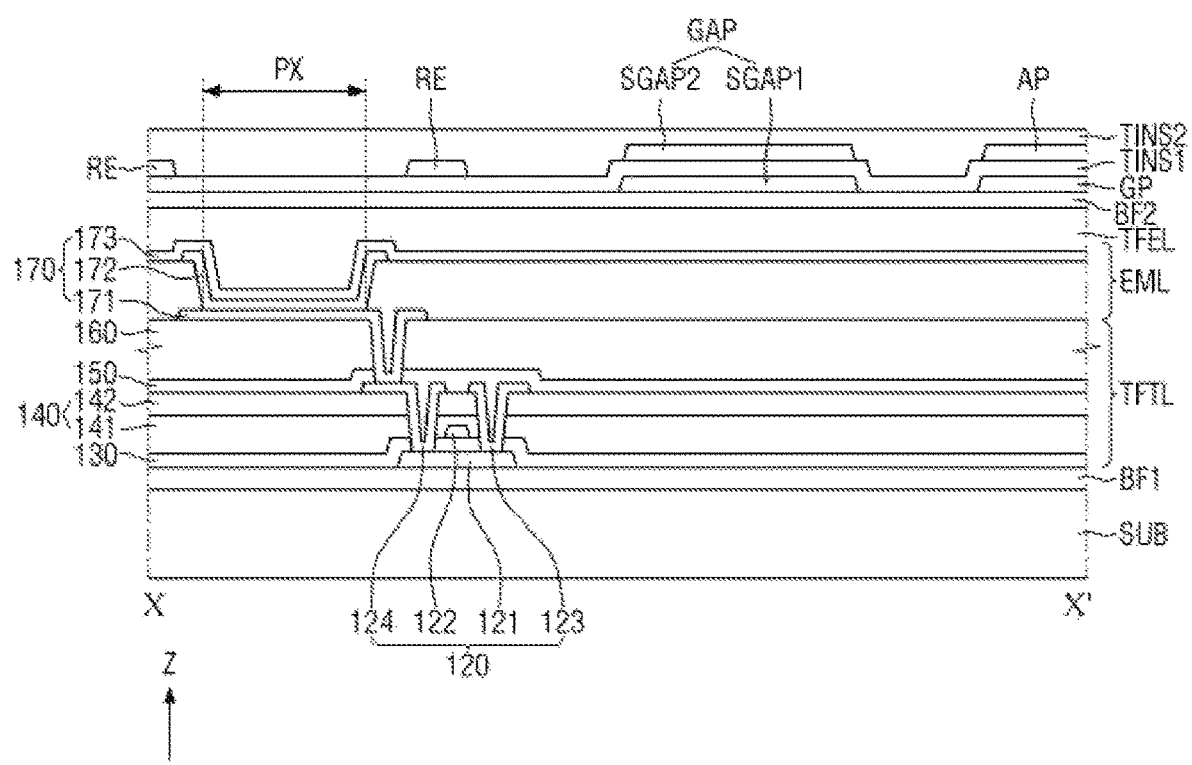
FIG. 64 is a schematic cross-sectional view taken along line X-X' of FIG. 61.

FIG. 64 is a schematic cross-sectional view taken along line X-X' of FIG. 61.

An embodiment of FIG. 64 may be different from an embodiment of FIG. 63 in that each of guard patterns GAP may include a first sub guard pattern SGAP1 and a second sub guard pattern SGAP2.

Referring to FIG. 64, the first sub gaud pattern SGAP1 may be made of the same or similar material on a same layer as the first connection unit BE1 and the second conductive pattern GP. The first sub guard pattern SGAP1 may be disposed on the second buffer layer BF2.

The second sub guard pattern SGAP2 may be made of the same or similar material on a same layer as the sensing electrode RE and the first conductive pattern AP. The second sub guard pattern SGAP2 may be disposed on the first sensor insulating layer TINS1. The second sub guard pattern SGAP2 may be electrically connected to the first sub guard pattern SGAP1 through a contact hole penetrating the first sensor insulating layer TINS1.

As shown in FIG. 64, when the guard pattern GAP is made up of the two layers of the first sub guard pattern SGAP1 and the second sub guard pattern SGAP2, it is possible to more effectively block the influence on driving electrodes TE and the sensing electrodes RE by electromagnetic waves from the first conductive pattern AP.

Figure 65:
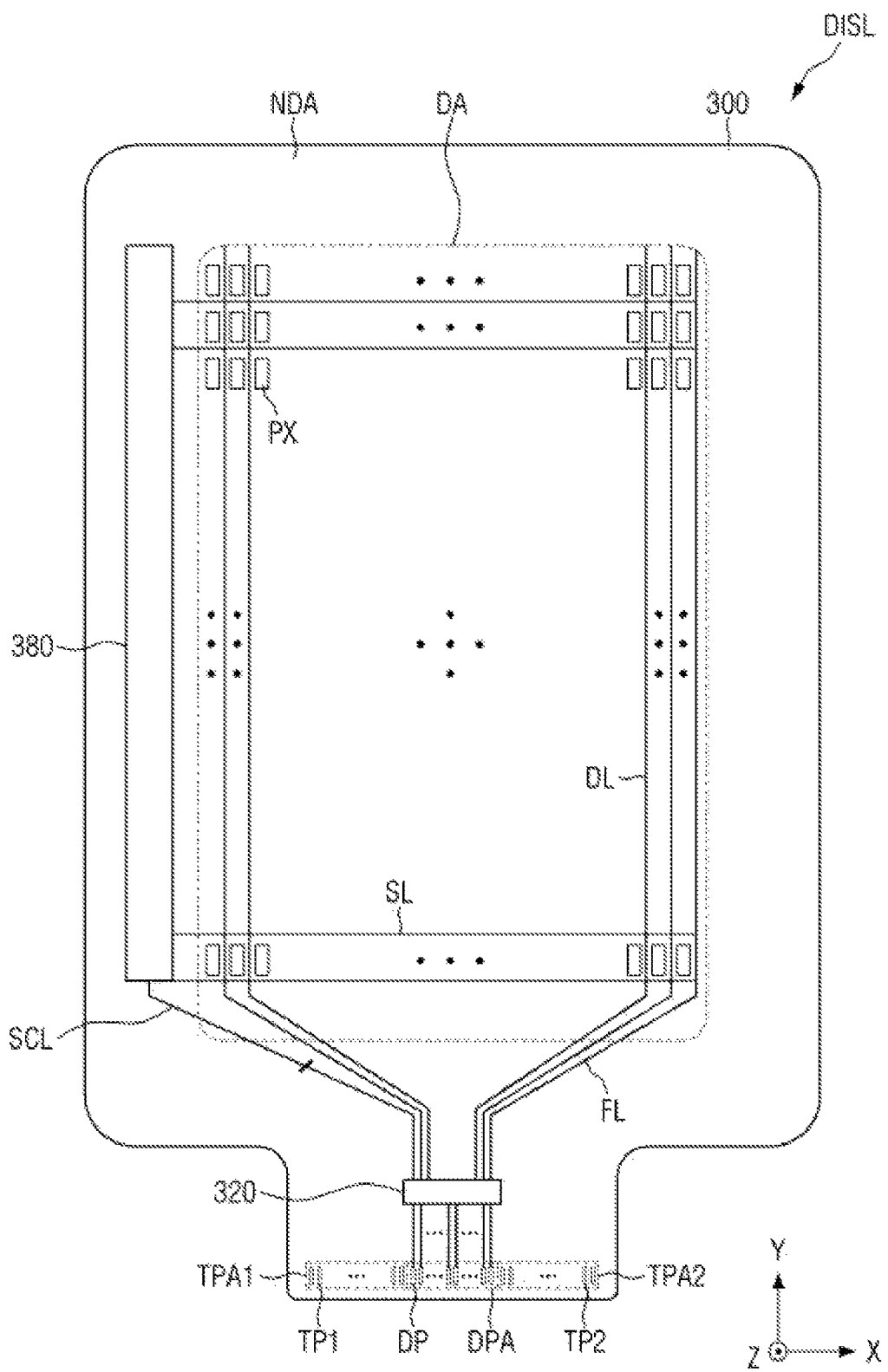
FIG. 65 is a plan view showing a display layer of a display panel according to an embodiment.

FIG. 65 is a plan view showing a display layer of a display panel according to an embodiment.

For convenience of illustration, FIG. 65 shows only pixels P, scan lines SL, data lines DL, scan control lines SCL, fan-out lines DLL, a scan driver 380, a display driver 320 and display pads DP of the display unit DU. However, the disclosure is not limited thereto.

Referring to FIG. 65, the scan lines SL, the data lines DL and the pixels P are disposed in the display area DA. The scan lines SL may be arranged or disposed in the first direction (x-axis direction), while the data lines DL may be arranged or disposed in the second direction (y-axis direction) intersecting the first direction (x-axis direction).

Each of the sub-pixels PX may be electrically connected to at least one of the scan lines SL and at least one of the data lines DL. Each of the sub-pixels PX may include thin-film transistors including a driving transistor and at least one switching transistor, a light-emitting element, and a capacitor. When a scan signal is applied from a scan line SL, each of the sub-pixels P receives a data voltage of a data line DL and supplies a driving current to the light-emitting element according to the data voltage applied to the gate electrode, so that light is emitted.

The scan driver 380 may be electrically connected to the display driver 320 through scan control lines SCL. Accordingly, the scan driver 380 may receive the scan control signal from the display driver 320. The scan driver 380 generates scan signals according to a scan control signal and supplies the scan signals to the scan lines SL.

Although the scan driver 380 may be formed or disposed in the non-display area NDA on the left outer side of the display area DA in the drawing, the disclosure is not limited thereto. For example, the scan driver 380 may be formed or disposed in the non-display area NDA on the left outer side as well as in the non-display area NDA on the right outer side of the display area DA.

The display driver 320 may be electrically connected to the display pads DP and receives digital video data and timing signals. The display driver 320 converts the digital video data into analog positive/negative data voltages and supplies them to the data lines DL through the fan-out lines DLL. The display driver 320 generates and supplies scan control signals for controlling the scan driver 380 through the scan control line SCL. The pixels P to which the data voltages are to be supplied are selected by the scan signals of the scan driver 380, and the data voltages are supplied to the selected pixels P. The display driver 320 may be an integrated circuit (IC) and may be attached to the substrate SUB by a chip on glass (COG) technique, a chip on plastic (COP) technique, or an ultrasonic bonding. It is, however, to be understood that the disclosure is not limited thereto. For example, the display driver 320 may be mounted on the display circuit board 310.

As shown in FIG. 65, the display panel 300 may include display pads DP electrically connected to the display driver 320 and sensor pads TP1 and TP2 electrically connected to the sensor lines. A display pad area DPA in which the display pads DP are disposed may be disposed between a first sensor pad area TPA1 in which the first sensor pads TP1 are disposed and a second sensor pad area TPA2 in which the second sensor pads TP2 are disposed. As shown in FIG. 65, the display pad area DPA may be disposed at the center of one end of the display panel 300, the first sensor pad area TPA1 may be disposed at the left side of the end of the display panel 300, and the second sensor pad area TPA2 may be disposed on the right side of the end of the display panel 300.

Figure 66:
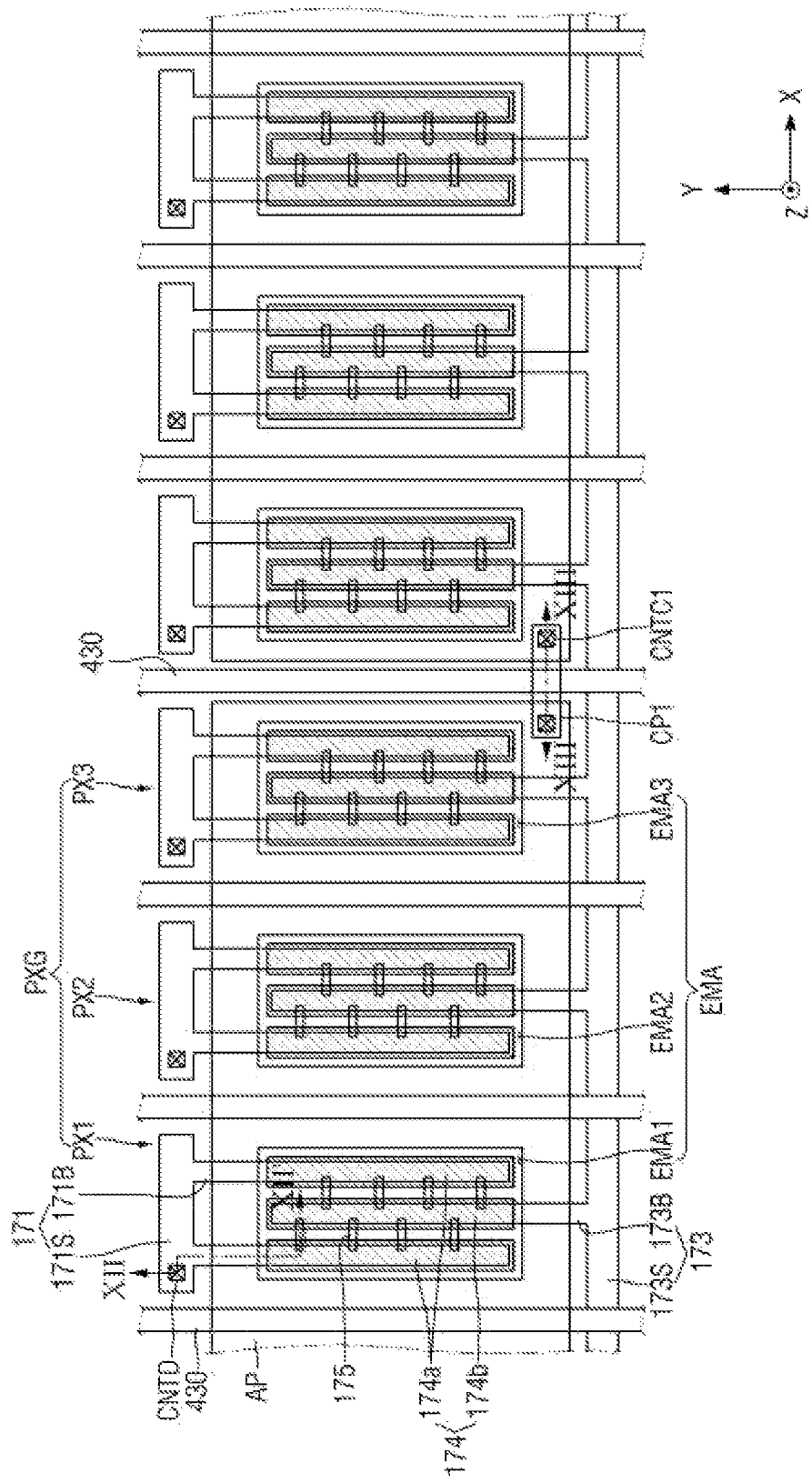
FIG. 66 is a plan view showing an example of the pixels in the display area of FIG. 65.

FIG. 66 is a plan view showing an example of the pixels in the display area of FIG. 65.

Referring to FIG. 66, each of the pixels PXG may include a first sub-pixel PX1, a second sub-pixel PX2 and a third sub-pixel PX3. The first sub-pixel PX1 may emit a first light, the second sub-pixel PX2 may emit a second light, and the third sub-pixel PX3 may emit a third light. The first light may be red light, the second light may be green light, and the third light may be blue light. It is, however, to be understood that the disclosure is not limited thereto. The sub-pixels PX1, PX2 and PX3 may emit light of the same color. Although the pixel PXG includes the three sub-pixels in the example shown in FIG. 55, the disclosure is not limited thereto. Each of the sub-pixels PX1, PX2 and PX3 may include an emission area EMA and a non-emission area. The first sub-pixel PX1 may include a first emission area EMA1, the second sub-pixel PX2 may include a second emission area EMA2, and the third sub-pixel PX3 may include a third emission area EMA3. The emission area EMA may be defined as a region in which a light-emitting element 175 is disposed to emit light of a specific wavelength band. The emission area EMA may not be covered or overlapped by the first conductive pattern AP but may be exposed. The non-emission area may be defined as the other region than the emission area EMA. In the non-emission area, the light-emitting element 175 is not disposed and the light emitted from the light-emitting element 170 does not reach, and thus no light exits therefrom.

Each of the sub-pixels PX1, PX2 and PX3 may include a first electrode 171, a second electrode 173, a contact electrode 174, a light-emitting element 175, a first conductive pattern AP, and a first connection pattern CP1.

The first electrode 171 may be a pixel electrode disposed in each of the sub-pixels PX1, PX2 and PX3, while the second electrode 173 may be a common electrode electrically connected across the sub-pixels PX1, PX2 and PX3. Alternatively, the first electrode 171 may be an anode electrode of the light-emitting element 175, and the other may be a cathode electrode of the light-emitting element 175.

The first electrode 171 and the second electrode 173 may include electrode stems 171S and 173S extended in the first direction (x-axis direction), respectively, and one or more electrode branches 171B and 173B branching off from the electrode stems 171S and 173S, respectively, and extended in the second direction (y-axis direction) intersecting the first direction D1 (x-axis direction).

The first electrode 171 may include the first electrode stem 171S extended in the first direction (x-axis direction), and at least one first electrode branch 171B branching off from the first electrode stem 171S and extended in the second direction (y-axis direction).

The first electrode stem 171S of a pixel may be electrically separated from the first electrode stem 171S of another pixel adjacent to the pixel in the first direction (x-axis direction). The first electrode stem 171S of a pixel may be spaced apart from the first electrode stem 171S of another pixel adjacent to the pixel in the first direction (x-axis direction). The first electrode stem 171S may be electrically connected to the thin-film transistor through a first electrode contact hole CNTD.

The first electrode branch 171B may be spaced apart from the second electrode stem 173S in the second direction (y-axis direction). The first electrode branch 171B may be spaced apart from the second electrode stem 173S in the second direction (y-axis direction).

The second electrode 173 may include the second electrode stem 173S extended in the first direction (x-axis direction), and a second electrode branch 173B branching off from the second electrode stem 173S and extended in the second direction (y-axis direction).

The second electrode stem 173S of a pixel may be electrically connected to the second electrode stem 173S of another pixel adjacent to the pixel in the first direction (x-axis direction). The second electrode stem 173S may traverse the sub-pixels PX1, PX2 and PX3 in the first direction (x-axis direction).

The second electrode branch 173B may be spaced apart from the first electrode stem 171S in the second direction (y-axis direction). The second electrode branch 173B may be spaced apart from the first electrode branch 171B in the first direction (x-axis axis direction). The second electrode branch 173B may be disposed between the first electrode branches 171B in the first direction (x-axis axis direction).

Figure 67:
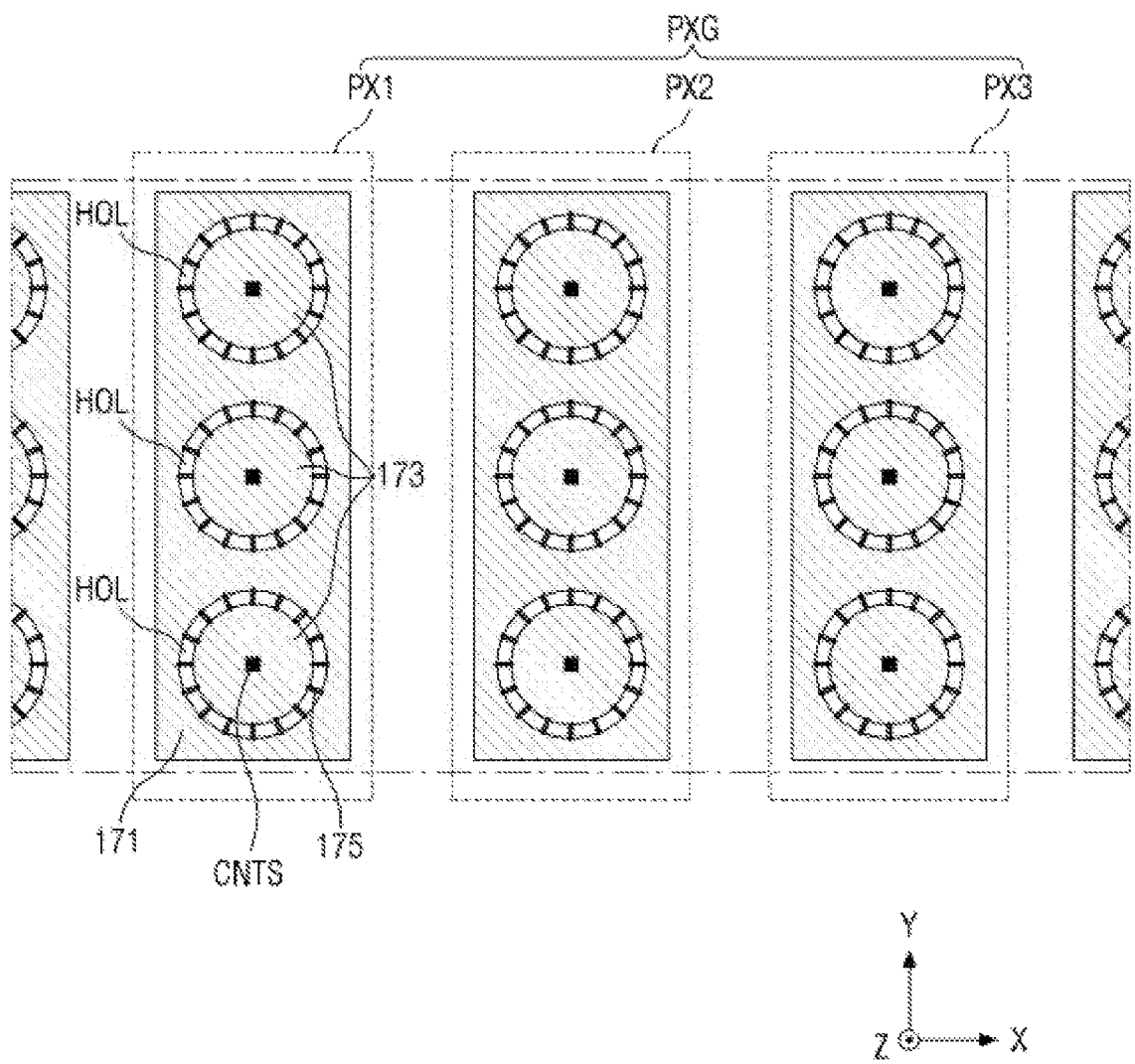
FIG. 67 is a plan view showing an example of the pixels in the display area of FIG. 65.

Although FIG. 66 shows that the first electrode branch 171B and the second electrode branch 173B are extended in the second direction (y-axis direction), but the disclosure is not limited thereto. For example, each of the first electrode branch 171B and the second electrode branch 173B may be partially curved or bent, and as shown in FIG. 67, one electrode may surround the other electrode. In the example shown in FIG. 67, the second electrode 173 may have a substantially circular shape, the first electrode 171 surrounds the second electrode 173, a hole having a substantially ring or annular shape may be formed or disposed between the first electrode 171 and the second electrode 173, and the second electrode 173 receives a cathode voltage through a second electrode contact hole CNT5. The shapes of the first electrode branch 171B and the second electrode branch 173B are not particularly limed as long as the first electrode 171 and the second electrode 173 are at least partially spaced apart from each other so that the light-emitting elements 175 may be disposed in the space between the first electrode 171 and the second electrode 173.

The light-emitting elements 175 may be disposed between the first electrode line 171 and the second electrode line 173. One end of each of the light-emitting element 175 may be electrically connected to the first electrode 171, and the other end thereof may be electrically connected to the second electrode 173. The light-emitting elements 175 may be spaced apart from each other. The light-emitting elements 175 may be arranged or disposed substantially in parallel.

Figure 68:
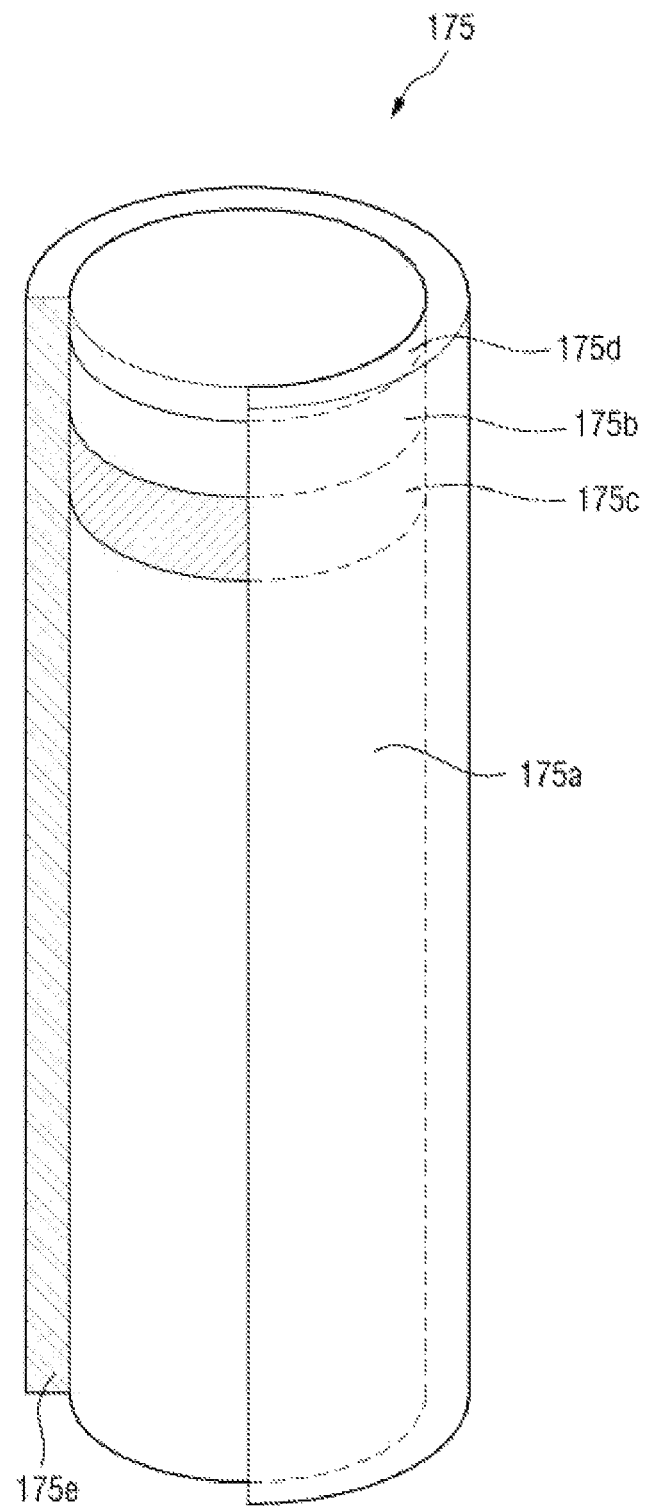
FIG. 68 is a perspective view showing one of the light-emitting elements of FIG. 66 in detail.

The light-emitting element 175 may have a shape of a rod, a line (line), a tube, a nanorod, within the spirit and the scope of the disclosure. For example, the light-emitting element 175 may be formed in a substantially cylindrical shape or a substantially rod shape as shown in FIG. 68. It is to be understood that the shape of the light-emitting elements 175 is not limited thereto. The light-emitting elements 175 may have a substantially polygonal column shape such as a cube, a cuboid and/or a hexagonal column, or a shape that may be extended in a direction with partially inclined outer surfaces. The length 'h' of the light-emitting element 175 may be in a range of about 1 µm to about 10 µm or in a range of about 2 µm to about 6 µm, and as an example, approximately or in a range of about 3 µm to about 5 µm. The diameter of the light-emitting element 175 may be in a range of about 300 nm to about 700 nm, and the aspect ratio of the light-emitting element 175 may be in a range of about 1.2 to about 100.

The light-emitting element 175 of the first sub-pixel PX1 may emit first light, the light-emitting element 175 of the second sub-pixel PX2 may emit second light, and the light-emitting element 175 of the third sub-pixel PX3 may emit third light. The first light may be red light having a center wavelength band in a range of 620 nm to 752 nm, the second light may be green light having a center wavelength band in a range of 495 nm to 570 nm, and the third light may be blue light having a center wavelength band in a range of 450 nm to 495 nm. Alternatively, the light-emitting element 175 of the first sub-pixel PX1, the light-emitting element 175 of the second sub-pixel PX2 and the light-emitting element 175 of the third sub-pixel PX3 may emit light of substantially the same color.

The contact electrode 174 may include a first contact electrode 174*a* and a second contact electrode 174*b*. The first contact electrode 174*a* and the second contact electrode 174*b* may have a shape extended in the second direction (y-axis direction).

The first contact electrode 174*a* may be disposed on the first electrode branch 171B and electrically connected to the first electrode branch 171B. The first contact electrode 174*a* may be in contact with one end of the light-emitting element 175. The first contact electrode 174*a* may be disposed between the first electrode branch 171B and the light-emitting element 175. Accordingly, the light-emitting element 175 may be electrically connected to the first electrode 171 through the first contact electrode 174*a*.

The second contact electrode 174*b* may be disposed on the second electrode branch 173B and electrically connected to the second electrode branch 173B. The second contact electrode 174*b* may be in contact with the other end of the light-emitting element 175. The second contact electrode 174*b* may be disposed between the second electrode branch 173B and the light-emitting element 175. Accordingly, the light-emitting element 175 may be electrically connected to the second electrode 173 through the second contact electrode 174*b*.

The width (or length in the first direction (x-axis direction)) of the first contact electrode 174*a* may be greater than the width (or length in the first direction (x-axis direction))

of the first electrode branch 171B, and the width (or length in the first direction (x-axis direction)) of the second contact electrode 174b may be greater than the width (or length in the first direction (x-axis direction)) of the second electrode branch 173B.

Outer banks 430 may be disposed between the sub-pixels PX1, PX2 and PX3. The outer banks 430 may be extended in the second direction (y-axis direction). The length of each of the sub-pixels PX1, PX2 and PX3 in the first direction (x-axis direction) may be defined as the distance between the outer banks 430.

The first conductive pattern AP may be disposed to surround the emission area EMA in which the light-emitting elements 175 are disposed. The first conductive pattern AP may not cover or overlap the light-emitting elements 175 but may expose them. The first conductive pattern AP may not cover or overlap at least a part of the first contact electrode 174a and the second contact electrode 174b but may expose it. The first conductive pattern AP may overlap the first electrode branch 171B and the second electrode branch 173B.

The first conductive patterns AP of the first sub-pixel PX1, the second sub-pixel PX2 and the third sub-pixel PX3 may be electrically connected with one another as a single piece as shown in FIG. 66. A single pixel PX may include a single first conductive pattern AP. The first conductive pattern AP of a pixel PX may be electrically connected to the first conductive pattern AP of another pixel PX adjacent to the pixel PX in the first direction (x-axis direction) through the connection pattern CP1. The first conductive pattern AP may be electrically connected to the first connection pattern CP1 through a first connection contact hole CNTC1.

The first conductive pattern AP may be disposed on the outer bank 430 between the first sub-pixel PX1 and the second sub-pixel PX2, and on the outer bank 430 between the second sub-pixel PX2 and the third sub-pixel PX3. The first conductive pattern AP is not disposed on the outer bank 430 between the first sub-pixel PX1 and the third sub-pixel PX3. The first connection pattern CP1 may be disposed on the outer bank 430 between the first sub-pixel PX1 and the third sub-pixel PX3.

Although a single pixel PX includes a single first conductive pattern AP in the example shown in FIG. 66, but the disclosure is not limited thereto. For example, pixels PX may include one first conductive pattern AP. In this instance, the first conductive pattern AP may be disposed on the outer bank 430 between the first sub-pixel PX1 and the third sub-pixel PX3. Alternatively, each of the sub-pixels PX1, PX2 and PX3 may include a single first conductive pattern AP. The first conductive pattern AP is not disposed on the outer bank 430 between the first sub-pixel PX1 and the second sub-pixel PX2, and on the outer bank 430 between the second sub-pixel PX2 and the third sub-pixel PX3. The first connection pattern CP1 may be disposed on the outer bank 430 between the first sub-pixel PX1 and the second sub-pixel PX2, and on the outer bank 430 between the second sub-pixel PX2 and the third sub-pixel PX3.

The first conductive pattern AP may be electrically connected to the feeding line through the contact hole. Accordingly, the first conductive pattern AP may be electrically connected to the radio frequency driver disposed on the display circuit board or the flexible film through the feeding line. Therefore, the first conductive pattern AP may be utilized as a patch antenna for mobile communication or an antenna for an RFID tag for short range communication.

FIG. 68 is a perspective view showing one of the light-emitting elements of FIG. 66 in detail.

Referring to FIG. 68, the light-emitting element 175 may include a first semiconductor layer 175a, a second semiconductor layer 175b, an active layer 175c, an electrode layer 175d, and an insulating layer 175e.

The first semiconductor layer 175a may be, e.g., an n-type semiconductor having a first conductivity-type. The first semiconductor layer 175a may be one or more of n-type doped AlGaInN, GaN, AlGaN, InGaN, AN and InN. For example, when the light-emitting element 175 emits light of a blue wavelength band, the first semiconductor layer 175a may include a semiconductor material having Chemical Formula below: $Al_xGa_yIn_{1-x-y}N$ ($0 \leq x \leq 1$, $0 \leq y \leq 1$, $0 \leq x+y \leq 1$). The first semiconductor layer 175a may be doped with a first conductivity-type dopant such as Si, Ge and Sn. For example, the first semiconductor layer 175a may be n-GaN doped with n-type Si.

The second semiconductor layer 175b may be a second conductive-type, e.g., a p-type semiconductor. The second semiconductor layer 175b may be one or more of p-type doped AlGaInN, GaN, AlGaN, InGaN, AN and InN. For example, when the light-emitting element 175 emits light of a blue or green wavelength band, the second semiconductor layer 175b may include a semiconductor material having Chemical Formula below: $Al_xGa_yIn_{1-x-y}N$ ($0 \leq x \leq 1$, $0 \leq y \leq 1$, $0 \leq x+y \leq 1$). The second semiconductor layer 175b may be doped with a second conductivity-type dopant such as Mg, Zn, Ca, Se and Ba. According to an embodiment, the second semiconductor layer 175b may be p-GaN doped with p-type Mg.

The active layer 175c may be disposed between the first semiconductor layer 175a and the second semiconductor layer 175b. The active layer 175c may include a material having a single or multiple quantum well structure. When the active layer 175c includes a material having the multiple quantum well structure, quantum layers and well layers may be alternately stacked in the structure. Alternatively, the active layer 175c may have a structure in which a semiconductor material having a large band gap energy and a semiconductor material having a small band gap energy may be alternately stacked on one another, and may include other Group III to Group V semiconductor materials depending on the wavelength range of the emitted light.

The active layer 175c may emit light as electron-hole pairs are combined therein in response to an electrical signal applied through the first semiconductor layer 175a and the second semiconductor layer 175b. The light emitted from the active layer 175c is not limited to light in the blue wavelength band. The active layer 175c may emit light in the red or green wavelength band. For example, when the active layer 175 emits light of the blue wavelength band, it may include a material such as AlGaN and AlGaInN. In particular, when the active layer 175c has a multi-quantum well structure in which quantum layers and well layers are alternately stacked on one another, the quantum layers may include AlGaN or AlGaInN, and the well layers may include a material such as GaN and AlGaN. For example, the active layer 175c includes AlGaInN as the quantum layer and AlInN as the well layer, and as described above, the active layer 175c may emit blue light having a center wavelength band of 450 nm to 495 nm.

The light emitted from the active layer 175c may exit not only through the outer surfaces of the light-emitting element 175 in the longitudinal direction but also through both side surfaces. For example, the direction in which the light emitted from the active layer 175c propagates is not limited to one direction.

The electrode layer 175d may be an ohmic contact electrode or a Schottky contact electrode. The light-emitting element 175 may include at least one electrode layer 175d. When the light-emitting element 175 is electrically connected to the first electrode 171 or the second electrode 173, the resistance between the light-emitting element 175 and the first electrode 171 or between the light-emitting element 175 and the second electrode 173 may be reduced due to the electrode layer 175d. The electrode layer 175d may include a conductive metal material such as at least one of aluminum (Al), titanium (Ti), indium (In), gold (Au), silver (Ag), indium tin oxide (ITO), indium zinc oxide (IZO) and indium tin-zinc oxide (ITZO). The electrode layer 175d may include a semiconductor material doped with n-type or p-type impurities. The electrode layer 175d may include the same or similar material or may include different materials. It is, however, to be understood that the disclosure is not limited thereto.

The insulating layer 175e is disposed to surround the outer surfaces of the first semiconductor layer 175a, the second semiconductor layer 175b, the active layer 175c, and the electrode layer 175d. The insulating layer 175e serves to protect the first semiconductor layer 175a, the second semiconductor layer 175b, the active layer 175c, and the electrode layer 175d. The insulating layer 175e may be formed to expose both ends of the light-emitting element 175 in the longitudinal direction. For example, an end of the first semiconductor layer 175a and another end of the electrode layer 175d may not be covered or overlapped by the insulating layer 175e but may be exposed. As the insulating layer 175e includes the active layer 175c, and may cover or overlap only the outer surface of a part of the first semiconductor layer 175a and a part of the second semiconductor layer 175b, or may cover or overlap only the outer surface of a part of the electrode layer 175d.

The insulating layer 175e may include materials having an insulating property such as silicon oxide (SiOx), silicon nitride (SiNx), silicon oxynitride (SiOxNy), aluminum nitride (AlN) and aluminum oxide ($Al_2O_3$). Accordingly, it is possible to prevent an electrical short-circuit that may be created when the active layer 175c is brought into contact with the first electrode 171 and the second electrode 173 to which an electrical signal is transmitted. Since the insulating layer 175e may include the active layer 175c to protect the outer surface of the light-emitting element 175, it may be possible to avoid a decrease in luminous efficiency.

Figure 69:
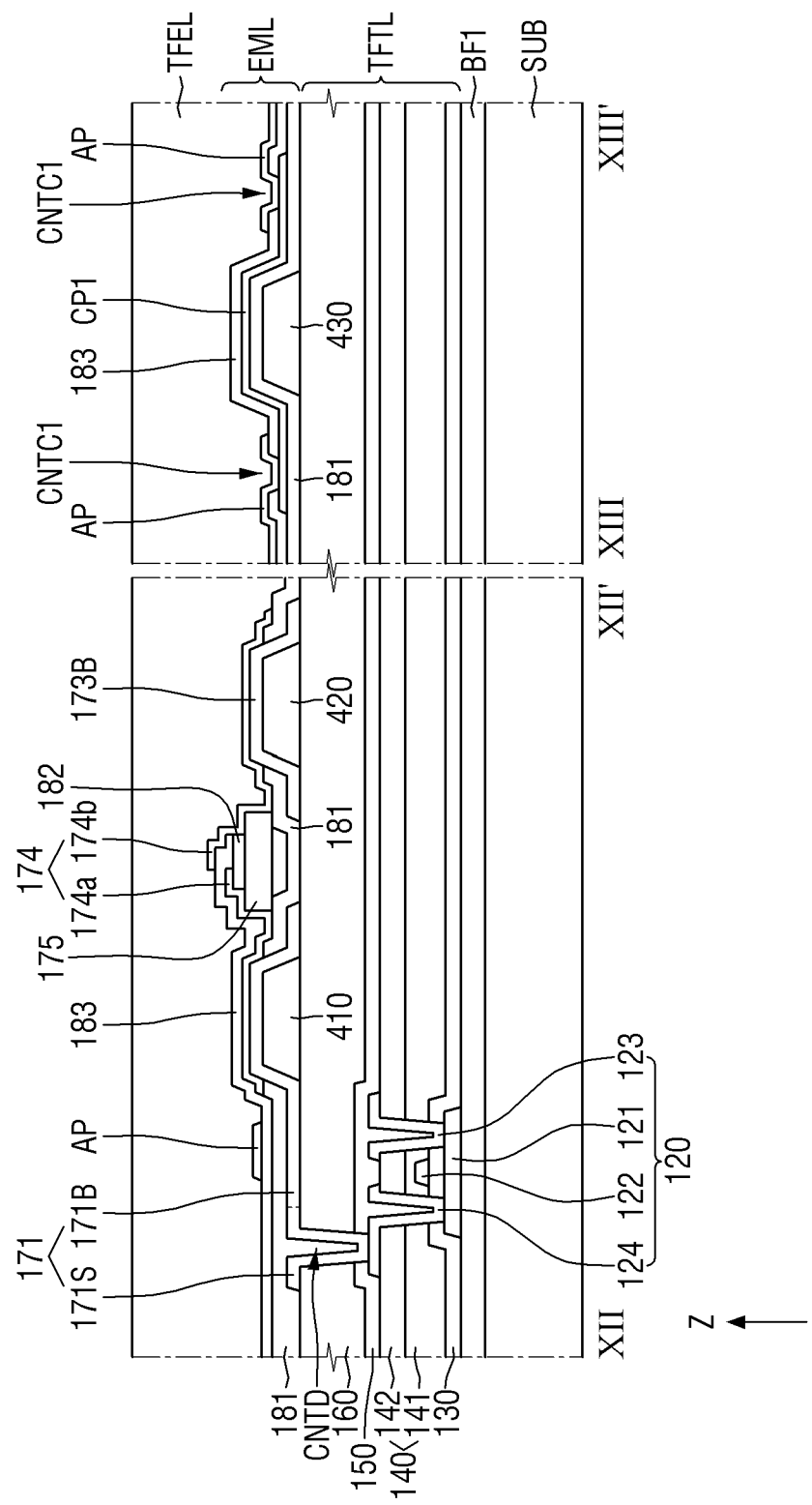
FIG. 69 is a schematic cross-sectional view taken along lines XII-XII' and XIII-XIII' of FIG. 66.

FIG. 69 is a schematic cross-sectional view taken along lines XII-XII' and XIII-XIII' of FIG. 66.

Referring to FIG. 69, the display layer DISL may include a thin-film transistor layer TFTL, an emission material layer EML, and an encapsulation layer TFEL disposed on a substrate SUB. The thin-film transistor layer TFTL of FIG. 69 is substantially identical to that described above with reference to FIG. 19.

The emission material layer EML may include a first inner bank 410, a second inner bank 420, a first electrode 171, a second electrode 173, a contact electrode 174, a light-emitting element 175, a first insulating layer 181, a second insulating layer 182, and a third insulating layer 183.

The first inner bank 410, the second inner bank 420 and the outer bank 430 may be disposed on a planarization layer 160. The first inner bank 410, the second inner bank 420 and the outer bank 430 may protrude from the upper surface of the planarization layer 160. The first inner bank 410, the second inner bank 420 and the outer bank 430 may have, but is not limited to, a trapezoidal cross-sectional shape. Each of the first inner bank 410, the second inner bank 420 and the outer bank 430 may include a lower surface in contact with the upper surface of the planarization layer 160, an upper surface opposed to the lower surface, and side surfaces between the upper surface and the lower surface. The side surfaces of the first inner bank 410, the side surfaces of the second inner bank 420, and the side surfaces of the third inner bank 430 may be inclined.

The first inner bank 410 may be spaced apart from the second inner bank 420. The first inner bank 410 and the second inner bank 420 may be an organic layer such as an acrylic resin, an epoxy resin, a phenolic resin, a polyamide resin, and a polyimide resin.

The first electrode branch 171B may be disposed on the first inner bank 410, and the second electrode branch 173B may be disposed on the second inner bank 420. The first electrode branch 171B may be electrically connected to the first electrode stem 171S, and the first electrode stem 171S may be electrically connected to the drain electrode 124 of the thin-film transistor 120 in the first electrode contact hole CNTD. Therefore, the first electrode 171 may receive a voltage from the drain electrode 124 of the thin-film transistor 120.

The first electrode 171 and the second electrode 173 may include a conductive material having high reflectance. For example, the first electrode 171 and the second electrode 173 may include a metal such as silver (Ag), copper (Cu) and aluminum (Al). Therefore, some of the lights that are emitted from the light-emitting element 175 and travels toward the first electrode 171 and the second electrode 173 are reflected off the first electrode 171 and the second electrode 173, so that they may travel toward the upper side of the light-emitting element 175.

The first insulating layer 181 may be disposed on the first electrode 171 and the second electrode branch 173B. The first insulating layer 181 may cover or overlap a first electrode stem 171S, a first electrode branch 171B disposed on the side surfaces of the first inner bank 410, and a second electrode branch 173B disposed on the side surfaces of the second inner bank 420. The first electrode branch 171B disposed on the upper surface of the first inner bank 410 and the second electrode branch 173B disposed on the upper surface of the second inner bank 420 may not be covered or overlapped by the first insulating layer 181 but may be exposed. The first insulating layer 181 may be disposed on the outer bank 430. The first insulating layer 181 may be formed of an inorganic layer, for example, a silicon nitride layer, a silicon oxynitride layer, a silicon oxide layer, a titanium oxide layer, or an aluminum oxide layer.

The light-emitting element 175 may be disposed on the first insulating layer 181 disposed between the first inner bank 410 and the second inner bank 420. One end of the light-emitting element 175 may be disposed adjacent to the first inner bank 410, while the other end thereof may be disposed adjacent to the second inner bank 420.

The second insulating layer 182 may be disposed on the light-emitting element 175. The second insulating layer 182 may be formed of an inorganic layer, for example, a silicon nitride layer, a silicon oxynitride layer, a silicon oxide layer, a titanium oxide layer, or an aluminum oxide layer.

The first contact electrode 174a may be disposed on the first electrode branch 171B that may not be covered or overlapped by the first insulating layer 181 but may be exposed and may be in contact with one end of the light-emitting element 175. The first contact electrode 174a may be disposed on the second insulating layer 182.

The first connection pattern CP1 may be disposed on the first insulating layer 181 covering or overlapping or disposed on the outer bank 430. The first connection pattern CP1 may be made of the same or similar material on a same layer as the first contact electrode 174a.

The third insulating layer 183 may be disposed on the first contact electrode 174a and the first connection pattern CP1. The third insulating layer 183 may cover or overlap the first contact electrode 174a to electrically separate the first contact electrode 174a from the second contact electrode 174b. The third insulating layer 183 may be formed of an inorganic layer, for example, a silicon nitride layer, a silicon oxynitride layer, a silicon oxide layer, a titanium oxide layer, or an aluminum oxide layer.

The second contact electrode 174b may be disposed on the second electrode branch 173B that may not be covered or overlapped by the first insulating layer 181 but may be exposed and may be in electrical contact with the other end of the light-emitting element 175. The second contact electrode 174b may be disposed on the second insulating layer 182 and the third insulating layer 183.

The first conductive pattern AP may be disposed on the third interlayer dielectric layer 183. The first conductive pattern AP may be made of the same or similar material on a same layer as the second contact electrode 174b. The first conductive pattern AP may not overlap the first contact electrode 174a and the second contact electrode 174b in the third direction (z-axis direction). The first conductive pattern AP may overlap the first electrode branch 171B in the third direction (z-axis direction).

The first conductive pattern AP may be electrically connected to the first connection pattern CP1 through a first connection contact hole CNTC1. The first connection contact hole CNTC1 may be a hole penetrating through the third insulating layer 183 to expose the first connection pattern CP1.

As shown in FIG. 69, the first conductive pattern AP may be made of the same or similar material on a same layer as the second contact electrode 174b, and the first connection pattern CP1 may be made of the same or similar material on a same layer as the first contact electrode 174a. Therefore, the first conductive pattern may be formed without any additional process, and the first conductive pattern AP may be utilized as a patch antenna for mobile communications or an RFID tag antenna for near field communications.

Figure 70:
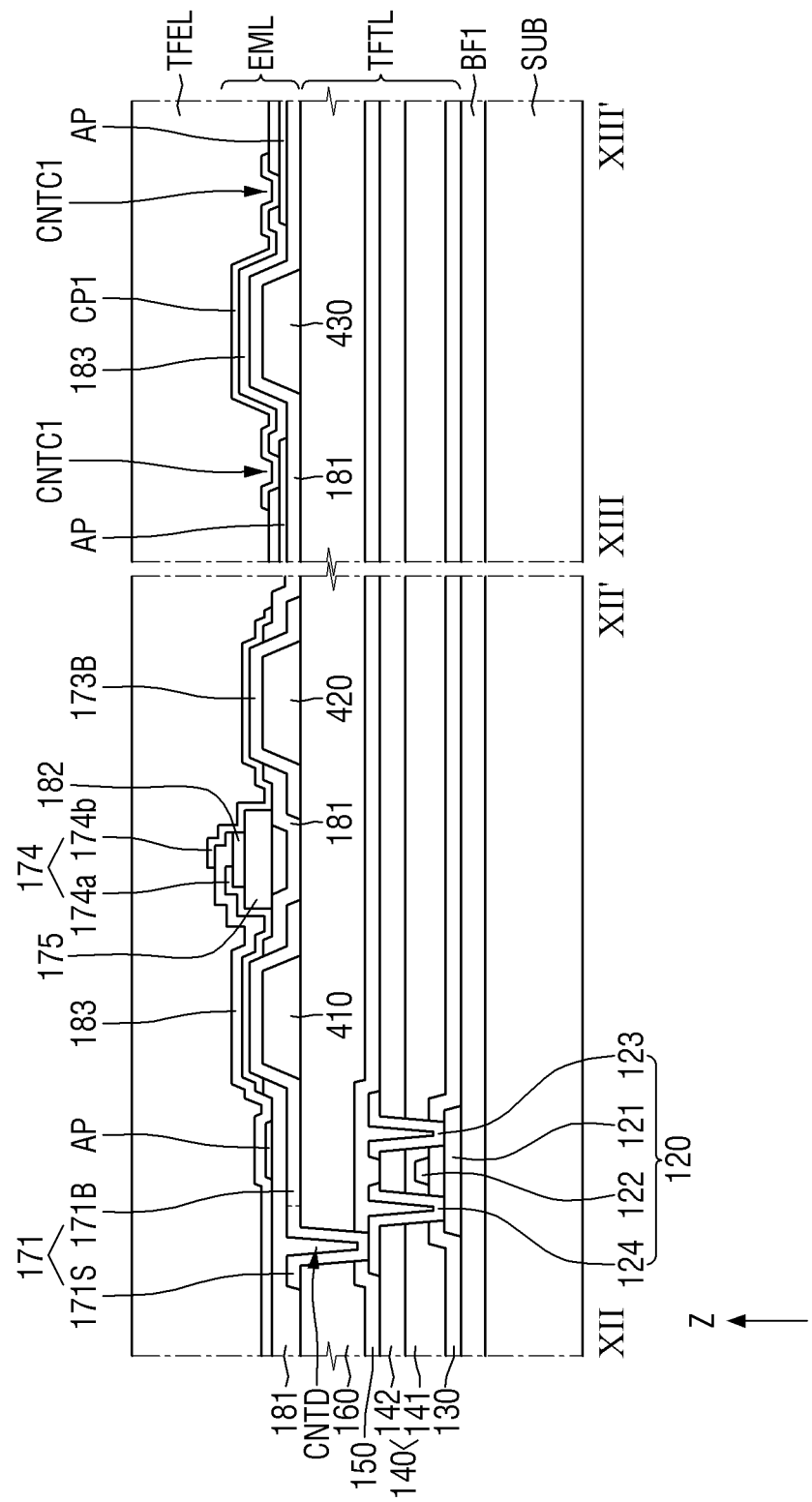
FIG. 70 is a schematic cross-sectional view taken along lines XII-XII' and XIII-XIII' of FIG. 66.

FIG. 70 is a schematic cross-sectional view taken along lines XII-XII' and XIII-XIII' of FIG. 69.

An embodiment of FIG. 70 may be different from an embodiment of FIG. 69 in that a first conductive pattern AP may be disposed on a first insulating layer 181, and a first connection pattern CP1 may be disposed on a third insulating layer 183.

Referring to FIG. 70, the first conductive pattern AP may be disposed on the first insulating layer 181. The first conductive pattern AP may be made of the same or similar material on a same layer as the first contact electrode 174a. The first conductive pattern AP may not overlap the first contact electrode 174a and the second contact electrode 174b in the third direction (z-axis direction). The first conductive pattern AP may overlap the first electrode branch 171B in the third direction (z-axis direction).

The third insulating layer 183 may be disposed on the first contact electrode 174a and the first conductive pattern AP. The first connection pattern CP1 may be disposed on the third insulating layer 183 covering or overlapping or disposed on the outer bank 430. The first connection pattern CP1 may be made of the same or similar material on a same layer as the second contact electrode 174b.

The first connection pattern CP1 may be electrically connected to the first conductive pattern AP through a first connection contact hole CNTC1. The first connection contact hole CNTC1 may be a hole penetrating through the third insulating layer 183 to expose the first conductive pattern AP.

As shown in FIG. 70, the first conductive pattern AP may be made of the same or similar material on a same layer as the first contact electrode 174a, and the first connection pattern CP1 may be made of the same or similar material on a same layer as the second contact electrode 174b. Therefore, the first conductive pattern AP may be formed without any additional process, and the first conductive pattern AP may be utilized as a patch antenna for mobile communications or an RFID tag antenna for near field communications.

Figure 71:
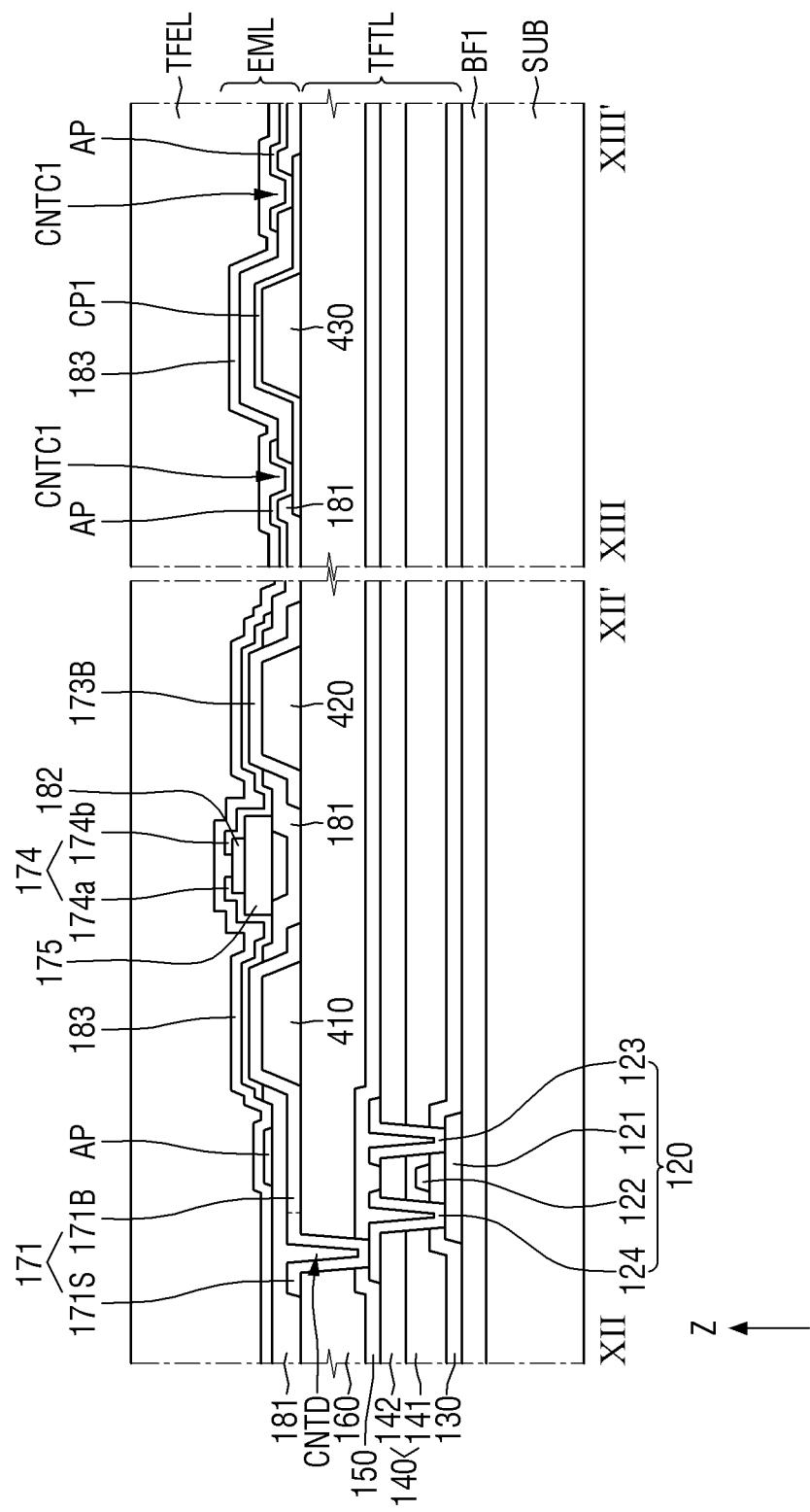
FIG. 71 is a schematic cross-sectional view taken along lines XII-XII' and XIII-XIII' of FIG. 66.

FIG. 71 is a schematic cross-sectional view taken along lines XII-XII' and XIII-XIII' of FIG. 69.

An embodiment of FIG. 71 may be different from an embodiment of FIG. 69 in that a first contact electrode 174a, a second contact electrode 174b and a first conductive pattern AP may be disposed on a first insulating layer 181, and that the first connection pattern CP1 may be covered by or overlapped by the first insulating layer 181.

Referring to FIG. 71, the first connection pattern CP1 may be disposed on the outer bank 430. The first connection pattern CP1 may be made of the same or similar material on a same layer as the first electrode 171 and the second electrode 173. The first insulating layer 181 may be disposed on the first connection pattern CP1.

The first contact electrode 174a, the second contact electrode 174b and the first conductive pattern AP may be disposed on the first insulating layer 181. The first contact electrode 174a, the second contact electrode 174b and the first conductive pattern AP may be covered or overlapped by the third insulating layer 183. The first conductive pattern AP may be made of the same or similar material on a same layer as the first contact electrode 174a and the second contact electrode 174b. The first conductive pattern AP may not overlap the first contact electrode 174a and the second contact electrode 174b in the third direction (z-axis direction). The first conductive pattern AP may overlap the first electrode branch 171B in the third direction (z-axis direction).

The first conductive pattern AP may be electrically connected to the first connection pattern CP1 through a first connection contact hole CNTC1. The first connection contact hole CNTC1 may be a hole penetrating through the first insulating layer 181 to expose the first connection pattern CP1.

Figure 73:
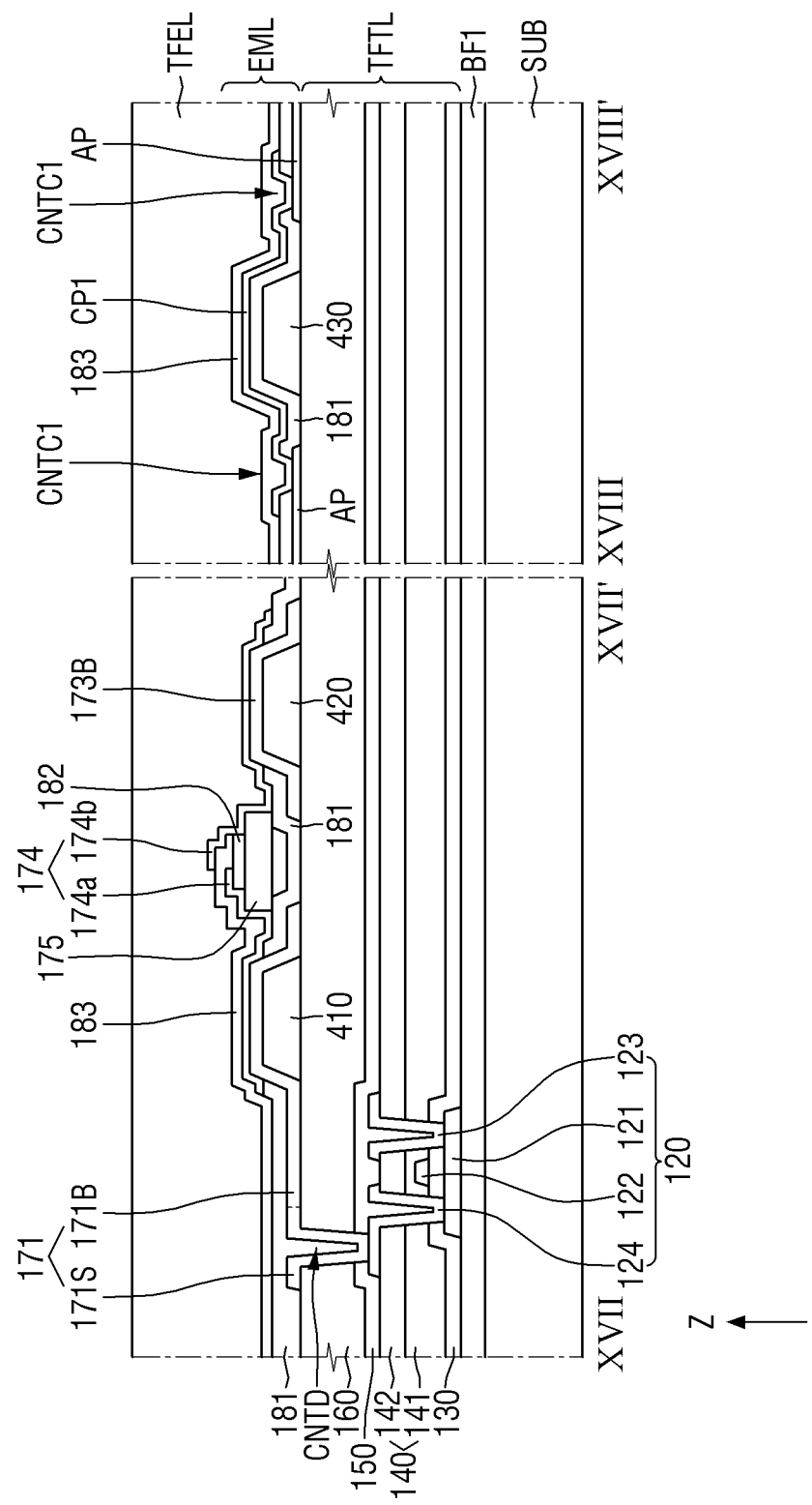
FIG. 73 is a schematic cross-sectional view taken along lines XVII-XVII' and XVIII-XVIII' of FIG. 72.

As shown in FIG. 73, the first conductive pattern AP may be made of the same or similar material on a same layer as the first contact electrode 174a and the second contact electrode 174b, and the first connection pattern CP1 may be made of the same or similar material on a same layer as the first electrode 171 and the second contact electrode 173. Therefore, the first conductive pattern AP may be formed without any additional process, and the first conductive pattern AP may be utilized as a patch antenna for mobile communications or an RFID tag antenna for near field communications.

Figure 72:
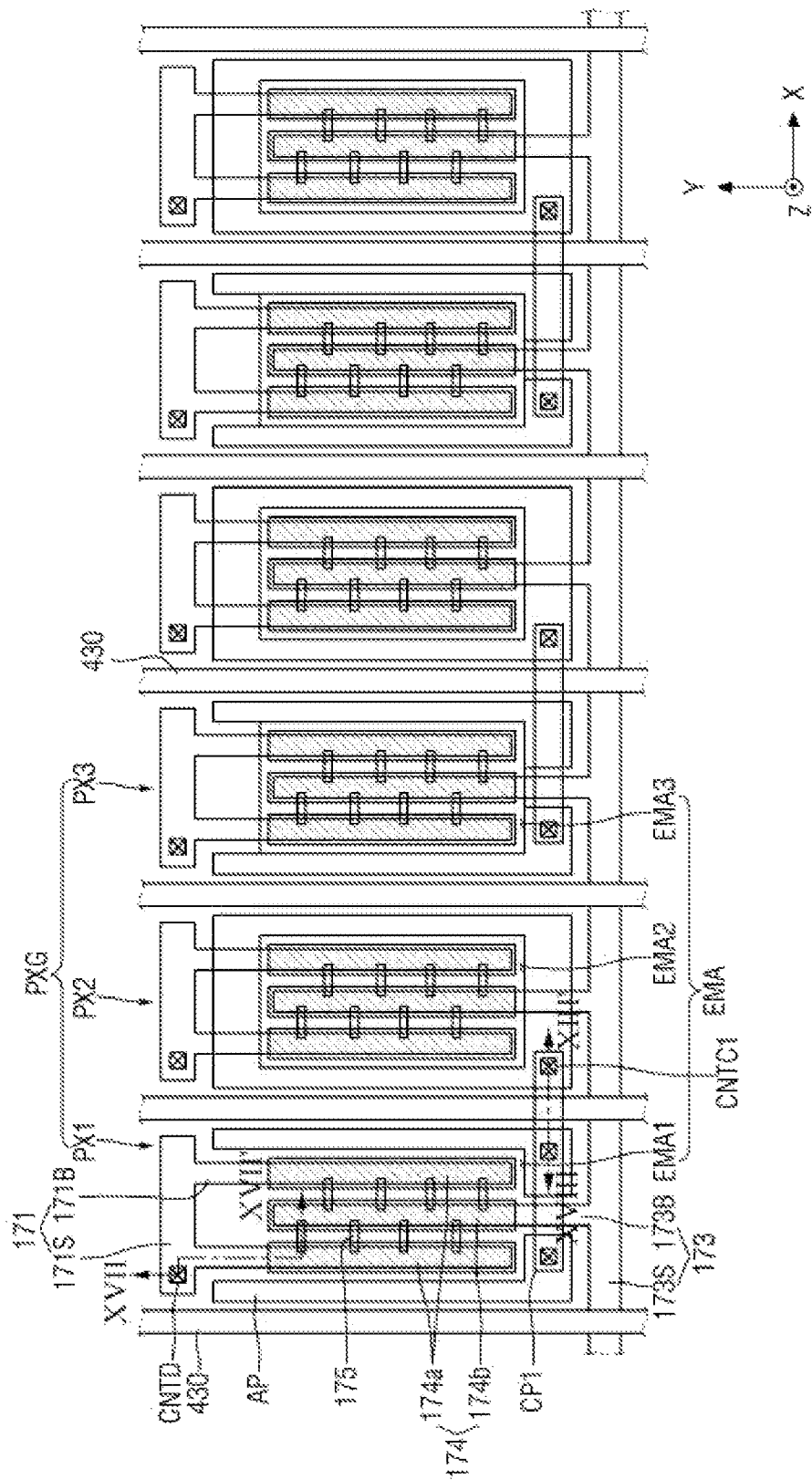
FIG. 72 is a plan view showing an example of the pixels in the display area of FIG. 65.

FIG. 72 is a plan view showing an example of the pixels in the display area of FIG. 65. FIG. 73 is a schematic cross-sectional view taken along lines XVII-XVII' and XVIII-XVIII' of FIG. 72.

An embodiment shown in FIGS. 72 and 73 may be different from an embodiment of FIGS. 66 and 69 in that a first conductive pattern AP may be made of the same or similar material on a same layer as a first electrode 171 and a second electrode 173, and that a first connection pattern CP1 may be made of the same or similar material on a same layer as a first contact electrode 174*a*.

Figure 74:
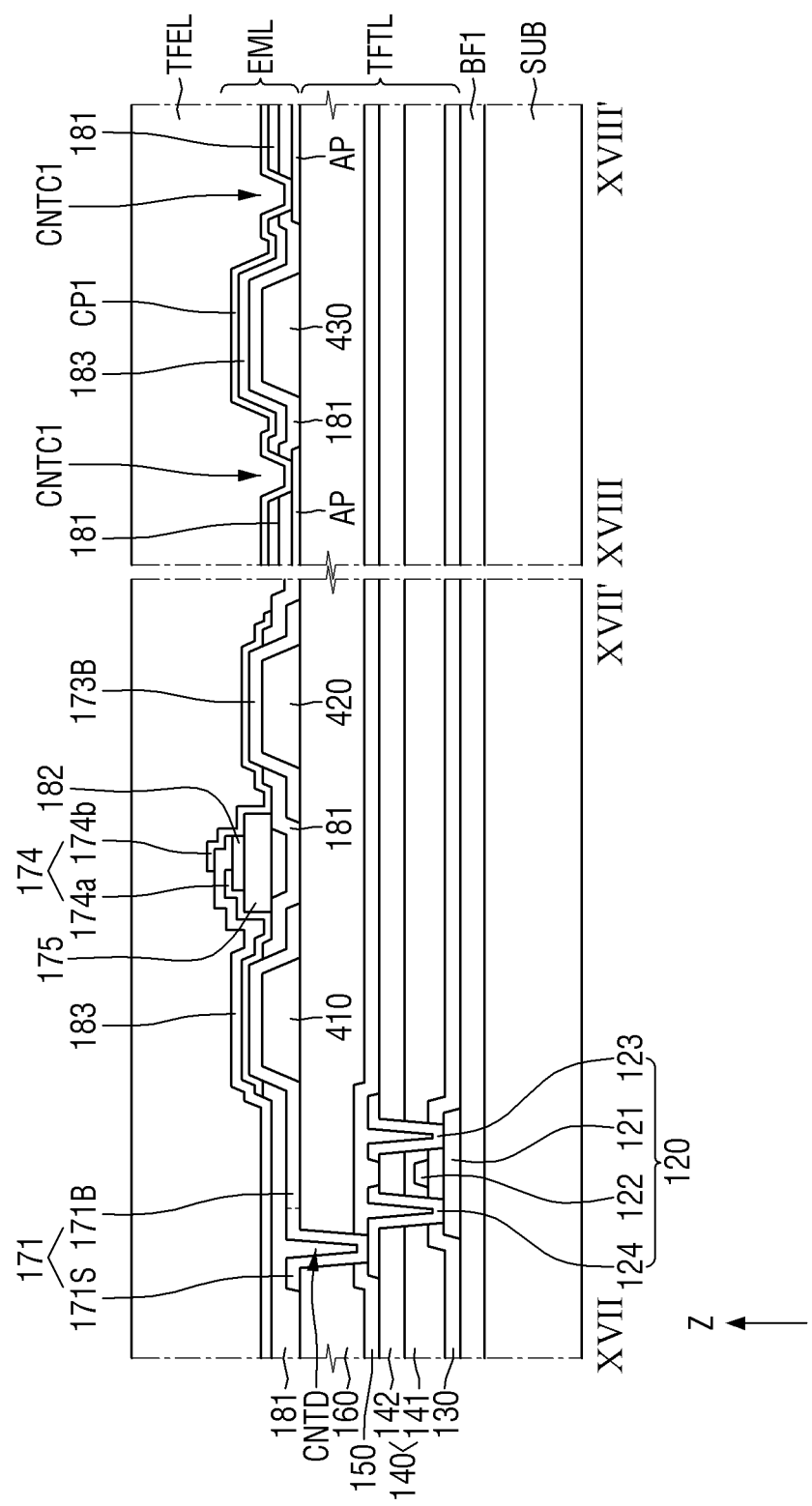
FIG. 74 is a schematic cross-sectional view taken along lines XVII-XVII' and XVIII-XVIII' of FIG. 72.

Referring to FIGS. 72 and 73, each of the sub-pixels PX1, PX2 and PX3 may include first conductive patterns AP, and each of the first conductive patterns AP may be electrically connected with one another via first connection patterns CP1. For example, each of the sub-pixels PX1, PX2 and PX3 may include two first conductive patterns AP as shown in FIG. 74. The first connection pattern CP1 may not only electrically connect the first conductive patterns AP of each of the sub-pixels PX1, PX2 and PX3, but also the first conductive patterns AP of the sub-pixels PX1, PX2 and PX3 adjacent to one another in the first direction (x-axis direction).

One of the first conductive patterns AP may be disposed between the respective one of the first electrode branches 171B and the outer bank 430. Another one of the first conductive patterns AP may be disposed between the respective one of the first electrode branches 171B and the outer bank 430. Each of the first conductive patterns AP may be disposed between the first electrode branch 171B and the second electrode stem 173S. The second electrode branch 173B may be disposed between the first conductive patterns AP.

The first conductive patterns AP may be disposed on the planarization layer 160. The first conductive patterns AP may be made of the same or similar material on a same layer as the first electrode 171 and the second electrode 173. The first conductive patterns AP may not overlap the first electrode 171, the second electrode 173, the first contact electrode 174*a*, and the second contact electrode 174*b* in the third direction (z-axis direction). The first insulating layer 181 may be disposed on the first conductive patterns AP.

The first connection pattern CP1 may be disposed on the first insulating layer 181 covering or overlapping or disposed on the outer bank 430. The first connection pattern CP1 may be made of the same or similar material on a same layer as the first contact electrode 174*a*. The third insulating layer 183 may be disposed on the first contact electrode 174*a* and the first connection pattern CP1.

The first connection pattern CP1 may be electrically connected to the first conductive pattern AP through a first connection contact hole CNTC1. The first connection contact hole CNTC1 may be a hole penetrating through the first insulating layer 181 to expose the first connection pattern CP1. The first connection pattern CP1 may intersect the second electrode branch 173B.

As shown in FIGS. 72 and 73, the first conductive pattern AP may be made of the same or similar material on a same layer as the first electrode 171 and the second electrode 173, and the first connection pattern CP1 may be made of the same or similar material on a same layer as the first contact electrode 174*a*. Therefore, the first conductive pattern AP may be formed without any additional process, and the first conductive pattern AP may be utilized as a patch antenna for mobile communications or an RFID tag antenna for near field communications.

FIG. 74 is a schematic cross-sectional view taken along lines XVII-XVII' and XVIII-XVIII' of FIG. 72.

An embodiment of FIG. 74 may be different from an embodiment of FIG. 73 in that a first connection pattern CP1 may be disposed on a third insulating layer 183.

Referring to FIG. 74, the first connection pattern CP1 may be disposed on the third insulating layer 183 covering or overlapping or disposed on the outer bank 430. The first connection pattern CP1 may be made of the same or similar material on a same layer as the second contact electrode 174*b*.

The first connection pattern CP1 may be electrically connected to the first conductive pattern AP through a first connection contact hole CNTC1. The first connection contact hole CNTC1 may be a hole penetrating through the first insulating layer 181 and the third insulating layer 183 to expose the first conductive pattern AP.

As shown in FIG. 74, the first conductive pattern AP may be made of the same or similar material on a same layer as the first electrode 171 and the second electrode 173, and the first connection pattern CP1 may be made of the same or similar material on a same layer as the second contact electrode 174*b*. Therefore, the first conductive pattern AP may be formed without any additional process, and the first conductive pattern AP may be utilized as a patch antenna for mobile communications or an RFID tag antenna for near field communications.

Figure 75:
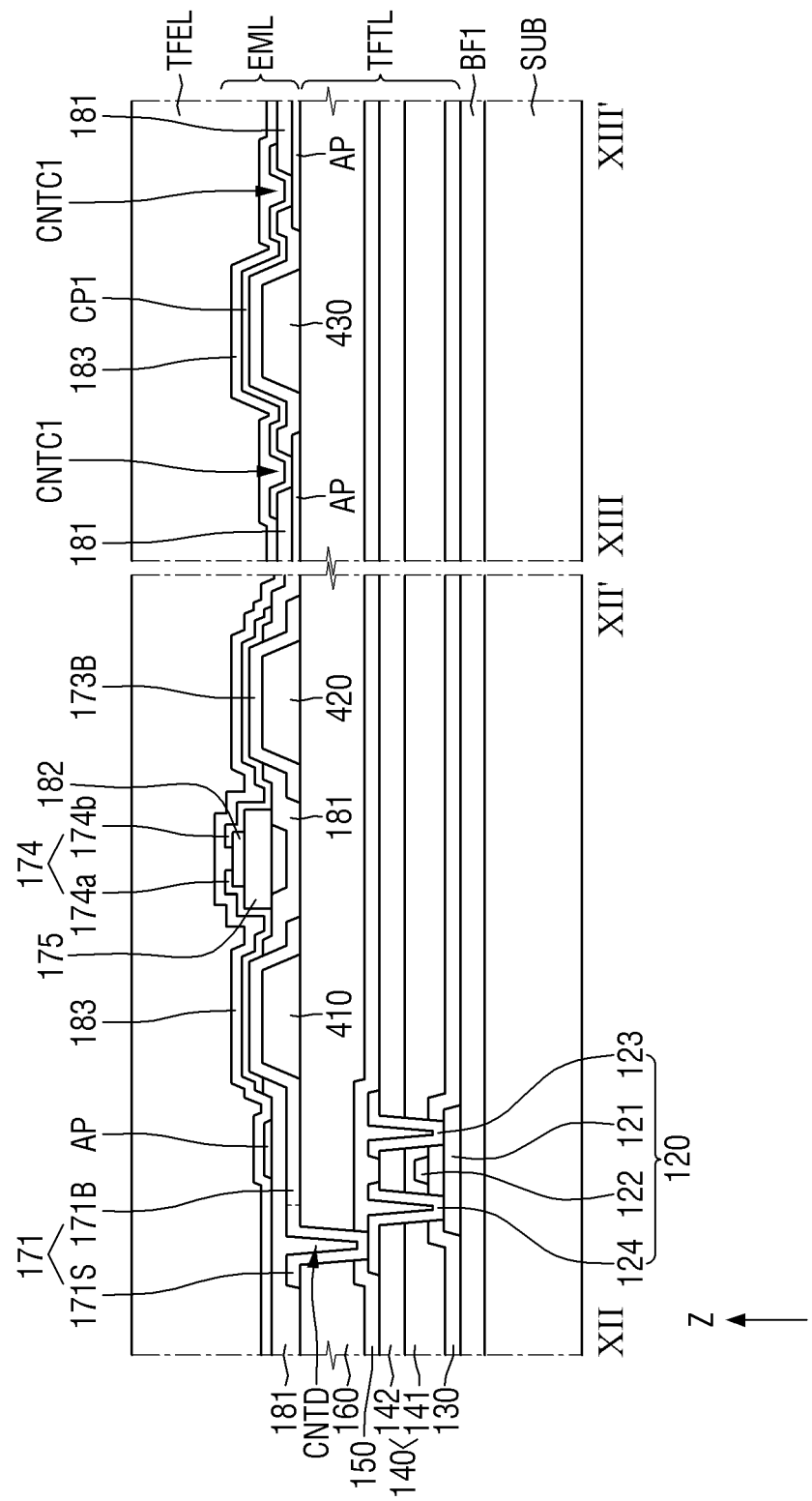
FIG. 75 is a schematic cross-sectional view taken along lines XVII-XVII' and XVIII-XVIII' of FIG. 72.

FIG. 75 is a schematic cross-sectional view taken along lines XVII-XVII' and XVIII-XVIII' of FIG. 74.

An embodiment of FIG. 75 may be different from an embodiment of FIG. 73 in that a first contact electrode 174*a*, a second contact electrode 174*b* and a first connection pattern CP1 may be disposed on a first insulating layer 181.

Referring to FIG. 75, the first connection pattern CP1 may be made of the same or similar material on a same layer as the first contact electrode 174*a* and the second contact electrode 174*b*. The first contact electrode 174*a*, the second contact electrode 174*b* and the first connection pattern CP1 may be covered or overlapped by the third insulating layer 183. The first connection pattern CP1 may be disposed on the first insulating layer 181 covering or overlapping or disposed on the outer bank 430.

The first connection pattern CP1 may be electrically connected to the first conductive pattern AP through a first connection contact hole CNTC1. The first connection contact hole CNTC1 may be a hole penetrating through the first insulating layer 181 to expose the first conductive pattern AP.

As shown in FIG. 75, the first conductive pattern AP may be made of the same or similar material on a same layer as the first electrode 171 and the second electrode 173, and the first connection pattern CP1 may be made of the same or similar material on a same layer as the first contact electrode 174*a* and the second contact electrode 174*b*. Therefore, the first conductive pattern AP may be formed without any additional process, and the first conductive pattern AP may be utilized as a patch antenna for mobile communications or an RFID tag antenna for near field communications.

Figure 76:
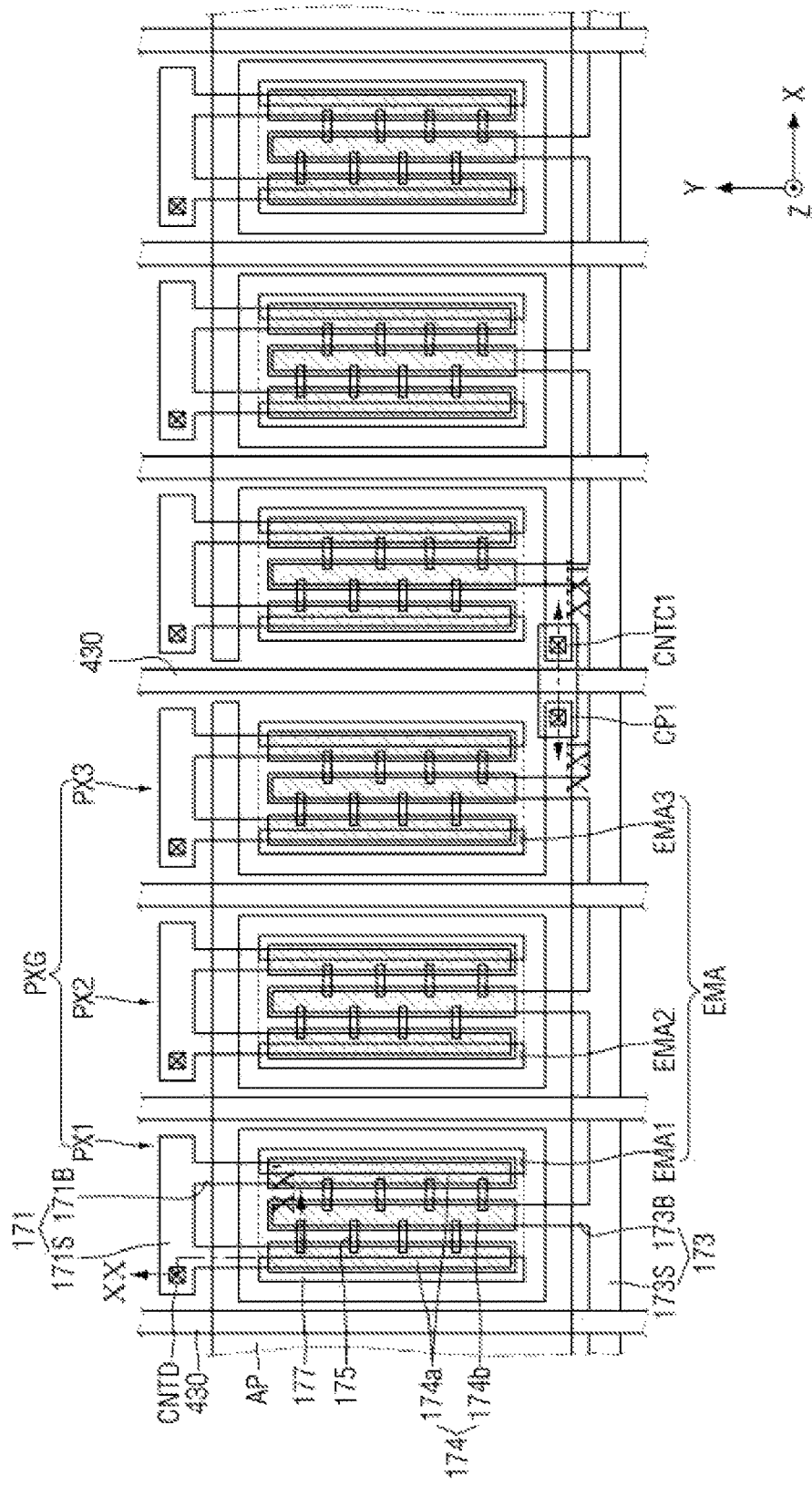
FIG. 76 is a plan view showing an example of the pixels in the display area of FIG. 65.

FIG. 76 is a plan view showing an example of the pixels in the display area of FIG. 65. FIG. 79 is a schematic cross-sectional view taken along lines XX-XX' and XXI-XXI' of FIG. 78.

Figure 77:
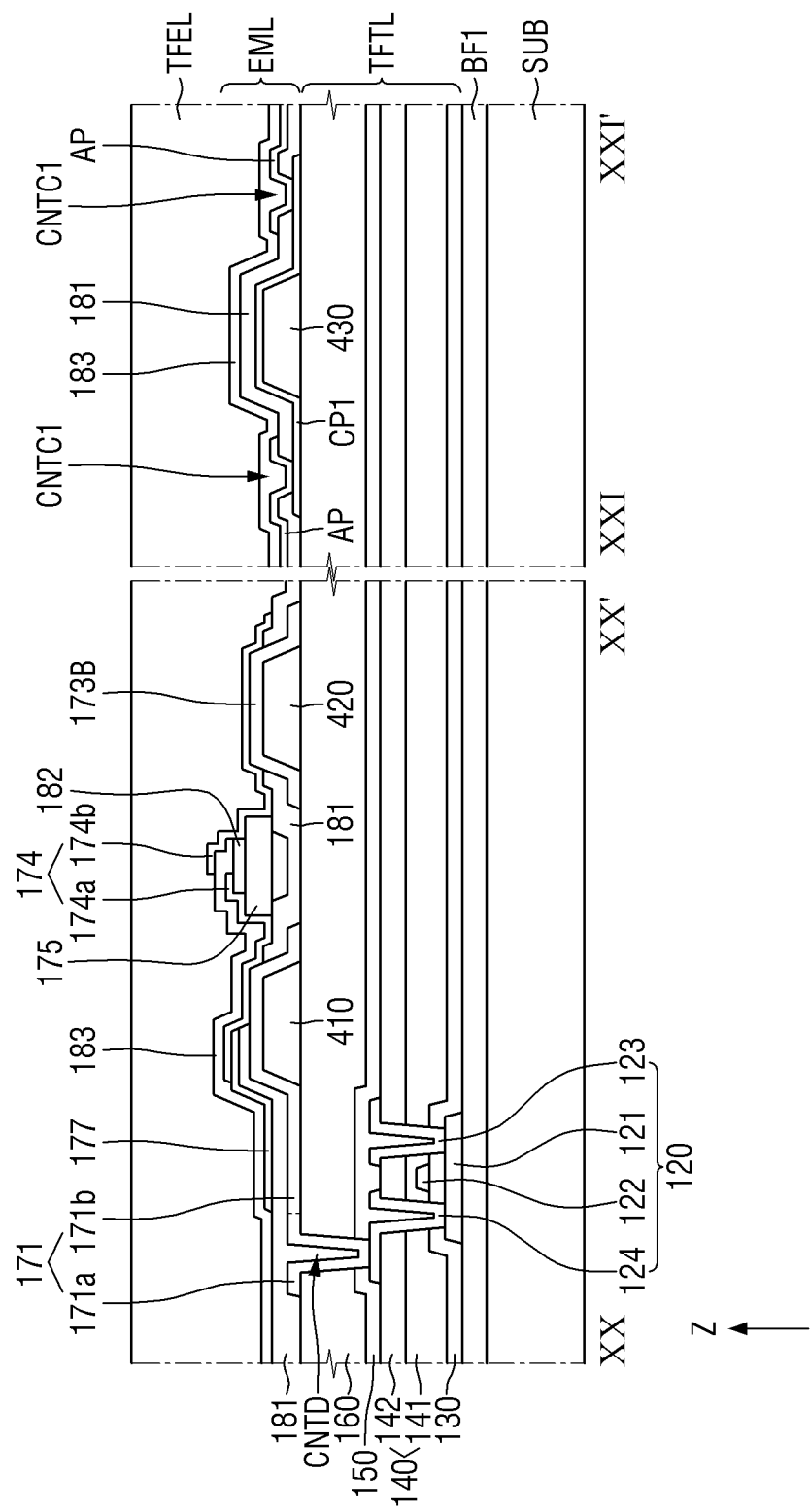
FIG. 77 is a schematic cross-sectional view taken along lines XX-XX' and XXI-XXI' of FIG. 76.

An embodiment shown in FIGS. 76 and 77 may be different from an embodiment shown in FIGS. 66 and 69 in that a shielding electrode 177 in contact with a first contact electrode 174*a* may be included, and a first conductive pattern AP may be made of the same or similar material as the shielding electrode 177.

Referring to FIGS. 76 and 77, the shielding electrode 177 may overlap a part of the first contact electrode 174*a*. A side of the first contact electrode 174*a* may be in electrical contact with the light-emitting element 175, and another side of the first contact electrode 174*a* may be in electrical contact with the shielding electrode 177.

The shielding electrode 177 may be disposed on the first insulating layer 181 disposed on the upper and side surfaces of the first inner bank 410. The shielding electrode 177 may be in contact with the first contact electrode 174*a* on the upper surface of the first inner bank 410. The first contact electrode 174*a* may be disposed on the shielding electrode 177 on the upper surface of the first inner bank 410. The shielding electrode 177 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The third insulating layer 183 may be disposed on the first contact electrode 174*a* and the shielding pattern 177. The first contact electrode 174*a* and the shielding electrode 177 may be covered or overlapped by the third insulating layer 183.

The first conductive pattern AP may be disposed to surround the emission areas EMA1, EMA2 and EMA3. The first conductive pattern AP may be spaced apart from the shielding electrode 177. The first conductive pattern AP may not overlap the first contact electrode 174*a*, the second contact electrode 174*b* and the shielding electrode 177 in the third direction (z-axis direction).

The first conductive pattern AP may be made of the same or similar material on a same layer as the shielding electrode 177. The first conductive pattern AP may be disposed on the first insulating layer 181. The third insulating layer 183 may be disposed on the first conductive pattern AP.

The first connection pattern CP1 may be disposed on the outer bank 430. The first connection pattern CP1 may be made of the same or similar material on a same layer as the first electrode 171 and the second electrode 173. The first insulating layer 181 may be disposed on the first connection pattern CP1.

The first connection pattern CP1 may be electrically connected to the first conductive pattern AP through a first connection contact hole CNTC1. The first connection contact hole CNTC1 may be a hole penetrating through the first insulating layer 181 to expose the first connection pattern CP1.

As shown in FIGS. 76 and 77, the first conductive pattern AP may be made of the same or similar material on a same layer as the shielding electrode 177, and the first connection pattern CP1 may be made of the same or similar material on a same layer as the first electrode 171 and the second electrode 173. Therefore, the first conductive pattern AP may be formed without any additional process, and the first conductive pattern AP may be utilized as a patch antenna for mobile communications or an RFID tag antenna for near field communications.

Figure 78:
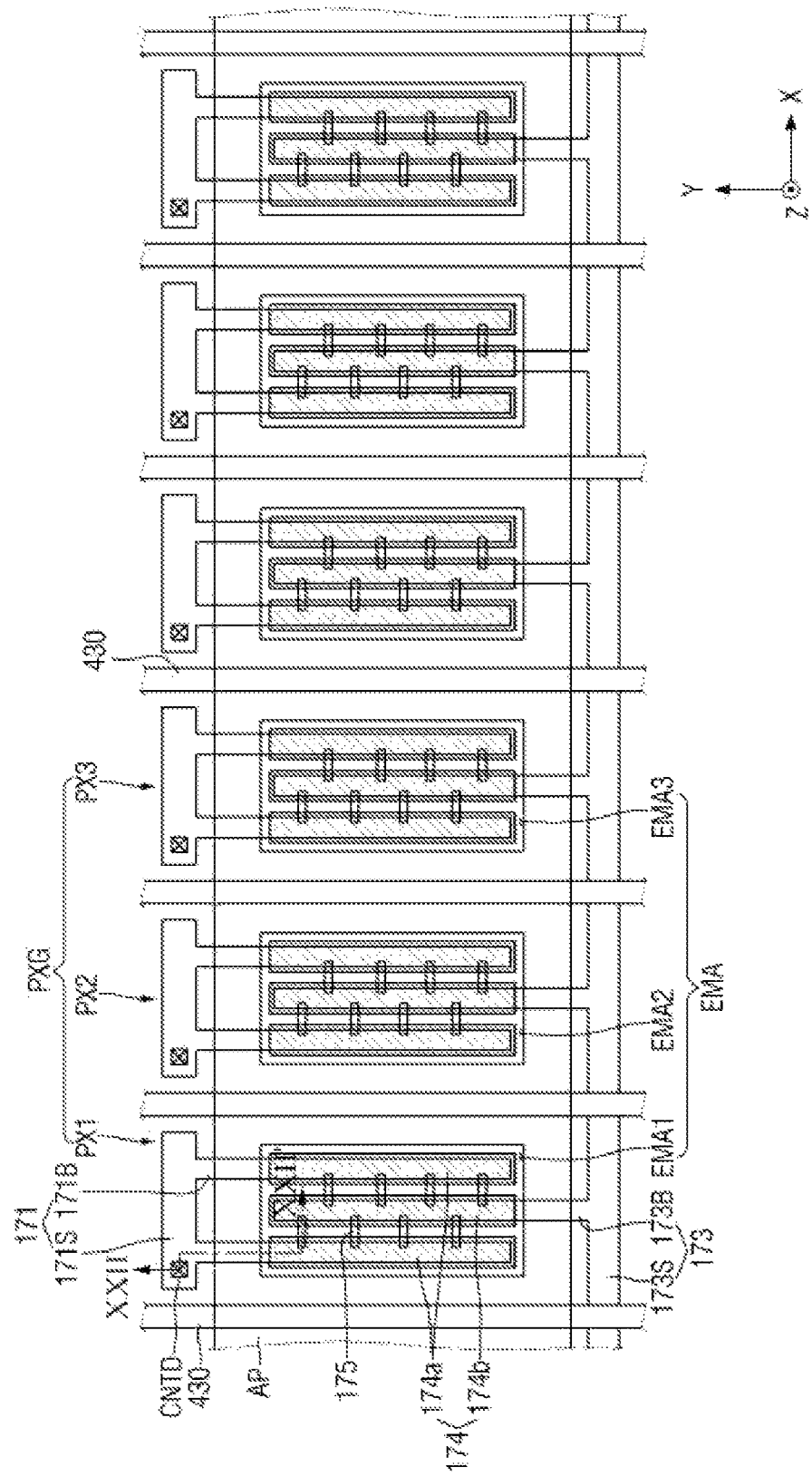
FIG. 78 is a plan view showing an example of the pixels in the display area of FIG. 65.
Figure 79:
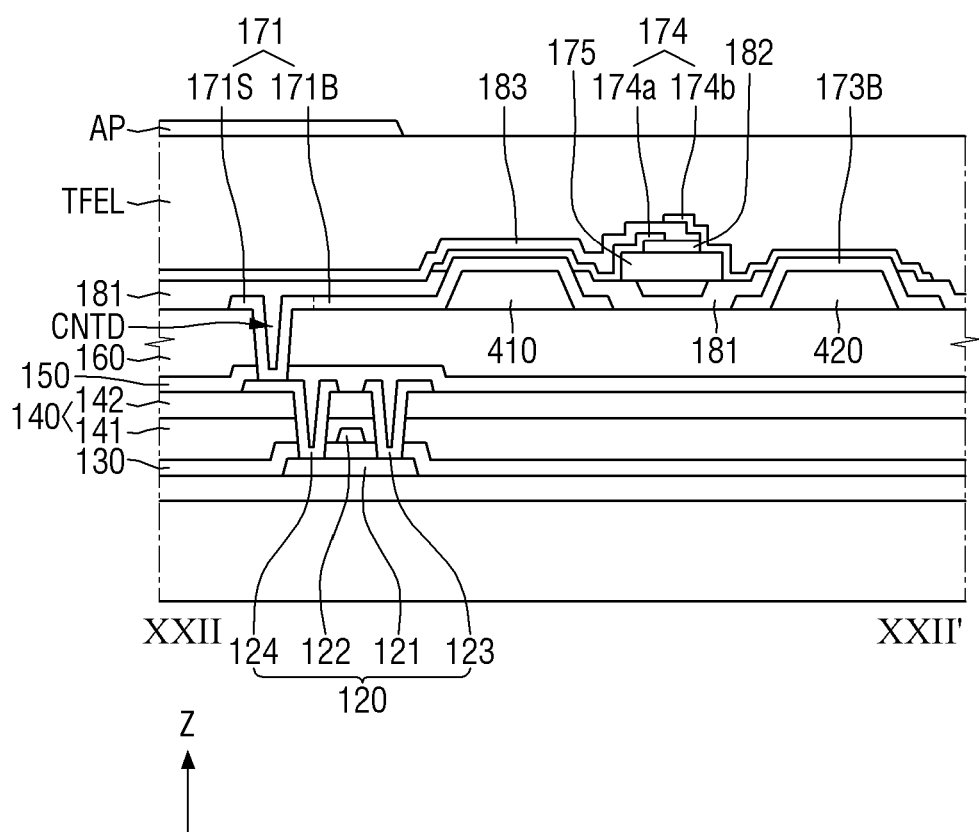
FIG. 79 is a schematic cross-sectional view taken along line XXII-XXII' of FIG. 78.

FIG. 78 is a plan view showing an example of the pixels in the display area of FIG. 65. FIG. 79 is a schematic cross-sectional view taken along line XXII-XXII' of FIG. 78.

An embodiment shown in FIGS. 78 and 79 may be different from an embodiment of FIGS. 66 and 69 in that a first conductive pattern AP may be disposed on an encapsulation layer TFEL.

Referring to FIGS. 78 and 79, the first conductive pattern AP may be formed or disposed on the encapsulation layer TFEL, so that it may overlap the other areas than emission areas EMA1, EMA2 and EMA3 of the sub-pixels PX1, PX2 and PX3. The first conductive pattern AP may overlap a first electrode stem 171S and a first electrode branch 171B of a first electrode 171, a second electrode stem 173S and a second electrode branch 173B a second electrode 173, and an outer bank 430. The first conductive pattern AP may be utilized as a patch antenna for mobile communication or an antenna for an RFID tag for short range communication.

The first conductive pattern AP may include a conductive material having high reflectance. For example, the first conductive pattern AP may include a metal such as silver (Ag), copper (Cu) and aluminum (Al). As a result, the light incident from above the display panel 300 may be reflected by the first conductive pattern AP to be output to the outside. Therefore, the display panel 300 may be a reflective display panel that may reflect an object or a background on the upper surface of the display panel 300.

As shown in FIGS. 78 and 79, since the first conductive pattern AP is disposed on the encapsulation layer TFEL, the first conductive pattern AP may be spaced apart from the first electrode 171, the second electrode 173, the first contact electrode 174*a* and the second contact electrode 174*b* by 200 μm or more. In this manner, it is possible to reduce influence on the first electrode 171, the second electrode 173, the first contact electrode 174*a* and the second contact electrode 174*b* by electromagnetic waves from the first conductive pattern AP.

Figure 80:
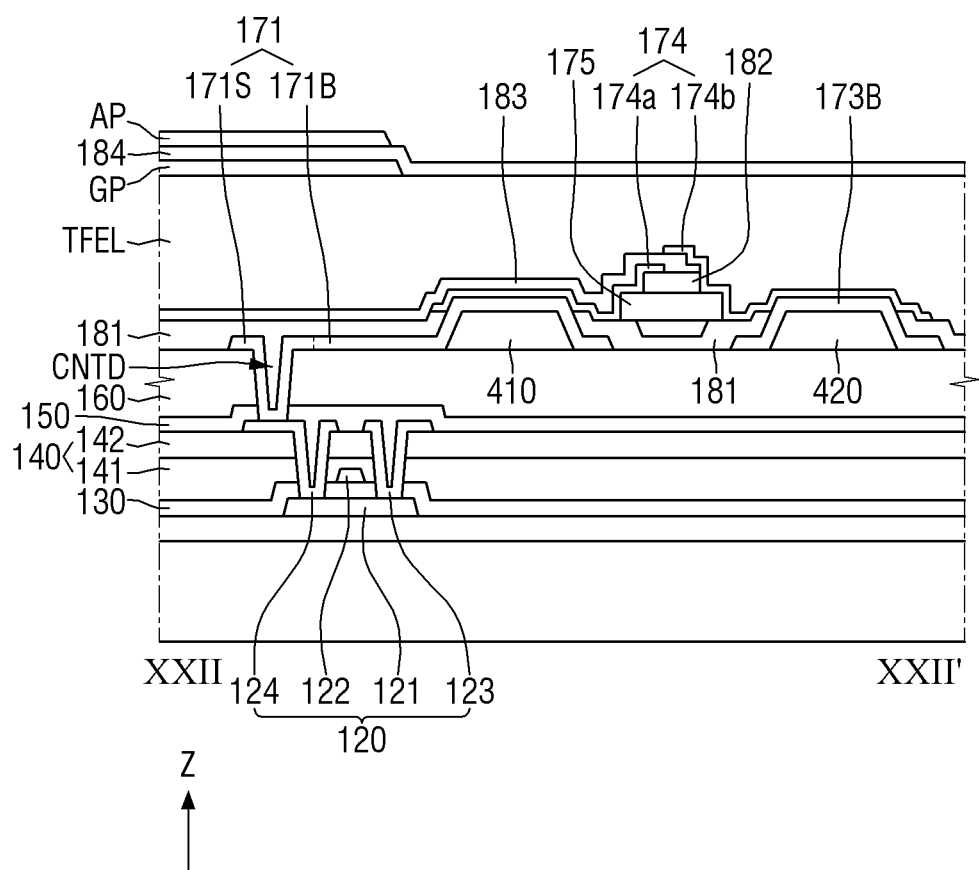
FIG. 80 is a schematic cross-sectional view taken along line XXII-XXII' of FIG. 78.

FIG. 80 is a schematic cross-sectional view taken along line XXII-XXII' of FIG. 78.

Figure 82:
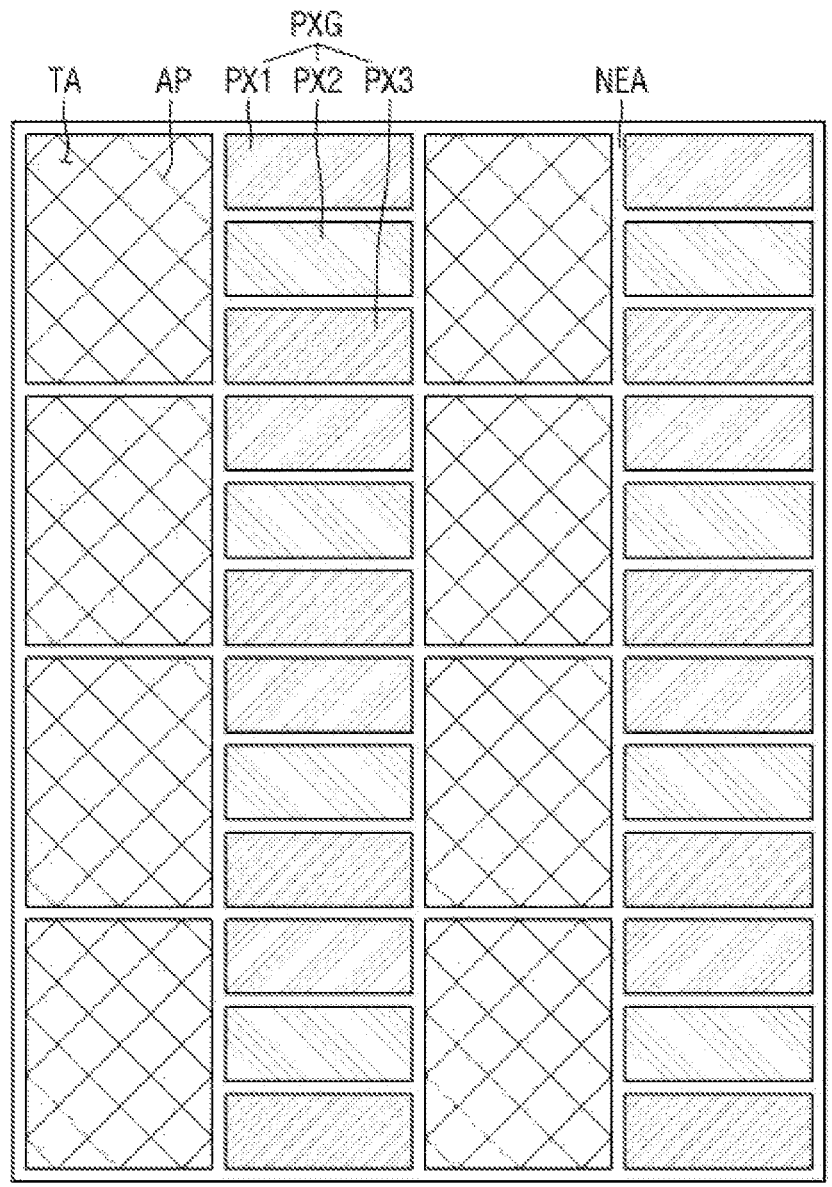
FIG. 82 is a plan view showing an example of the pixels in the display area of FIG. 65.

An embodiment of FIG. 80 may be different from an embodiment of FIG. 82 in that a second conductive pattern GP overlapping the first conductive pattern AP may be disposed.

Referring to FIG. 80, a second conductive pattern GP to which the ground voltage may be applied may be disposed on an encapsulation layer TFEL. The second conductive pattern GP may overlap the other areas than the emission areas EMA1, EMA2 and EMA3 of the sub-pixels PX1, PX2 and PX3. The second conductive pattern GP may overlap a first electrode stem 171S and a first electrode branch 171B of a first electrode 171, a second electrode stem 173S and a second electrode branch 173B a second electrode 173, and an outer bank 430.

The second conductive pattern GP may include a conductive material. For example, the second conductive pattern GP may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. Alternatively, the second conductive pattern GP may include a conductive material having high reflectance. For example, the second conductive pattern GP may include a metal such as silver (Ag), copper (Cu) and aluminum (Al). When the second conductive pattern GP includes a conductive material having high reflectance, it is possible to reflect the light incident from above the display panel 300 by using the two reflective layers, i.e., the second conductive pattern GP and the first conductive pattern AP.

A fourth insulating layer 184 may be disposed on the second conductive pattern GP. The fourth insulating layer 184 may be formed of an inorganic layer, for example, a silicon nitride layer, a silicon oxynitride layer, a silicon oxide layer, a titanium oxide layer, or an aluminum oxide layer.

The first conductive pattern AP may be disposed on the fourth insulating layer 184. The first conductive pattern AP may be disposed to overlap the second conductive pattern GP in the third direction (z-axis direction). As shown in FIG. 80, since the second conductive pattern GP is disposed on the encapsulation layer TFEL and the first conductive pattern AP is disposed on the encapsulation layer TFEL, electromagnetic waves from the first conductive pattern AP may be blocked by the second conductive pattern GP.

Therefore, it is possible to reduce influence on the first electrode 171, the second electrode 173, the first contact electrode 174a and the second contact electrode 174b by electromagnetic waves from the first conductive pattern AP.

Figure 81:
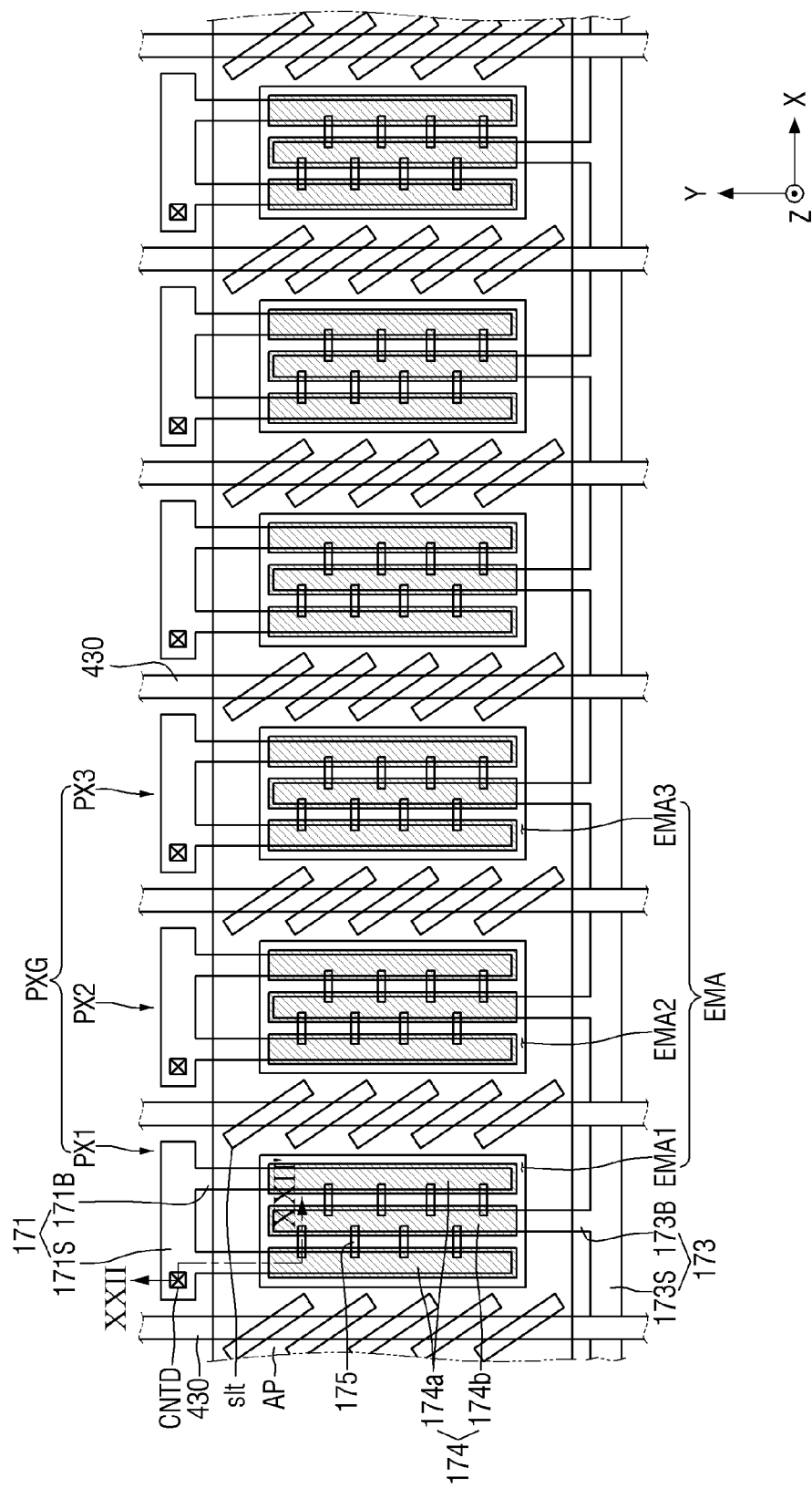
FIG. 81 is a plan view showing an example of the pixels in the display area of FIG. 65.

FIG. 81 is a plan view showing an example of the pixels in the display area of FIG. 65.

An embodiment of FIG. 81 may be different from an embodiment of FIG. 80 in that a first conductive pattern AP may include slits. The slits may be openings or apertures.

Referring to FIG. 81, each of the slits of the first conductive pattern AP may be inclined with respect to the second direction (y-axis direction). Due to the slits, the area where the first conductive pattern AP overlaps with the first electrode 171 and the area where the first conductive pattern AP overlaps with the second electrode 173 may be reduced. As a result, the parasitic capacitance between the first conductive pattern AP and the first electrode 171 and the parasitic capacitance between the first conductive pattern AP and the second electrode 173 may be reduced. Therefore, it is possible to reduce the influence on the first electrode 171 and the second electrode 173 by electromagnetic waves from the first conductive pattern AP.

Although the slits are disposed between the emission areas EMA1, EMA2 and EMA3 adjacent to one another in the first direction (x-axis direction) in FIG. 81, the positions of the slits are not limited to that shown.

It is to be noted that the sensor electrode layer SENL including the first conductive pattern AP may be disposed on the encapsulation layer TFE, instead of the first conductive pattern AP in FIGS. 80 and 81.

FIG. 82 is a plan view showing an example of the pixels in the display area of FIG. 65.

Referring to FIG. 82, the display area DA may include pixels PXs, a non-emission area NEA, and transmissive areas TA.

Each of the pixels PXG may include a first sub-pixel PX1, a second sub-pixel PX2 and a third sub-pixel PX3. Each of the first sub-pixel PX1, the second sub-pixel PX2 and the third sub-pixel PX3 may include a light-emitting element that emits light. The light-emitting element may be an organic light-emitting diode including an organic light-emitting layer, a micro LED, a quantum-dot light-emitting diode including a quantum-dot light-emitting layer, or an inorganic light-emitting diode including an inorganic semiconductor.

The first sub-pixel PX1 may emit a first light, the second sub-pixel PX2 may emit a second light, and the third sub-pixel PX3 may emit a third light. The first light may be red light, the second light may be green light, and the third light may be blue light. It is, however, to be understood that the disclosure is not limited thereto. Alternatively, the sub-pixels PX1, PX2 and PX3 may emit light of the same color.

Each of the sub-pixels PX1, PX2 and PX3 may have, but is not limited to, a substantially rectangular shape having longer sides in the first direction (x-axis direction) and shorter sides in the second direction (y-axis direction). The sub-pixels PX1, PX2 and PX3 may be arranged or disposed in, but is not limited to, the second direction (y-axis direction).

In the non-emission area NEA, lines for driving the light-emitting element of each of the sub-pixels PX1, PX2 and PX3 may be disposed. The non-emission area NEA may surround the sub-pixels PX1, PX2 and PX3. The non-emission area NEA may be disposed between adjacent ones of the sub-pixels PX1, PX2 and PX3. The non-emission area NEA may be disposed between the transmissive area TA and each of the sub-pixels PX1, PX2 and PX3. The non-emission area NEA may be disposed between adjacent ones of the transmissive areas TA.

The transmissive areas TA transmit the incident light substantially as it is. The transmissive areas TA may be arranged or disposed in the second direction (y-axis direction). Due to the transmissive areas TA, an object or a background located or disposed on the lower surface of the display panel 300 may be seen from the upper surface of the display panel 300.

The first conductive pattern AP may be disposed in the transmissive areas TA. The first conductive pattern AP may have a substantially mesh topology. The width of the first conductive patterns AP may be 2 µm or less in order to prevent the first conductive pattern AP from being recognized by the user. Although the first conductive pattern AP is disposed in every transmissive area TA in the example shown in FIG. 82, but the disclosure is not limited thereto. The first conductive pattern AP may be formed or disposed in some of the transmissive areas TA but may not be formed or disposed in the others.

The first conductive pattern AP may be electrically connected to a feeding line in the non-emission area NEA. Therefore, the first conductive pattern AP may be electrically connected to the radio frequency driver 350 disposed on the display circuit board 310 or the first flexible film 340 through the feeding line. Therefore, the first conductive pattern AP may be utilized as a patch antenna for mobile communications or an antenna for an RFID tag for near field communications.

As shown in FIG. 82, when the display panel 300 may be a transparent display panel including transmissive areas TA, or it includes transmissive areas TA overlapping sensor devices disposed on the lower surface of the display panel 300, the first conductive pattern AP formed or disposed in the transmissive areas TA of the display panel 300 may be utilized as the antenna.

Figure 83:
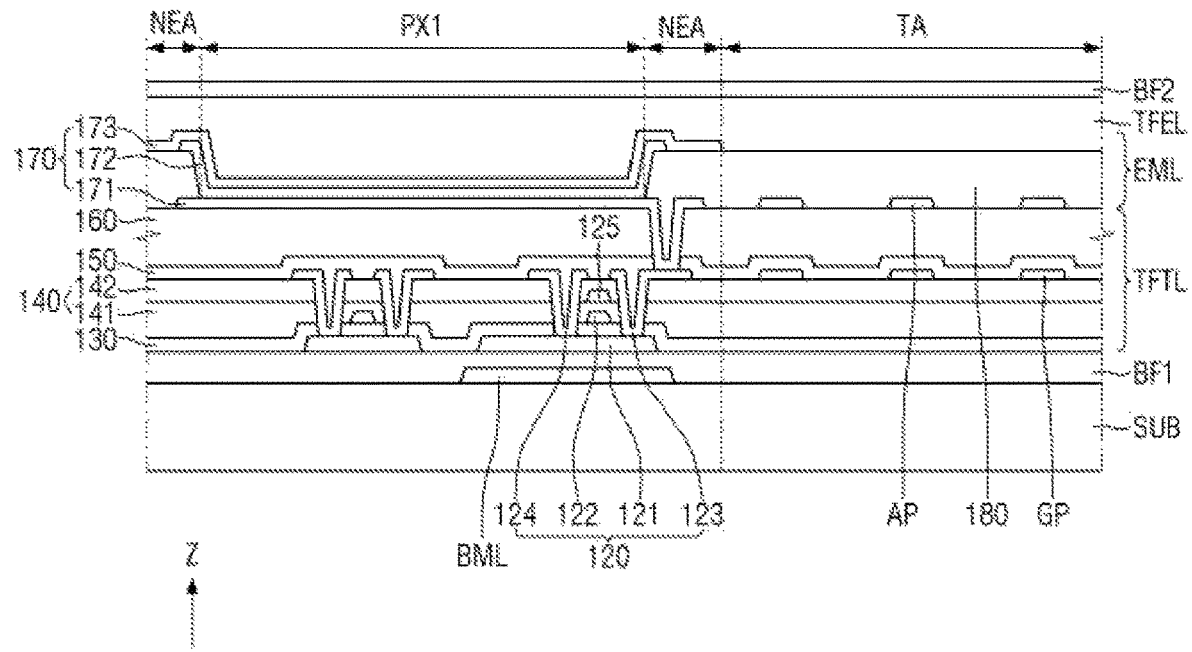
FIG. 83 is a schematic cross-sectional view showing an example of a sub-pixel and an example of a transmissive area of FIG. 82.

FIG. 83 is a schematic cross-sectional view showing an example of a sub-pixel and an example of a transmissive area of FIG. 82.

Referring to FIG. 83, the display layer DISL may include a thin-film transistor layer TFTL, an emission material layer EML, and an encapsulation layer TFEL disposed on a substrate SUB. The thin-film transistor layer TFTL, the emission material layer EML and the encapsulation layer TFEL of the sub-pixel of FIG. 83 is substantially identical to that described above with reference to FIG. 21.

The first conductive pattern AP may be made of the same or similar material on a same layer as the first electrode 171 in the transmissive area TA. The first conductive pattern AP may be disposed on the planarization layer 160.

The second conductive pattern GP may overlap the first conductive pattern AP in the third direction (z-axis direction) in the transmissive area TA. The second conductive pattern GP may be eliminated. The second conductive pattern GP may be made of the same or similar material on a same layer as the source electrode 123 and the drain electrode 124 of the thin-film transistor 120. The second conductive pattern GP may be disposed on the first interlayer dielectric layer 141.

Alternatively, the second conductive pattern GP may be made of the same or similar material on a same layer as the gate electrode 122 of the thin-film transistor 120. The second conductive pattern GP may be disposed on the gate insulating layer 130.

As shown in FIG. 83, the first conductive pattern AP may be made of the same or similar material on a same layer as the first electrode 171 in the transmissive area TA, and the second conductive pattern GP may be made of the same or similar material on a same layer as the source electrode 123 and the drain electrode 124 of the thin-film transistor 120. Therefore, the first conductive pattern AP may be formed without any additional process, and the first conductive pattern AP may be utilized as a patch antenna for mobile communications or an RFID tag antenna for near field communications.

Figure 84:
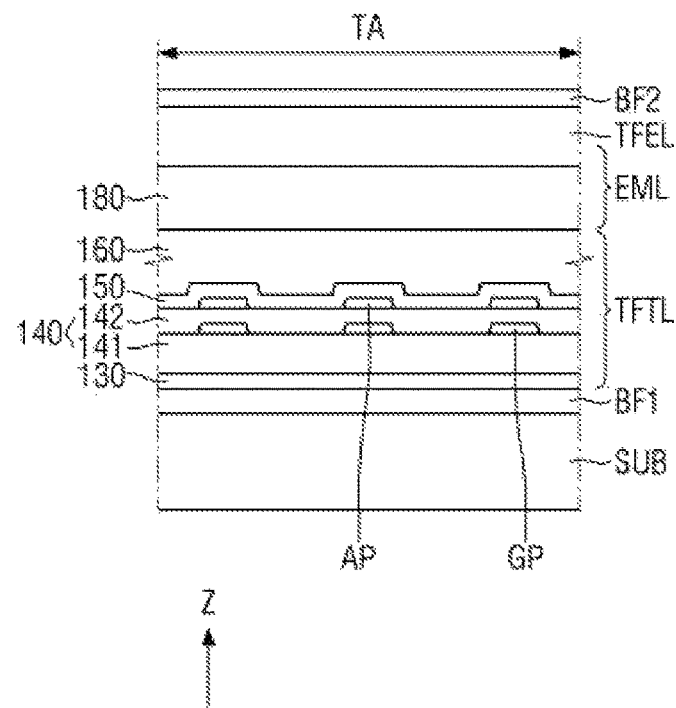
FIG. 84 is a schematic cross-sectional view showing an example of the transmissive area of FIG. 82.

FIG. 84 is a schematic cross-sectional view showing an example of the transmissive area of FIG. 82.

Referring to FIG. 84, the first conductive pattern AP may be made of the same or similar material on a same layer as the source electrode 123 and the drain electrode 124 of the thin-film transistor 120 in the transmissive area TA. The first conductive pattern AP may be disposed on the second interlayer dielectric layer 142.

The second conductive pattern GP may overlap the first conductive pattern AP in the third direction (z-axis direction) in the transmissive area TA. The second conductive pattern GP may be eliminated. The second conductive pattern GP may be made of the same or similar material on a same layer as a capacitor electrode 125. The second conductive pattern GP may be disposed on the first interlayer dielectric layer 141.

As shown in FIG. 84, the first conductive pattern AP may be made of the same or similar material on a same layer as the source electrode 123 and the drain electrode of the thin-film transistor 120 in the transmissive area TA, and the second conductive pattern GP may be made of the same or similar material on a same layer as the capacitor electrode 125. Therefore, the first conductive pattern AP may be formed without any additional process, and the first conductive pattern AP may be utilized as a patch antenna for mobile communications or an RFID tag antenna for near field communications.

Figure 85:
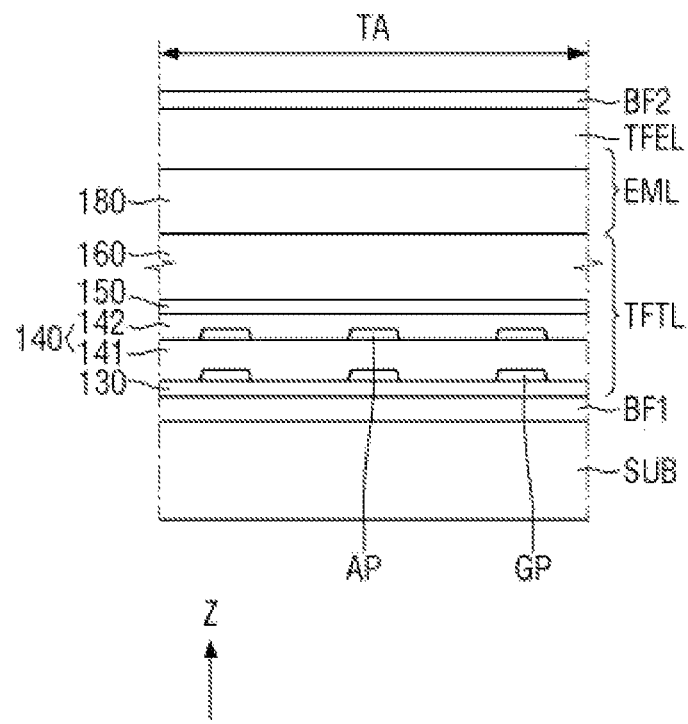
FIG. 85 is a schematic cross-sectional view showing an example of the transmissive area of FIG. 82.

FIG. 85 is a schematic cross-sectional view showing an example of the transmissive area of FIG. 82.

Referring to FIG. 85, the first conductive pattern AP may be made of the same or similar material on a same layer as the capacitor electrode 125 in the transmissive area TA. The first conductive pattern AP may be disposed on the first interlayer dielectric layer 141.

The second conductive pattern GP may overlap the first conductive pattern AP in the third direction (z-axis direction) in the transmissive area TA. The second conductive pattern GP may be eliminated. The second conductive pattern GP may be made of the same or similar material on a same layer as the gate electrode 122 of the thin-film transistor 120. The second conductive pattern GP may be disposed on the gate insulating layer 130.

As shown in FIG. 85, the first conductive pattern AP may be made of the same or similar material on a same layer as the capacitor electrode 125 in the transmissive area TA, and the second conductive pattern GP may be made of the same or similar material on a same layer as the gate electrode 122 of the thin-film transistor 120. Therefore, the first conductive pattern AP may be formed without any additional process, and the first conductive pattern AP may be utilized as a patch antenna for mobile communications or an RFID tag antenna for near field communications.

Figure 86:
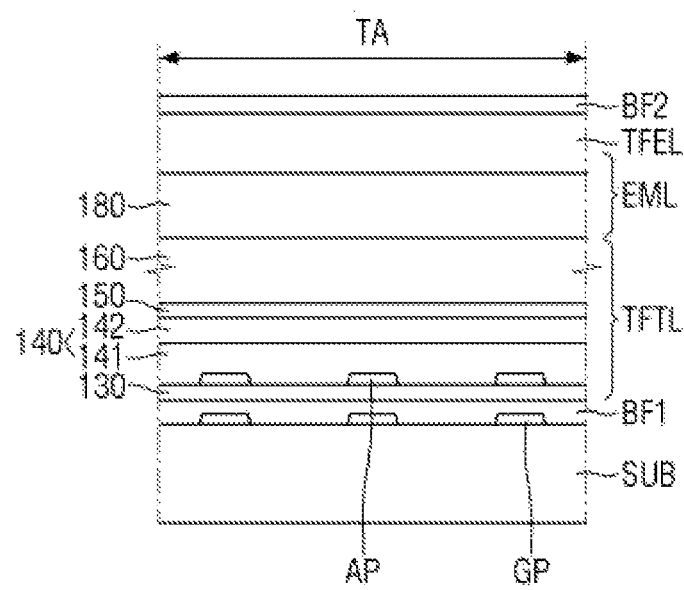
FIG. 86 is a schematic cross-sectional view showing an example of the transmissive area of FIG. 82.

FIG. 86 is a schematic cross-sectional view showing an example of the transmissive area of FIG. 82.

Referring to FIG. 86, the first conductive pattern AP may be made of the same or similar material on a same layer as the gate electrode 122 of the thin-film transistor 120 in the transmissive area TA. The first conductive pattern AP may be disposed on the gate insulating layer 130.

The second conductive pattern GP may overlap the first conductive pattern AP in the third direction (z-axis direction) in the transmissive area TA. The second conductive pattern GP may be eliminated. The second conductive pattern GP may be made of the same or similar material on a same layer as a first light-blocking layer BML1. The second conductive pattern GP may be disposed on the substrate SUB, and the first buffer layer BF1 may be disposed on the second conductive pattern GP.

As shown in FIG. 86, the first conductive pattern AP may be made of the same or similar material on a same layer as the gate electrode 122 of the thin-film transistor 120 in the transmissive area TA, and the second conductive pattern GP may be made of the same or similar material on a same layer as the first light-blocking layer BML1. Therefore, the first conductive pattern AP may be utilized as a patch antenna for mobile communications or an antenna for an RFID tag for near field communications.

Figure 87:
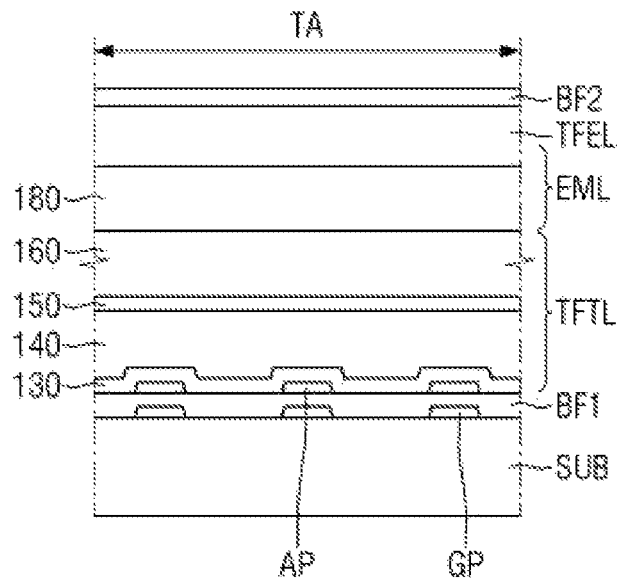
FIG. 87 is a schematic cross-sectional view showing an example of the transmissive area of FIG. 82.

FIG. 87 is a schematic cross-sectional view showing an example of the transmissive area of FIG. 82.

Referring to FIG. 87, the first conductive pattern AP may be made of the same or similar material on a same layer as the active layer 121 of the thin-film transistor 120 in the transmissive area TA. In such case, the first conductive pattern AP may have conductivity. The first conductive pattern AP may be disposed on the first buffer layer BF1.

The second conductive pattern GP may overlap the first conductive pattern AP in the third direction (z-axis direction) in the transmissive area TA. The second conductive pattern GP may be eliminated. The second conductive pattern GP may be made of the same or similar material on a same layer as a first light-blocking layer BML1. The second conductive pattern GP may be disposed on the substrate SUB, and the first buffer layer BF1 may be disposed on the second conductive pattern GP.

As shown in FIG. 87, the first conductive pattern AP may be made of the same or similar material on a same layer as the active layer 121 of the thin-film transistor 120 in the transmissive area TA, and the second conductive pattern GP may be made of the same or similar material on a same layer as the first light-blocking layer BML1. Therefore, the first conductive pattern AP may be utilized as a patch antenna for mobile communications or an antenna for an RFID tag for near field communications.

Figure 88:
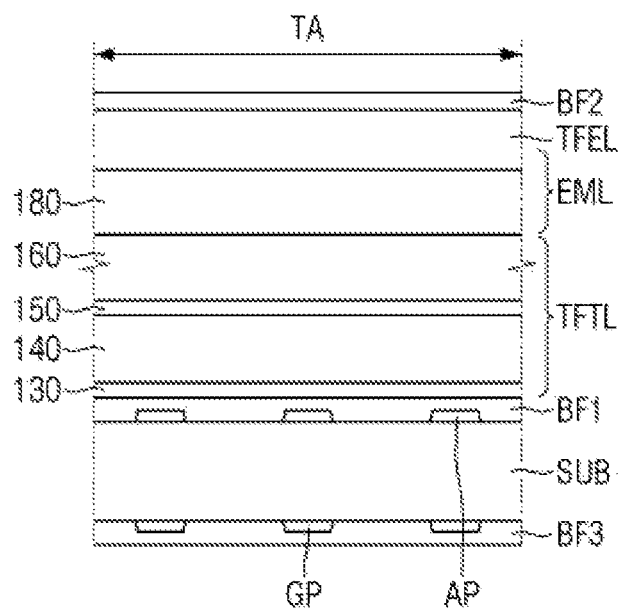
FIG. 88 is a schematic cross-sectional view showing an example of the transmissive area of FIG. 82.

FIG. 88 is a schematic cross-sectional view showing an example of the transmissive area of FIG. 82.

Referring to FIG. 88, the first conductive pattern AP may be made of the same or similar material on a same layer as the first light-blocking layer BML1 in the transmissive area TA. The first conductive pattern AP may be disposed on the substrate SUB, and the first buffer layer BF1 may be disposed on the second conductive pattern GP.

The second conductive pattern GP may overlap the first conductive pattern AP in the third direction (z-axis direction) in the transmissive area TA. The second conductive pattern GP may be eliminated. The second conductive pattern GP may be disposed on the opposite surface of the substrate SUB, and a third buffer layer BF3 may be disposed on the second conductive pattern GP.

The first conductive pattern AP may be utilized as a patch antenna for mobile communication or an antenna for an RFID tag for short range communication.

Figure 89:
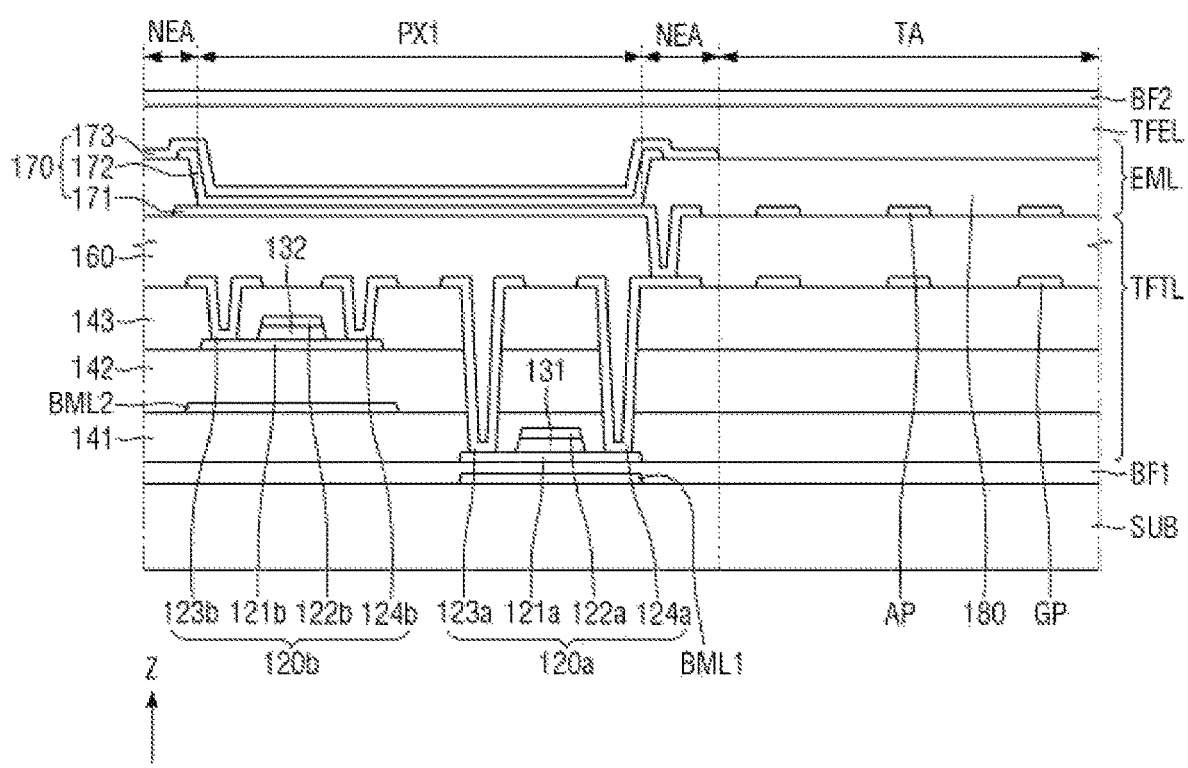
FIG. 89 is a schematic cross-sectional view showing an example of the sub-pixels and an example of the transmissive areas of FIG. 82.

FIG. 89 is a schematic cross-sectional view showing an example of the sub-pixels and an example of the transmissive areas of FIG. 82.

Referring to FIG. 89, the thin-film transistor layer TFTL may include a first thin-film transistor 120a including an active layer 121a made of polysilicon and a second thin-film transistor 120b including an active layer 121b made of an oxide semiconductor.

The first thin-film transistor 120a may include a first active layer 121a, a first gate electrode 122a, a first source electrode 123a, and a first drain electrode 124a. The second thin-film transistor 120b may include a second active layer 121b, a second gate electrode 122b, a second source electrode 123b, and a second drain electrode 124b.

The first active layer 121a may be disposed on the first buffer layer BF1. The first active layer 121a may be made of polycrystalline silicon or low-temperature polysilicon (LTPS).

The first gate insulating layer 131 may be disposed on the first active layer 121a. The first gate insulating layer 131 may be formed of an inorganic layer, for example, a silicon nitride layer, a silicon oxynitride layer, a silicon oxide layer, a titanium oxide layer, or an aluminum oxide layer.

The first gate electrode 122a may be disposed on the first gate insulating layer 131. The first gate electrode 122a may overlap the first active layer 121a in the third direction (z-axis direction).

The first interlayer dielectric layer 141 may be disposed on the first gate electrode 122a. A light-blocking layer BML may be disposed on the first interlayer dielectric layer 141. The light-blocking layer BML may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The second interlayer dielectric layer 142 may be disposed on the light-blocking layer BML. The second active layer 121b may be disposed on the second interlayer dielectric layer 142. The second active layer 121b may overlap the light-blocking layer BML in the third direction (z-axis direction). The second active layer 121b may be made of an oxide semiconductor.

The second gate electrode 122b may be disposed on the second active layer 121b. The second gate electrode 122b may overlap the second active layer 121b in the third direction (z-axis direction). The first gate electrode 122a and the second gate electrode 122b may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A third interlayer dielectric layer 143 may be disposed on the second gate electrode 122b. Each of the first interlayer dielectric layer 141, the second interlayer dielectric layer 142 and the third interlayer dielectric layer 143 may be formed of an inorganic layer, e.g., a silicon nitride layer, a silicon oxy nitride layer, a silicon oxide layer, a titanium oxide layer, or an aluminum oxide layer.

The first source electrode 123a, the second source electrode 123b, the first drain electrode 124a, and the second drain electrode 124b may be formed or disposed on the third interlayer dielectric layer 143. The first source electrode 123a and the first drain electrode 124a may be electrically connected to the first active layer 121a through contact holes penetrating through the first interlayer dielectric layer 141, the second interlayer dielectric layer 142 and the third interlayer dielectric layer 143. The second source electrode 123b and the second drain electrode 124b may be electrically connected to the second active layer 121b through a contact hole penetrating through the third interlayer insulating layer 143. Each of the first source electrode 123a, the second source electrode 123b, the first drain electrode 124a and the second drain electrode 124b may be made up of a single layer or multiple layers made of one of molybdenum (Mo), aluminum (Al), chromium (Cr), gold (Au), titanium (Ti), nickel (Ni), neodymium (Nd) and copper (Cu) or an alloy thereof.

The planarization layer 160 may be formed or disposed on the first source electrode 123a, the second source electrode 123b, the first drain electrode 124a and the second drain electrode 124b in order to provide a flat surface over the step differences caused by the first thin-film transistor 120a and the second thin-film transistor 120b. The planarization layer 160 may be formed of an organic layer such as an acryl resin, an epoxy resin, a phenolic resin, a polyamide resin and a polyimide resin.

The emission material layer EML and the encapsulation layer TFEL may be formed or disposed on the thin-film transistor layer TFTL. The emission material layer EML and the encapsulation layer TFEL may be substantially identical to those described above with reference to FIG. 21.

The first conductive pattern AP may be made of the same or similar material on a same layer as the first electrode 171 in the transmissive area TA. The first conductive pattern AP may be disposed on the planarization layer 160.

The second conductive pattern GP may overlap the first conductive pattern AP in the third direction (z-axis direction) in the transmissive area TA. The second conductive pattern GP may be eliminated. The second conductive pattern GP may be made of the same or similar material on a same layer as the first source electrode 123a, the second source electrode 123b, the first drain electrode 124a and the second drain electrode 124b. The second conductive pattern GP may be disposed on the third interlayer dielectric layer 143. Alternatively, the second conductive pattern GP may be made of the same or similar material on a same layer as one of the second gate electrode 122b, the second light-blocking layer BML2, the first gate electrode 122a, and the first light-blocking layer BML1.

Alternatively, the first conductive pattern AP may be made of the same or similar material on a same layer as the first source electrode 123a, the second source electrode 123b, the first drain electrode 124a and the second drain electrode 124b. In such case, the second conductive pattern GP may be made of the same or similar material on a same layer as one of the second gate electrode 122b, the second light-blocking layer BML2, the first gate electrode 122a, and the first light-blocking layer BML1.

Alternatively, the first conductive pattern AP may be made of the same or similar material on a same layer as the second gate electrode 122b. In such case, the second conductive pattern GP may be made of the same or similar material on a same layer as one of the second light-blocking layer BML2, the first gate electrode 122a, and the first light-blocking layer BML1.

Alternatively, the first conductive pattern AP may be made of the same or similar material on a same layer as the light-blocking layer BML. In such case, the second conductive pattern GP may be made of the same or similar material on a same layer as the first gate electrode 122a and the first light-blocking layer BML1.

Alternatively, the first conductive pattern AP may be made of the same or similar material on a same layer as the first gate electrode 122a and the first active layer 121a. In such case, the second conductive pattern GP may be made of the same or similar material on a same layer as a first light-blocking layer BML1.

As shown in FIG. 89, the first conductive pattern AP may be made of the same or similar material on a same layer as the first electrode 171 in the transmissive area TA, and the second conductive pattern GP may be made of the same or similar material on a same layer as the source electrode 123 and the drain electrode 124 of the thin-film transistor 120. Therefore, the first conductive pattern AP may be formed without any additional process, and the first conductive pattern AP may be utilized as a patch antenna for mobile communications or an RFID tag antenna for near field communications.

As shown in FIG. 89, when the thin-film transistor layer TFTL may include the first thin-film transistor 120a including the active layer 121a made of polysilicon and the second thin-film transistor 120b including the active layer 121b made of an oxide semiconductor, the distance between the first thin-film transistor 120a and the second thin-film transistor 120b may be reduced to thereby reduce the non-emission area NEA, so that the area of the transmissive area TA may be increased. As the area of the transmissive area TA is increased, the first conductive pattern AP may be disposed in a larger area.

Figure 90:
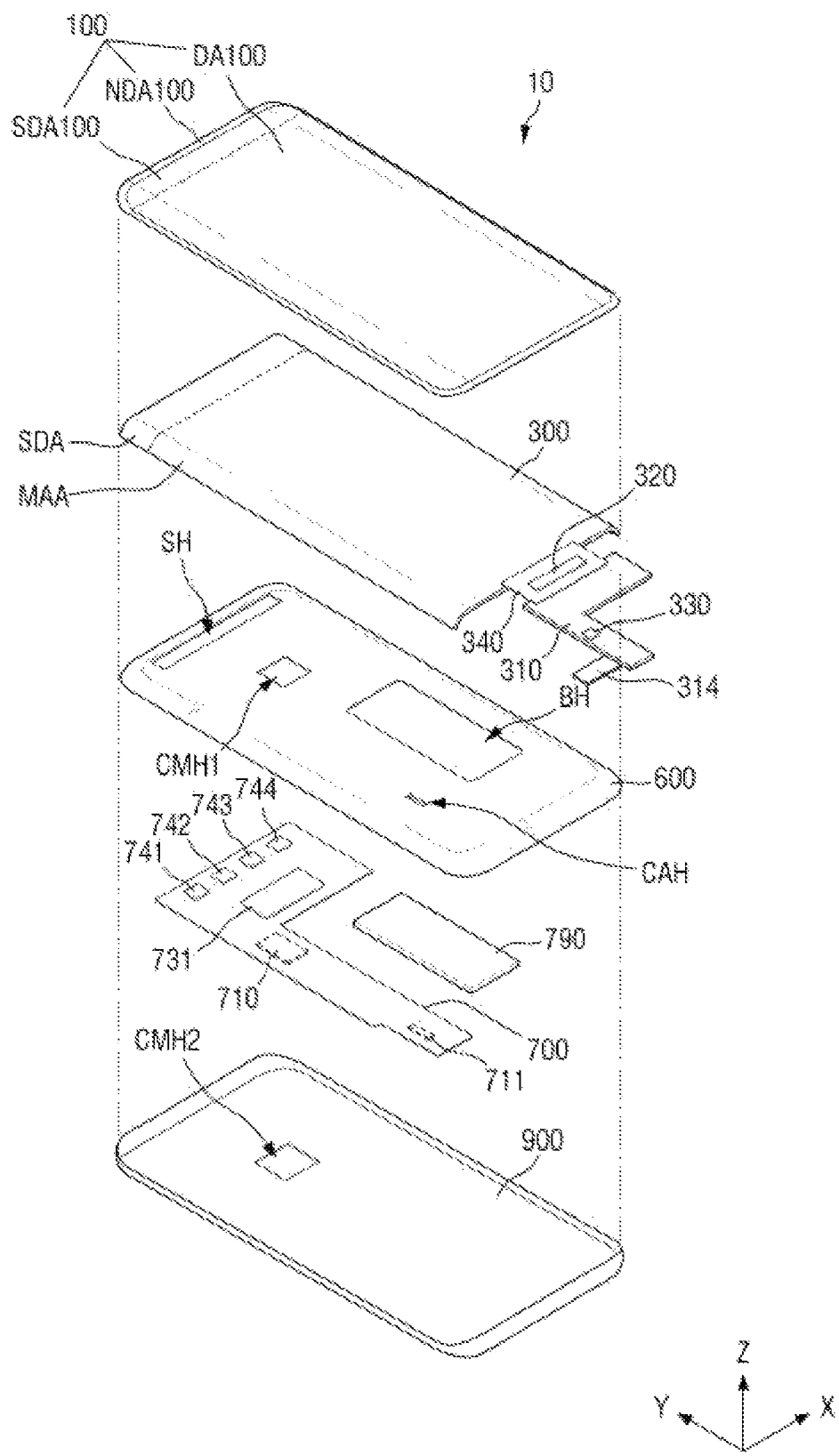
FIG. 90 is an exploded, perspective view of a display device according to an embodiment.

FIG. 90 is an exploded, perspective view of a display device according to an embodiment.

An embodiment of FIG. 90 is different from an embodiment of FIG. 2 in that a display area DA of a display panel 300 includes a main area MAA and a sub area SDA.

Referring to FIG. 90, the display panel 300 may include the main area MAA and the sub area SDA. The main area MAA may overlap with a first transmissive portion DA100 of a cover window 100. The sub area SDA may overlap with a second transmissive portion SDA100 of the cover window 100. The sub area SDA may be disposed on, but is not limited to, one side of the main area MAA, e.g., the upper side as shown in FIG. 2. For example, the sub area SDA may be surrounded by the main area MAA, and may be disposed adjacent to a corner of the display panel 300. Although the display panel 300 may include one sub area SDA in the example shown in FIG. 90, this is merely illustrative. For example, the display panel 300 may include sub areas SDA.

In a bracket 600, a sensor hole SH may be formed or disposed to overlap the sub area SDA of the display panel 300 in the third direction (z-axis direction). The sensor hole SH may overlap the sensor devices 741, 742, 743 and 744 of the main circuit board 700 in the third direction (z-axis direction). Therefore, the sub area SDA of the display panel 300 may overlap the sensor devices 741, 742, 743 and 744 of the main circuit board 700 in the third direction (z-axis direction). For example, the sub area SDA of the display panel 300 may be disposed on the sensor devices 741, 742, 743 and 744 of the main circuit board 700. The sensor hole SH may not be formed or disposed in the bracket 600. In which case, the bracket 600 may be disposed so as not to overlap the sensor area SDA of the display panel 300 in the third direction (z-axis direction).

Figure 91:
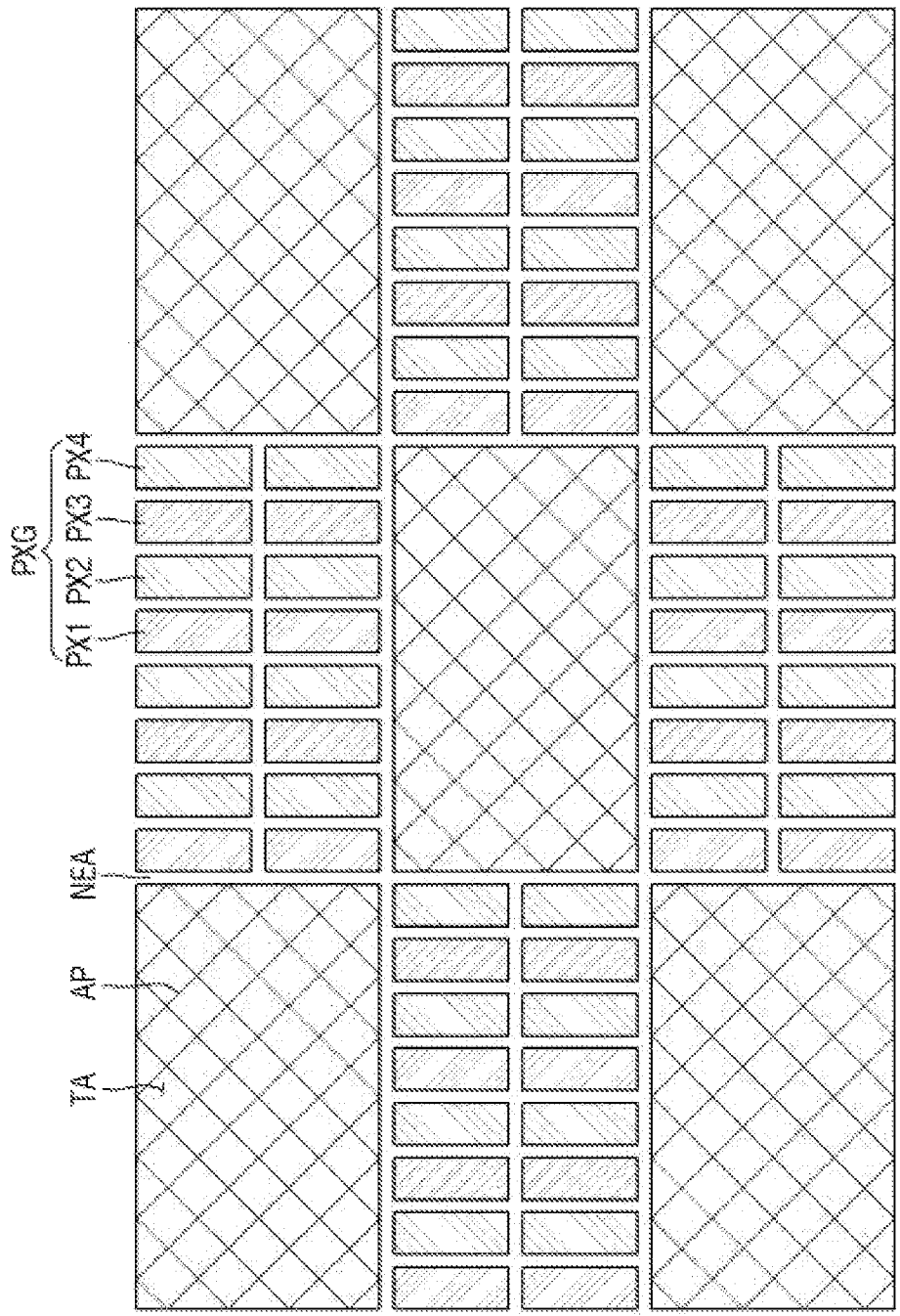
FIG. 91 is a plan view showing an example of pixels in a sub area of a display panel.
Figure 92:
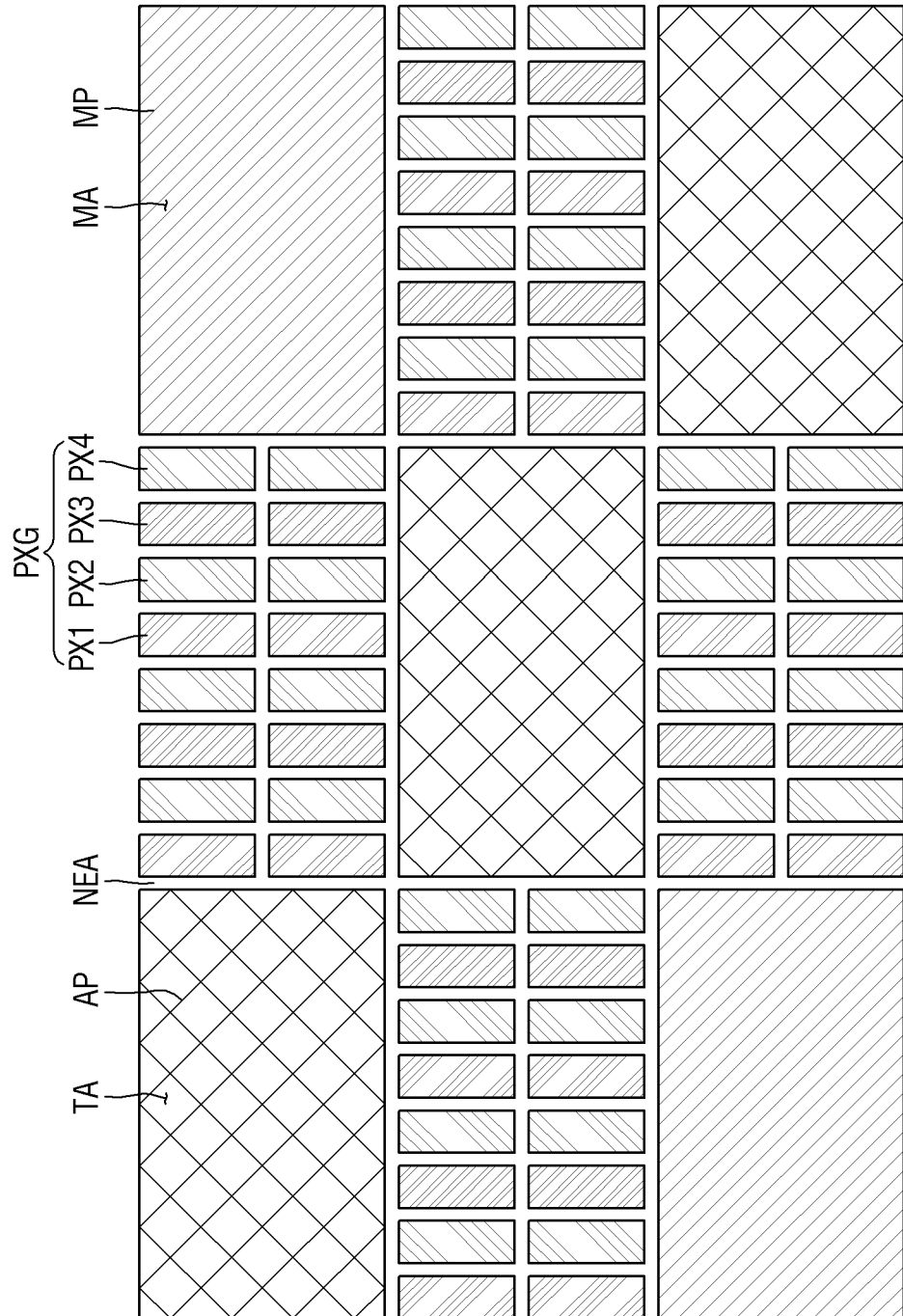
FIG. 92 is a plan view showing an example of pixels in a sub area of a display panel.

A proximity sensor 741, an illuminance sensor 742, an iris sensor 743 and a front camera sensor 744 may be disposed on one surface of the main processor 710. Since the sub area SDA of the display panel 300 includes the transmissive areas TA as shown in FIGS. 91 and 92, the proximity sensor 741 may detect an object disposed near the upper surface of the display device 10, and the illumination sensor 742 may detect the brightness of the light incident on the upper surface of the display device 10. The iris sensor 743 may capture a person's iris on an upper side of the display device 10, and the front camera sensor 744 may capture an object on an upper side of the display device 10. The sensors overlapping the sub area SDA of the display panel 300 are not limited to the proximity sensor 741, the illuminance sensor 742, the iris sensor 743 and the front camera sensor 744. Other sensor devices than the proximity sensor 741, the illuminance sensor 742, the iris sensor 743 and the front camera sensor 744 may be disposed to overlap the sub area SDA of the display panel 300 in the third direction (z-axis direction).

As shown in FIG. 90, the sensor devices 741, 742, 743 and 744 overlap the sub area SDA of the display panel 300, a light-blocking portion NDA100 of the cover window 100 may be reduced. Therefore, the bezel of the display device 10 may be reduced.

FIG. 91 is a plan view showing an example of pixels in a sub area of a display panel. Referring to FIG. 91, the display area DA may include pixels PXs, a non-emission area NEA, and transmissive areas TA.

An embodiment of FIG. 91 is different from an embodiment of FIG. 82 in that each of the pixels PXG includes four sub-pixels PX1, PX2, PX3 and PX4, and that the transmissive areas TA surround four sides of a group of pixels PXG.

Each of the pixels PXG may include a first sub-pixel PX1, a second sub-pixel PX2, a third sub-pixel PX3 and a fourth sub-pixel PX4. The first sub-pixel PX1 may emit a first light, the second sub-pixel PX2 and the fourth sub-pixel PX4 may emit a second light, and the third sub-pixel PX3 may emit a third light. The first light may be red light, the second light may be green light, and the third light may be blue light. It is, however, to be understood that the disclosure is not limited thereto. Alternatively, the sub-pixels PX1, PX2, PX3 and PX4 may emit light of the same color. Each of the sub-pixels PX1, PX2, PX3 and PX4 may have, but is not limited to, a substantially rectangular shape having longer sides in the second direction (y-axis direction) and shorter sides in the first direction (x-axis direction).

Although each of pixels PXG includes four sub-pixels PX1, PX2, PX3, PX4 in the example shown in FIG. 91, the disclosure is not limited thereto. The transmissive areas TA may be disposed on four sides of the group of pixels PXG. A transmissive area TA may be disposed between a group of pixels PXG and another group of pixels PXG adjacent to each other in the first direction (x-axis direction). A transmissive area TA may be disposed between a group of pixels PXG and another group of pixels PXG adjacent to each other in the second direction (y-axis direction).

The transmissive areas TA transmit the incident light substantially as it is. Due to the transmissive areas TA, an object or a background located or disposed on the lower surface of the display panel 300 may be seen from the upper surface of the display panel 300.

The first conductive pattern AP may be disposed in the transmissive areas TA. The first conductive pattern AP may have a substantially mesh topology. The width of the first conductive patterns AP may be 2 μm or less in order to prevent the first conductive pattern AP from being recognized by the user. Although the first conductive pattern AP is disposed in every transmissive area TA in the example shown in FIG. 91, but the disclosure is not limited thereto. The first conductive pattern AP may be formed or disposed in some of the transmissive areas TA but may not be formed or disposed in the others.

The first conductive pattern AP may be electrically connected to a feeding line in the non-emission area NEA. Accordingly, the first conductive pattern AP may be electrically connected to the radio frequency driver disposed on the display circuit board or the flexible film through the feeding line. Therefore, the first conductive pattern AP may be utilized as a patch antenna for mobile communications or an antenna for an RFID tag for near field communications.

FIG. 92 is a plan view showing an example of pixels in a sub area of a display panel. An embodiment of FIG. 92 is different from an embodiment of FIG. 91 in that mirror areas MA may be included.

Referring to FIG. 92, the mirror areas MA reflect light incident from above the display panel 300. By virtue of the mirror areas MA, the sub area SDA of the display panel 300 may reflect an object or a background on the upper surface of the display panel 300. Some of the transmissive areas TA of FIG. 91 may be replaced with the mirror areas MA.

Although the first conductive pattern AP is disposed in every transmissive area TA in the example shown in FIG. 92, but the disclosure is not limited thereto. The first conductive pattern AP may be formed or disposed in some of the transmissive areas TA but may not be formed or disposed in the others.

Figure 93:
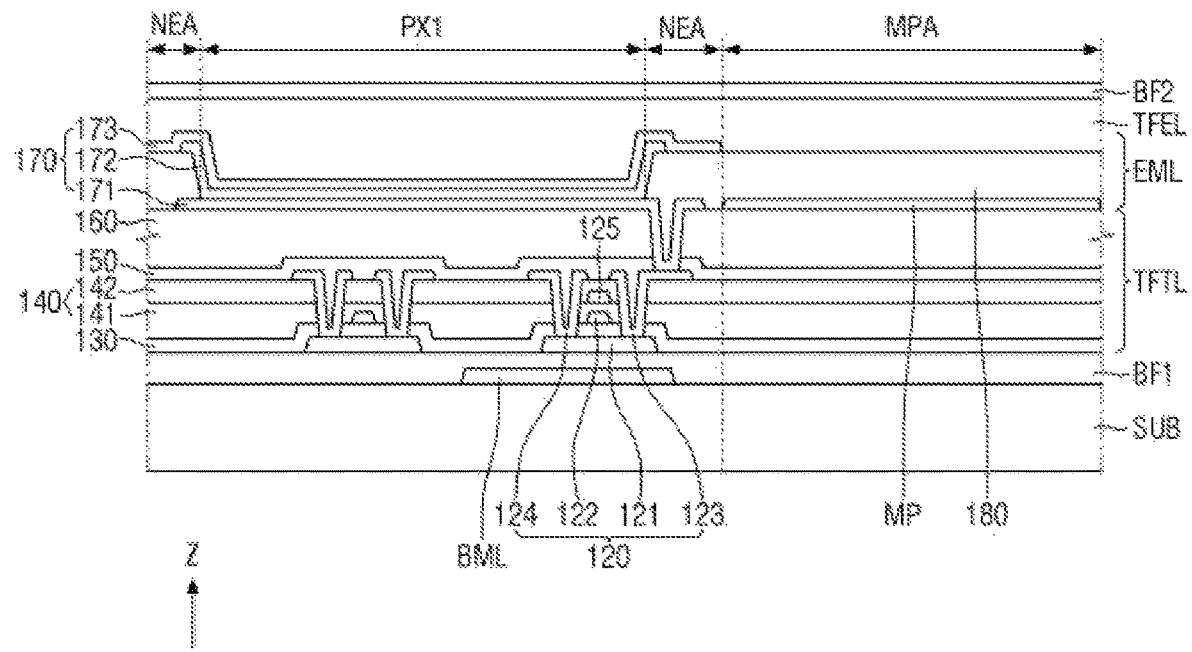
FIG. 93 is a schematic cross-sectional view showing an example of the mirror area of FIG. 92.

As shown in FIG. 93, a mirror pattern MP may be disposed in the mirror area MA. The mirror pattern MP may be made of the same or similar material on a same layer as the first electrode 171. The mirror pattern MP may be disposed on the planarization layer 160. The mirror pattern MP may be made of a metal material having a high reflectivity such as a stack structure of aluminum and titanium (Ti/Al/Ti), a stack structure of aluminum and ITO (ITO/Al/ITO), an APC alloy and a stack structure of APC alloy and ITO (ITO/APC/ITO). The APC alloy is an alloy of silver (Ag), palladium (Pd) and copper (Cu).

Although the second electrode 173 is not disposed in the mirror area MA in the example shown in FIG. 92, the disclosure is not limited thereto. The second electrode 173 may be disposed in the mirror area MA.

Figure 94:
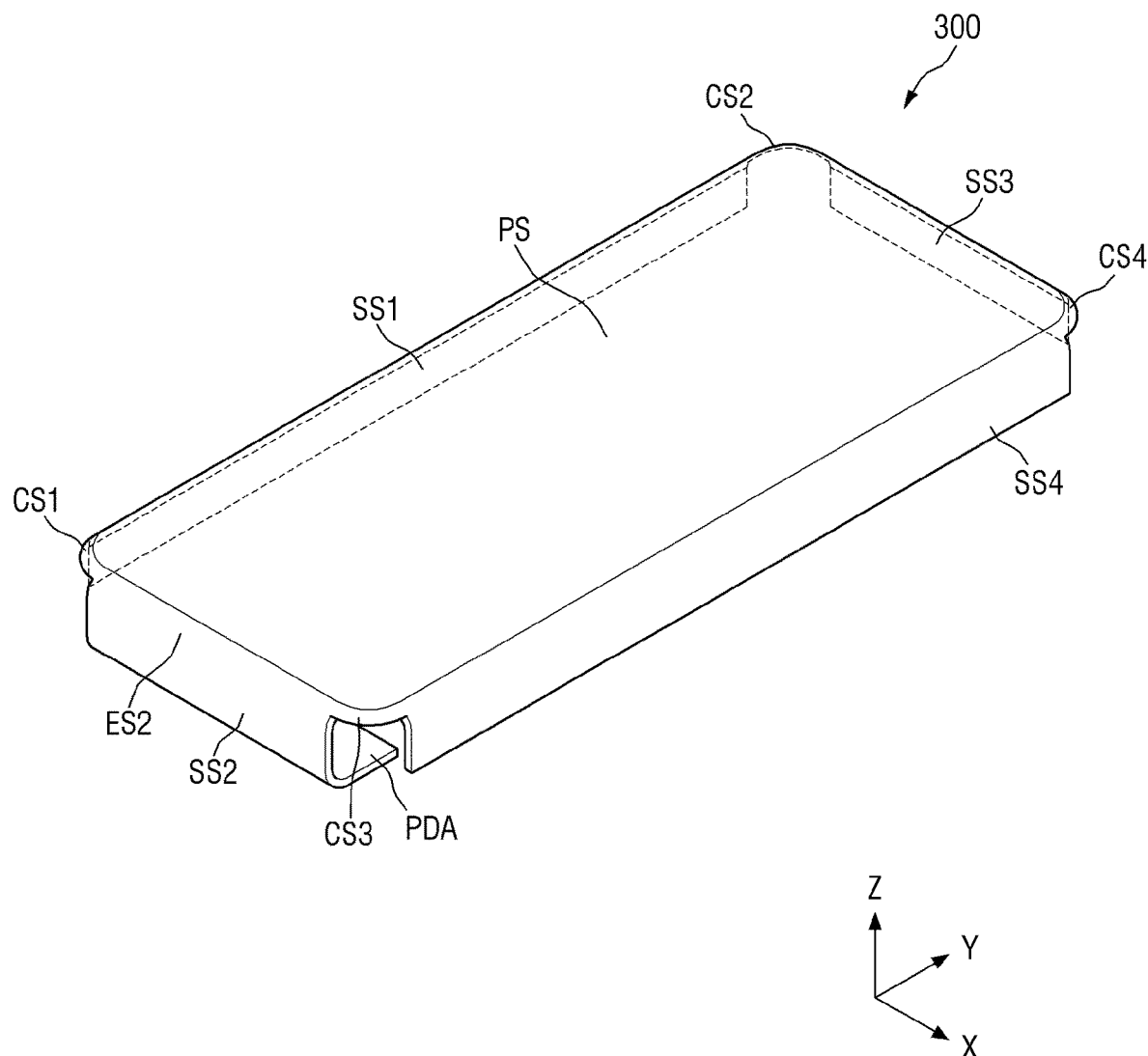
FIG. 94 is a perspective view showing a display panel according to an embodiment.
Figure 95:
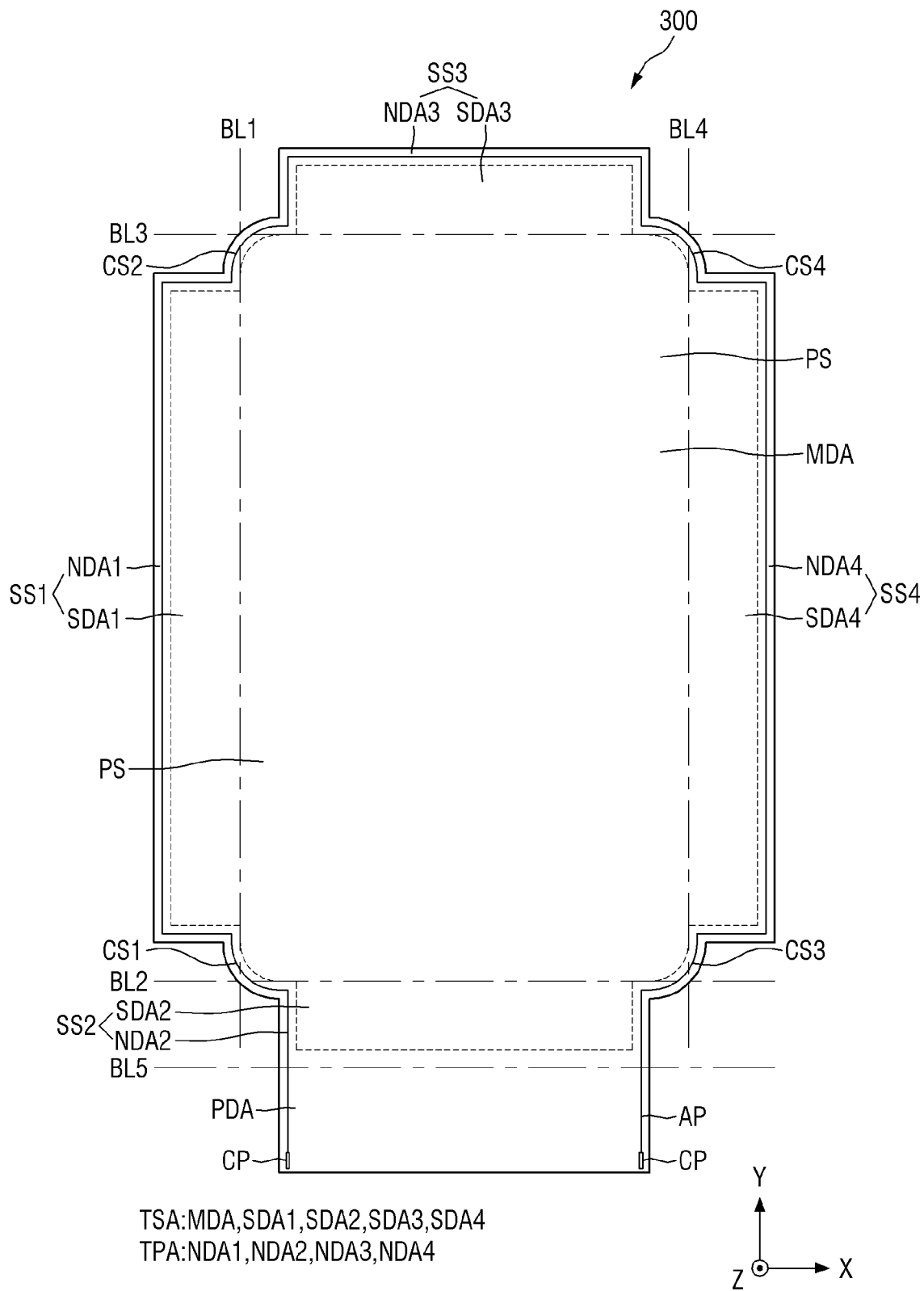
FIG. 95 is a development view showing a display panel according to an embodiment.
Figure 96:
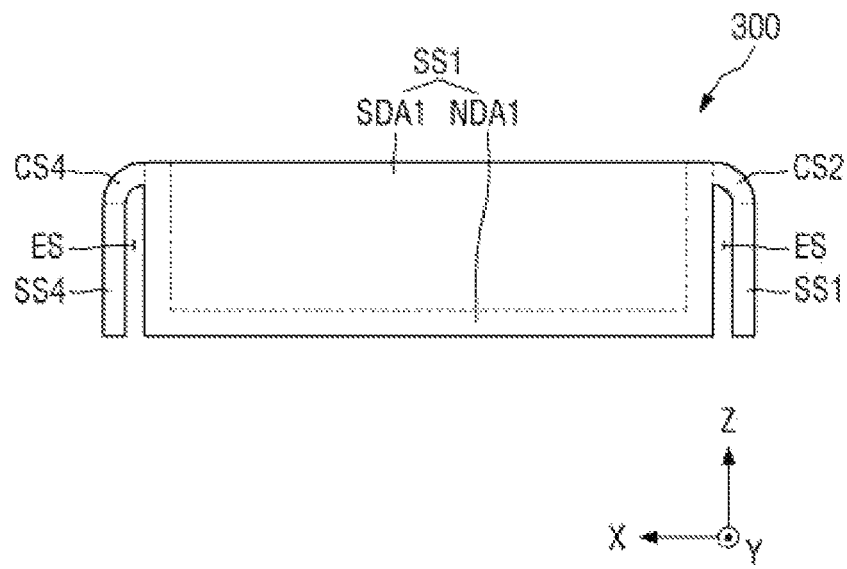
FIG. 96 is a front view showing an example of the display panel of FIG. 94.
Figure 97:
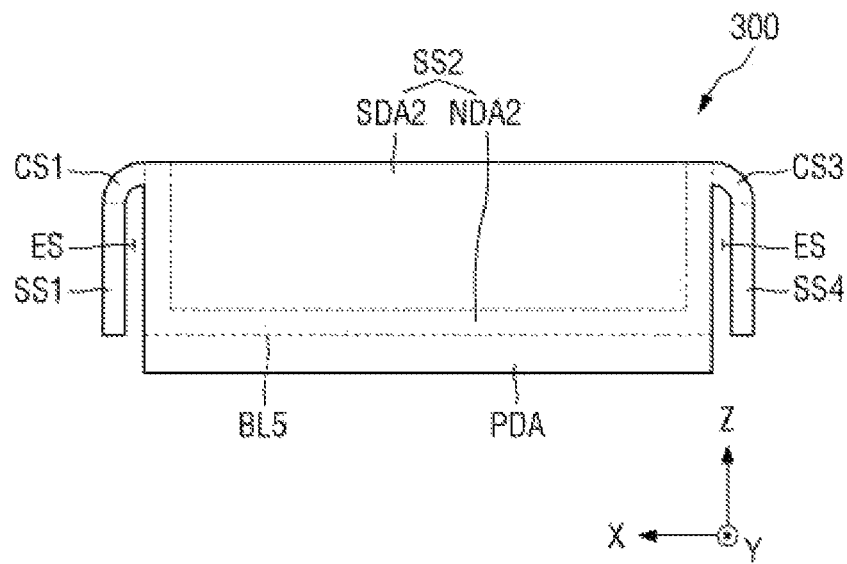
FIG. 97 is a rear view showing an example of the display panel of FIG. 94.
Figure 98:
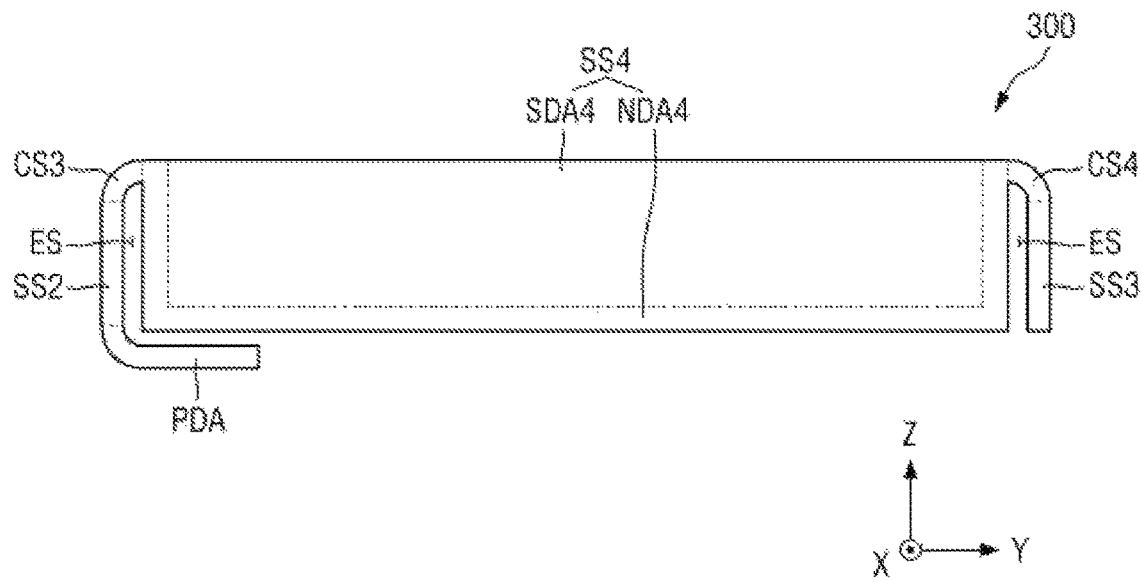
FIG. 98 is a side view showing an example of the display panel of FIG. 94.
Figure 99:
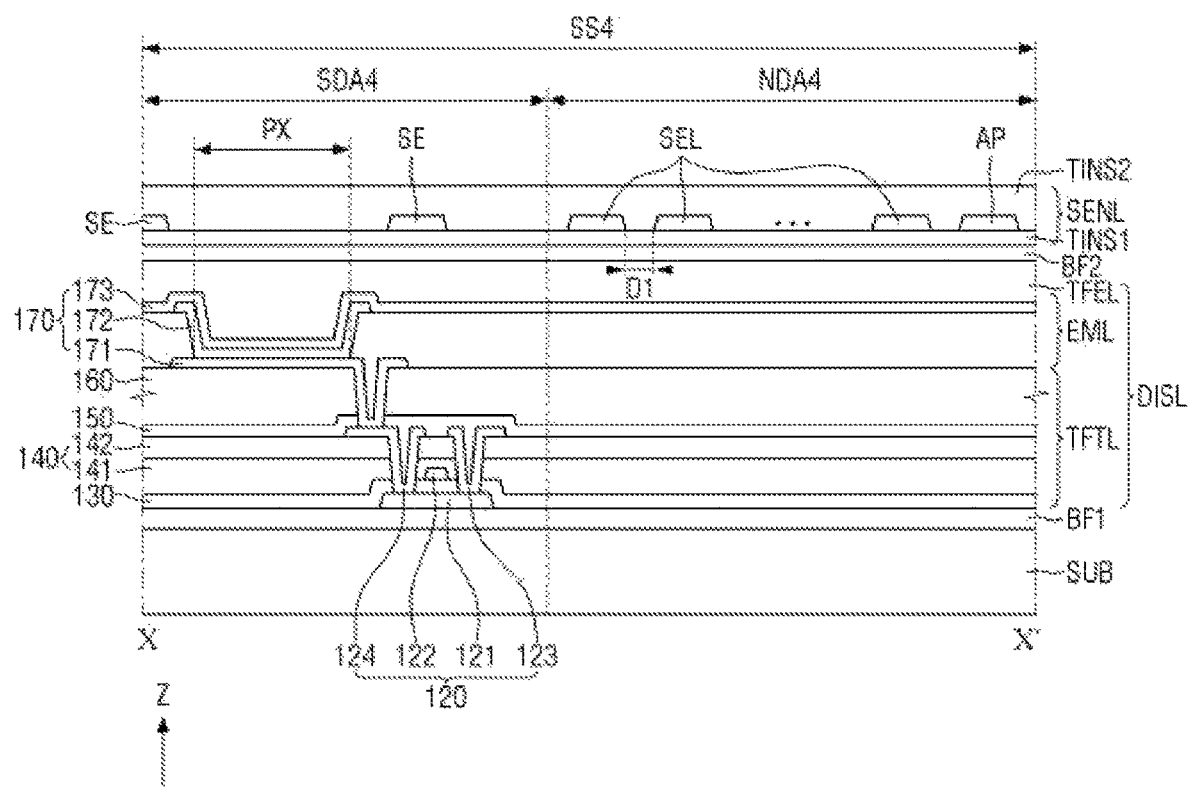
FIG. 99 is a schematic cross-sectional view showing an example of a part of a fourth side surface of FIG. 95.

FIG. 94 is a perspective view showing a display panel according to an embodiment. FIG. 95 is a development view showing a display panel according to an embodiment. FIG. 96 is a front view showing an example of the display panel of FIG. 94. FIG. 97 is a rear view showing an example of the display panel of FIG. 94. FIG. 98 is a side view showing an example of the display panel of FIG. 94. FIG. 99 is a schematic cross-sectional view showing an example of a part of a fourth side surface of FIG. 95.

A display layer DISL and a sensor electrode layer SENL of a fourth side surface SS4 shown in FIG. 99 are substantially identical to those described above with reference to FIG. 21. In the example shown in FIG. 99, the mutual capacitive sensing is carried out by using the two layers of the sensor electrode layer SENL shown in FIGS. 17 to 21 or FIGS. 55 to 58. It is, however, to be understood that the disclosure is not limited thereto. The mutual capacitive sensing may be carried out by using the one layer shown in FIGS. 46 to 51, the self-capacitive sensing may be carried out by using the one layer shown in FIGS. 52 and 53, and the strain-gauge sensing may be implemented by using the one layer shown in FIG. 54.

Referring to FIGS. 94 to 99, the display panel 300 may include a substrate having an upper surface PS, a first side surface SS1, a second side surface SS2, a third side surface SS3, a fourth side surface SS4, a first corner CS1, a second corner CS2, a third corner CS3, and a fourth corner CS4.

The upper surface PS may be flat without being bent. The upper surface PS may be a rectangular surface having shorter sides in the first direction (x-axis direction) and longer sides in the second direction (y-axis direction). The corners where the shorter sides and the longer side meet on the upper surface PS may be bent with a certain curvature. The upper surface PS may be the upper surface of the display panel 300.

The first side surface SS1 may be extended from the first side of the upper surface PS. The first side surface SS1 may be extended from the left side of the upper surface PS. The first side surface SS1 may be bent at a first bending line BL1. The first bending line BL1 may be the boundary between the upper surface PS and the first side surface SS1. The first side surface PS may be a rectangular surface having shorter sides in the third direction (z-axis direction) and longer sides in the second direction (y-axis direction) when viewed from the top. The first side surface SS1 may be the left side surface of the display panel 300.

The second side surface SS2 may be extended from the second side of the upper surface PS. The second side surface SS2 may be extended from the lower side of the upper surface PS. The second side surface SS2 may be bent at a second bending line BL2. The second bending line BL2 may be the boundary between the upper surface PS and the second side surface SS2. The second side surface SS2 may be a rectangular surface having shorter sides in the third direction (z-axis direction) and longer sides in the first direction (x-axis direction) when viewed from the top. The second side surface SS2 may be the lower side surface of the display panel 300.

The third side surface SS3 may be extended from the third side of the upper surface PS. The third side surface SS3 may be extended from the upper side of the upper surface PS. The third side surface SS3 may be bent at a third bending line BL3. The third bending line BL3 may be the boundary between the upper surface PS and the third side surface SS2. The third side surface SS3 may be a rectangular surface having shorter sides in the third direction (z-axis direction) and longer sides in the first direction (x-axis direction) when viewed from the top. The third side surface SS3 may be the upper side surface of the display panel 300.

The fourth side surface SS4 may be extended from the fourth side of the upper surface PS. The fourth side surface SS4 may be extended from the right side of the upper surface PS. The fourth side surface SS4 may be bent at a fourth bending line BL4. The fourth bending line BL4 may be the boundary between the upper surface PS and the fourth side surface SS4. The fourth side surface SS4 may be a rectangular surface having shorter sides in the third direction (z-axis direction) and longer sides in the second direction (y-axis direction) when viewed from the top. The fourth side surface SS4 may be the right side surface of the display panel 300.

The first corner CS1 may be located or disposed between the first side surface SS1 and the second side surface SS2. The width of the first corner CS1 may be smaller than the width of the first side surface SS1 and the width of the second side surface SS2. Therefore, an empty space ES may be formed between a part of the first side surface SS1 and a part of the second side surface SS2.

The second corner CS2 may be located or disposed between the first side surface SS1 and the third side surface SS3. The width of the second corner CS2 may be smaller than the width of the first side surface SS1 and the width of the third side surface SS3. Therefore, an empty space ES may be formed between a part of the first side surface SS1 and a part of the third side surface SS3.

The third corner CS3 may be located or disposed between the second side surface SS2 and the fourth side surface SS4. The width of the third corner CS3 may be smaller than the width of the second side surface SS2 and the width of the fourth side surface SS4. Therefore, an empty space ES may be formed between a part of the second side surface SS2 and a part of the fourth side surface SS4.

The fourth corner CS4 may be located or disposed between the third side surface SS3 and the fourth side surface SS4. The width of the fourth corner CS4 may be smaller than the width of the third side surface SS3 and the width of the fourth side surface SS4. Therefore, an empty space ES may be formed between a part of the third side surface SS3 and a part of the fourth side surface SS4.

A pad area PDA may be extended from one side of the second side surface SS2. The pad area PDA may be bent at a fifth bending line BL5. The fifth bending line BL5 may be the boundary between the second side surface SS2 and the pad area PDA. The pad area PDA may be a rectangular surface having shorter sides in the second direction (y-axis direction) and longer sides in the first direction (x-axis direction) when viewed from the top. The second side surface SS2 may be the lower side surface of the display panel 300 that faces the upper surface.

The upper surface PS may include a main display area MDA where a main image is displayed. The upper surface PS may not include a non-display area, and accordingly the entire upper surface PS may be the main display area MDA.

The first side surface SS1 may include a first sub display area SDA1 where a first sub image is displayed, and a first non-display area NDA1. As shown in FIG. 97, the first non-display area NDA1 may be disposed at the upper edge, the left edge and the lower edge of the first side surface SS1. The first sub display area SDA1 may be extended from the left side of the main display area MDA. The first sub display area SDA1 may be the area of the first side surface SS1 other than the first non-display area NDA1.

The second side surface SS2 may include a second sub display area SDA2 where a second sub image is displayed, and a second non-display area NDA2. As shown in FIG. 97, the second non-display area NDA2 may be disposed at the left edge, the lower edge and the right edge of the second side surface SS2. The second sub display area SDA2 may be extended from the lower side of the main display area MDA. The second sub display area SDA2 may be the area of the second side surface SS2 other than the second non-display area NDA2.

The third side surface SS3 may include a third sub display area SDA3 where a third sub image is displayed, and a third non-display area NDA3. As shown in FIG. 97, the third non-display area NDA3 may be disposed at the left edge, the upper edge and the right edge of the third side surface SS3. The third sub display area SDA3 may be extended from the upper side of the main display area MDA. The third sub display area SDA3 may be the area of the third side surface SS3 other than the third non-display area NDA3.

The fourth side surface SS4 may include a fourth sub display area SDA4 where a fourth sub image is displayed, and a fourth non-display area NDA4. As shown in FIG. 97, the fourth non-display area NDA4 may be disposed at the upper edge, the right edge and the lower edge of the fourth side surface SS4. The fourth sub display area SDA4 may be extended from the right side of the main display area MDA. The fourth sub display area SDA4 may be the area of the fourth side surface SS4 other than the fourth non-display area NDA4.

The first corner CS1, the second corner CS2, the third corner CS3 and the fourth corner CS4 may be, but is not limited to, the non-display area. A part of the first corner CS1, a part of the second corner CS2, a part of the third corner CS3 and a part of the fourth corner CS4 may be the display area where images are displayed. In such case, a part of the first corner CS1, a part of the second corner CS2, a part of the third corner CS3 and a part of the fourth corner CS4 may be extended from the main display area MDA.

In the sensor area TSA, the sensor electrodes are disposed in the sensor electrode layer SENL so that a user's touch, the presence of a nearby object, and the pressure of the user's touch may be sensed. The sensor area TSA may overlap the main display area MDA, the first sub display area SDA1, the second sub display area SDA2, the third sub display area SDA3, and the fourth sub display area SDA4. The sensor area TSA may be substantially identical to the sum of the main display area MDA, the first sub display area SDA1, the second sub display area SDA2, the third sub display area SDA3 and the fourth sub display area SDA4.

In the sensor peripheral area TPA, no sensor electrodes are disposed. The sensor peripheral area TPA may surround the sensor area TSA. The sensor peripheral area TPA may overlap the first non-display area NDA1, the second non-display area NDA2, the third display area NDA3, the fourth non-display area NDA4, and the pad area PDA. The sensor peripheral area TPA may be substantially identical to the sum of the first non-display area NDA1, the second non-display area NDA2, the third display area NDA3, the fourth non-display area NDA4 and the pad area PDA.

As shown in FIG. 99, in the fourth sub display area SDA4 of the fourth side surface SS4, the sensor electrodes SE may be disposed to overlap the bank 180, and may not overlap the sub-pixels PX. The sensor lines SEL electrically connected to the sensor electrodes SE may be spaced apart from one another by a first distance D1. The first conductive pattern AP may be disposed more to the outside than the sensor lines SEL. For the mutual capacitive sensing, the sensor electrodes SE may include driving electrodes and sensing electrodes, and the sensor lines SEL may include driving lines and sensing lines.

Although the sensor lines SENL are single lines disposed on the first sensor insulating layer TINS in the example shown in FIG. 99, the disclosure is not limited thereto. For example, the sensor lines SENL may include a first sub sensor line disposed on the second buffer layer BF2 and a second sub sensor line disposed on the first sensor insulating layer TINS1. The second sub sensor line may be electrically connected to the first sub sensor line through a contact hole penetrating the first sensor insulating layer TINS1 for exposing the first sub sensor line.

It is to be noted that the first side surface SS1, the second side surface SS2 and the third side surface SS3 may be formed to be substantially identical to the fourth side surface shown in FIG. 99, instead of the fourth side surface SS4. Alternatively, at least one of the first side surface SS1, the second side surface SS2 and the third side surface SS3 may be substantially identical to the fourth side surface SS4 shown in FIG. 99.

As shown in FIG. 95, the first conductive pattern AP for implementing the antenna may be disposed in the sensor peripheral area TPA including the first to fourth non-display areas NDA1, NDA2, NDA3 and NDA4. The first conductive pattern AP may be disposed at the edges of four side surfaces of the display panel 300. For example, the first conductive pattern AP may be disposed at the pad area PDA, the second non-display area NDA2 of the second side surface SS2, the first corner CS1, the first non-display area NDA1 of the first side surface SS1, the second corner CS2, the third non-display area NDA3 of the third side surface SS3, the fourth corner CS4, the fourth non-display area NDA4 of the fourth side surface SS4, and the third corner CS3. The first conductive pattern AP may be electrically connected to at least one conductive pad CP in the pad area PDA. At least one conductive pad CP may be electrically connected to the display circuit board 310 through an anisotropic conductive film. For convenience of illustration, the sensor pads and the display pads electrically connected to the sensor electrodes of the sensor electrode layer TSL are not shown in FIG. 95.

When the first conductive pattern AP is disposed in the sensor peripheral area TPA including the first to fourth non-display areas NDA1, NDA2, NDA3 and NDA4, there is not enough space for forming the first conductive pattern AP. Therefore, the first conductive pattern AP is preferably formed substantially in the form of a loop or a coil, but is not limited thereto. The first conductive pattern AP may be quadrangular patches.

Although the first conductive pattern AP for implementing the antenna may be disposed in the sensor peripheral area TPA in the example shown in FIG. 95, but the disclosure is not limited thereto. The first conductive pattern AP may be disposed in the sensor area TSA as shown in FIGS. 48 to 58.

Figure 100:
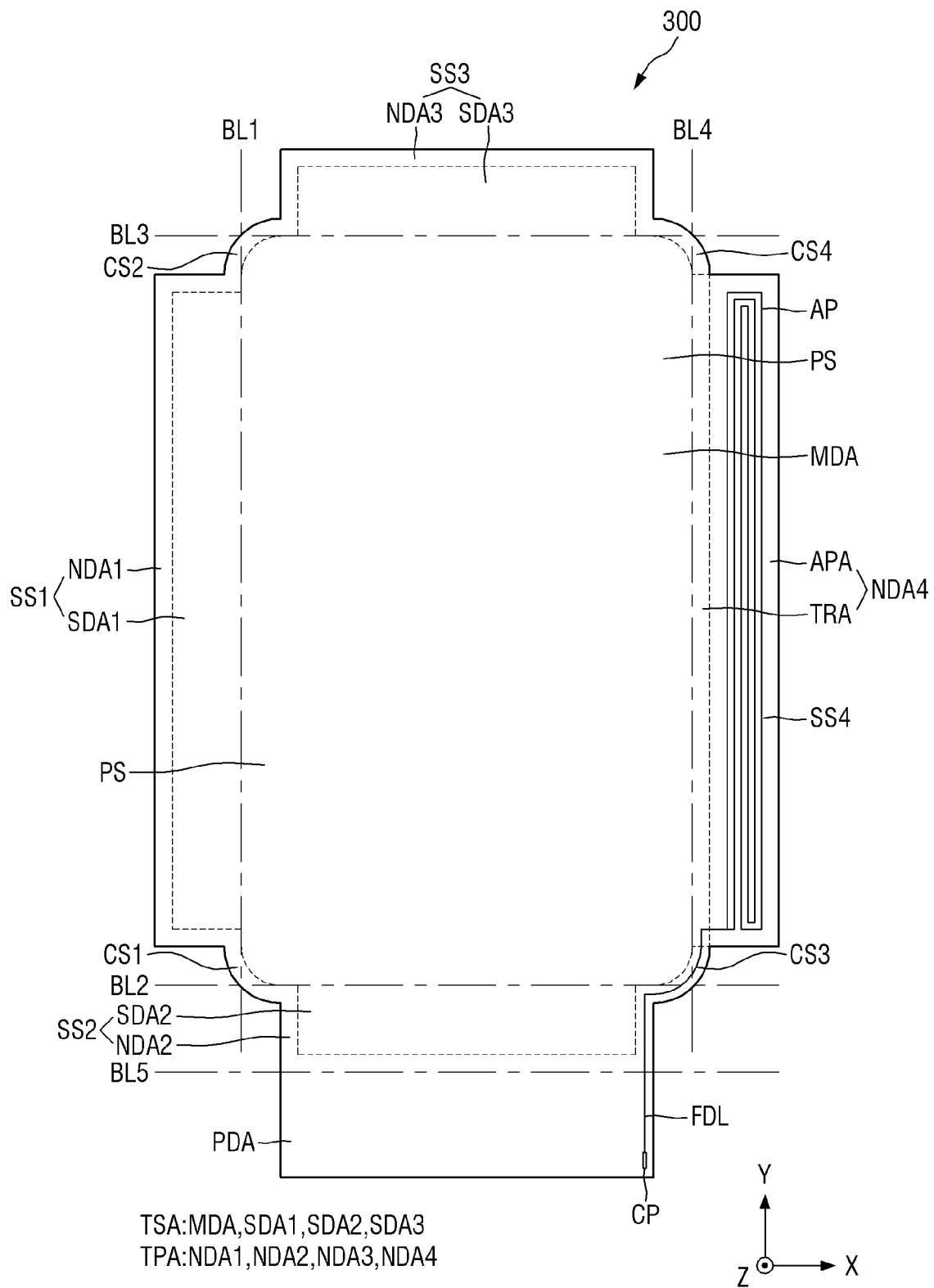
FIG. 100 is a development view showing a display panel according to an embodiment.
Figure 101:
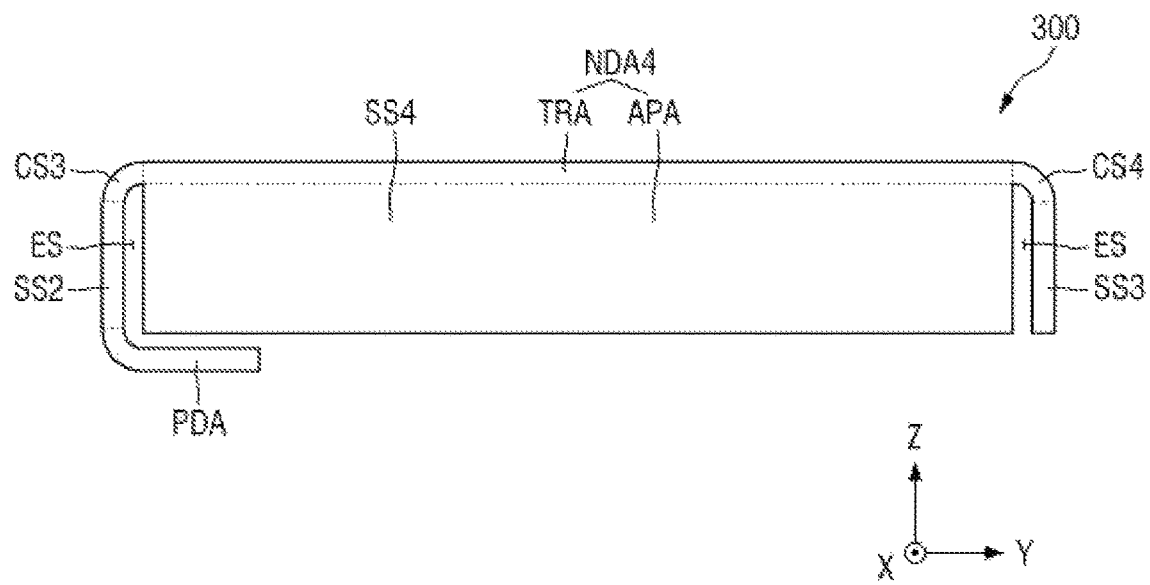
FIG. 101 is a side view showing an example of the display panel of FIG. 100.
Figure 102:
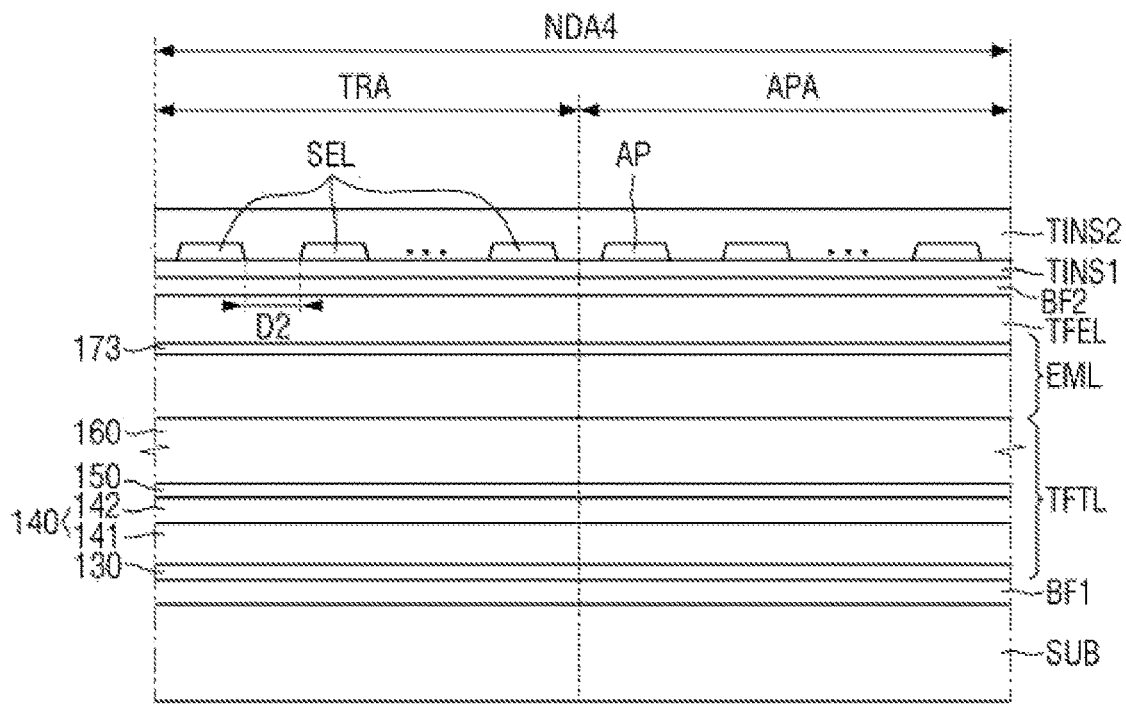
FIG. 102 is a schematic cross-sectional view showing an example of a part of a fourth side surface of FIG. 100.

FIG. 100 is a development view showing a display panel according to an embodiment. FIG. 101 is a side view showing an example of the display panel of FIG. 100. FIG. 102 is a schematic cross-sectional view showing an example of a part of a fourth side surface of FIG. 100.

An embodiment shown in FIGS. 101 and 102 is different from an embodiment of FIGS. 95, 98 and 99 in that no image is displayed on one side surface of the display panel 300.

Referring to FIGS. 101 and 102, a fourth side surface SS4 may not include a sub display area SDA4 and may include only a fourth non-display area NDA4. Since the fourth side surface SS4 does not include the fourth sub display area SDA4, no image is displayed. Since the fourth side surface SS4 may not include the fourth sub display area SDA4, the sensor area TSA may not be disposed in the fourth side surface SS4.

The fourth non-display area NDA4 may include a sensor wiring area TRA electrically connected to the sensor electrodes of the sensor area TSA overlapping the main display area MDA, and an antenna area APA where the first conductive pattern AP may be formed or disposed.

The sensor wiring area TRA may be extended from the upper surface PS. The sensor wiring area TRA may be disposed on the right side of the upper surface. For the mutual capacitive sensing, the sensor lines SEL disposed in the sensor wiring area TRA may be driving lines or sensing lines.

When the sensor area TSA is not disposed in the fourth side surface SS4, the sensor wiring area TRA and the antenna area APA may be increased compared to when the sensor area TSA is disposed in the fourth side surface SS4. Therefore, the sensor lines SEL of the sensor wiring area TRA may be spaced apart from one another by a second distance D2 that is larger than the first distance D1.

Figure 104:
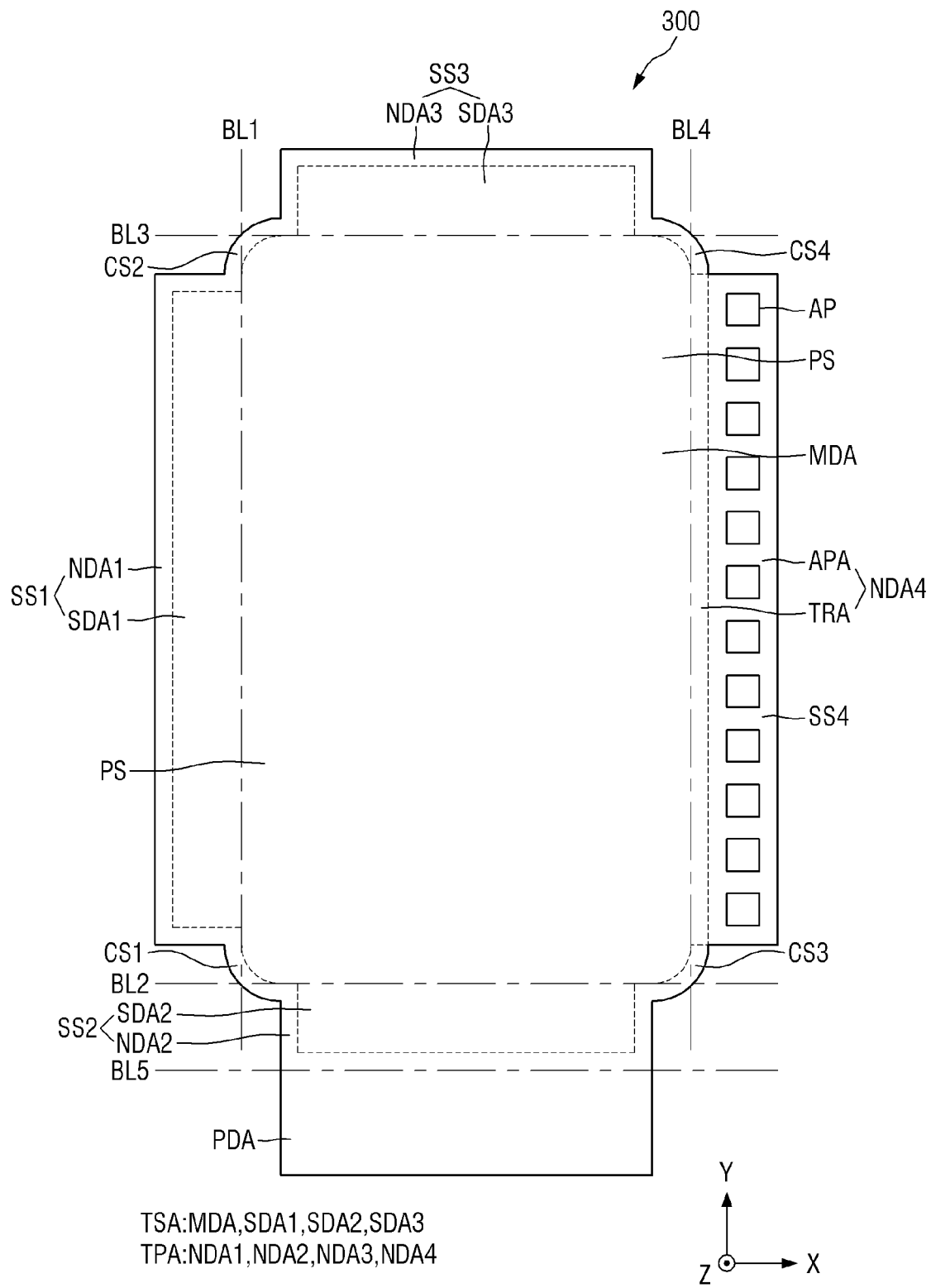
FIG. 104 is a development view showing a display panel according to an embodiment.

The antenna area APA may be the area of the fourth side surface SS4 other than the sensor wiring area TRA. The first conductive pattern AP may be formed or disposed in the antenna area APA. In the example shown in FIG. 101, the first conductive pattern AP may be formed in the form of a substantial loop or a coil. The first conductive pattern AP having a substantially loop shape or a substantially coil shape may be utilized as an antenna for an RFID tag for near field communications. Alternatively, the first conductive pattern AP may be as quadrangular patches as shown in FIG. 104. The first conductive pattern AP as the quadrangular patches may be utilized as the antenna for mobile communications.

The first conductive pattern AP may be made of the same or similar material on a same layer as the sensor lines SEL of the sensor wiring area TRA. The first conductive pattern AP may be made of the same or similar material on a same layer as the sensor electrodes of the sensor area TSA. For example, the first conductive pattern AP may be disposed on the first sensor insulating layer TINS1 as shown in FIG. 102.

Figure 103:
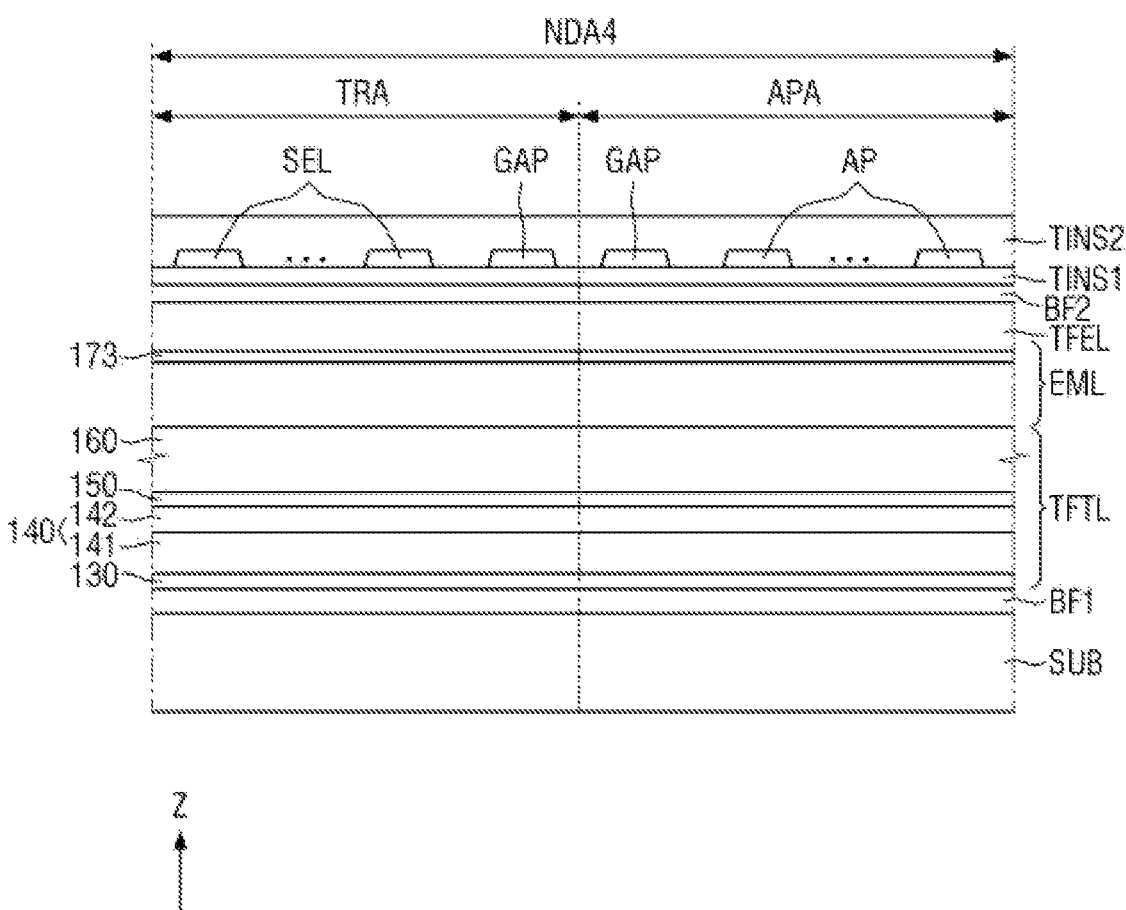
FIG. 103 is a schematic cross-sectional view showing an example of a part of a fourth side surface of FIG. 100.

As shown in FIG. 103, a second conductive pattern GP may be formed or disposed in the antenna area APA, which may overlap the first conductive pattern AP in the third direction (z-axis direction) and receive a ground voltage. The second conductive pattern GP may be disposed on the second buffer layer BF2 and may be covered or overlapped by the first sensor insulating layer TINS1.

As shown in FIG. 103, a guard pattern GAP may be formed or disposed in the antenna area APA, which may be disposed between the first conductive pattern AP and the sensor wiring area TRA. The guard pattern GAP may be electrically floated or receive a ground voltage. The guard pattern GAP may be made of the same or similar material on a same layer as the first conductive pattern AP. Alternatively, the guard pattern GAP may include a first sub guard pattern made of the same or similar material on a same layer as the second conductive pattern GROUP, and a second sub guard pattern made of the same or similar material on a same layer as the first conductive pattern AP.

When the sensor area TSA is not disposed in at least one side surface as shown in FIGS. 100 to 102, the antenna area may be increased compared to when the sensor area TSA may be disposed in at least one side surface. Therefore, the first conductive pattern AP of the antenna area APA may be designed more freely.

It is to be noted that the first side surface SS1, the second side surface SS2 and the third side surface SS3 may be formed to be substantially identical to the fourth side surface shown in FIGS. 101 to 104, instead of the fourth side surface SS4. Alternatively, at least one of the first side surface SS1, the second side surface SS2 and the third side surface SS3 may be substantially identical to the fourth side surface SS4 shown in FIGS. 101 to 104.

Figure 105:
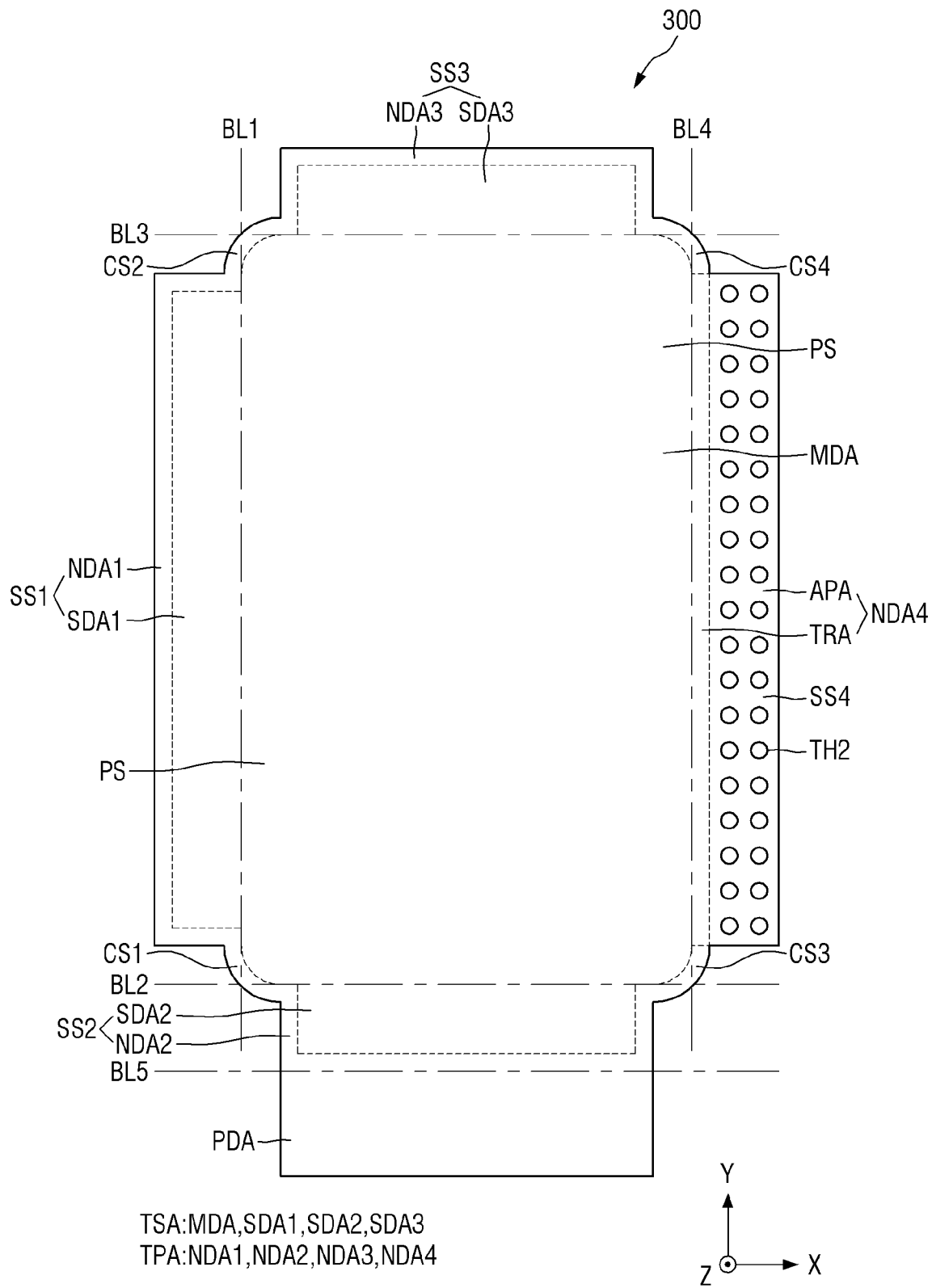
FIG. 105 is a development view showing a display panel according to an embodiment.
Figure 106:
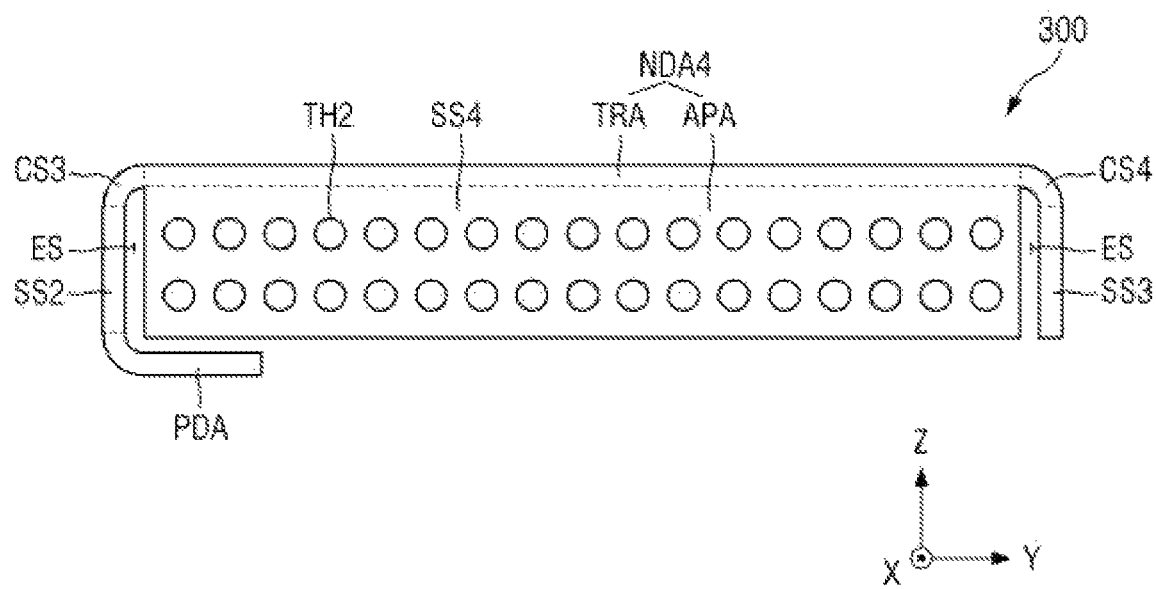
FIG. 106 is a side view showing an example of the display panel of FIG. 105.
Figure 107:
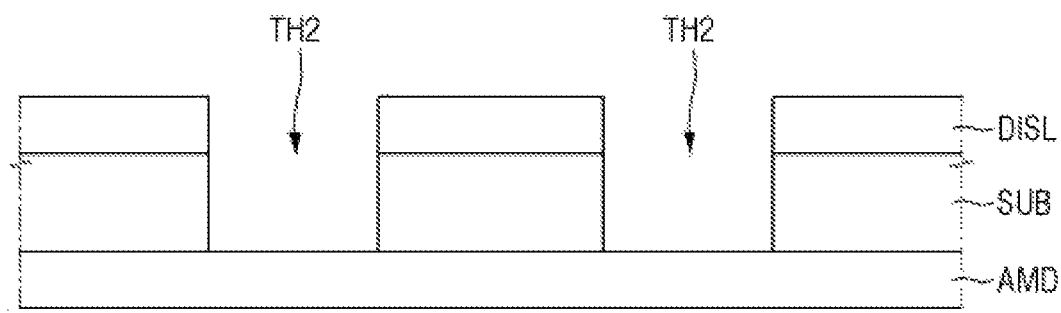
FIG. 107 is a schematic cross-sectional view showing an example of a fourth side surface of FIG. 105.

FIG. 105 is a development view showing a display panel according to an embodiment. FIG. 106 is a side view showing an example of the display panel of FIG. 105. FIG. 107 is a schematic cross-sectional view showing an example of a fourth side surface of FIG. 105.

An embodiment of FIGS. 105 to 107 is different from an embodiment of FIGS. 100 and 101 in that through holes TH2 may be formed or disposed through a substrate SUB and a display layer DISL in an antenna area APA.

Referring to FIGS. 105 to 107, the display layer DISL may be disposed on one surface of the substrate SUB, and an antenna module AMD including a first conductive pattern may be disposed on the opposite surface of the substrate SUB.

Because the wavelength of the electromagnetic waves of an antenna is short in 5G mobile communications, it may be difficult for the electromagnetic waves of the antenna radiated toward the upper side of the display device 10 to pass through the lines and the electrodes of the display layer DISL of the display panel 300. For this reason, by forming through holes TH2 in the substrate SUB and the display layer DISL of the display panel 300, it may be possible to reduce electromagnetic waves of the antenna radiated from the antenna module AMD disposed under or below the substrate SUB from being disturbed by the lines and the electrodes of the display layer DISL disposed on the substrate SUB.

It is to be noted that the first side surface SS1, the second side surface SS2 and the third side surface SS3 may be formed to be substantially identical to the fourth side surface shown in FIGS. 105 to 107, instead of the fourth side surface SS4. Alternatively, at least one of the first side surface SS1, the second side surface SS2 and the third side surface SS3 may be substantially identical to the fourth side surface SS4 shown in FIGS. 105 to 107.

Figure 108:
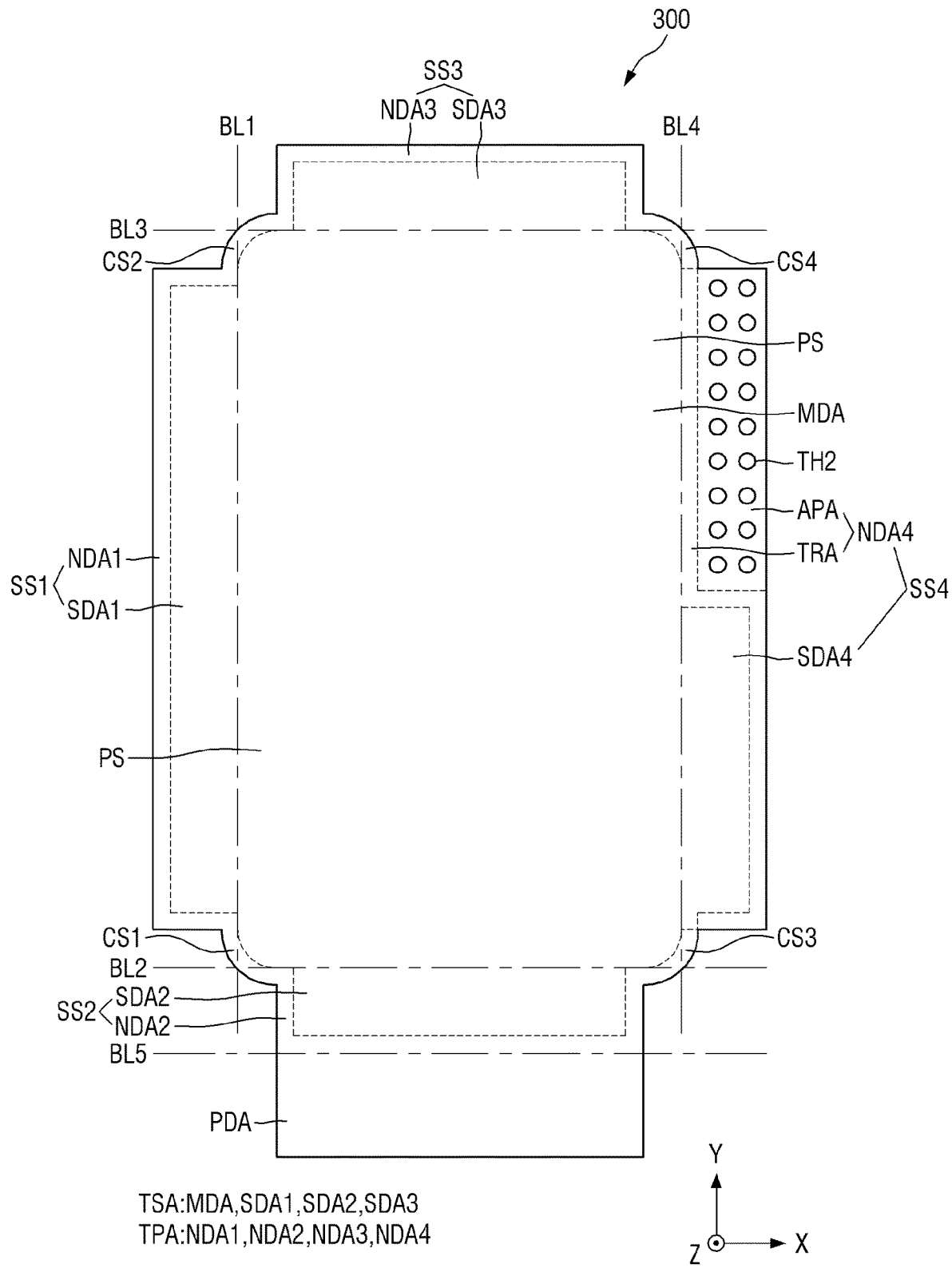
FIG. 108 is a development view showing a display panel according to an embodiment.

FIG. 108 is a development view showing a display panel according to an embodiment.

An embodiment of FIG. 108 may be different from an embodiment of FIG. 105 in that an antenna area APA may be formed or disposed only on a part of the fourth side surface SS4, in which through holes TH2 may be formed or disposed.

Referring to FIG. 108, when the antenna area APA may include a first conductive pattern used for 5G mobile communication, a frequency of approximately 28 GHz or approximately 39 GHz may be used as described above with reference to FIG. 20. Accordingly, the area of the first conductive pattern may not be large. Therefore, the antenna area APA may be formed or disposed only in a part of the fourth side surface SS4.

In FIG. 108, the antenna area APA may be disposed on the upper side of the fourth side surface SS4, and the fourth sub display area SDA4 and the fourth non-display area NDA4 may be disposed on the lower side of the fourth side surface SS4. It is, however, to be understood that the position of the antenna area APA, the position of the fourth sub display area SDA4, and the position of the fourth non-display area NDA4 in the fourth side surface SS4 are not limited thereto.

It is to be noted that the first side surface SS1, the second side surface SS2 and the third side surface SS3 may be formed to be substantially identical to the fourth side surface shown in FIG. 108, instead of the fourth side surface SS4. Alternatively, at least one of the first side surface SS1, the second side surface SS2 and the third side surface SS3 may be substantially identical to the fourth side surface SS4 shown in FIG. 108.

Figure 109:
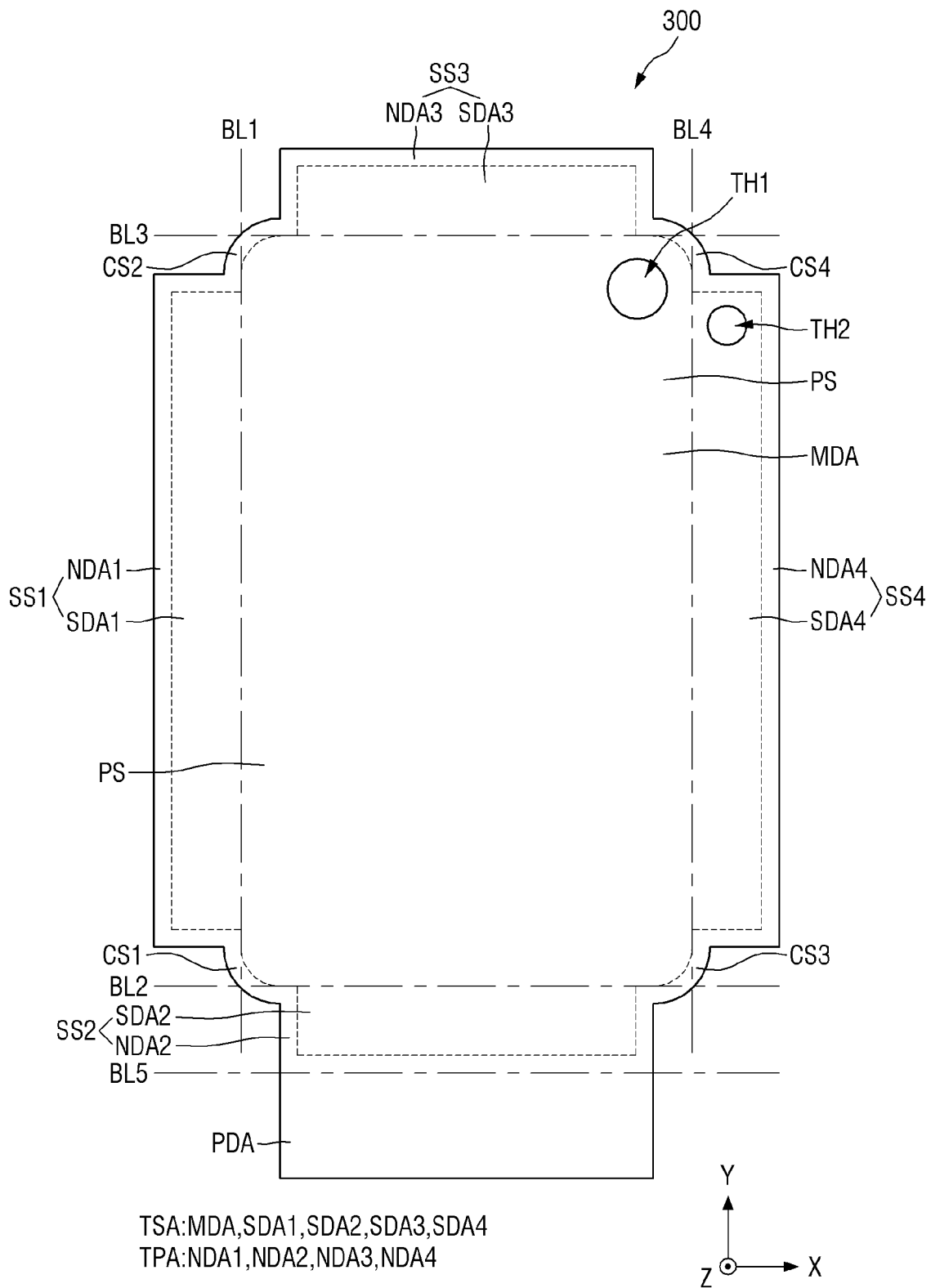
FIG. 109 is a development view showing a display panel according to an embodiment.

FIG. 109 is a development view showing a display panel according to an embodiment.

An embodiment of FIG. 109 is different from an embodiment of FIG. 95 in that through holes TH1 and TH2 are formed or disposed in the sensor area TAS on the upper surface PS and a side surface of the display panel 300.

Referring to FIG. 109, a first through hole TH1 may be formed or disposed in the upper surface PS of the display panel 300. Although the single first through hole TH1 is formed or disposed in the upper surface PS of the display panel 300 in the example of FIG. 109, the disclosure is not limited thereto. More than one first through holes TH1 may be formed or disposed in the upper surface PS of the display panel 300. Although the first through hole TH1 is disposed on the upper right side of the upper surface PS of the display panel 300 in the example shown in FIG. 109, the position of the first through hole TH1 is not limited thereto.

The second through hole TH2 may be formed or disposed in one side surface of the display panel 300. For example, the second through hole TH2 may be formed or disposed in the fourth side surface SS4 of the display panel 300. Although the single second through hole TH2 may be formed or disposed in the upper surface PS of the display panel 300 in the example of FIG. 109, the disclosure is not limited thereto. More than one second through holes TH2 may be formed or disposed in the upper surface PS of the display panel 300. Although the second through hole TH2 is disposed on the upper left side of the upper surface PS of the display panel 300 in the example shown in FIG. 109, the position of the second through hole TH2 is not limited thereto. Although the size of the second through hole TH2 is larger than that of the first through hole TH1 in the example shown in FIG. 109, the size of the second through hole TH2 is not limited thereto.

Although the through holes TH1 and TH2 may be formed or disposed in the upper surface PS and one side surface of the display panel 300 in the example of FIG. 109, the disclosure is not limited thereto. For example, at least one through hole may be formed or disposed in the upper surface PS and at least one of the four side surfaces SS1, SS2, SS3 and SS4 of the display panel 300.

A dead space and a wiring area may be disposed around each of the through holes TH1 and TH2 formed or disposed in the upper surface PS and one side surface the upper surface PS of the display panel 300. A first conductive pattern for implementing the antenna may be formed or disposed in a part of the wiring area as shown in FIGS. 60 to 64.

Figure 110:
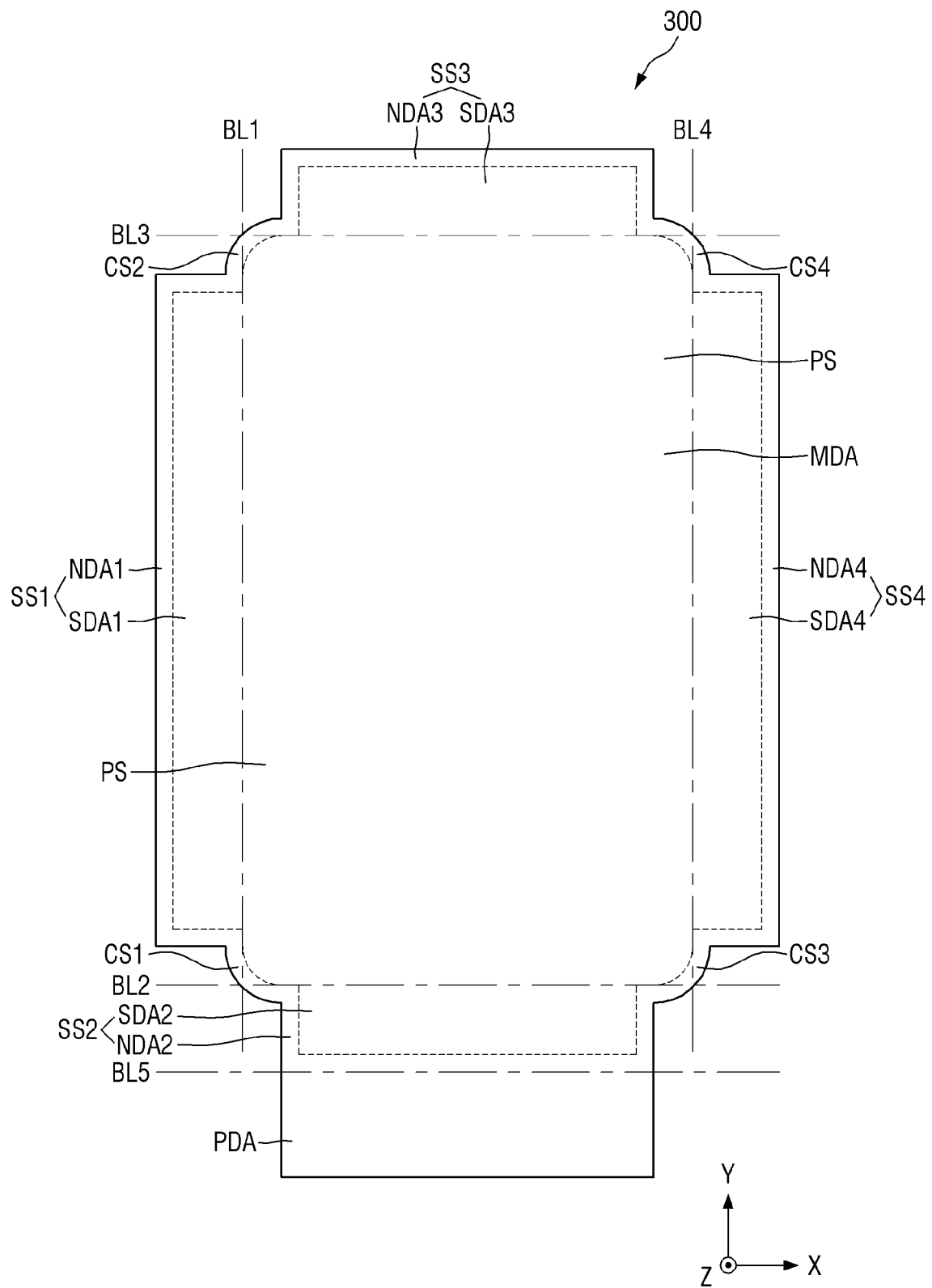
FIG. 110 is a development view showing a display panel according to an embodiment.
Figure 111:
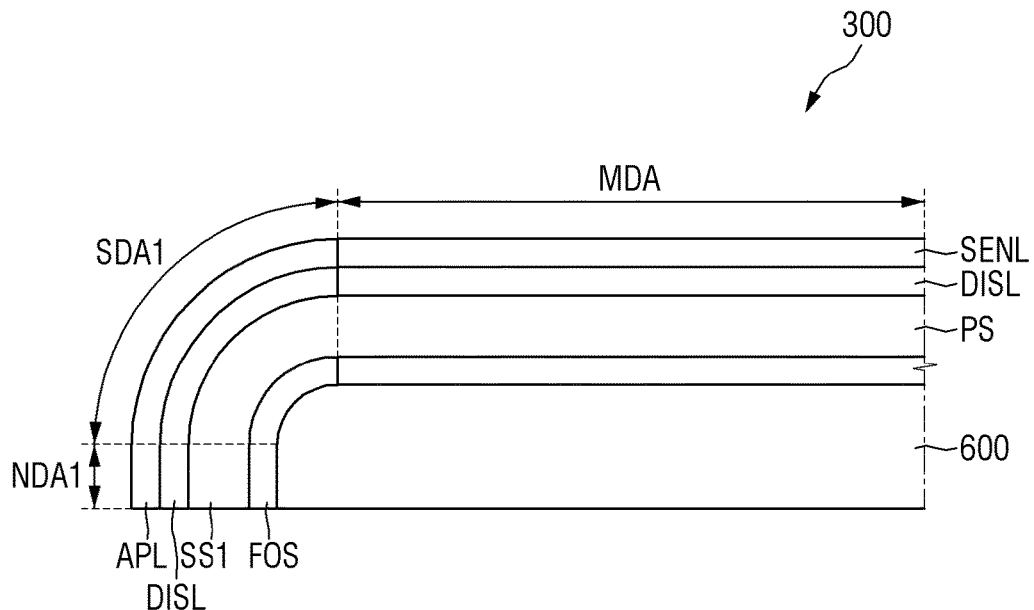
FIG. 111 is a schematic cross-sectional view showing an example of a display panel according to an embodiment.
Figure 112:
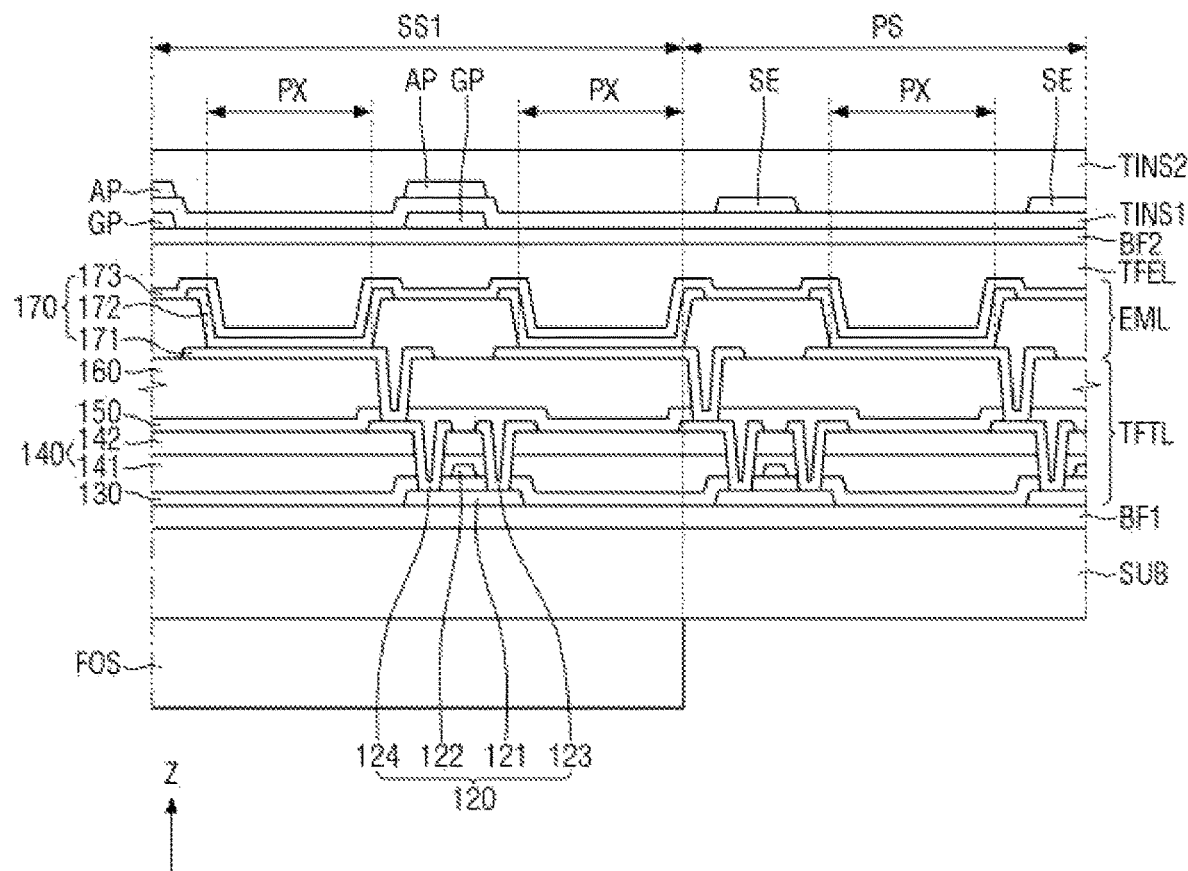
FIG. 112 is a schematic cross-sectional view showing a sensor electrode layer of an upper surface and an antenna layer of a first side surface of FIG. 111.

FIG. 110 is a development view showing a display panel according to an embodiment. FIG. 111 is a schematic cross-sectional view showing an example of a display panel according to an embodiment. FIG. 112 is a schematic cross-sectional view showing a sensor electrode layer of an upper surface and an antenna layer of a first side surface of FIG. 111.

An embodiment of FIGS. 110 to 112 may be different from an \embodiment of FIG. 95 in that an antenna layer APL including a first conductive pattern AP may be formed or disposed on at least one of the side surfaces SS1, SS2, SS3 and SS4.

Referring to FIGS. 110 to 112, a display layer DISL may be disposed on a surface of the first side surface SS1, and the antenna layer APL including the first conductive pattern AP may be disposed on the display layer DISL. Although the antenna layer APL is disposed on the first side surface SS1 in the example shown in FIG. 11, the disclosure is not limited thereto. For example, the antenna layer APL may be formed or disposed on at least one of the side surfaces SS1, SS2, SS3 and SS4. When the area of the first conductive pattern AP is large, it may be formed or disposed in some of the side surfaces SS1, SS2, SS3 and SS4. When the area of the first conductive pattern AP is small, it may be formed or disposed in one of the side surfaces SS1, SS2, SS3 and SS4 or on only one of the side surfaces SS1, SS2, SS3 and SS4. Although the sensor electrode layer SENL may be disposed on the upper surface PS in the example shown in FIG. 11, the disclosure is not limited thereto. For example, the sensor electrode layer SENL may be disposed in at least one of the side surfaces SS1, SS2, SS3 and SS4 where the antenna layer APL may not be disposed. As shown in FIG. 111, since the sensor electrode layer SENL may not be disposed in the side surface where the antenna layer APL may be disposed, the antenna layer APL may be designed more freely from the sensor electrode layer SENL in the side surface.

The antenna layer APL may be the same layer as the sensor electrode layer SENL as shown in FIG. 111. The first conductive pattern AP of the antenna layer APL may be made of the same or similar material on a same layer as the sensor electrodes SE of the sensor electrode layer SENL. For example, the first conductive pattern AP of the antenna layer APL may be disposed on the first sensor insulating layer TINS1 as shown in FIG. 112. In this instance, a second conductive pattern GP may be disposed on the second buffer layer BF2, which overlaps the first conductive pattern AP in the third direction (z-axis direction) and receives a ground voltage. As shown in FIG. 112, the first conductive pattern AP is made of the same or similar material on a same layer as the sensor electrodes SE of the sensor electrode layer SENL, and thus the first conductive pattern AP may be formed without any additional process.

The first conductive pattern AP may be formed in a substantially loop shape or a substantially coil shape, or as quadrangular patches. The antenna implemented with the first conductive pattern AP having a substantially loop shape or a substantially coil shape may be utilized as an antenna for an RFID tag for near field communications. The antenna implemented with the first conductive pattern AP having rectangular patches may be utilized as an antenna for mobile communications.

A force sensor FOS for sensing a user's touch input or a user's pressure may be disposed in the side surface where the antenna layer APL is disposed and the sensor electrode layer SENL is not disposed. The force sensor FOS may include a strain-gauge force sensor, a capacitive force sensor, a gap-cap type force sensor, or a force sensor including metal microparticles such as quantum tunneling composite (QTC) force sensor. The force sensor FOS including the strain gauge may be similar to that described above with reference to FIGS. 43 to 45 and 54. A schematic cross-sectional structure of the force sensor FOS of a gap-cap type and the force sensor FOS including a pressure sensing layer will be described later with reference to FIG. 113.

The force sensor FOS may be disposed on the opposite surface of the first side surface SS1. The force sensor FOS may be attached to the other surface of the first side surface SS1 using a pressure sensitive adhesive. The force sensor FOS may be disposed between the display panel 300 and the bracket 600. The bracket 600 may work as a supporting member for supporting the force sensors FOS. The force sensor FOS may be attached to the bracket 600 using a pressure sensitive adhesive.

Figure 113:
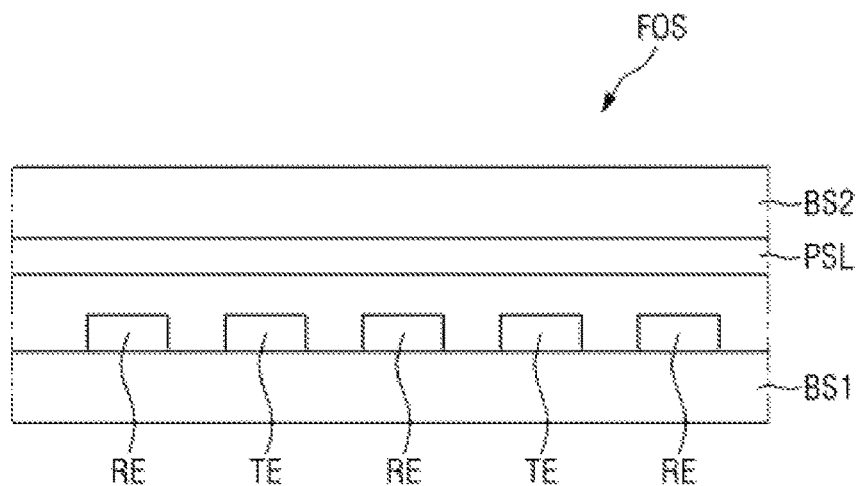
FIG. 113 is a schematic cross-sectional view showing an example of the force sensor of FIG. 111.
Figure 113:
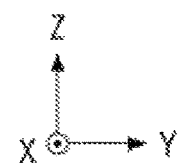

FIG. 113 is a schematic cross-sectional view showing an example of the force sensor of FIG. 111. In the example shown in FIG. 113, a force sensor FOS includes a pressure sensing layer PSL.

Referring to FIG. 113, the force sensor FOS may include a first base member BS1, a second base member BS2, a driving electrode TE, a sensing electrode RE, and a pressure sensing layer PSL.

The first base member BS1 and the second base member BS2 are disposed to face each other. Each of the first base member BS1 and the second base member BS2 may be made of a polyethylene terephthalate (PET) film or a polyimide film.

The driving electrodes TE1 and the sensing electrodes RE1 are disposed adjacent to each other but are not electrically connected to each other. The driving electrodes TE and the sensing electrodes RE may be arranged or disposed in parallel. The driving electrodes TE and the sensing electrodes RE may be arranged or disposed alternately. For example, the driving electrodes TE and the sensing electrodes RE may be repeatedly arranged or disposed in the order of the driving electrode TE, the sensing electrode RE, the driving electrode TE, the sensing electrode RE, within the spirit and the scope of the disclosure.

The driving electrodes TE and the sensing electrodes RE may include a conductive material such as silver (Ag) and copper (Cu). The driving electrodes TE and the sensing electrodes RE may be formed or disposed on the first substrate SUB1 by screen printing.

The pressure sensing layer PSL is disposed on the surface of the second substrate SUB2 facing the first substrate SUB1. The pressure sensing layer PSL may be disposed such that it overlaps with the driving electrodes TE and the sensing electrodes RE.

The pressure sensing layer PSL may include a polymer resin having a pressure sensitive material. The pressure sensitive material may be metal microparticles (or metal nanoparticles) such as nickel, aluminum, titanium, tin and copper. For example, the pressure sensing layer PSL may be a quantum tunneling composite (QTC).

When no pressure is applied to the second substrate SUB2 in the height direction (z-axis direction) of the force sensor FOS, there is a gap between the pressure sensing layer PSL and the driving electrode TE1 and between the pressure sensing layer PSL and the sensing electrodes RE1. For example, when no pressure is applied to the second substrate SUB2, the pressure sensing layer PSL may be spaced apart from the driving electrodes TE and the sensing electrodes RE.

When a pressure is applied to the second substrate SUB2 in the height direction (z-axis direction) of the force sensor FOS, the pressure sensing layer PSL may contact the driving electrodes TE and the sensing electrodes RE. In this case, at least one of the driving electrodes TE1 and at least one of the sensing electrodes RE1 may be physically connected with one another through the pressure sensing layer PSL, and the pressure sensing layer PSL may work as an electrical resistance.

Therefore, since the area in which the pressure sensing layer PSL is brought into contact with the driving electrodes TE and the sensing electrodes RE varies depending on the applied pressure, the resistance of the sensing electrodes RE may vary. For example, as the pressure applied to the force sensor FOS increases, the resistance of the sensing electrodes RE may decrease. A pressure sensing unit may sense a change in current value or a voltage value from the sensing electrodes RE based on a change in the resistance, thereby determining the pressure that the user presses by a finger. Therefore, the force sensor FOS may be used as the input device for sensing a user's input.

One of the first base member BS1 and the second base member BS2 of the force sensor FOS may be attached to the other surface of the first side surface SS1 of the substrate via a pressure sensitive adhesive, while the other may be attached to the bracket 600 via a pressure sensitive adhesive.

Alternatively, one of the first base member BS1 and the second base member BS2 of the force sensor FOS may be eliminated. For example, when the first base member BS1 of the force sensor FOS is eliminated, the driving electrodes TE and the sensing electrodes RE may be disposed on one surface or the other surface of the first side surface SS1. For example, the force sensor FOS may use the first side surface SS1 of the display panel 300 as a base member. If the driving electrodes TE and the sensing electrodes RE are disposed on one surface of the first side surface SS1, the driving electrodes TE and the sensing electrodes RE may be made of the same or similar material on a same layer as the light-blocking layer BML1 of the display layer DISL.

Alternatively, when the first base member BS1 of the force sensor FOS is eliminated, the driving electrodes TE and the sensing electrodes RE may be disposed on the bracket 600. In other words, the force sensor FOS may use the bracket 600 as the base member.

Alternatively, if the second base member BS2 of the force sensor FOS is eliminated, the pressure sensing layer PSL may be disposed on the other surface of the first side surface SS1. For example, the force sensor FOS may use the first side surface SS1 of the display panel 300 as the base member.

Alternatively, if the second base member BS2 of the force sensor FOS is eliminated, the pressure sensing layer PSL may be disposed on the bracket 600. In other words, the force sensor FOS may use the bracket 600 as the base member.

In the example shown in FIG. 113, a ground potential layer may be disposed in place of the pressure sensing layer PSL, in which case, the force sensor FOS may sense a user's touch pressure by gap-cap manner. Specifically, according to the gap-cap manner, the first base member BS1 and the second base member BS2 may be bent according to the pressure applied from the user, and thus the distance between the ground potential layer and the driving electrodes TE or the sensing electrodes RE may be decreased. As a result, the voltage charged in the capacitance between the driving electrodes TE and the sensing electrodes RE may be decreased due to the ground potential layer. Therefore, according to the gap-cap manner, the pressure of the user's touch may be sensed by receiving the voltage charged in the capacitance through the sensing electrodes RE.

When the force sensor FOS of the gap-cap manner is disposed on four side surfaces SS1, SS2, SS3 and SS4 as shown in FIG. 111, the first base member BS1 and the second base member BS2 of the force sensor FOS may be bent less in the four side surfaces SS1, SS2, SS3 and SS4. Accordingly, in order to more effectively sense the pressure of a user's touch, a force sensor FOS of the gap-cap manner disposed in the first side surface SS1 may operate together with a force sensor FOS of the gap-cap manner disposed in the fourth side surface SS4 facing the first side surface SS1. According to the gap-cap manner, a force sensor FOS disposed in the second side surface SS2 may operate together with a force sensor FOS disposed in the third side surface SS3 facing the second side surface SS2.

Figure 114:
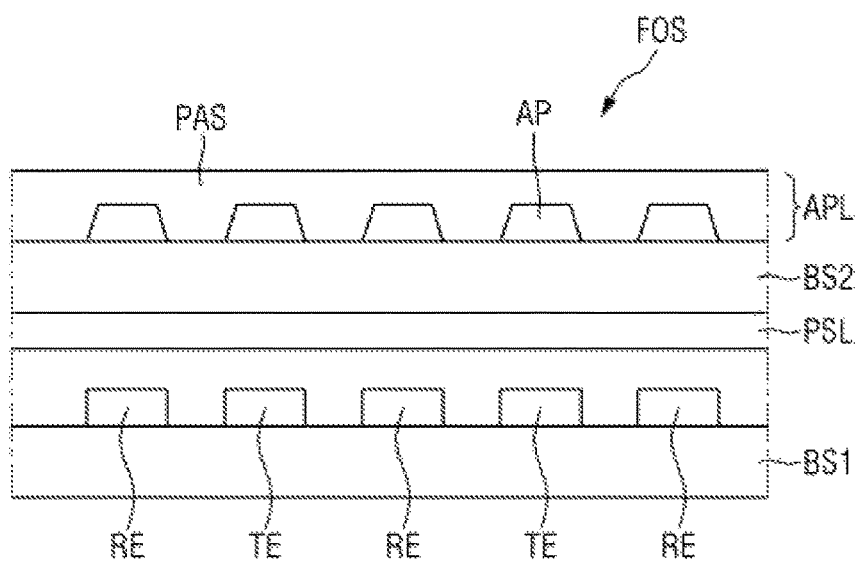
FIG. 114 is a schematic cross-sectional view showing an example of the force sensor of FIG. 111.
Figure 114:
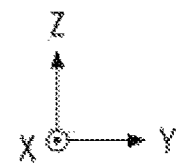

FIG. 114 is a schematic cross-sectional view showing an example of the force sensor of FIG. 111.

An embodiment of FIG. 114 may be different from an embodiment of FIG. 113 in that an antenna layer APL may be disposed on a force sensor FOS.

Referring to FIG. 114, a first conductive pattern AP may be formed or disposed on the second base member BS2 of the force sensor FOS, and a passivation layer PAS may be formed or disposed on the first conductive pattern AP. The first conductive pattern AP may include a conductive material such as silver (Ag) and copper (Cu). The passivation layer PAS may be formed of an inorganic layer, for example, a silicon nitride layer, a silicon oxynitride layer, a silicon oxide layer, a titanium oxide layer, or an aluminum oxide layer.

As shown in FIG. 114, since the antenna layer APL is disposed on the force sensor FOS, the force sensor FOS may be integrated with the antenna layer APL. The antenna layer APL disposed on the display layer DISL may be eliminated.

Figure 115:
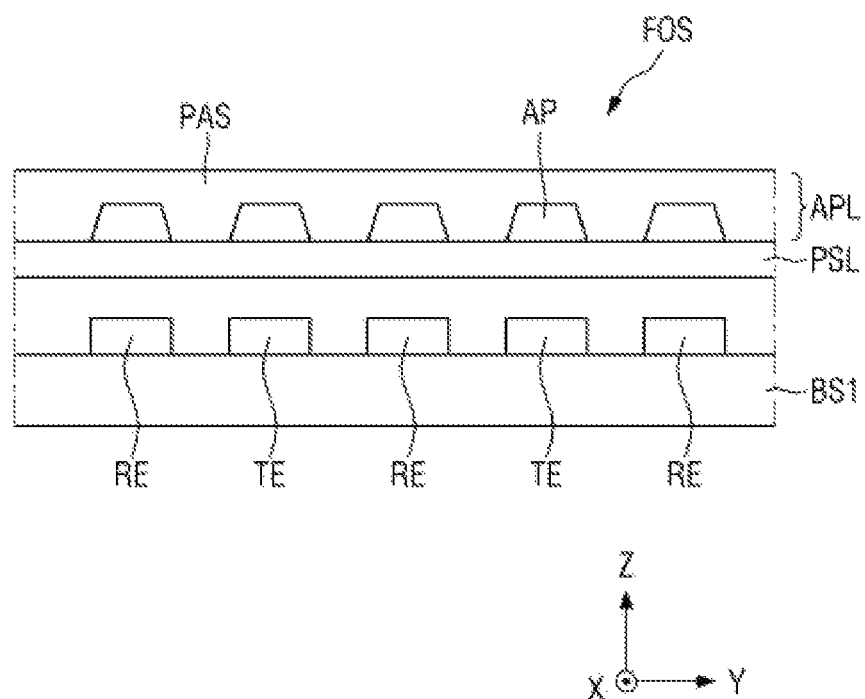
FIG. 115 is a schematic cross-sectional view showing an example of the force sensor of FIG. 111.

FIG. 115 is a schematic cross-sectional view showing an example of the force sensor of FIG. 111.

An embodiment of FIG. 115 may be different from an embodiment of FIG. 113 in that an antenna layer APL may be disposed on a pressure sensing layer PSL of a force sensor FOS.

Referring to FIG. 115, the second base member BS2 of the force sensor FOS may be eliminated, a first conductive pattern AP may be formed or disposed on the pressure sensing layer PSL, and a passivation layer PAS may be formed or disposed on the first conductive pattern AP.

As shown in FIG. 115, since the antenna layer APL is disposed on the pressure sensing layer PSL of the force sensor FOS, the force sensor FOS may be integrated with the antenna layer APL. The antenna layer APL disposed on the display layer DISL may be eliminated.

Figure 116:
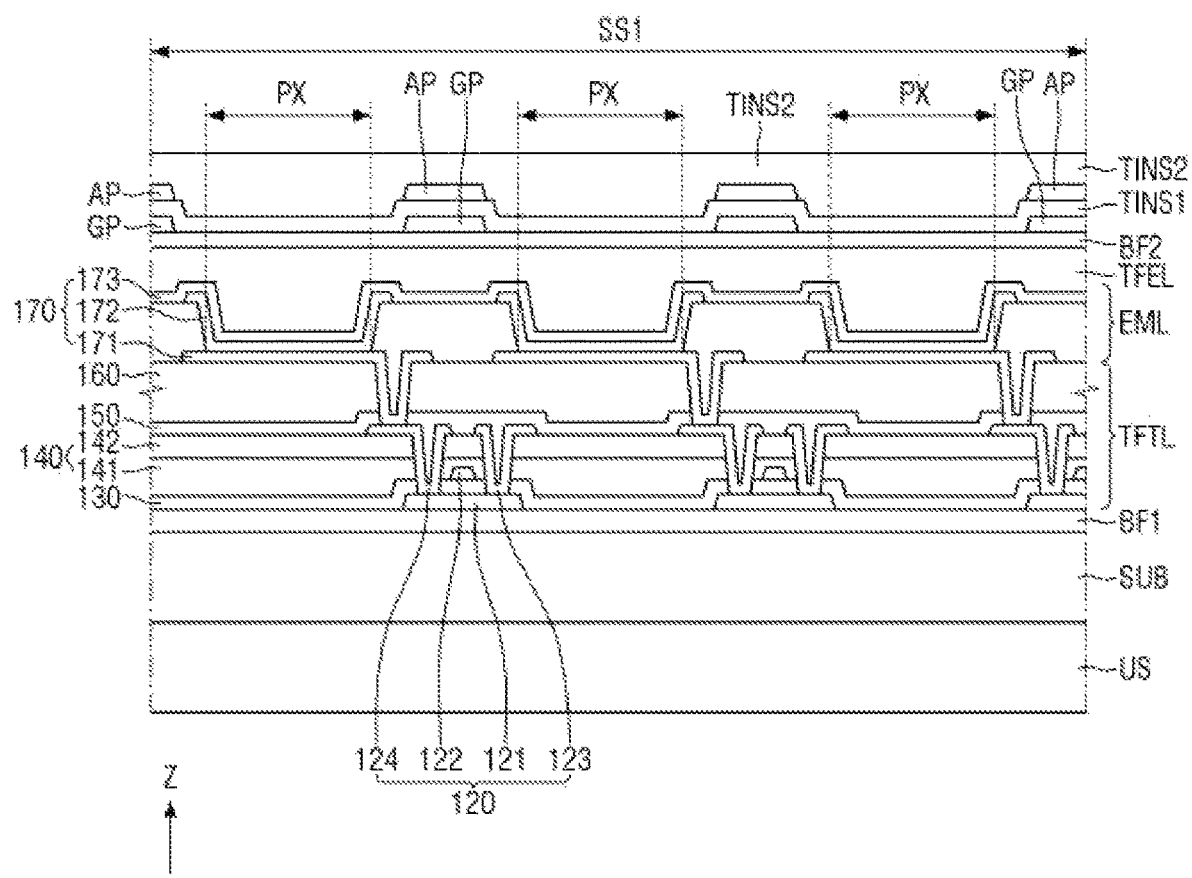
FIG. 116 is a schematic cross-sectional view showing an example of a display panel according to an embodiment.

FIG. 116 is a schematic cross-sectional view showing an example of a first side surface of a display panel according to an embodiment.

An embodiment of FIG. 116 may be different from an embodiment of FIG. 112 in that an ultrasonic sensor US may be disposed in the first side surface SS1 in place of the force sensor FOS.

Referring to FIG. 116, the ultrasonic sensor US may be either an ultrasonic fingerprint recognition sensor that recognizes a user's fingerprint using ultrasonic waves or an ultrasonic proximity sensor that detects a nearby object using ultrasonic waves. The ultrasonic sensor US may be disposed on the other surface of the first side surface SS1. The ultrasonic sensor US may be attached to the other surface of the first side surface SS1 using a pressure sensitive adhesive. The ultrasonic sensor US may overlap the first conductive pattern AP of the antenna layer APL in the thickness direction of the substrate SUB.

Although the ultrasonic sensor US is disposed on the first side surface SS1 in the example shown in FIG. 116, the disclosure is not limited thereto. The ultrasonic sensor US may be disposed on the upper surface PS and at least one of the first to fourth side surfaces SS1, SS2, SS3 and SS4.

While embodiments are described above, it is not intended that these embodiments describe all possible forms thereof. Rather, the words used in the specification are words of description rather than limitation, and it is understood that various changes may be made without departing from the spirit and scope of the of the disclosure. The features of various embodiments may be combined to form further embodiments.

What is claimed is:

1. A display panel comprising:
    a pixel unit comprising a plurality of sub-pixels disposed on a substrate;
    a transmissive portion disposed on a side of the pixel unit; and
    a first conductive pattern disposed in the transmissive portion,
    wherein the first conductive pattern is an antenna.

2. The display panel of claim 1, further comprising:
    a second conductive pattern disposed in the transmissive portion, the second conductive pattern overlapping the first conductive pattern in a thickness direction of the substrate, and receiving a ground voltage or supply voltage.

3. The display panel of claim 2, wherein each of the plurality of sub-pixels comprises:
    a thin-film transistor including:
        an active layer disposed on the substrate;
        a gate electrode disposed on a gate insulating layer disposed on at least a part of the active layer; and
        a source electrode and a drain electrode disposed on an interlayer dielectric layer disposed on the gate electrode; and
    a light-emitting element including:
        a first electrode disposed on a planarization layer disposed on the source electrode and the drain electrode;
        an emissive layer disposed on the first electrode; and
        a second electrode disposed on the emissive layer.

4. The display panel of claim 3, wherein
the first conductive pattern and the first electrode are disposed on a same layer, and
the second conductive pattern and the source electrode and the drain electrode are disposed on a same layer.

5. The display panel of claim 3, further comprising:
a mirror area disposed on another side of the pixel unit; and
a mirror pattern disposed in the mirror area.

6. The display panel of claim 5, wherein the mirror pattern and the first conductive pattern are disposed on a same layer.

7. The display panel of claim 5, wherein the mirror pattern and the first electrode are disposed on a same layer.

8. The display panel of claim 3, wherein
each of the plurality of sub-pixels comprises a capacitor electrode disposed on a first insulating layer disposed on the gate electrode, and
the source electrode and the drain electrode disposed on a second insulating layer are disposed on the capacitor electrode.

9. The display panel of claim 8, wherein
the first conductive pattern and the source electrode and the drain electrode are disposed on a same layer, and
the second conductive pattern and the capacitor electrode are disposed on a same layer.

10. The display panel of claim 8, wherein
the first conductive pattern and the capacitor electrode are disposed on a same layer, and
the second conductive pattern and the gate electrode are disposed on a same layer.

11. The display panel of claim 3, wherein
each of the plurality of sub-pixels comprises a light-blocking layer disposed on the substrate, and
the active layer is disposed on a first buffer film disposed on the light-blocking layer.

12. The display panel of claim 11, wherein
the first conductive pattern and the gate electrode are disposed on a same layer, and
the second conductive pattern and the light-blocking layer are disposed on a same layer.

13. The display panel of claim 11, wherein
the first conductive pattern and the active layer are disposed on a same layer, and
the second conductive pattern and the light-blocking layer are disposed on a same layer.

14. The display panel of claim 11, wherein
the first conductive pattern is disposed on a first surface of the substrate, and
the second conductive pattern is disposed on a second surface of the substrate opposite to the first surface of the substrate.

15. The display panel of claim 14, wherein the first conductive pattern and the light-blocking layer are disposed on a same layer.

16. The display panel of claim 14, wherein
the first buffer film is disposed on the first conductive pattern, and
a second buffer film is disposed on the second conductive pattern and the second surface of the substrate.

17. The display panel of claim 2, wherein each of the plurality of sub-pixels comprises:
a first thin-film transistor including:
a first active layer disposed on the substrate;
a first gate electrode disposed on a first gate insulating layer disposed on at least a part of the first active layer; and
a first source electrode and a first drain electrode disposed on a first interlayer dielectric layer disposed on the first gate electrode;
a second thin-film transistor including:
a light-blocking layer disposed on the first interlayer dielectric layer;
a second active layer disposed on a second interlayer dielectric layer disposed the light-blocking layer;
a second gate electrode disposed on a second gate insulating layer disposed on at least a part of the second active layer; and
a second source electrode and a second drain electrode disposed on a third interlayer dielectric layer disposed on the second gate electrode; and
a light-emitting element including:
a first electrode disposed on a planarization layer disposed on the first source electrode, the second source electrode, the first drain electrode and the second drain electrode;
an emissive layer disposed on the first electrode; and
a second electrode disposed on the emissive layer.

18. The display panel of claim 17, wherein
the first conductive pattern and the first electrode are disposed on a same layer, and
the second conductive pattern and the source electrode and the drain electrode are disposed on a same layer.

19. A display device comprising:
a display panel including a display area having a main area and a sub-area; and
a sensor device, wherein
the display panel includes:
a pixel unit comprising a plurality of sub-pixels disposed on a substrate;
a transmissive portion disposed on a side of the pixel unit; and
a first conductive pattern disposed in the transmissive portion,
the first conductive pattern is an antenna, and
the sensor device overlaps the transmissive portion of the sub-area.

20. The display device of claim 19, further comprising:
a second conductive pattern disposed in the transmissive portion, the second conductive pattern overlapping the first conductive pattern in a thickness direction of the substrate, and receiving a ground voltage or supply voltage.

* * * * *